US012588409B2

(12) United States Patent
Yamatani

(10) Patent No.: US 12,588,409 B2
(45) Date of Patent: Mar. 24, 2026

(54) LIGHT EMITTING ELEMENT AND NITROGEN-CONTAINING COMPOUND FOR THE SAME

(71) Applicant: Samsung Display Co., Ltd., Yongin-si (KR)

(72) Inventor: Akinori Yamatani, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 765 days.

(21) Appl. No.: 17/494,522

(22) Filed: Oct. 5, 2021

(65) Prior Publication Data

US 2022/0246859 A1 Aug. 4, 2022

(30) Foreign Application Priority Data

Jan. 25, 2021 (KR) ........................ 10-2021-0010436

(51) Int. Cl.
*H10K 85/60* (2023.01)
*H10K 50/11* (2023.01)
(Continued)

(52) U.S. Cl.
CPC ........... *H10K 85/631* (2023.02); *H10K 85/40* (2023.02); *H10K 85/626* (2023.02);
(Continued)

(58) Field of Classification Search
CPC ............. H10K 85/6572; H10K 85/626; H10K 85/657; C07D 221/20; C07D 471/10; C07D 491/153; C07D 495/10; C07D 209/96
See application file for complete search history.

(56) References Cited

U.S. PATENT DOCUMENTS

| | | | |
|---|---|---|---|
| 6,461,748 | B1 | 10/2002 | Suzuki et al. |
| 7,318,966 | B2 | 1/2008 | Tominaga et al. |

(Continued)

FOREIGN PATENT DOCUMENTS

| | | | |
|---|---|---|---|
| CN | 103946215 A | | 7/2014 |
| CN | 104293349 B | * | 5/2016 |

(Continued)

OTHER PUBLICATIONS

Machine Translation of KR20180054502A (Year: 2018).*

(Continued)

*Primary Examiner* — Jenna N Chandhok
(74) *Attorney, Agent, or Firm* — Lerner David LLP

(57) ABSTRACT

Provided is a light emitting element including a first electrode, a second electrode disposed on the first electrode, and at least one functional layer disposed between the first electrode and the second electrode. The at least one functional layer may include a nitrogen-containing compound represented by Formula 1 below, and the nitrogen-contain-
(Continued)

ing compound may improve efficiency and a service life of the light emitting element. Therefore, the light emitting element including the nitrogen-containing compound may exhibit excellent efficiency and long service life characteristics.

[Formula 1]

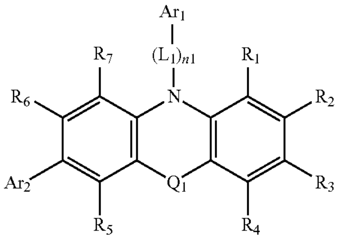

14 Claims, 6 Drawing Sheets

(51) Int. Cl.
*H10K 50/18* (2023.01)
*H10K 85/40* (2023.01)
*H10K 101/10* (2023.01)

(52) U.S. Cl.
CPC ..... *H10K 85/6572* (2023.02); *H10K 85/6574* (2023.02); *H10K 85/6576* (2023.02); *H10K 85/658* (2023.02); *H10K 50/11* (2023.02); *H10K 50/181* (2023.02); *H10K 2101/10* (2023.02)

(56) References Cited

U.S. PATENT DOCUMENTS

| | | | | |
|---|---|---|---|---|
| 7,824,779 | B2 | 11/2010 | Cho et al. | |
| 8,029,919 | B2 | 10/2011 | Gessner et al. | |
| 9,722,186 | B2 | 8/2017 | Park et al. | |
| 10,056,549 | B2 | 8/2018 | Montenegro et al. | |
| 10,305,040 | B2 | 5/2019 | Stoessel et al. | |
| 10,981,876 | B2 | 4/2021 | Cha et al. | |
| 11,374,182 | B2 | 6/2022 | Jin et al. | |
| 11,770,973 | B2 | 9/2023 | Han et al. | |
| 12,256,633 | B2 | 3/2025 | Baek et al. | |
| 2008/0018238 | A1 | 1/2008 | Gessner et al. | |
| 2014/0316134 | A1* | 10/2014 | Stoessel | C07D 221/20 546/18 |
| 2018/0134706 | A1 | 5/2018 | Itoi | |
| 2018/0201632 | A1 | 7/2018 | Fuchiwaki | |
| 2018/0205019 | A1 | 7/2018 | Fuchiwaki et al. | |
| 2018/0233675 | A1 | 8/2018 | Kim et al. | |
| 2019/0165282 | A1 | 5/2019 | Parham et al. | |
| 2020/0199149 | A1 | 6/2020 | Choe et al. | |
| 2020/0403163 | A1 | 12/2020 | Yoshioka et al. | |
| 2021/0119143 | A1 | 4/2021 | Tang et al. | |

FOREIGN PATENT DOCUMENTS

| | | | | |
|---|---|---|---|---|
| CN | 106478610 | | 3/2017 | |
| CN | 106892914 | | 6/2017 | |
| CN | 110452237 | | 11/2019 | |
| CN | 110526905 | A | 12/2019 | |
| CN | 111662255 | | 9/2020 | |
| CN | 112142666 | A | 12/2020 | |
| EP | 1 120 839 | | 8/2001 | |
| EP | 1 120 840 | | 8/2001 | |
| KR | 20120079411 | A | 7/2012 | |
| KR | 10-2012-0095765 | | 8/2012 | |
| KR | 10-2013-0007390 | | 1/2013 | |
| KR | 10-2013-0029132 | | 3/2013 | |
| KR | 10-2013-0115160 | | 10/2013 | |
| KR | 10-2013-0118084 | | 10/2013 | |
| KR | 20130118269 | A | 10/2013 | |
| KR | 10-2014-0020208 | | 2/2014 | |
| KR | 10-2014-0070450 | | 6/2014 | |
| KR | 10-2014-0083897 | | 7/2014 | |
| KR | 10-2014-0093135 | | 7/2014 | |
| KR | 10-2014-0096372 | | 8/2014 | |
| KR | 10-2014-0103394 | | 8/2014 | |
| KR | 10-2014-0103842 | | 8/2014 | |
| KR | 10-2014-0105633 | | 9/2014 | |
| KR | 10-1636848 | | 7/2016 | |
| KR | 20170041155 | A | 4/2017 | |
| KR | 10-1742436 | | 5/2017 | |
| KR | 2018054502 | A * | 5/2018 | C07C 211/54 |
| KR | 10-1888252 | | 9/2018 | |
| KR | 10-2003366 | | 7/2019 | |
| KR | 10-2019-0120538 | | 10/2019 | |
| KR | 20200030157 | A | 3/2020 | |
| KR | 10-2110834 | | 5/2020 | |
| KR | 10-2020-0079377 | | 7/2020 | |
| KR | 20200139287 | A | 12/2020 | |
| KR | 20200145889 | A | 12/2020 | |
| WO | 97/11217 | | 3/1997 | |
| WO | 02/43449 | | 5/2002 | |
| WO | 2006/033564 | | 3/2006 | |
| WO | 2006/056416 | | 6/2006 | |
| WO | 2006/056465 | | 6/2006 | |
| WO | WO-2012093862 | A2 * | 7/2012 | C07D 241/38 |
| WO | 2012/150001 | | 11/2012 | |
| WO | 2013/083216 | | 6/2013 | |
| WO | 2014/017844 | | 1/2014 | |
| WO | 2014/058123 | | 4/2014 | |
| WO | 2014/104704 | | 7/2014 | |
| WO | 2017/105041 | | 6/2017 | |
| WO | 2017/178311 | | 10/2017 | |
| WO | 2019/165890 | | 9/2019 | |
| WO | 2019/176754 | | 9/2019 | |
| WO | 2020/101314 | | 5/2020 | |

OTHER PUBLICATIONS

Machine Translation of CN104293349B (Year: 2016).*
Machine Translation of WO2012093862A2 (Year: 2012).*
Office Action including Search Report for Chinese Application No. 2021115737006 dated Dec. 19. 2025. 14 pgs.

* cited by examiner

LIGHT EMITTING ELEMENT AND NITROGEN-CONTAINING COMPOUND FOR THE SAME

CROSS-REFERENCE TO RELATED APPLICATION(S)

This application claims priority to and benefits of Korean Patent Application No. 10-2021-0010436 under 35 U.S.C. § 119, filed on Jan. 25, 2021 in the Korean Intellectual Property Office, the entire contents of which are incorporated herein by reference.

BACKGROUND

1. Technical Field

The disclosure relates to a nitrogen-containing compound used as a hole transport material and a light emitting element including the same.

2. Description of the Related Art

Active development continues for an organic electroluminescence display device as an image display device. The organic electroluminescence display device includes a so-called self-luminescent light emitting element in which holes and electrons respectively injected from a first electrode and a second electrode recombine in an emission layer, so that a luminescent material of the emission layer emits light to achieve display.

In the application of a light emitting element to a display device, there is a demand for a light emitting element having low driving voltage, high luminous efficiency, and a long service life, and continuous development is required on materials for a light emitting element which are capable of stably attaining such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting element exhibiting excellent luminous efficiency and long service life characteristics.

The disclosure also provides a nitrogen-containing compound as a material for a light emitting element having high efficiency and long service life characteristics.

An embodiment provides a light emitting element which may include a first electrode, a second electrode disposed on the first electrode, and at least one functional layer disposed between the first electrode and the second electrode and including a nitrogen-containing compound represented by Formula 1 below:

[Formula 1]

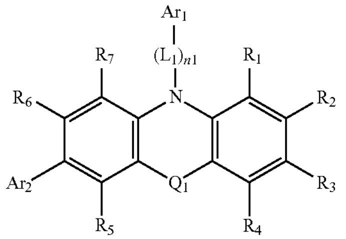

In Formula 1 above, n1 may be an integer from 0 to 2, $L_1$ may be a substituted or unsubstituted arylene group having 6 to 30 ring-forming carbon atoms, or a substituted or unsubstituted heteroarylene group having 2 to 30 ring-forming carbon atoms, $Ar_1$ may be a substituted or unsubstituted aryl group having 6 to 30 ring-forming carbon atoms, or a substituted or unsubstituted heteroaryl group having 2 to 30 ring-forming carbon atoms, and $Ar_2$ may be a group represented by Formula 2 below:

[Formula 2]

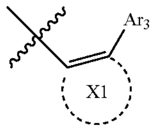

ring X1 may be a substituted or unsubstituted aryl ring having 6 to 30 ring-forming carbon atoms, or a substituted or unsubstituted heteroaryl ring having 2 to 30 ring-forming carbon atoms, $Ar_3$ may be a substituted or unsubstituted aryl group having 6 to 30 ring-forming carbon atoms, or a substituted or unsubstituted heteroaryl group having 2 to 30 ring-forming carbon atoms, or may be bonded to ring X1 to form a ring, $R_1$ to $R_7$ may each independently be a hydrogen atom, a deuterium atom, a substituted or unsubstituted silyl group, a substituted or unsubstituted amine group, a substituted or unsubstituted oxy group, a substituted or unsubstituted thio group, a substituted or unsubstituted alkyl group having 1 to 20 carbon atoms, a substituted or unsubstituted alkenyl group having 2 to 20 carbon atoms, a substituted or unsubstituted aryl group having 6 to 20 ring-forming carbon atoms, or a substituted or unsubstituted heteroaryl group having 2 to 20 ring-forming carbon atoms, or may be bonded to an adjacent group to form a ring, $Q_1$ may be O, S, SO, $SO_2$, Se, CO, $C(R_{11})(R_{12})$, $B(R_{13})$, $N(R_{14})$, $P(R_{15})$, $PO(R_{16})$, $PS(R_{17})$, or a group represented by Formula 3 below, $R_{11}$ and $R_{12}$ may each independently be a substituted or unsubstituted alkyl group having 1 to 20 carbon atoms, or a substituted or unsubstituted aryl group having 6 to 20 ring-forming carbon atoms, or may be bonded to an adjacent group to form a ring, and $R_{13}$ to $R_{17}$ may each independently be a substituted or unsubstituted aryl group having 6 to 30 ring-forming carbon atoms:

[Formula 3]

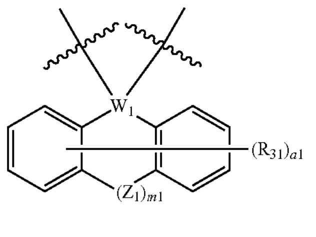

In Formula 3 above, $W_1$ may be C, Si, or Ge, m1 may be 0 or 1, $Z_1$ may be a direct linkage, $C(R_{32})(R_{33})$, $N(R_{34})$, O, or S, a1 may be an integer from 0 to 8, $R_{31}$ to $R_{34}$ may each independently be a hydrogen atom, a deuterium atom, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, when $R_3$ is a hydrogen atom, $Ar_1$ may be a substituted or unsubstituted fluorenyl group, a substituted or unsubstituted carbazole group, a substituted or unsubstituted dibenzofuran group, a substituted or unsubstituted dibenzothiophene group, or a substituted or unsubstituted dibenzosilole group, and when $Ar_1$ is a substituted or unsubstituted aryl group and when $Ar_2$ and $R_3$ are each a substituted or unsubstituted biphenyl group, $Q_1$ may be a group represented by Formula 3, and $Z_1$ may be a direct linkage or $N(R_{34})$.

In an embodiment, $Ar_1$ above may be a group represented by any one of Ar1-1 to Ar1-9 below:

Ar1-1

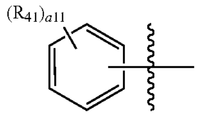

Ar1-2

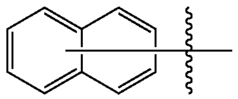

Ar1-3

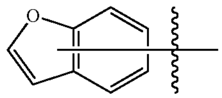

Ar1-4

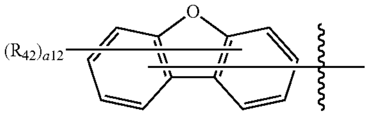

Ar1-5

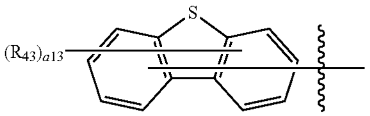

Ar1-6

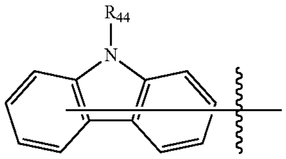

Ar1-7

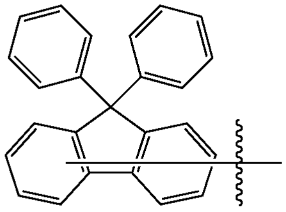

-continued

Ar1-8

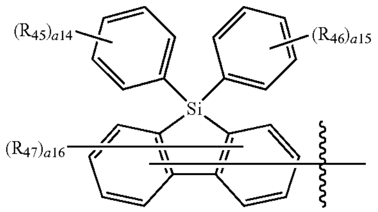

Ar1-9

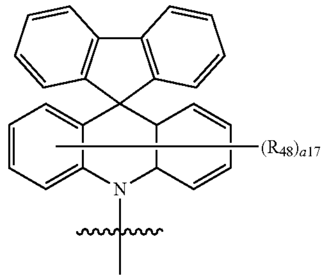

In Ar1-1 above, a11 may be an integer from 0 to 5. In Ar1-4 and Ar1-5 above, a12 and a13 may each independently be an integer from 0 to 7. In Ar1-8 above, a14 and a15 may each independently be an integer from 0 to 5, and a16 may be an integer from 0 to 7. In Ar1-9 above, a17 may be an integer from 0 to 8. In Ar1-1, Ar1-4 to Ar1-6, Ar1-8, and Ar1-9 above, $R_{41}$ to $R_{48}$ may each independently be a hydrogen atom, a deuterium atom, or a substituted or unsubstituted aryl group having 6 to 30 ring-forming carbon atoms.

In an embodiment, $Ar_2$ may be a substituted phenyl group, a substituted naphthyl group, a substituted carbazole group, a substituted or unsubstituted fluorenyl group, a substituted or unsubstituted dibenzofuran group, or a substituted or unsubstituted dibenzothiophene group.

In an embodiment, $Ar_2$ may be a group represented by any one of Ar2-1 to Ar2-6 below:

Ar2-1

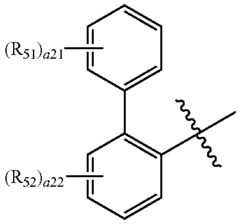

Ar2-2

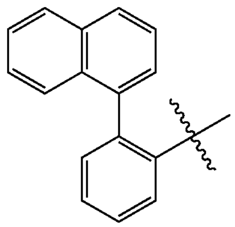

-continued

Ar2-3

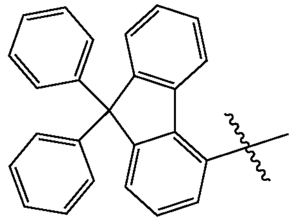

Ar2-4

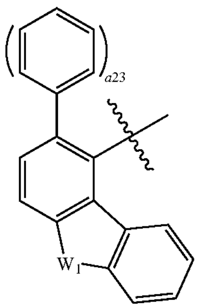

Ar2-5

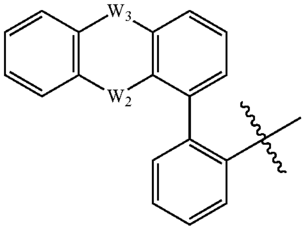

Ar2-6

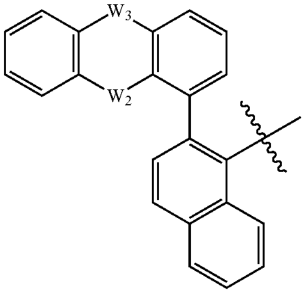

In Ar2-1 above, a21 may be an integer from 0 to 5, a22 may be an integer from 0 to 4, and $R_{51}$ and $R_{52}$ may each independently be a hydrogen atom, a deuterium atom, or an unsubstituted phenyl group. In Ar2-4 above, a23 may be 0 or 1, and $W_1$ may be N(Ph), O, or S. In Ar2-5 and Ar2-6 above, one of $W_2$ or $W_3$ may be a direct linkage, and the other of $W_2$ and $W_3$ may be N(Ph), O, or S. In Ar2-4 to Ar2-6 above, Ph is a phenyl group.

In an embodiment, $Ar_2$ and $R_3$ may be the same.

In an embodiment, the nitrogen-containing compound represented by Formula 1 above may be represented by any one of Formula 1-1 to Formula 1-3 below:

[Formula 1-1]

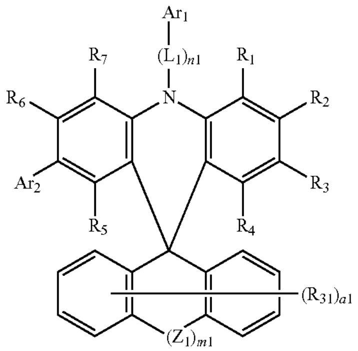

[Formula 1-2]

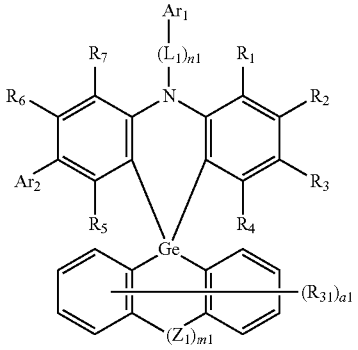

[Formula 1-3]

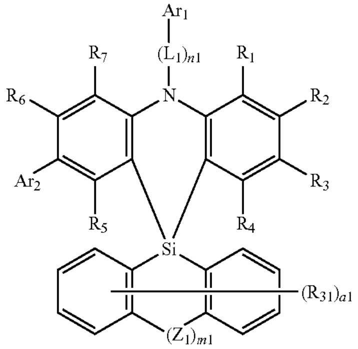

In Formula 1-1 to Formula 1-3 above, $Ar_1$, $Ar_2$, $L_1$, n1, $R_1$ to $R_7$, a1, $R_{31}$, m1, and $Z_1$ may be the same as defined in connection with Formula 1 above.

In an embodiment, the nitrogen-containing compound represented by Formula 1-1 above may be represented by any one of Formula 1-1A to Formula 1-1E below:

[Formula 1-1A]

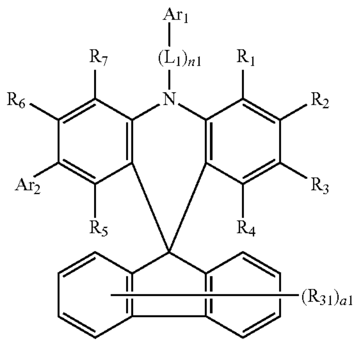

-continued

[Formula 1-1B]

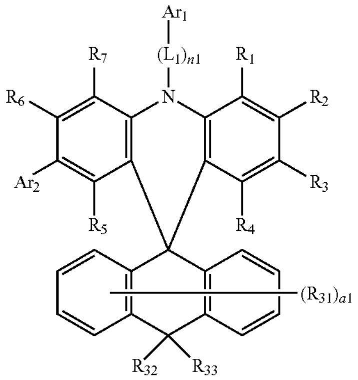

[Formula 1-1C]

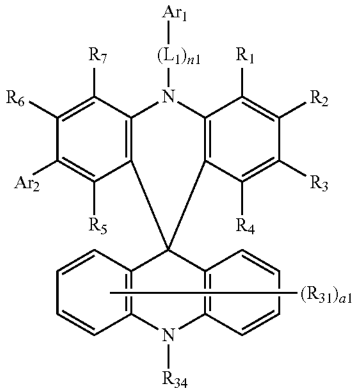

[Formula 1-1D]

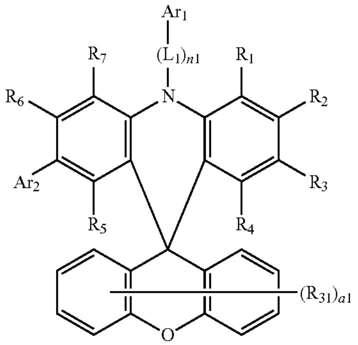

[Formula 1-1E]

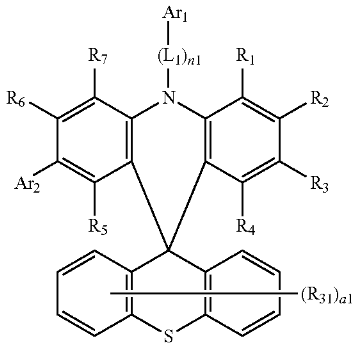

In Formula 1-1A to Formula 1-1E above, $Ar_1$, $Ar_2$, $L_1$, n1, $R_1$ to $R_7$, a1, and $R_{31}$ to $R_{34}$ may be the same as defined in connection with Formula 1 above.

In an embodiment, at least one of $R_1$ to $R_7$ may be a deuterium atom.

In an embodiment, the at least one functional layer may include a hole injection layer disposed on the first electrode, a hole transport layer disposed on the hole injection layer, an electron blocking layer disposed on the hole transport layer, and an emission layer disposed on the electron blocking layer. At least one of the hole injection layer, the hole transport layer, the electron blocking layer, and the emission layer may include the nitrogen-containing compound.

In an embodiment, a nitrogen-containing compound may be represented by Formula 1 above.

In an embodiment, the nitrogen-containing compound may be bilaterally symmetrical with respect to the nitrogen atom (N) in Formula 1 above.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
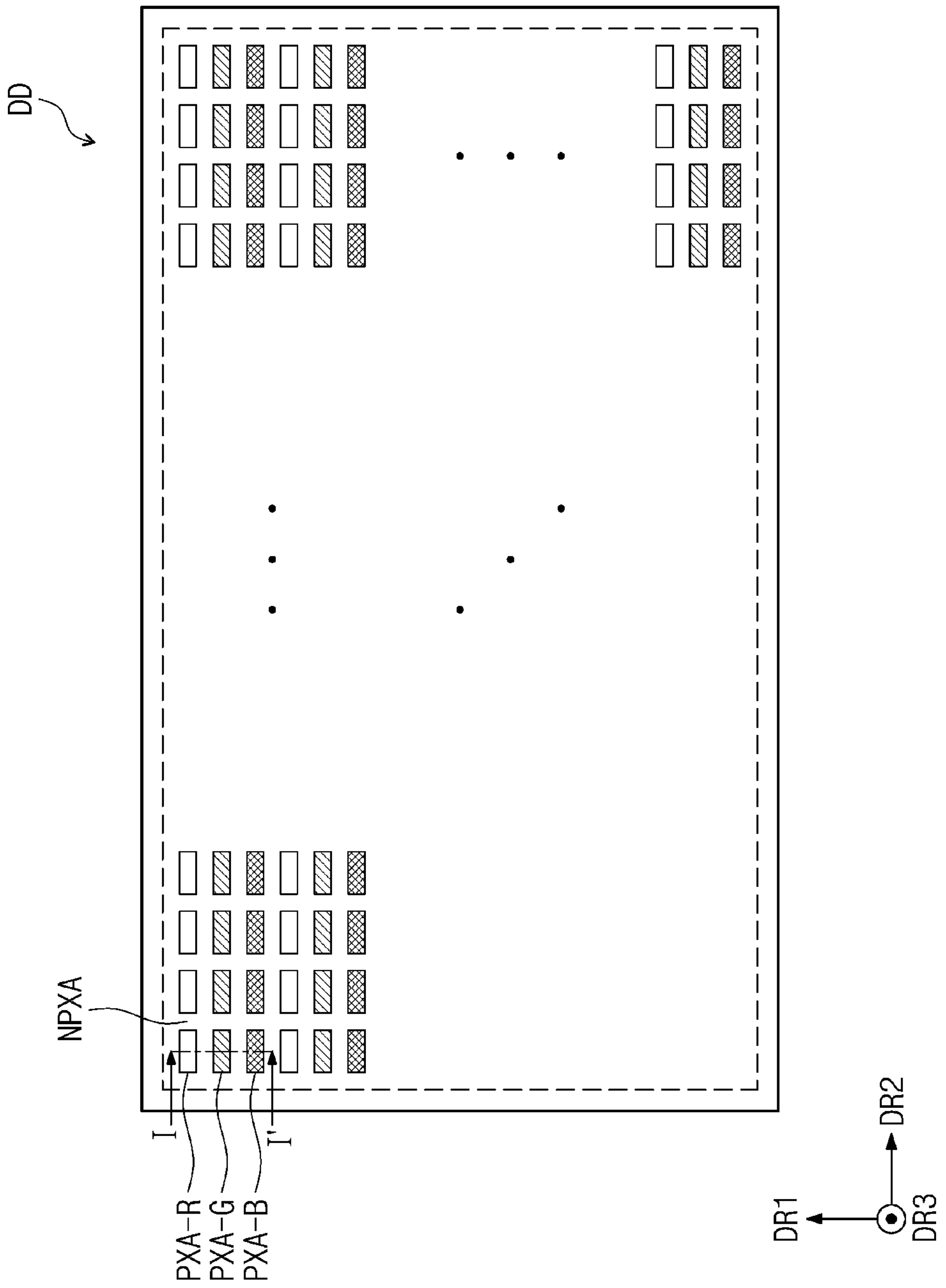
FIG. 1 is a plan view illustrating a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described with reference to the accompanying drawings.

Figure 2:
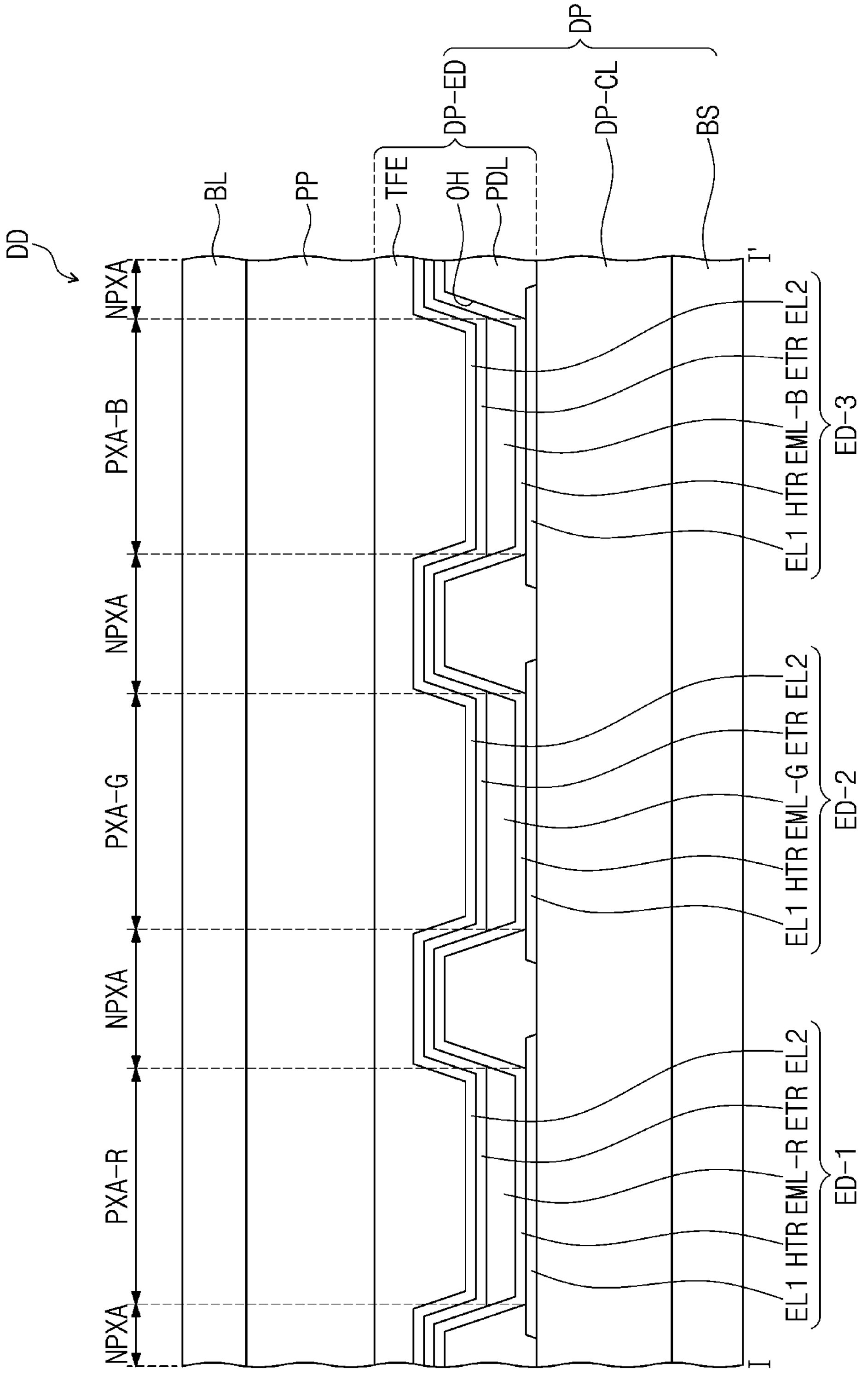
FIG. 2 is a schematic cross-sectional view illustrating a display device according to an embodiment.

FIG. 1 is a plan view illustrating an embodiment of a display device DD. FIG. 2 is a schematic cross-sectional view of the display device DD of the embodiment. FIG. 2 is a schematic cross-sectional view illustrating a part taken along line I-I' of FIG. 1.

The display device DD may include a display panel DP and an optical layer PP disposed on the display panel DP. The display panel DP may include light emitting elements ED-1, ED-2, and ED-3. The display device DD may include multiples of each of the light emitting elements ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawing, in an embodiment, the optical layer PP may be omitted from the display device DD.

A base substrate BL may be disposed on the optical layer PP. The base substrate BL may provide a base surface on which the optical layer PP disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

The display device DD according to an embodiment may further include a filling layer (not shown). The filling layer (not shown) may be disposed between a display element layer DP-ED and the base substrate BL. The filling layer (not shown) may be an organic material layer. The filling layer (not shown) may include at least one of an acrylic-based resin, a silicone-based resin, or an epoxy-based resin.

The display panel DP may include a base layer BS, a circuit layer DP-CL provided on the base layer BS, and a display element layer DP-ED. The display element layer DP-ED may include a pixel defining film PDL, the light emitting elements ED-1, ED-2, and ED-3 disposed between portions of the pixel defining film PDL, and an encapsulation layer TFE disposed on the light emitting elements ED-1, ED-2, and ED-3.

The base layer BS may provide a base surface on which the display element layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL may be disposed on the base layer BS, and the circuit layer DP-CL may include transistors (not shown). Each of the transistors (not shown) may include a control electrode, an input electrode, and an output electrode. For example, the circuit layer DP-CL may include a switching transistor and a driving transistor in order to drive the light emitting elements ED-1, ED-2, and ED-3 of the display element layer DP-ED.

Each of the light emitting elements ED-1, ED-2, and ED-3 may have a structure of a light emitting element ED of an embodiment according to FIGS. 3 to 6, which will be described later. Each of the light emitting elements ED-1, ED-2, and ED-3 may include a first electrode EL1, a hole transport region HTR, emission layers EML-R, EML-G, and EML-B, an electron transport region ETR, and a second electrode EL2.

FIG. 2 illustrates an embodiment in which the emission layers EML-R, EML-G, and EML-B of the light emitting elements ED-1, ED-2, and ED-3 are disposed in the openings OH defined in the pixel defining film PDL, and the hole transport region HTR, the electron transport region ETR, and the second electrode EL2 are each provided as a common layer for all the light emitting elements ED-1, ED-2, and ED-3. However, embodiments are not limited thereto, and although not shown in FIG. 2, the hole transport region HTR and the electron transport region ETR in an embodiment may each be provided by being patterned inside the openings OH defined in the pixel defining film PDL. For example, the hole transport region HTR, the emission layers EML-R, EML-G, and EML-B, and the electron transport region ETR of the light emitting elements ED-1, ED-2, and ED-3 in an embodiment may each be provided by being patterned in an inkjet printing method.

The encapsulation layer TFE may cover the light emitting elements ED-1, ED-2, and ED-3. The encapsulation layer TFE may seal the display element layer DP-ED. The encapsulation layer TFE may be a thin film encapsulation layer. The encapsulation layer TFE may be formed by laminating one layer or multiple layers. The encapsulation layer TFE may include at least one insulation layer. The encapsulation layer TFE according to an embodiment may include at least one inorganic film (hereinafter, an encapsulation-inorganic film). The encapsulation layer TFE according to an embodiment may include at least one organic film (hereinafter, an encapsulation-organic film) and at least one encapsulation-inorganic film.

The encapsulation-inorganic film may protect the display element layer DP-ED from moisture and/or oxygen, and the encapsulation-organic film may protect the display element layer DP-ED from foreign substances such as dust particles. The encapsulation-inorganic film may include silicon nitride, silicon oxynitride, silicon oxide, titanium oxide, aluminum oxide, or the like, but embodiments are not limited thereto. The encapsulation-organic film may include an acrylic-based compound, an epoxy-based compound, or the like. The encapsulation-organic film may include a photopolymerizable organic material, but embodiments are not limited thereto.

The encapsulation layer TFE may be disposed on the second electrode EL2. The encapsulation layer TFE may be disposed to fill the openings OH.

Referring to FIGS. 1 and 2, the display device DD may include a non-light emitting region NPXA and light emitting regions PXA-R, PXA-G, and PXA-B. The light emitting regions PXA-R, PXA-G, and PXA-B each may be a region which emits light generated from the light emitting elements ED-1, ED-2, and ED-3, respectively. The light emitting regions PXA-R, PXA-G, and PXA-B may be spaced apart from each other in a plane.

The light emitting regions PXA-R, PXA-G, and PXA-B may be separated from each other by the pixel defining film PDL. The non-light emitting region NPXA may be areas between the adjacent light emitting regions PXA-R, PXA-G, and PXA-B, which corresponds to portions of the pixel defining film PDL. Each of the light emitting regions PXA-R, PXA-G, and PXA-B may correspond to a pixel. The pixel defining film PDL may separate the light emitting elements ED-1, ED-2, and ED-3. The emission layers EMLL-R, EML-G, and EMLL-B of the light emitting elements ED-1, ED-2, and ED-3 may be disposed in openings OH defined by the pixel defining film PDL and separated from each other.

The light emitting regions PXA-R, PXA-G, and PXA-B may be divided into multiple groups according to the color of light generated from each of the light emitting elements ED-1, ED-2, and ED-3. In the display device DD of an embodiment shown in FIGS. 1 and 2, three light emitting regions PXA-R, PXA-G, and PXA-B which respectively emit red light, green light, and blue light, are illustrated. For example, the display device DD of an embodiment may include the red light emitting region PXA-R, the green light emitting region PXA-G, and the blue light emitting region PXA-B, which are separated from one another.

In the display device DD according to an embodiment, the light emitting elements ED-1, ED-2, and ED-3 may emit light having wavelengths different from one another. For example, in an embodiment, the display device DD may include a first light emitting element ED-1 that emits red light, a second light emitting element ED-2 that emits green light, and a third light emitting element ED-3 that emits blue light. For example, the red light emitting region PXA-R, the green light emitting region PXA-G, and the blue light emitting region PXA-B of the display device DD may correspond to the first light emitting element ED-1, the second light emitting element ED-2, and the third light emitting element ED-3, respectively.

However, embodiments are not limited thereto, and the first to third light emitting elements ED-1, ED-2, and ED-3 may emit light in a same wavelength range or at least one light emitting element may emit light in a wavelength range different from the others. For example, the first to third light emitting elements ED-1, ED-2, and ED-3 may all emit blue light.

The light emitting regions PXA-R, PXA-G, and PXA-B in the display device DD according to an embodiment may be arranged in a stripe form. Referring to FIG. 1, the red light emitting regions PXA-R, the green light emitting regions PXA-G, and the blue light emitting regions PXA-B each may be arranged along a second directional axis DR2. The red light emitting region PXA-R, the green light emitting region PXA-G, and the blue light emitting region PXA-B may be alternately arranged in this order along a first directional axis DR1.

FIGS. 1 and 2 illustrate that all the light emitting regions PXA-R, PXA-G, and PXA-B have a similar area, but embodiments are not limited thereto, and the light emitting regions PXA-R, PXA-G, and PXA-B may have different areas from each other according to a wavelength range of the emitted light. The areas of the light emitting regions PXA-R, PXA-G, and PXA-B may be areas in a plan view that are defined by the first directional axis DR1 and the second directional axis DR2.

The arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be variously combined and provided according to characteristics of display quality that are required in the display device DD. For example, the arrangement form of the light emitting regions PXA-R, PXA-G, and PXA-B may be a PenTile® arrangement form or a diamond arrangement form.

In an embodiment, the areas of the light emitting regions PXA-R, PXA-G, and PXA-B may be different from each other. For example, in an embodiment, an area of the green light emitting region PXA-G may be smaller than that of the blue light emitting region PXA-B, but embodiments are not limited thereto.

Figure 3:
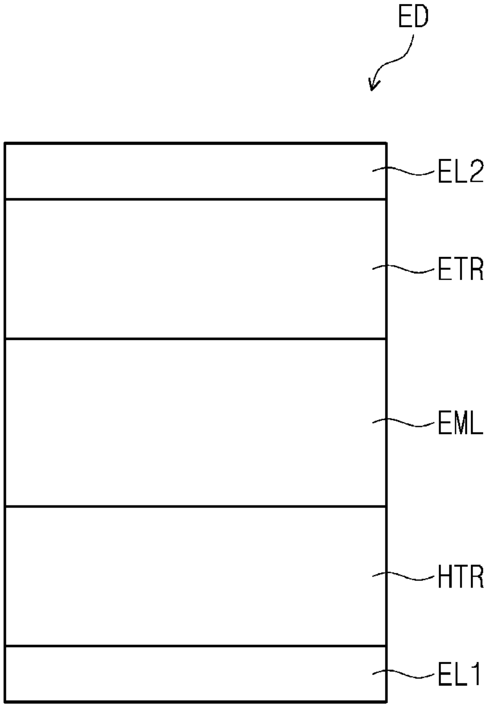
FIG. 3 is a schematic cross-sectional view illustrating a light emitting element of an embodiment.

Hereinafter, FIGS. 3 to 6 are each a schematic cross-sectional view illustrating a light emitting element according to embodiments. As shown in FIG. 3, the light emitting element ED according to an embodiment may include a first electrode EL1, a hole transport region HTR, an emission layer EML, an electron transport region ETR, and a second electrode EL2 that are sequentially stacked.

Figure 4:
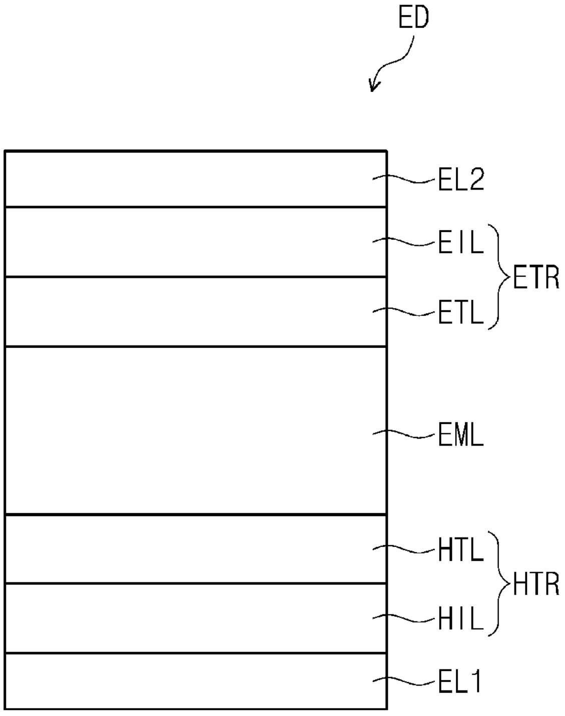
FIG. 4 is a schematic cross-sectional view illustrating a light emitting element of an embodiment.
Figure 5:
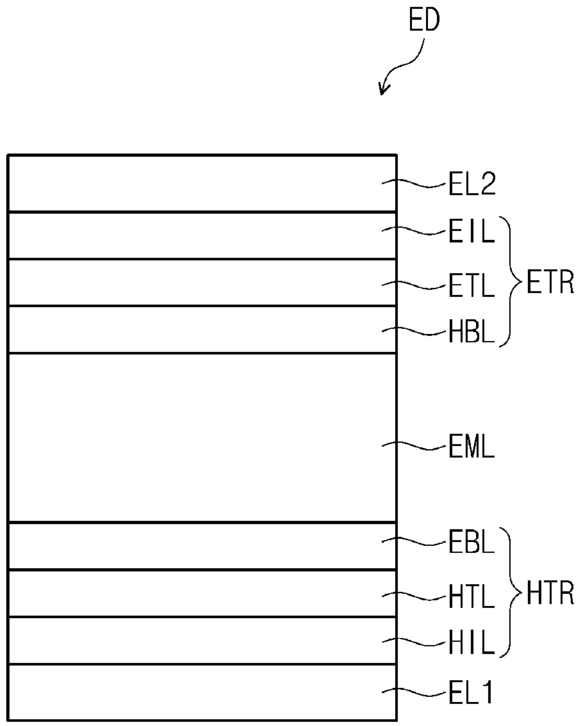
FIG. 5 is a schematic cross-sectional view illustrating a light emitting element of an embodiment.
Figure 6:
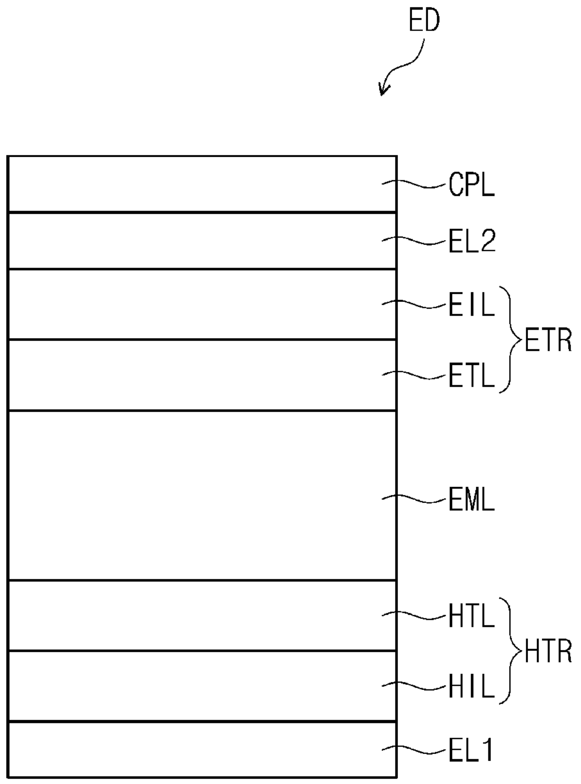
FIG. 6 is a schematic cross-sectional view illustrating a light emitting element of an embodiment.

In comparison to FIG. 3, FIG. 4 illustrates a schematic cross-sectional view of a light emitting element ED of an embodiment, in which a hole transport region HTR includes a hole injection layer HIL and a hole transport layer HTL, and an electron transport region ETR includes an electron injection layer EIL and an electron transport layer ETL. In comparison to FIG. 3, FIG. 5 illustrates a schematic cross-sectional view of a light emitting element ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 illustrates a schematic cross-sectional view of a light emitting element ED of an embodiment including a capping layer CPL disposed on a second electrode EL2.

The first electrode EL1 has conductivity. The first electrode EL1 may be formed of a metal material, a metal alloy, or a conductive compound. The first electrode EL1 may be an anode or a cathode. However, embodiments are not limited thereto. In an embodiment, the first electrode EL1 may be a pixel electrode. The first electrode EL1 may be a transmissive electrode, a transflective electrode, or a reflective electrode. If the first electrode EL1 is a transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, $L_1$, Ca, LiF/Ca, LiF/Al, Mo, Ti, W, a compound thereof, or a mixture thereof (e.g., a mixture of Ag and Mg).

In an embodiment, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but embodiments are not limited thereto. The first electrode EL1 may include the above-described metal materials, combinations of at least two metal materials of the above-described metal materials, oxides of the above-described metal materials, or the like. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode EL1. The hole transport region HTR in the light emitting element ED of an embodiment may include a nitrogen-containing compound of an embodiment.

In the specification, the term "substituted or unsubstituted" may mean a group that is substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents listed above may itself be substituted or unsubstituted. For example, a biphenyl group may be interpreted as an aryl group or as a phenyl group substituted with a phenyl group.

In the specification, the term "bonded to an adjacent group to form a ring" may mean a group that is bonded to an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The hydrocarbon ring and the heterocycle may each be monocyclic or polycyclic. A ring formed by groups being bonded to each other may be connected to another ring to form a spiro structure.

In the specification, the term "adjacent group" may mean a substituent substituted for an atom which is directly bonded to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other. For example, two methyl groups in 4,5-dimethylphenanthrene may be interpreted as "adjacent groups" to each other.

In the specification, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but are not limited thereto.

In the specification, an alkenyl group may be linear or branched. The number of carbon atoms in the alkynyl group is not specifically limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the specification, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but embodiments are not limited thereto. In the specification, the description of the aryl group may be equally applied to an aryl ring.

In the specification, a fluorenyl group may be substituted, and two substituents may be bonded to each other to form a spiro structure. Examples of substituted fluorenyl groups are as follows. However, embodiments are not limited thereto.

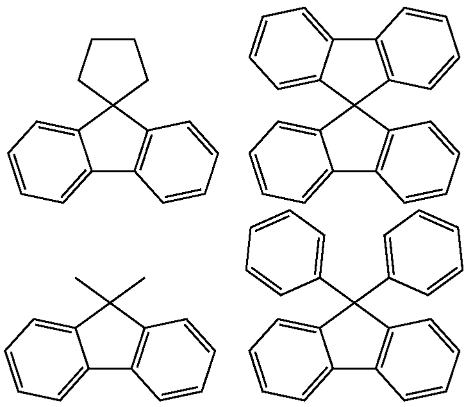

In the specification, a heteroaryl group may include at least one of B, O, N, P, Si, and S as a heteroatom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but embodiments are not limited thereto. In the specification, the description of the heteroaryl group may be equally applied to a heteroaryl ring.

In the specification, the above description of the aryl group may be applied to an arylene group except that the arylene group is a divalent group. The above description of the heteroaryl group may be applied to a heteroarylene group except that the heteroarylene group is a divalent group.

In the specification, a silyl group may include an alkylsilyl group or an arylsilyl group. Examples of the silyl group may include a trimethylsilyl group, a triethylsilyl group, a t-butyldimethylsilyl group, an ethyldimethylsilyl group, a propyldimethylsilyl group, a triphenylsilyl group, a diphenylsilyl group, a phenylsilyl group, etc., but embodiments are not limited thereto.

In the specification, the number of carbon atoms in an amine group is not specifically limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but embodiments are not limited thereto.

In the specification, an oxy group may be an oxygen atom that is bonded to the alkyl group or the aryl group as defined above. The oxy group may include an alkoxy group or an aryl oxy group. The alkoxy group may be a linear chain, a branched chain, or a ring chain. The number of carbon atoms in the alkoxy group is not specifically limited, but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., but embodiments are not limited thereto.

In the specification, a thio group may include an alkylthio group or an arylthio group. A thio group may be a sulfur atom that is bonded to the alkyl group or the aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, but embodiments are not limited thereto.

In the specification, a direct linkage may be a single bond.

In the specification,

and -* each represent a binding site to a neighboring atom.

The hole transport region HTR in the light emitting element ED of an embodiment may include a nitrogen-containing compound represented by Formula 1 below:

[Formula 1]

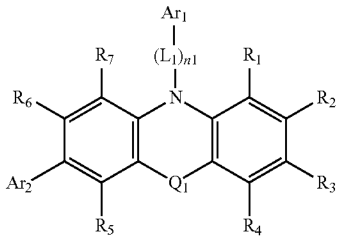

In Formula 1, n1 may be an integer from 0 to 2. $L_1$ may be a substituted or unsubstituted arylene group having 6 to 30 ring-forming carbon atoms, or a substituted or unsubstituted heteroarylene group having 2 to 30 ring-forming carbon atoms. When n1 is 2, multiple $L_1$ groups may be the same as or different from each other. For example, n1 may be 0 or 1. For example, $L_1$ may be a substituted or unsubstituted phenylene group, a substituted or unsubstituted naphthylene group, or a substituted or unsubstituted dibenzofuranylene group.

$Ar_1$ may be a substituted or unsubstituted aryl group having 6 to 30 ring-forming carbon atoms, or a substituted or unsubstituted heteroaryl group having 2 to 30 ring-forming carbon atoms. For example, $Ar_1$ may be a substituted or unsubstituted phenyl group, a substituted or unsubstituted naphthyl group, a substituted or unsubstituted fluorenyl group, a substituted or unsubstituted carbazole group, a substituted or unsubstituted acrydyl group, a substituted or unsubstituted benzofuran group, a substituted or unsubstituted dibenzofuran group, a substituted or unsubstituted dibenzothiophene group, or a substituted or unsubstituted dibenzosilole group.

In an embodiment, $Ar_1$ may be a group represented by any one of Ar1-1 to Ar1-9 below:

Ar1-1

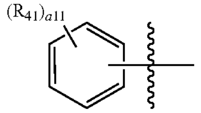

Ar1-2

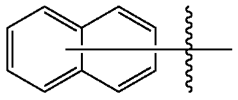

Ar1-3

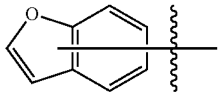

Ar1-4

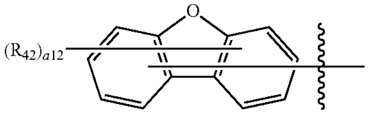

Ar1-5

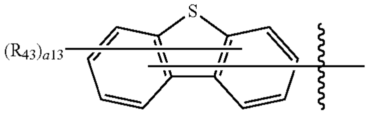

Ar1-6

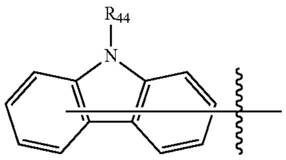

Ar1-7

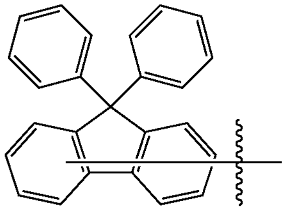

-continued

Ar1-8

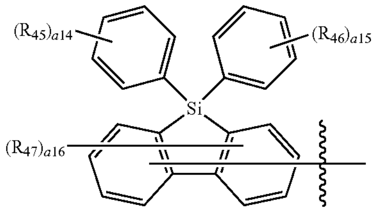

Ar1-9

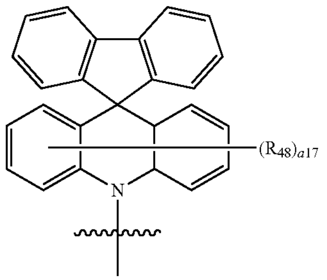

In Ar1-1, a11 may be an integer from 0 to 5. When a11 is 2 or more, multiple $R_{41}$ groups may be the same as each other or at least one thereof may be different from the others.

In Ar1-4 and Ar1-5, a12 and a13 may each independently be an integer from 0 to 7. In Ar1-8, a14 and a15 may each independently be an integer from 0 to 5, and a16 may be an integer from 0 to 7. In Ar1-9, a17 may be an integer from 0 to 8. When a12 is 2 or more, multiple $R_{42}$ groups may be the same as each other or at least one thereof may be different from the others. When a13 is 2 or more, multiple $R_{43}$ groups may be the same as each other or at least one thereof may be different from the others. When a14 is 2 or more, multiple $R_{45}$ groups may be the same as each other or at least one thereof may be different from the others. When a15 is 2 or more, multiple $R_{46}$ groups may be the same as each other or at least one thereof may be different from the others. When a16 is 2 or more, multiple $R_{47}$ groups may be the same as each other or at least one thereof may be different from the others. When a17 is 2 or more, multiple $R_{48}$ groups may be the same as each other or at least one thereof may be different from the others.

In Ar1-1, Ar1-4 to Ar1-6, Ar1-8, and Ar1-9, $R_{41}$ to $R_{48}$ may each independently be a hydrogen atom, a deuterium atom, or a substituted or unsubstituted aryl group having 6 to 30 ring-forming carbon atoms. For example, $Ar_1$ may be represented by Ar1-1, and $R_{41}$ may be a hydrogen atom or a deuterium atom. For example, $Ar_1$ may be represented by Ar1-4 or Ar1-5, and $R_{42}$ and $R_{43}$ may each be a hydrogen atom or a deuterium atom. For example, $Ar_1$ may be represented by Ar1-8, and $R_{45}$ to $R_{47}$ may each be a hydrogen atom or a deuterium atom. For example, $Ar_1$ may be represented by Ar1-6 or Ar1-9, and $R_{44}$ and $R_{48}$ may each be an unsubstituted phenyl group.

In Formula 1, $Ar_2$ may be a group represented by Formula 2 below:

[Formula 2]

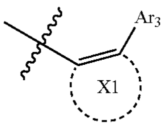

In Formula 2, ring X1 may be a substituted or unsubstituted aryl ring having 6 to 30 ring-forming carbon atoms, or a substituted or unsubstituted heteroaryl ring having 2 to 30 ring-forming carbon atoms. $Ar_3$ may be a substituted or unsubstituted aryl group having 6 to 30 ring-forming carbon atoms, or a substituted or unsubstituted heteroaryl group having 2 to 30 ring-forming carbon atoms, or may be bonded to ring X1 form a ring. For example, ring X1 and $Ar_3$ may each independently be a phenyl group, a biphenyl group, a naphthyl group, a carbazole group, or a dibenzofuran group. For example, ring X1 and $Ar_3$ may be bonded to form a three-cyclic ring group. For example, ring X1 and $Ar_3$ may be bonded to form a dibenzofuran group, a dibenzothiophene group, a carbazole group, or a fluorenyl group.

In an embodiment, $Ar_2$ may be a substituted phenyl group, a substituted naphthyl group, a substituted carbazole group, a substituted or unsubstituted fluorenyl group, a substituted or unsubstituted dibenzofuran group, or a substituted or unsubstituted dibenzothiophene group. For example, $Ar_2$ may be a phenyl group substituted with any one of a phenyl group, a naphthyl group, a dibenzofuran group, or a carbazole group. For example, $Ar_2$ may be a naphthyl group substituted with a dibenzofuran group, or a carbazole group substituted with a phenyl group. The carbazole group substituted with a phenyl group may be substituted with two or more phenyl groups. However, these are only illustrations, and embodiments are not limited thereto.

According to an embodiment, $Ar_2$ may be a group represented by any one of Ar2-1 to Ar2-6 below:

Ar2-1

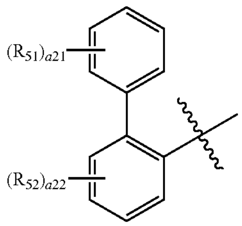

Ar2-2

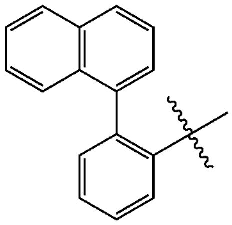

Ar2-3

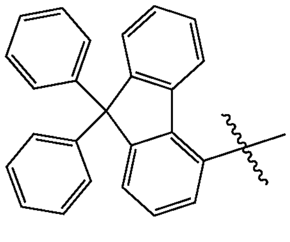

-continued

Ar2-4

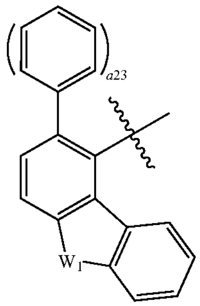

Ar2-5

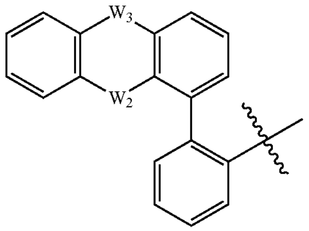

Ar2-6

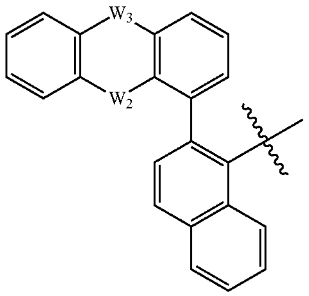

In Ar2-1, a21 may be an integer from 0 to 5, and a22 may be an integer from 0 to 4. $R_{51}$ and $R_{52}$ may each independently be a hydrogen atom, a deuterium atom, or an unsubstituted phenyl group. When a21 is 2 or more, multiple $R_{51}$ groups may be the same as each other or at least one thereof may be different from the others. When a22 is 2 or more, multiple $R_{52}$ groups may be the same as each other or at least one thereof may be different from the others.

In Ar2-4, a23 may be 0 or 1, and $W_1$ may be N(Ph), O or S. In the specification, Ph is a phenyl group. For example, Ar2-4 may be a dibenzofuran group substituted with a phenyl group, or may be an unsubstituted dibenzofuran group. For example, Ar2-4 may be a carbazole group substituted with a phenyl group, or maybe an unsubstituted dibenzothiophene group.

In Ar2-5 and Ar2-6, any one of $W_2$ or $W_3$ may be a direct linkage, and the other of $W_2$ and $W_3$ may be N(Ph), O, or S. For example, $W_2$ may be a direct linkage, and $W_3$ may be N(Ph), O or S. In another embodiment, $W_2$ may be N(Ph), O or S, and $W_3$ may be a direct linkage.

In Formula 1, $R_1$ to $R_7$ may each independently be a hydrogen atom, a deuterium atom, a substituted or unsubstituted silyl group, a substituted or unsubstituted amine group, a substituted or unsubstituted oxy group, a substituted or unsubstituted thio group, a substituted or unsubstituted alkyl group having 1 to 20 carbon atoms, a substituted or unsubstituted alkenyl group having 2 to 20 carbon atoms, a substituted or unsubstituted aryl group having 6 to 20 ring-forming carbon atoms, or a substituted or unsubstituted heteroaryl group having 2 to 20 ring-forming carbon atoms, or may be bonded to an adjacent group to form a ring. In an embodiment, at least one of $R_1$ to $R_7$ may be a deuterium atom.

According to an embodiment, the nitrogen-containing compound represented by Formula 1 may be bilaterally symmetrical with respect to the nitrogen atom (N) in Formula 1. In an embodiment, $Ar_2$ and $R_3$ may be the same. For example, $Ar_2$ and $R_3$ may both be a biphenyl group, a terphenyl group, a substituted carbazole group, a substituted or unsubstituted fluorenyl group, a substituted or unsubstituted dibenzofuran group, or a substituted or unsubstituted dibenzothiophene group. However, these are only illustrations, and embodiments are not limited thereto.

For example, $R_1$ and $R_2$ may be bonded, and the hydrocarbon ring formed by $R_1$ and $R_2$ may form a condensed ring with a benzene ring to which $R_1$ to $R_4$ are bonded. For example, $R_6$ and $R_7$ may be bonded, and the hydrocarbon ring formed by $R_6$ and $R_7$ may form a condensed ring with a benzene ring to which $R_5$ to $R_7$ are bonded. For example, $R_1$, $R_2$, $R_6$, and $R_7$ may each be an unsubstituted phenyl group. However, these are only illustrations, and embodiments are not limited thereto.

In Formula 1, $Q_1$ may be O, S, SO, $SO_2$, Se, CO, $C(R_{11})(R_{12})$, $B(R_{13})$, $N(R_{14})$, $P(R_{15})$, $PO(R_{16})$, $PS(R_{17})$, or may be a group represented by Formula 3 below. In Formula 1, $R_{11}$ and $R_{12}$ may each independently be a substituted or unsubstituted alkyl group having 1 to 20 carbon atoms, or a substituted or unsubstituted aryl group having 6 to 20 ring-forming carbon atoms, or may be bonded to an adjacent group to form a ring. For example, Rn and $R_{12}$ may each be an alkyl group, and the alkyl group of $R_1$ and the alkyl group of $R_{12}$ may be bonded to form a cyclic alkyl group.

In Formula 1, $R_{13}$ to $R_{17}$ may each independently be a substituted or unsubstituted aryl group having 6 to 30 ring-forming carbon atoms. For example, $Q_1$ may be $B(R_{11})$, and $R_{11}$ may be a substituted or unsubstituted phenyl group. For example, $Q_1$ may be $N(R_{12})$, and $R_{12}$ may be a substituted or unsubstituted phenyl group.

[Formula 3]

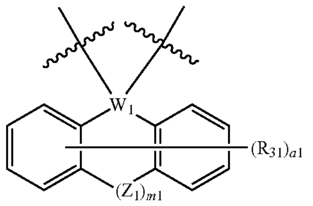

In Formula 3, $W_1$ may be C, Si, or Ge. In Formula 3, m1 may be 0 or 1, and $Z_1$ may be a direct linkage, $C(R_{32})(R_{33})$, $N(R_{34})$, O, or S. When m1 is 0, Formula 3 may be group containing two substituted or unsubstituted phenyl groups which are bonded to C, Si, or Ge. For example, when m1 is 0, Formula 3 may be diphenylmethane, diphenylsilane, or diphenyl germanium.

In Formula 3, a1 may be an integer from 0 to 8. When a1 is 2 or more, multiple $R_{3}1$ groups may be the same as each other or at least one thereof may be different from the others. In Formula 3, $R_{31}$ to $R_{34}$ may each independently be a hydrogen atom, a deuterium atom, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. For example, $Z_1$ may be $C(R_{32})(R_{33})$, and $R_{32}$ and $R_{33}$ may be bonded to each other to form a ring.

According to an embodiment, when $R_3$ is a hydrogen atom, $Ar_1$ may be a substituted or unsubstituted fluorenyl group, a substituted or unsubstituted carbazole group, a substituted or unsubstituted dibenzofuran group, a substituted or unsubstituted dibenzothiophene group, or a substituted or unsubstituted dibenzosilole group. According to an embodiment, when $Ar_1$ is a substituted or unsubstituted aryl group, and when $Ar_2$ and $R_3$ are each a substituted or unsubstituted biphenyl group, $Q_1$ may be a group represented by Formula 3, and $Z_1$ may be a direct linkage or $N(R_{34})$. For example, when $Ar_1$ is an unsubstituted phenyl group, and $Ar_2$ and $R_3$ are each a biphenyl group, $Q_1$ may be a group represented by Formula 3 and $Z_1$ may be a direct linkage. In an embodiment, when $Ar_1$ is an unsubstituted phenyl group and $Ar_2$ and $R_3$ are each a biphenyl groups, $Q_1$ may be a group represented by Formula 3 and $Z_1$ may be $N(R_{34})$.

In an embodiment, the nitrogen-containing compound represented by Formula 1 may be represented by any one of Formula 1-1 to Formula 1-3 below. Formula 1-1 to Formula 1-3 each represent a case where $Q_1$ in Formula 1 is a group represented by Formula 3. Formula 1-1 represents the case where $W_1$ in Formula 3 is C. Formula 1-2 represents the case where $W_1$ in Formula 3 is Ge. Formula 1-3 represents the case where $W_1$ in Formula 3 is Si.

[Formula 1-1]

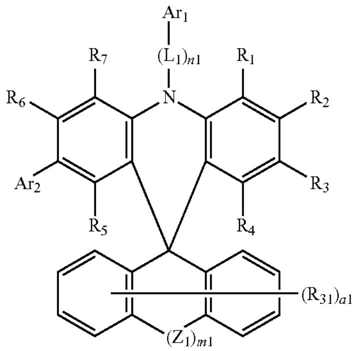

[Formula 1-2]

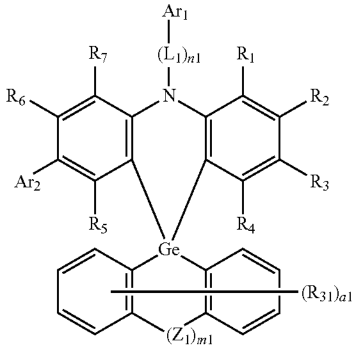

-continued

[Formula 1-3]

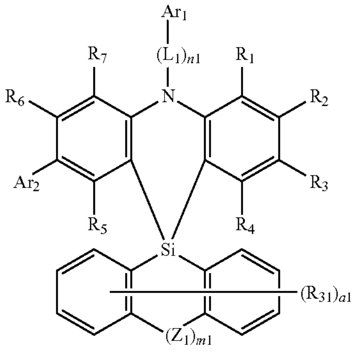

In Formula 1-1 to Formula 1-3, $Ar_1$, $Ar_2$, $L_1$, n1, $R_1$ to $R_7$, a1, $R_{31}$, m1, and $Z_1$ may be the same as defined in connection with Formula 1.

For example, in Formula 1-2 and Formula 1-3, m1 may be 0. For example, in Formula 1-2 and Formula 1-3, m1 may be 1 and $Z_1$ may be $N(R_{34})$. For example, $R_{34}$ may be an unsubstituted phenyl group or an unsubstituted dibenzofuran group.

In an embodiment, the nitrogen-containing compound represented by Formula 1-1 may be represented by any one of Formula 1-1A to Formula 1-1E below. Formula 1-1A represents the case where $Z_1$ in Formula 3 is a direct linkage. Formula 1-1B represents the case where $Z_1$ in Formula 3 is $C(R_{32})(R_{33})$. Formula 1-1C represents the case where $Z_1$ in Formula 3 is $N(R_{34})$. Formula 1-1D represents the case where $Z_1$ in Formula 3 is O. Formula 1-1E represents the case where $Z_1$ in Formula 3 is S.

[Formula 1-1A]

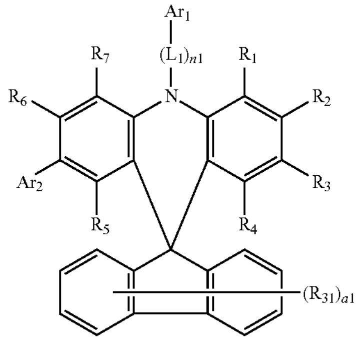

[Formula 1-1B]

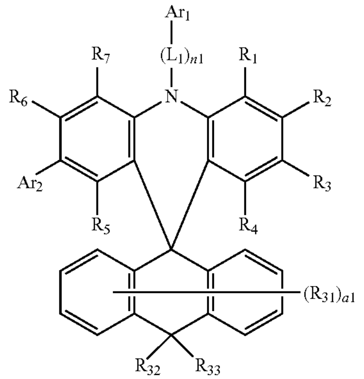

-continued

[Formula 1-1C]

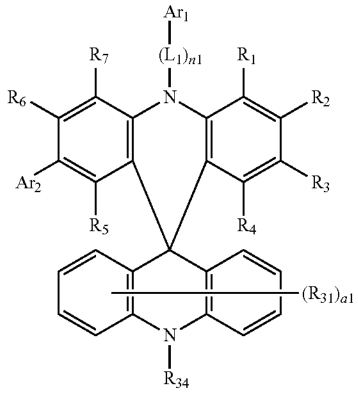

[Formula 1-1D]

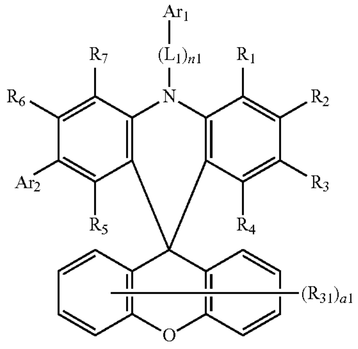

[Formula 1-1E]

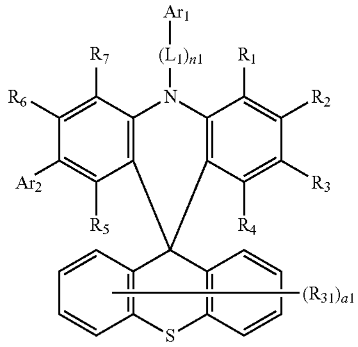

In Formula 1-1A to Formula 1-1E, $Ar_1$, $Ar_2$, $L_1$, n1, $R_1$ to $R_7$, a1, and $R_{31}$ to $R_{34}$ may be the same as defined in connection with Formula 1.

For example, in Formula 1-1B, $R_{32}$ and $R_{33}$ may each be a phenyl group. For example, in Formula 1-1B, $R_{32}$ and $R_{33}$ may be bonded to each other to form a ring. For example, in Formula 1-1C, $R_{31}$ and $R_{34}$ may each independently be a hydrogen atom, a substituted or unsubstituted phenyl group, or a substituted or unsubstituted dibenzofuran group. For example, in Formula 1-1D and Formula 1-1E, $Ar_1$ may be a substituted or unsubstituted dibenzofuran group, a substituted or unsubstituted dibenzothiophene group, or a substituted or unsubstituted dibenzosilole group.

The nitrogen-containing compound represented by Formula 1 of an embodiment may be any one selected from Compound Group 1 below. The hole transport region HTR of the light emitting element ED of an embodiment may include at least one of the nitrogen-containing compounds disclosed in Compound Group 1 below:

[Compound Group 1]
1
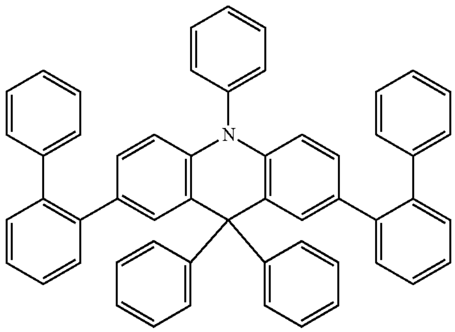
2
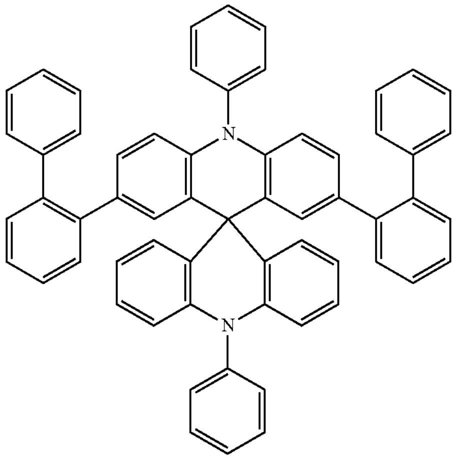
3
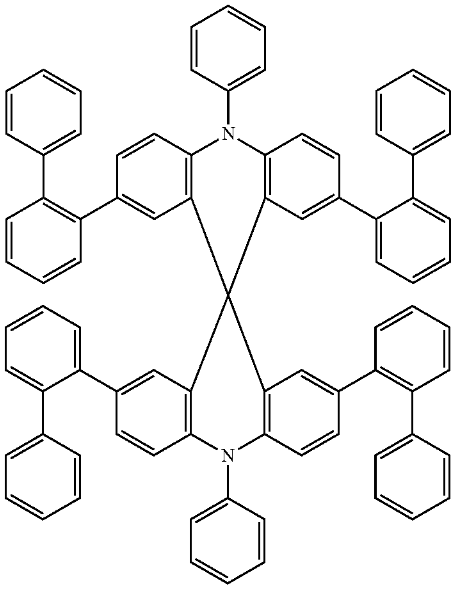
-continued
4
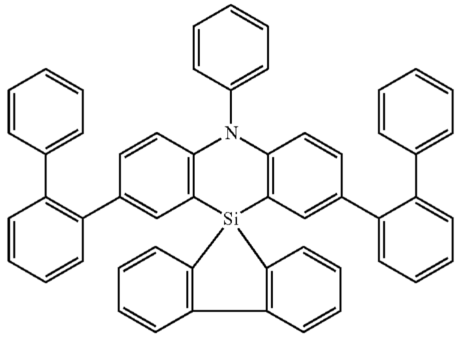
5
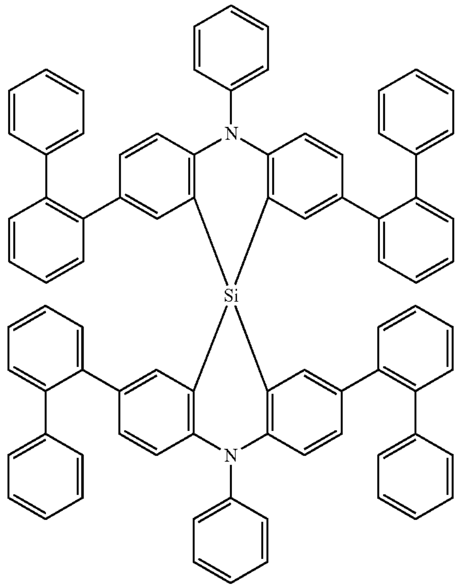
4
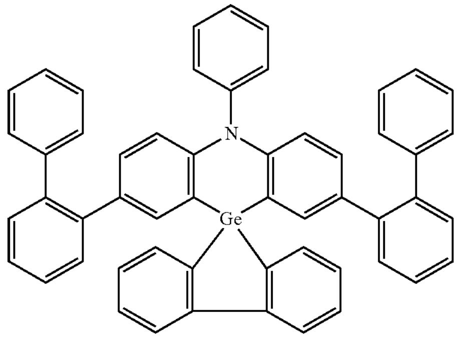

-continued
7
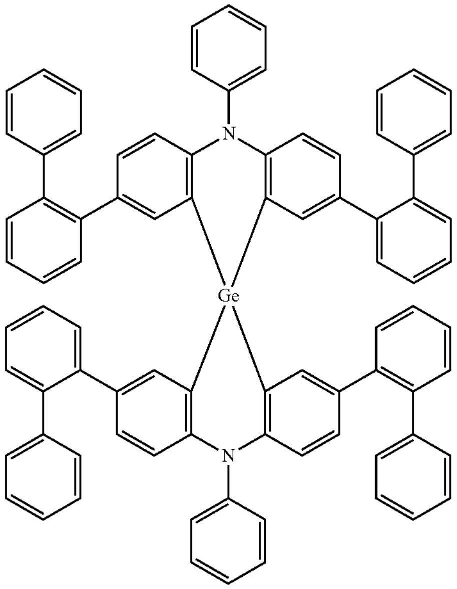
8
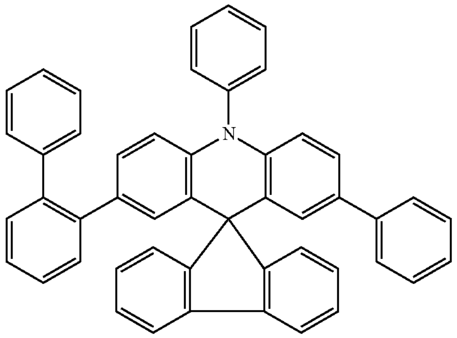
9
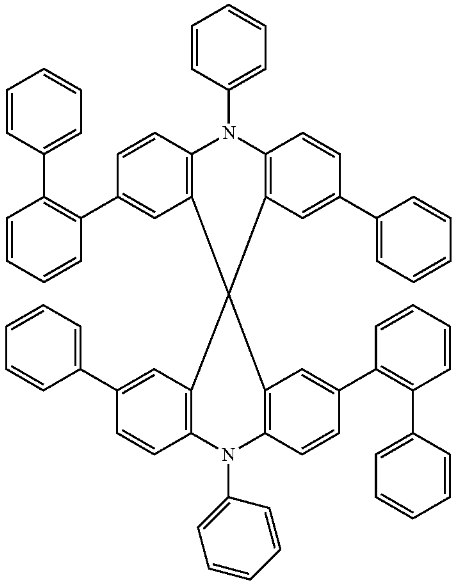
-continued
10
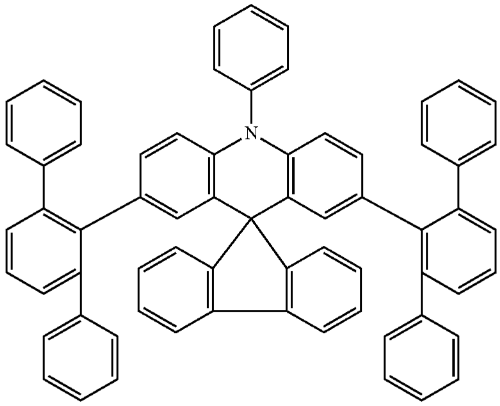
11
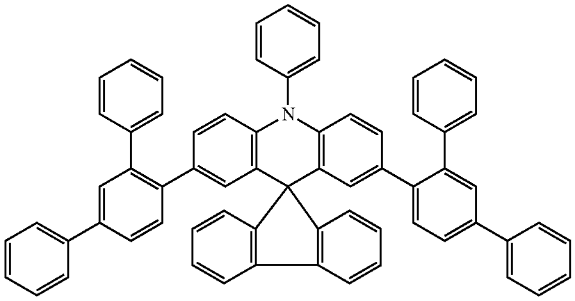
12
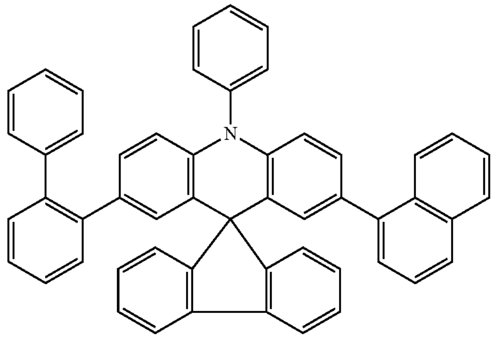
13
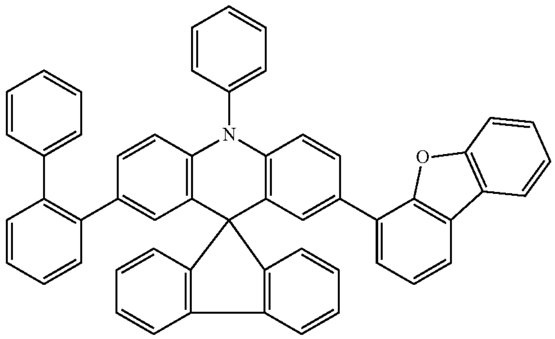

-continued
14
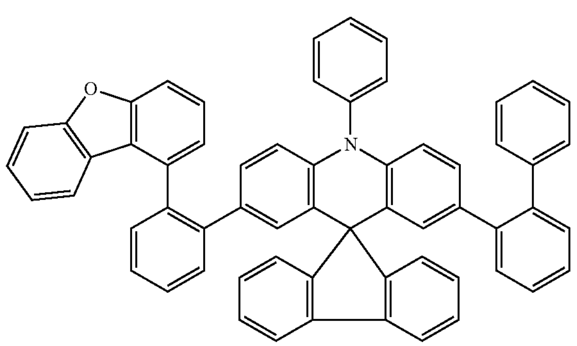
15
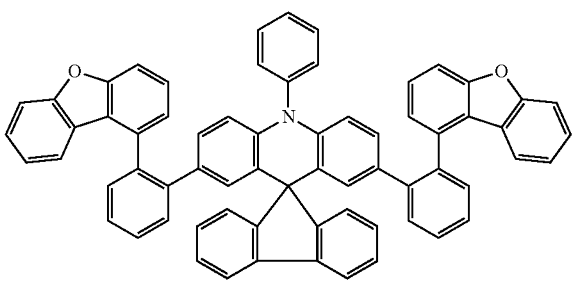
16
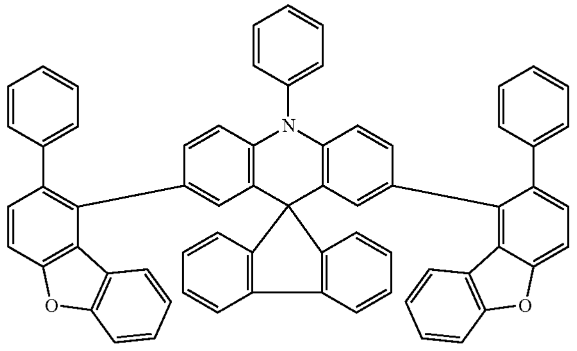
17
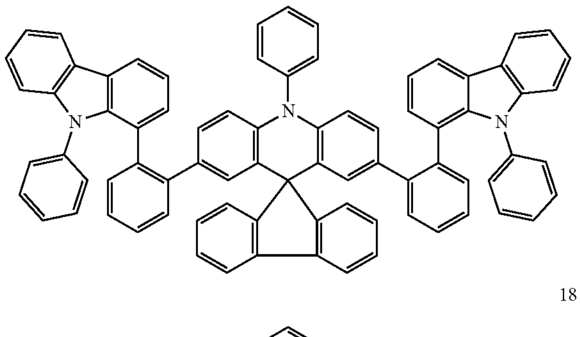
18
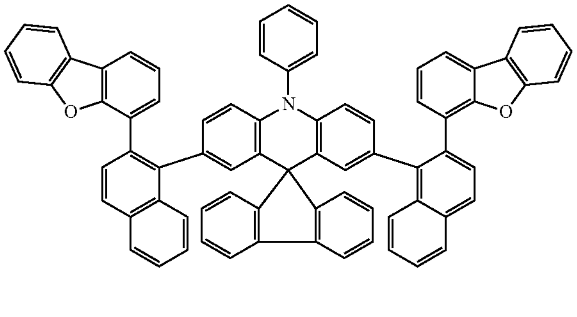
-continued
19
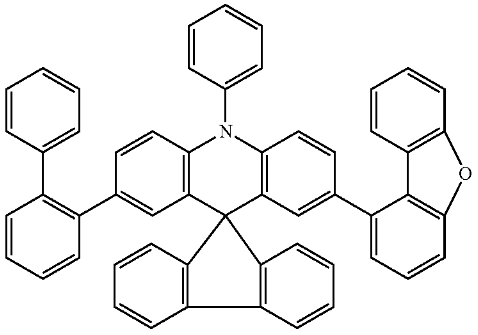
20
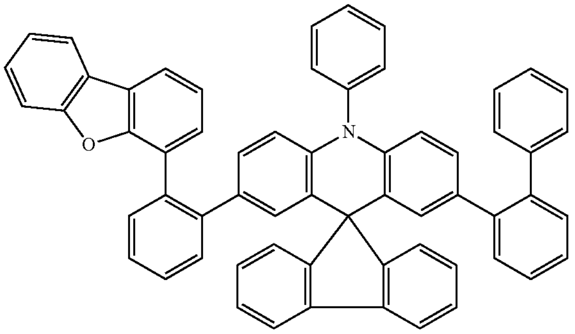
21
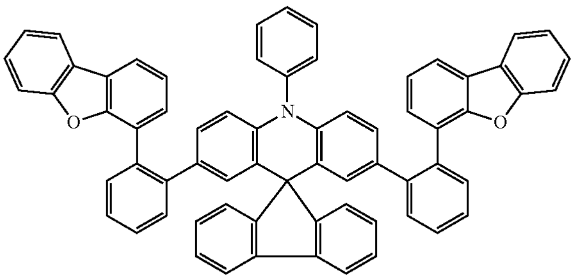
22
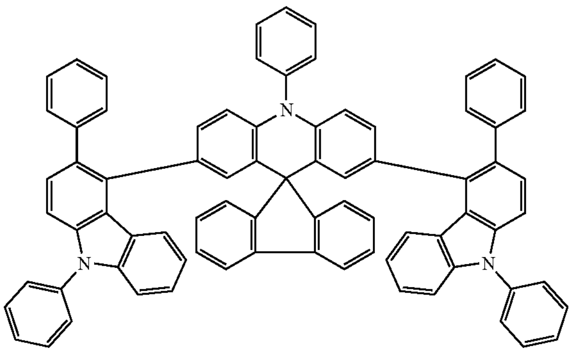

-continued
23
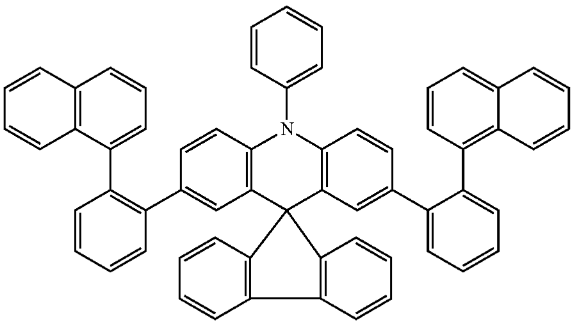
24
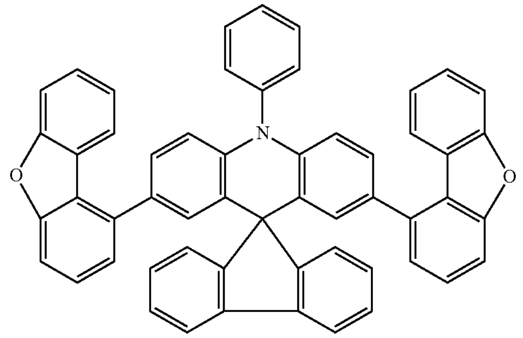
25
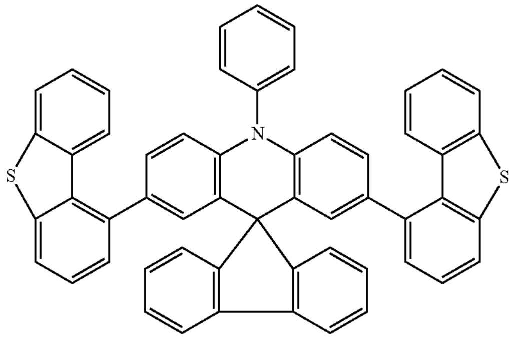
26
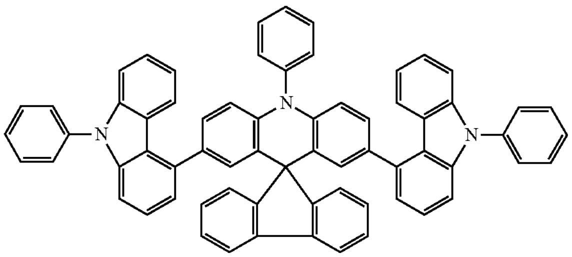
27
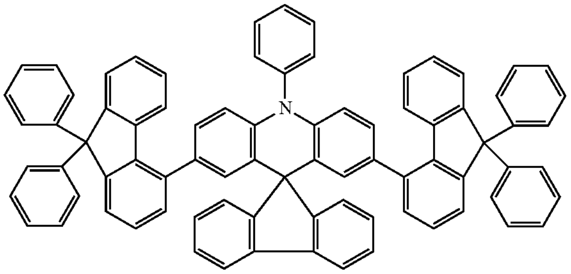
-continued
28
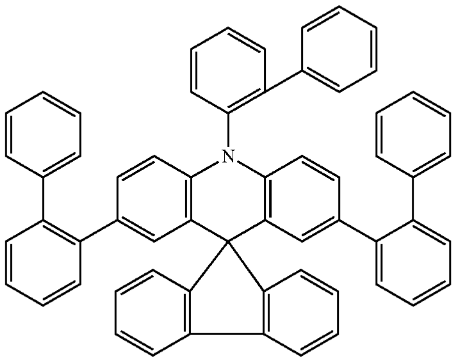
29
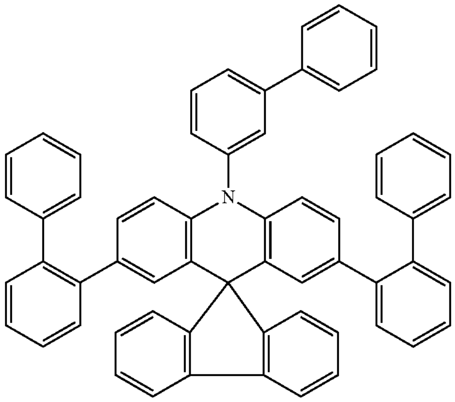
30
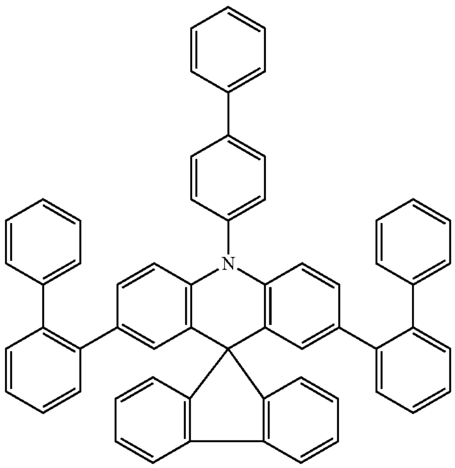
31
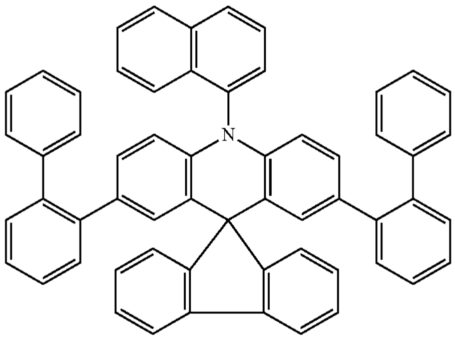

-continued
32
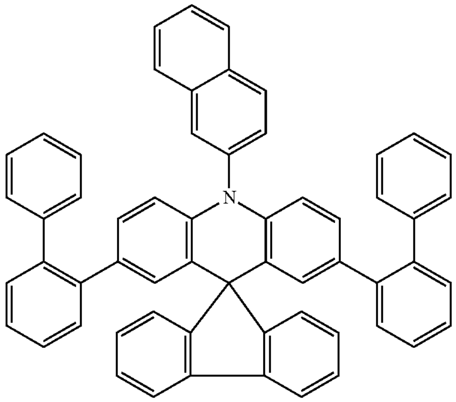
33
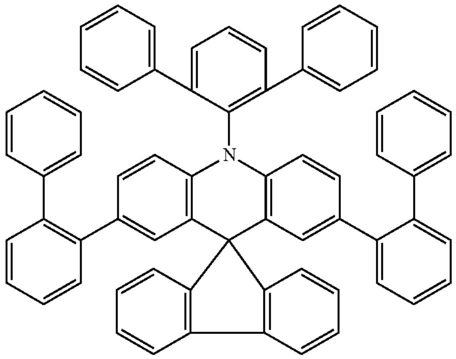
34
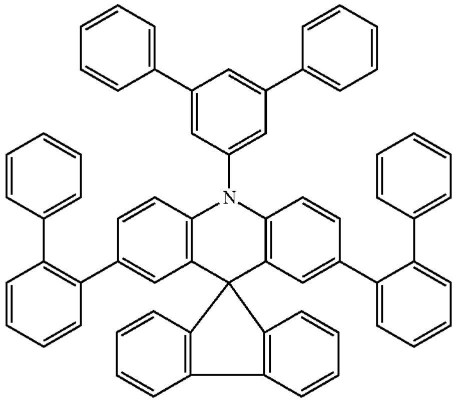
35
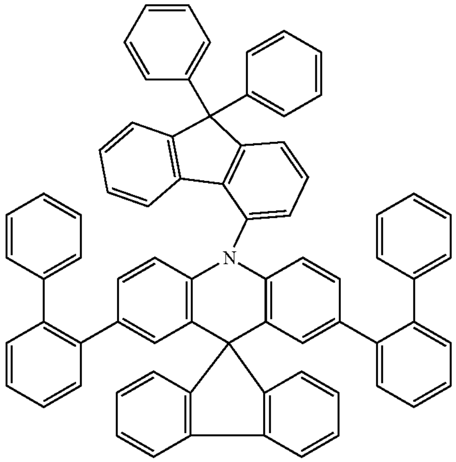
-continued
36
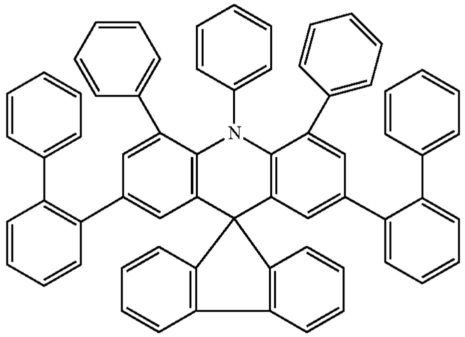
37
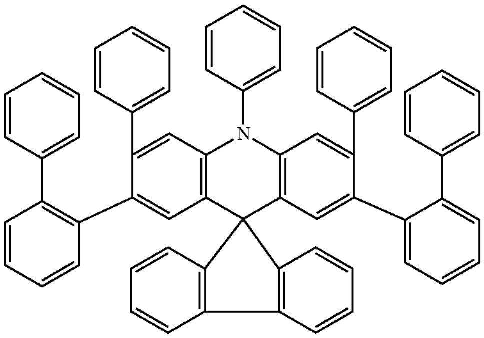
38
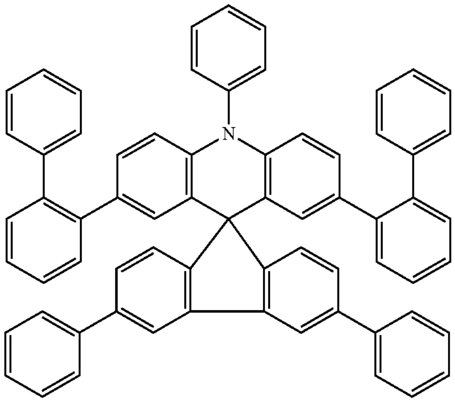
39
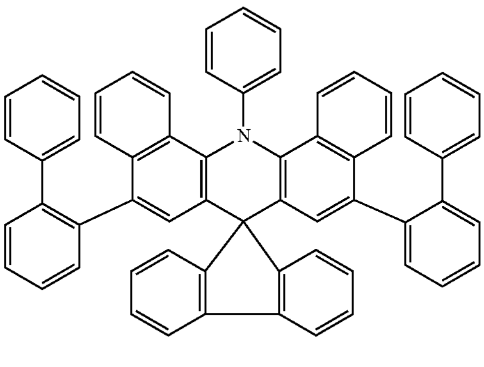

-continued
40
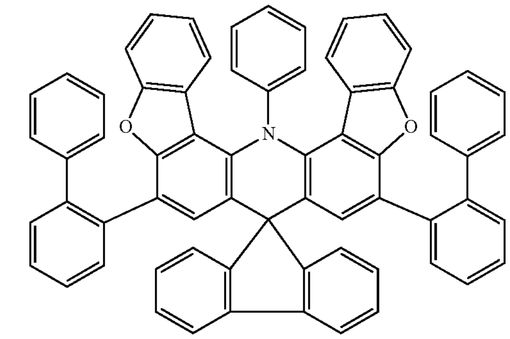
41
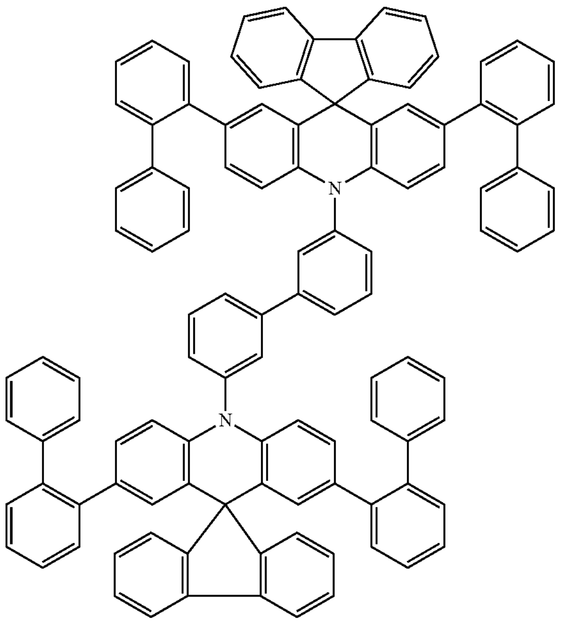
42
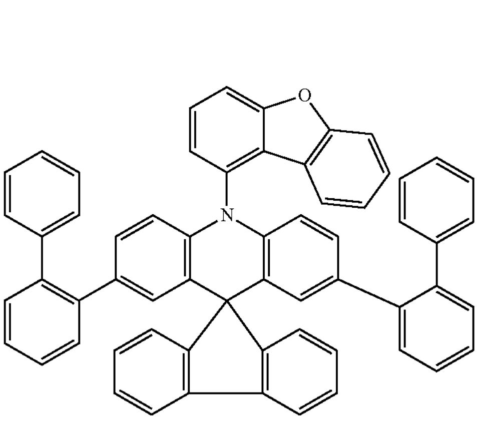
-continued
43
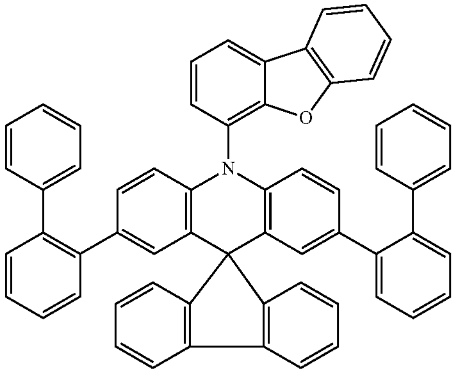
44
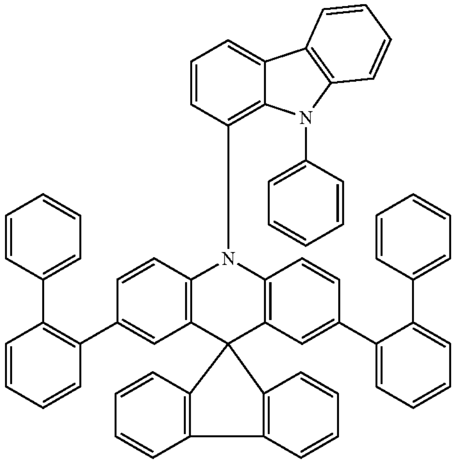
45
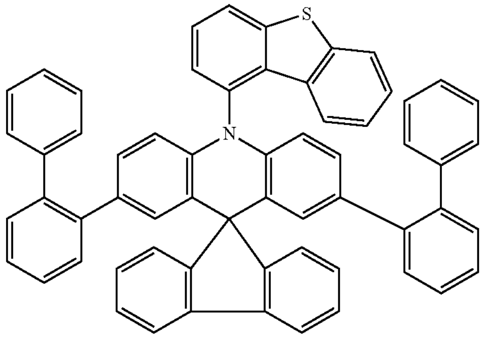
46
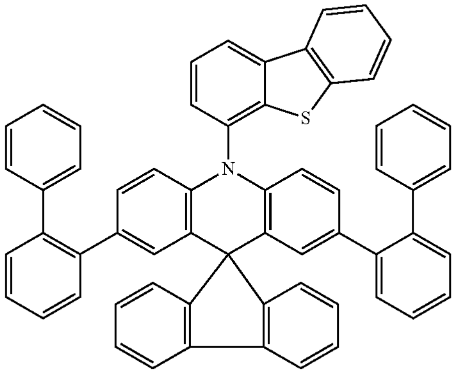

-continued
47
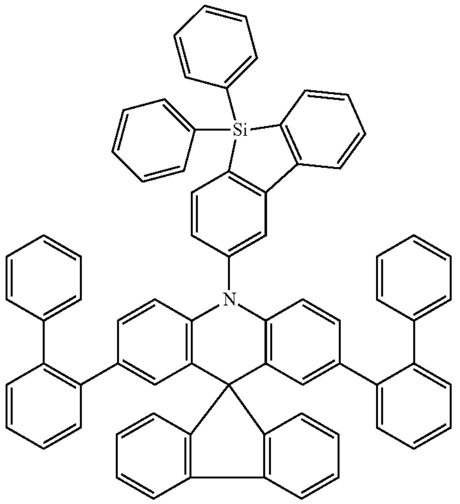
48
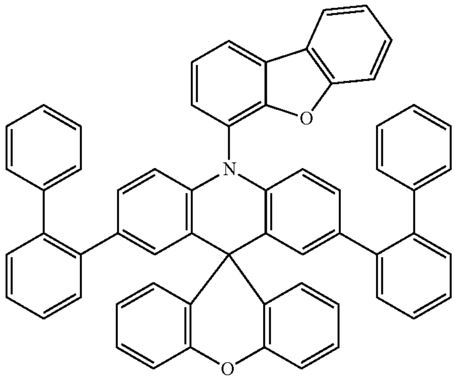
49
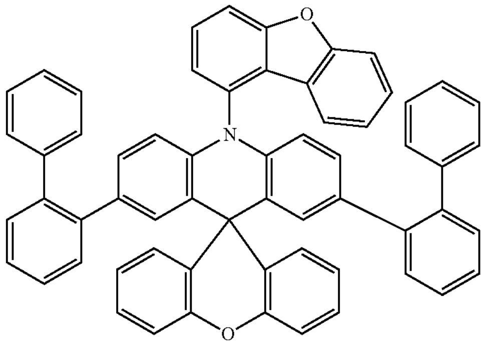
50
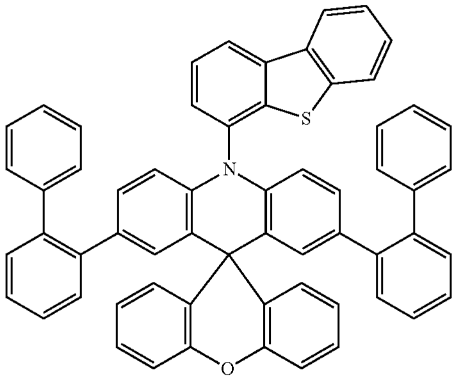
-continued
51
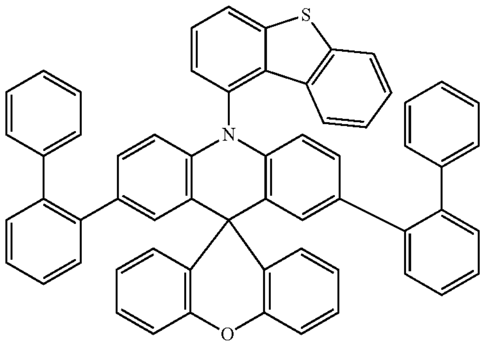
52
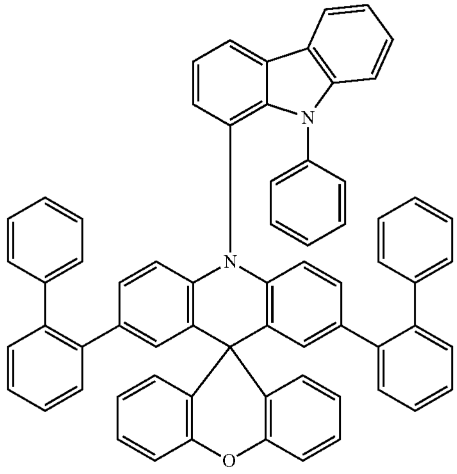
53
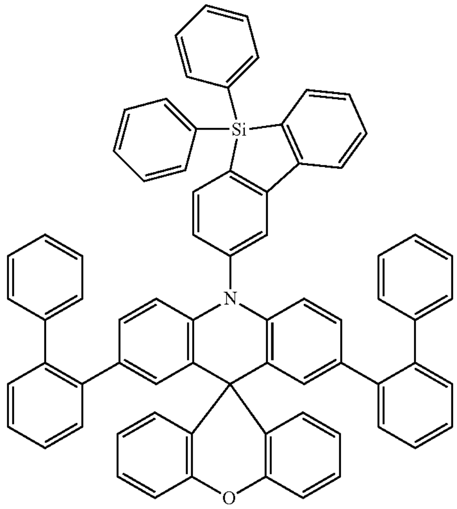

-continued
54
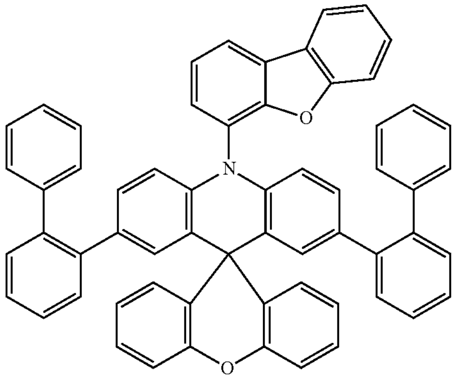
55
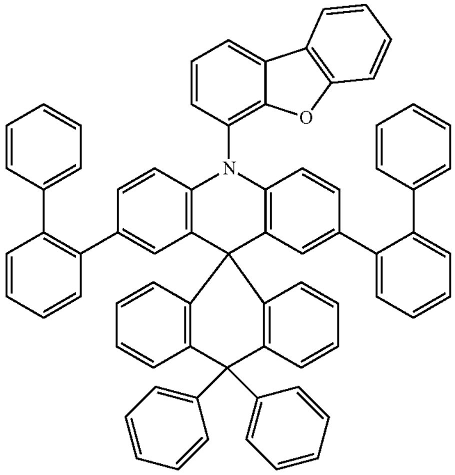
56
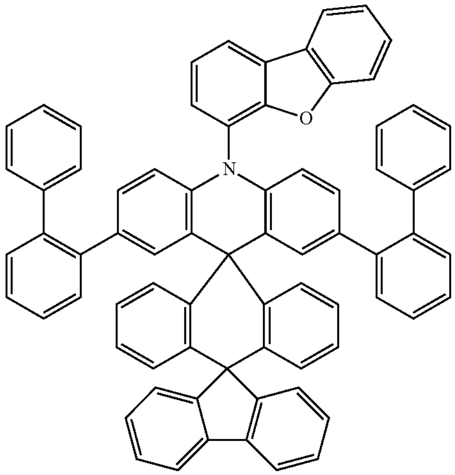
-continued
57
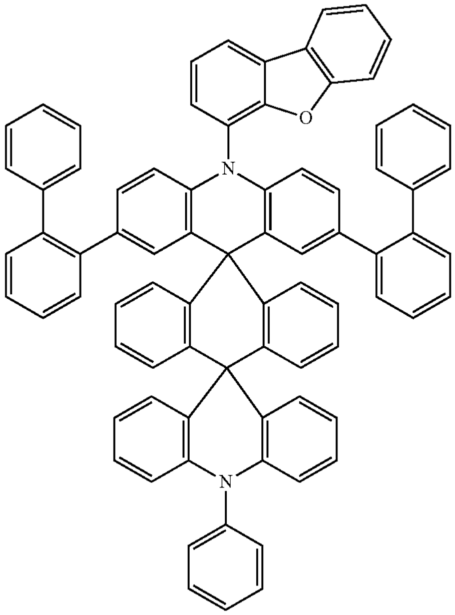
58
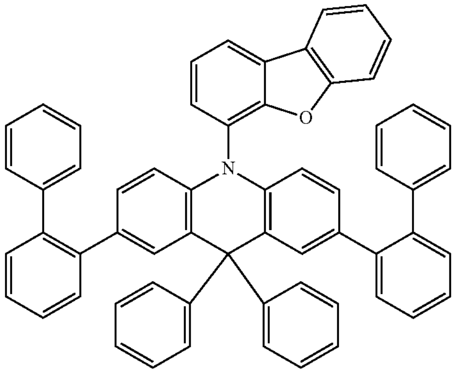
59
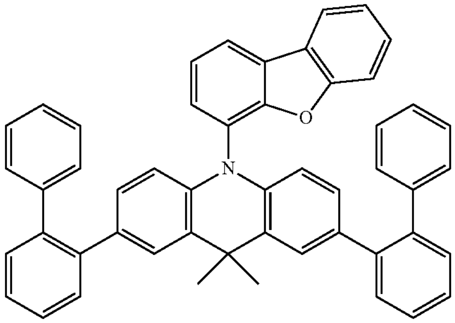

-continued
60
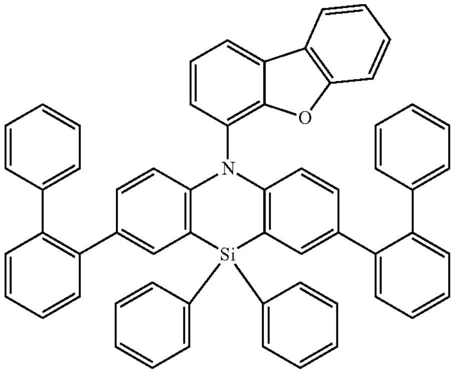
61
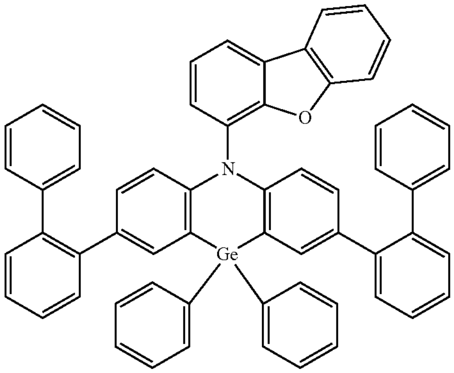
62
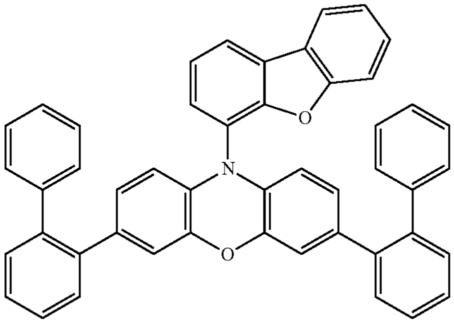
63
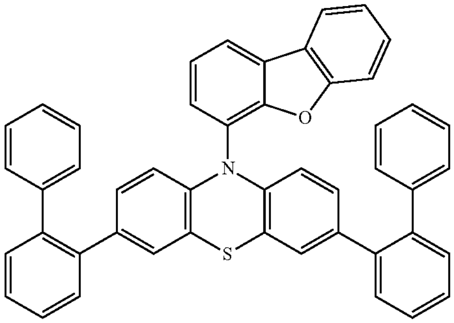
-continued
64
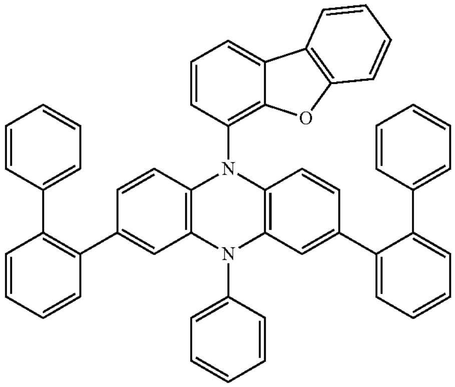
65
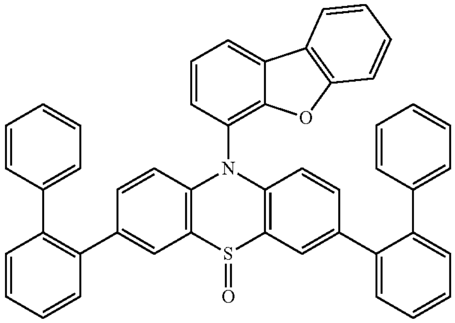
66
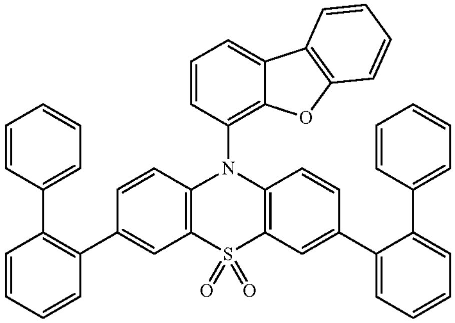
67
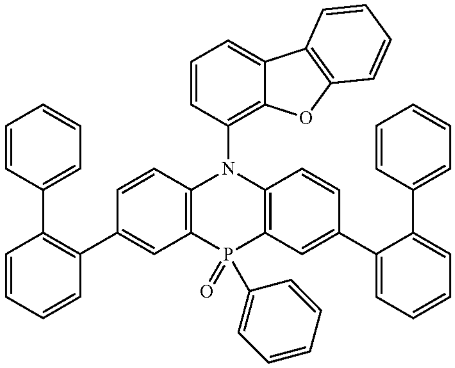

-continued
68
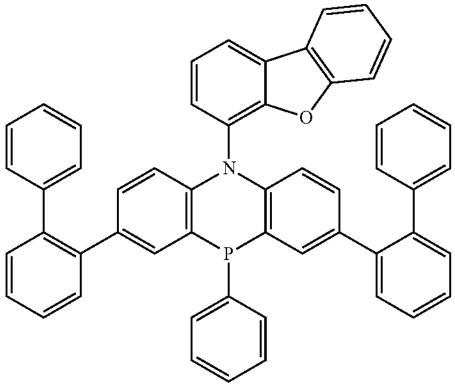
69
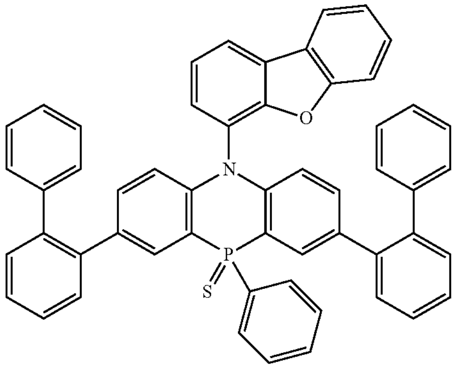
70
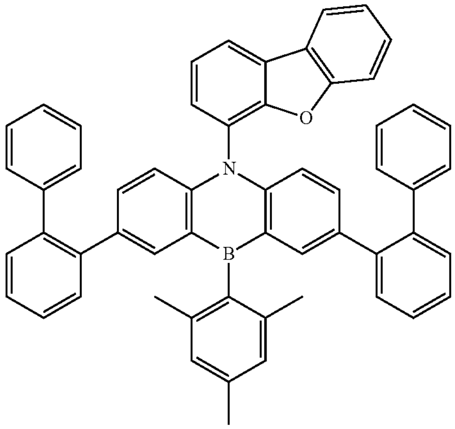
71
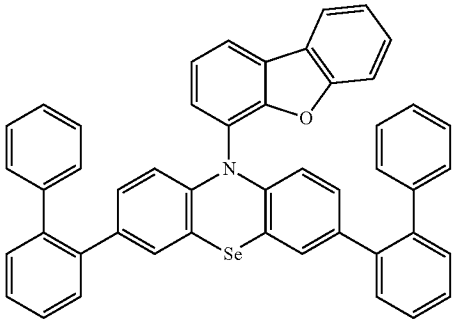
-continued
72
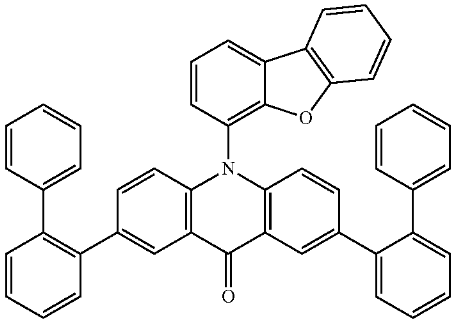
73
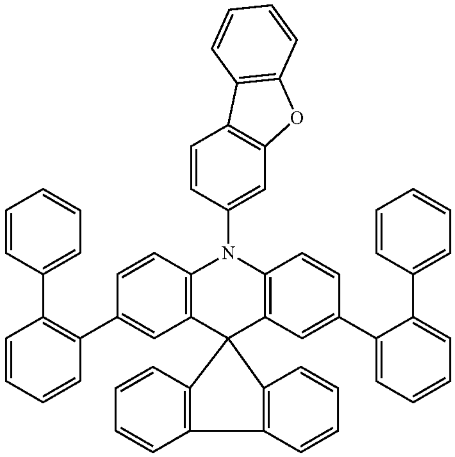
74
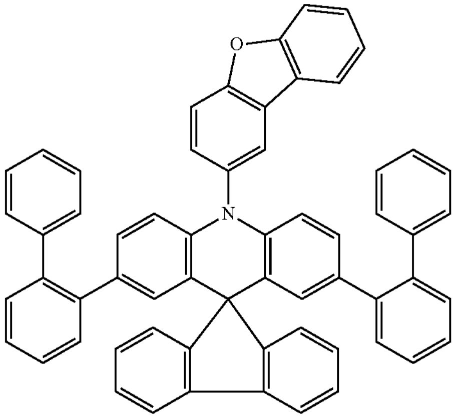

-continued
75
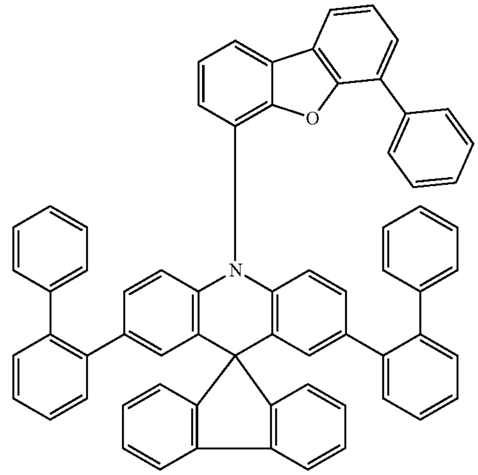
76
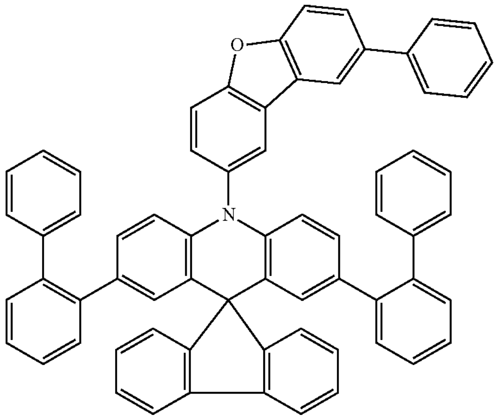
77
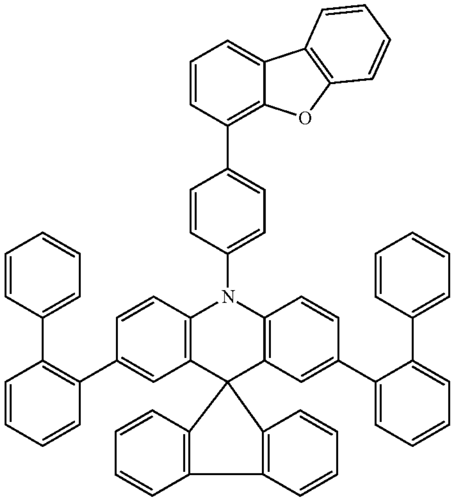
-continued
78
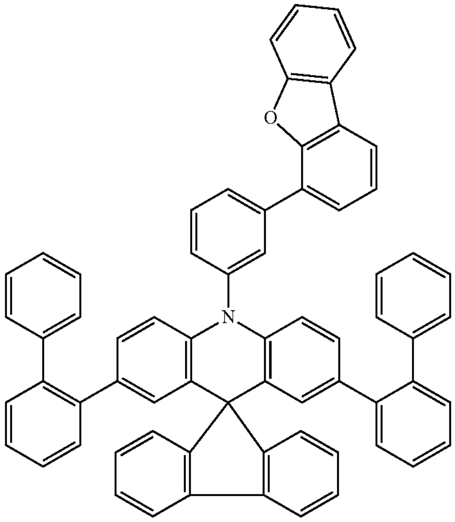
79
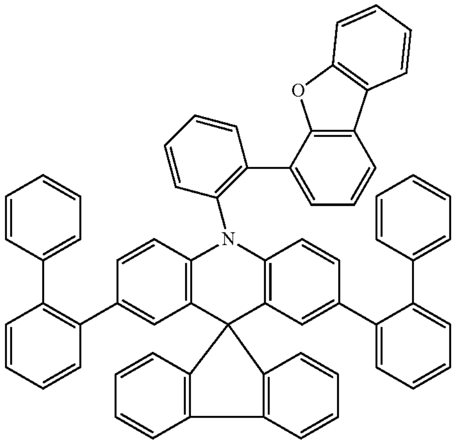
80
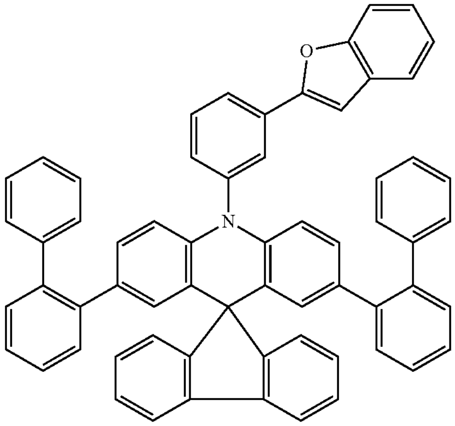

-continued
81
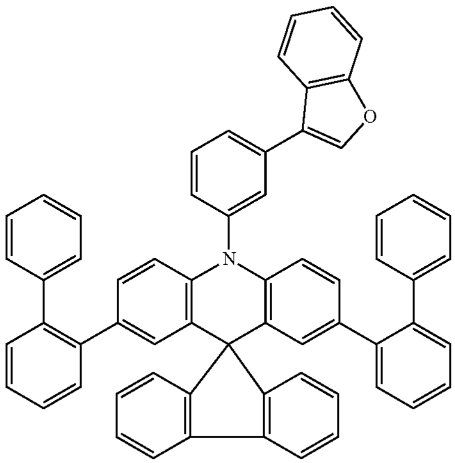
82
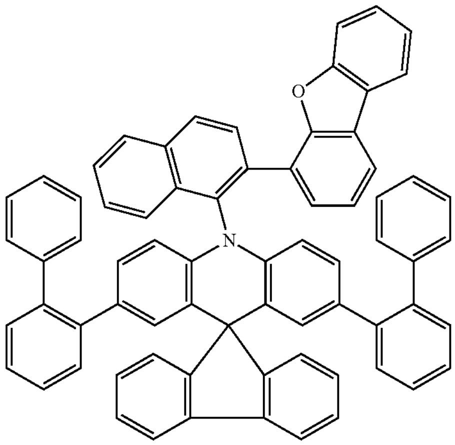
83
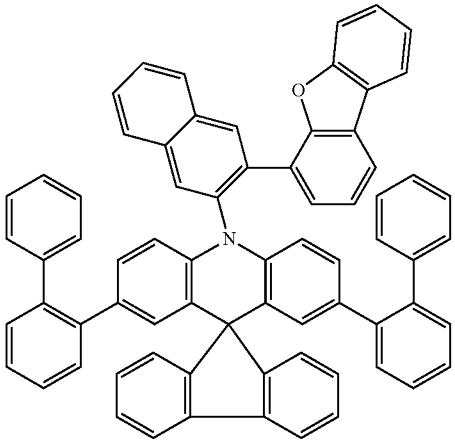
-continued
84
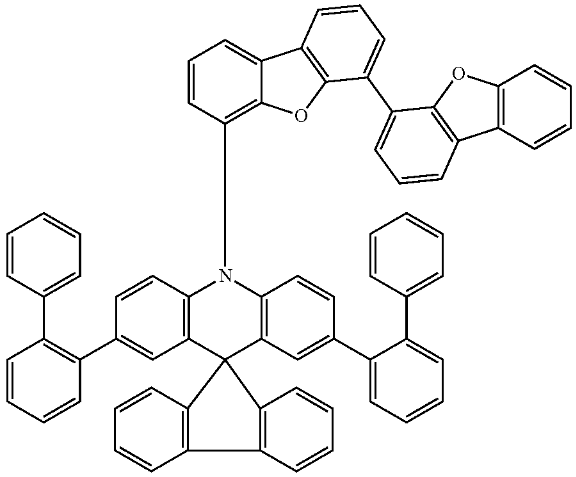
85
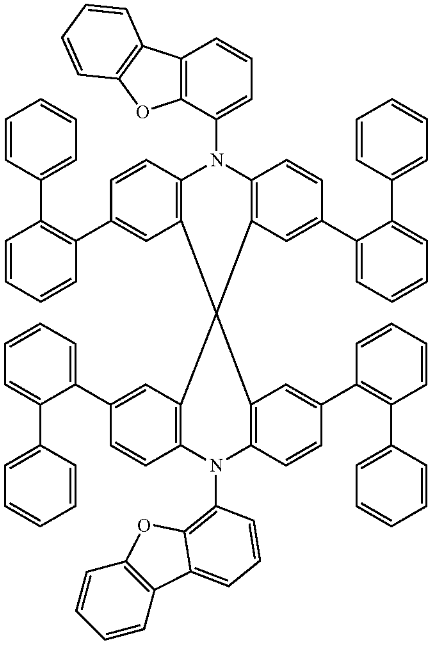

-continued
86
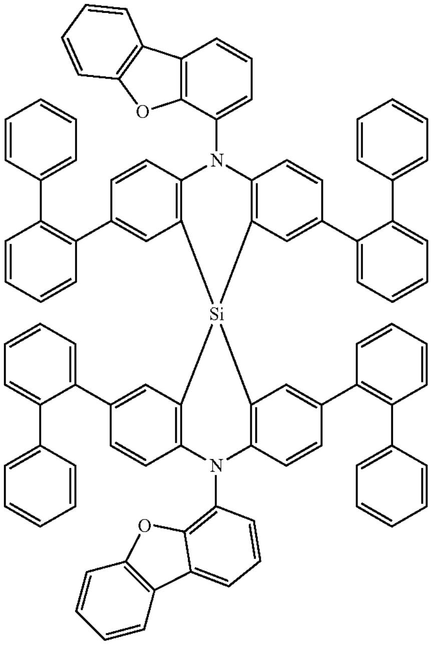
87
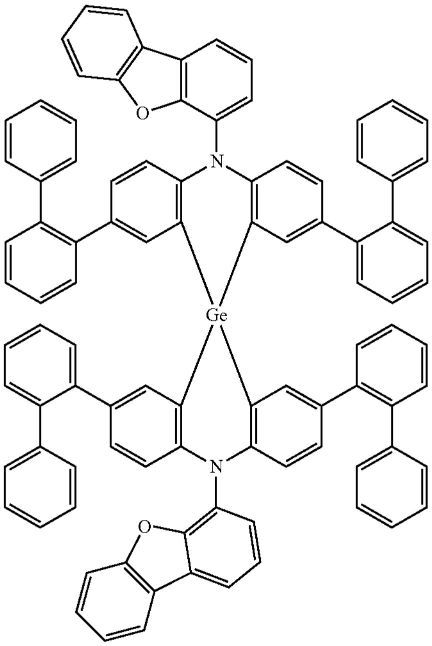
88
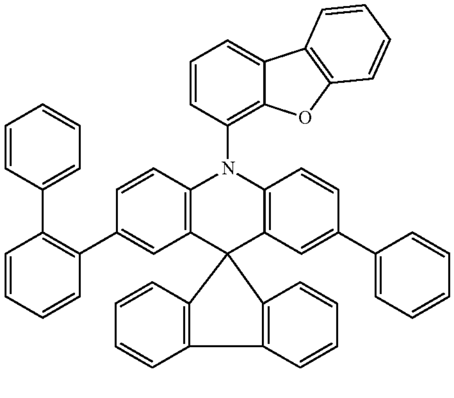
-continued
89
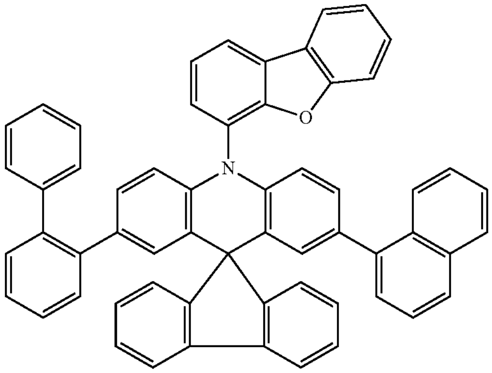
90
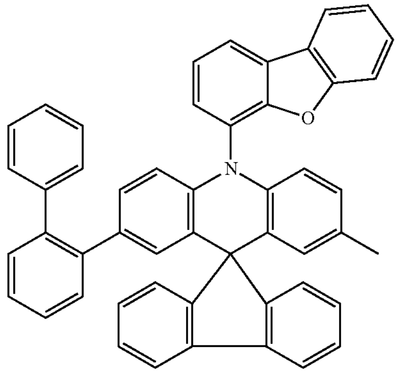
91
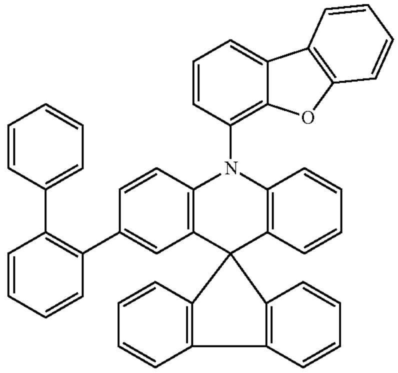
92
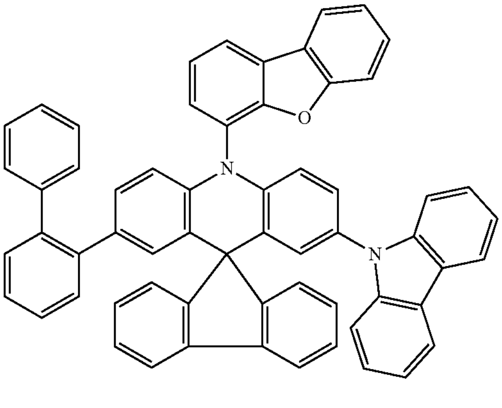

-continued
93
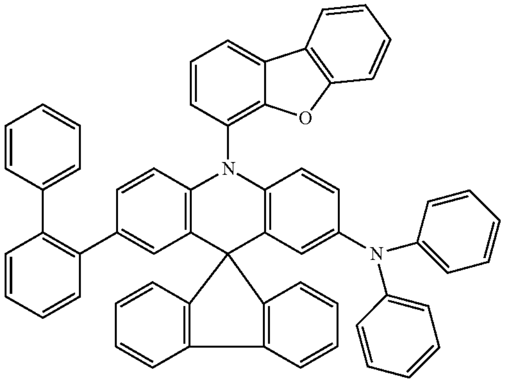
94
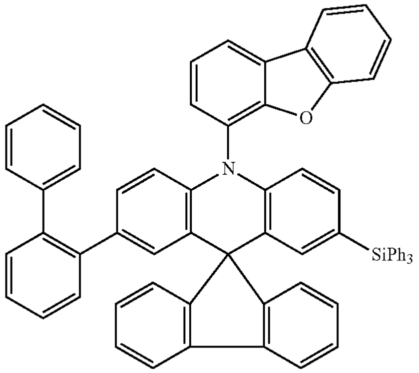
95
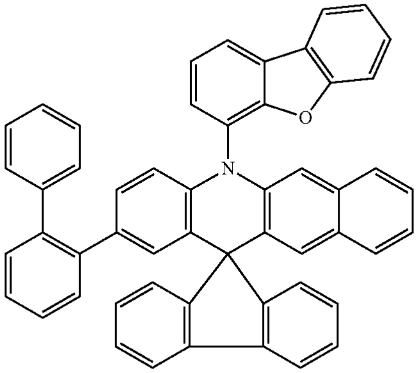
96
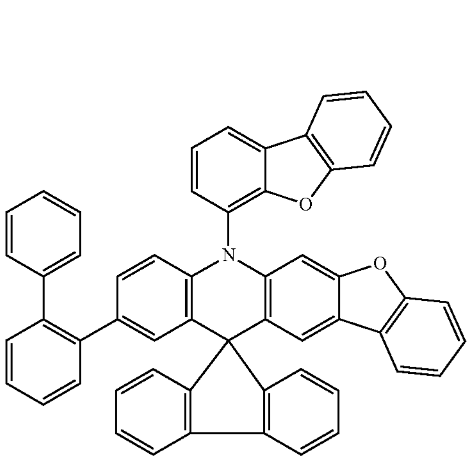
-continued
97
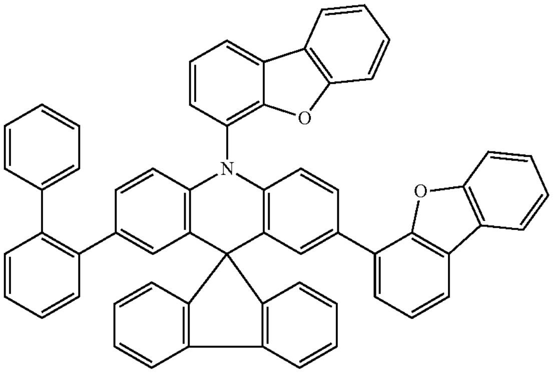
98
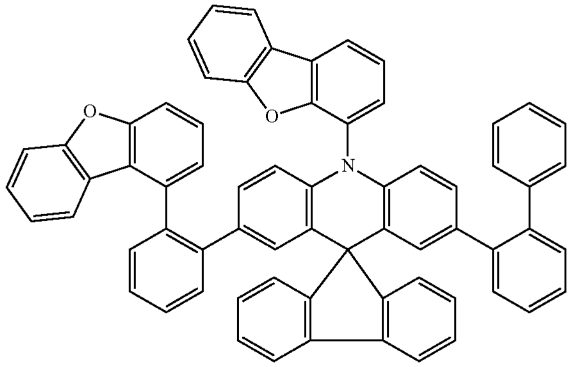
99
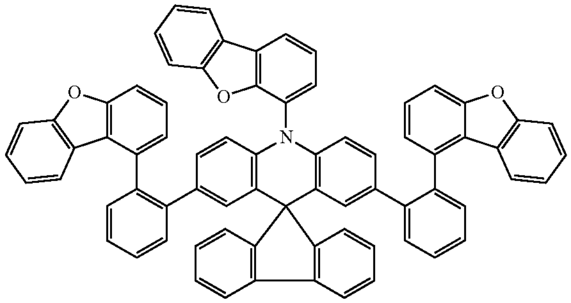
100
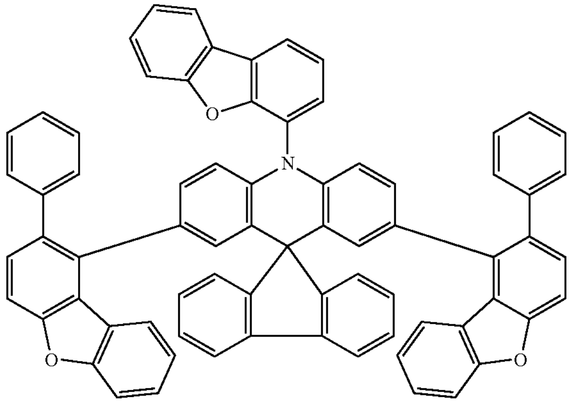

-continued
101
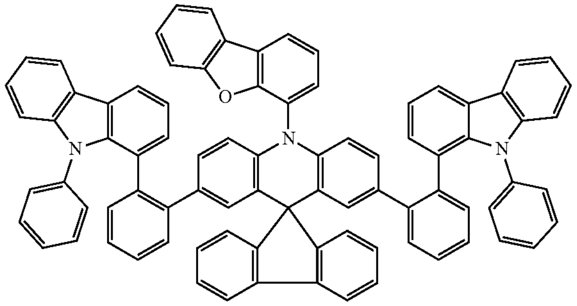
102
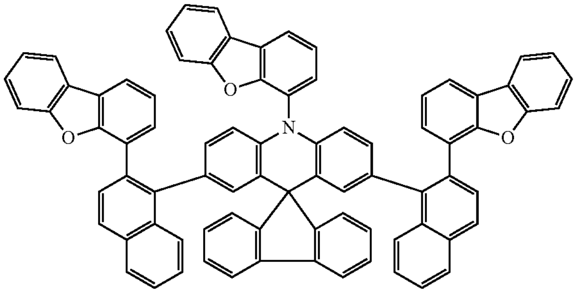
103
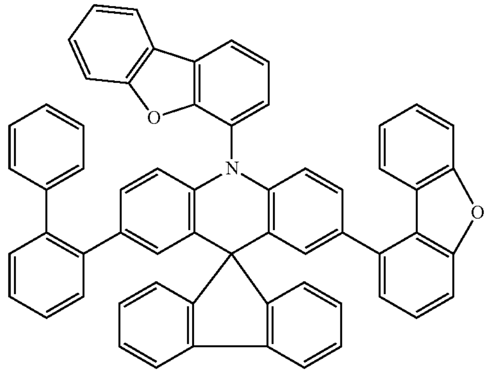
104
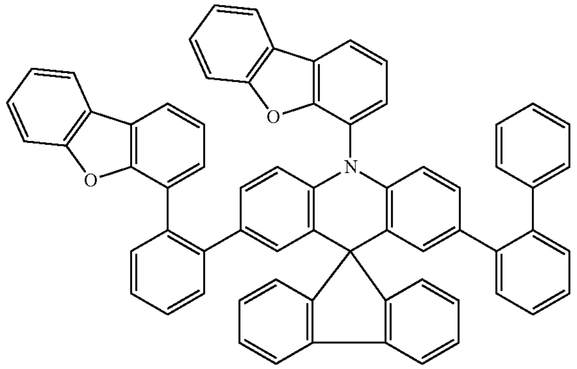
-continued
105
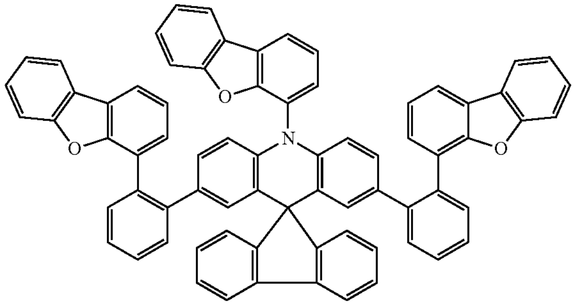
106
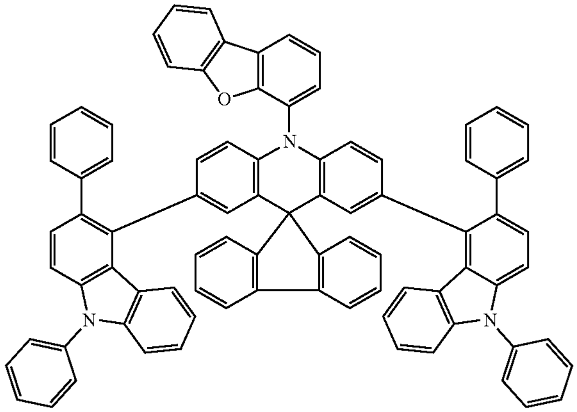
107
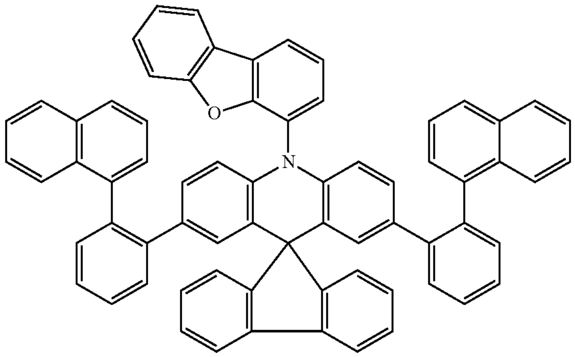
108
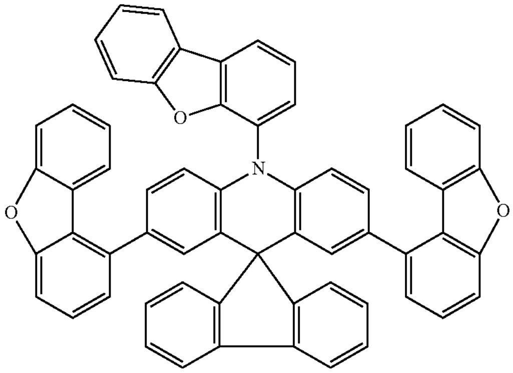

-continued
109
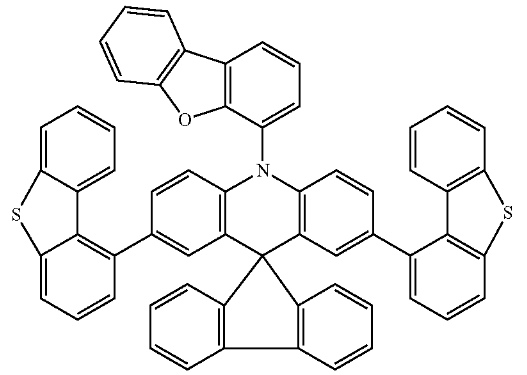
110
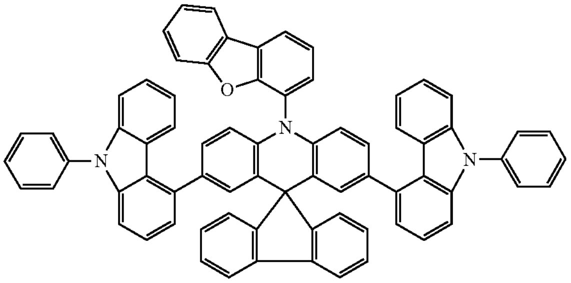
111
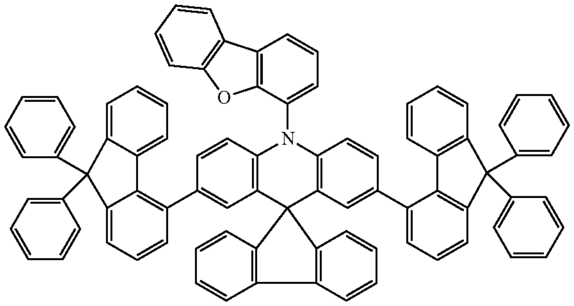
112
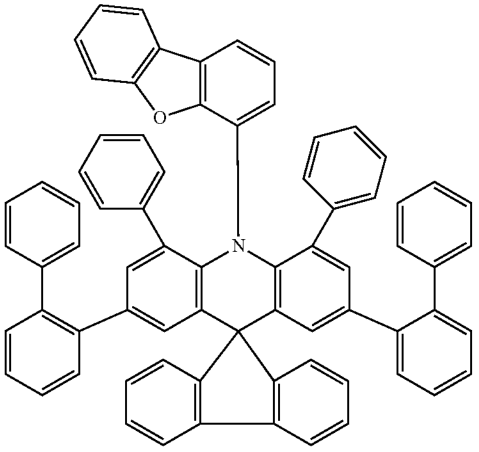
-continued
113
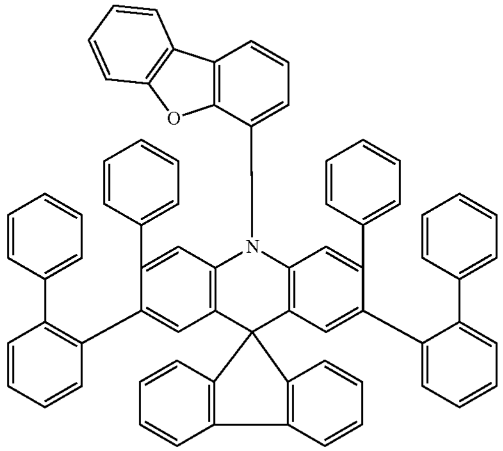
114
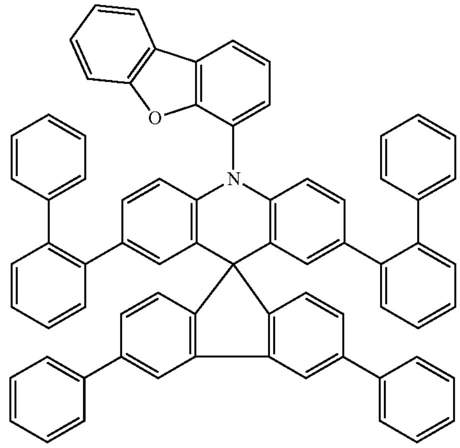
115
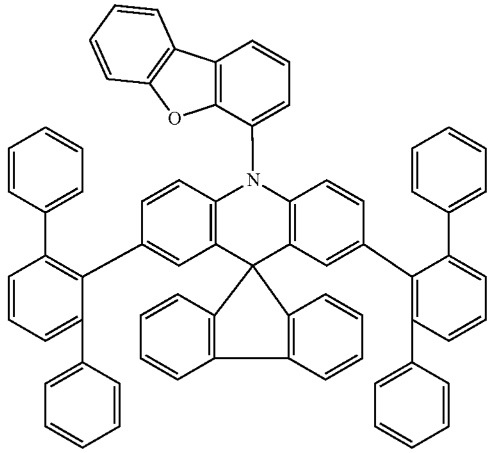

-continued
116
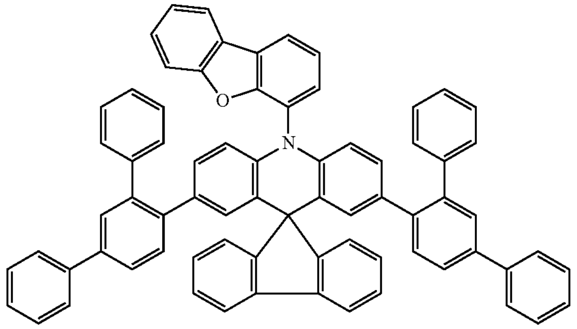
117
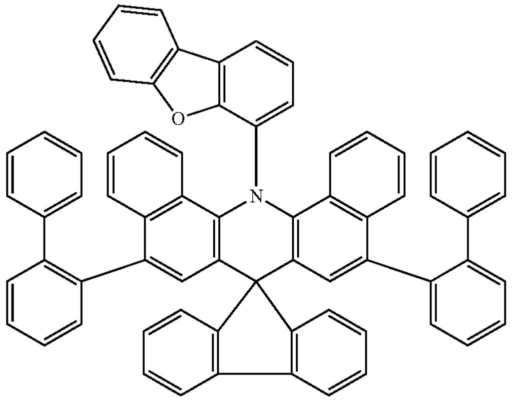
118
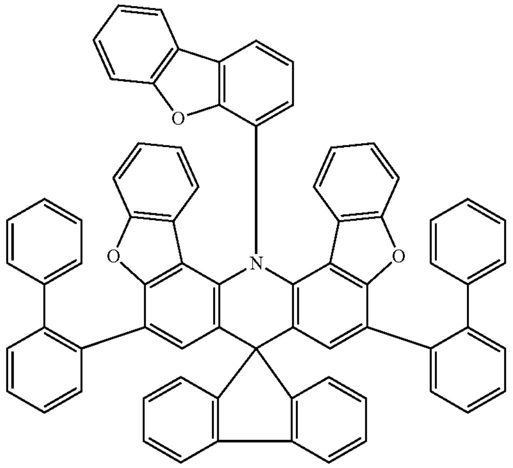
119
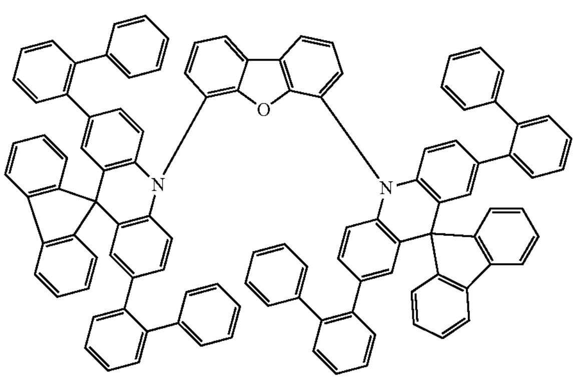
-continued
120
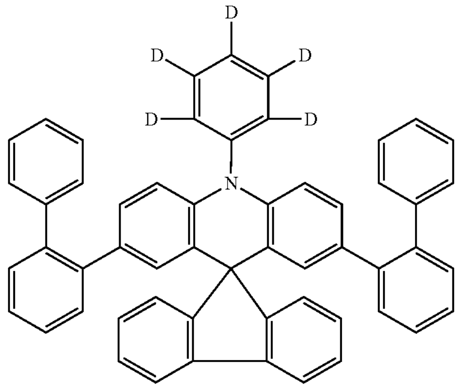
121
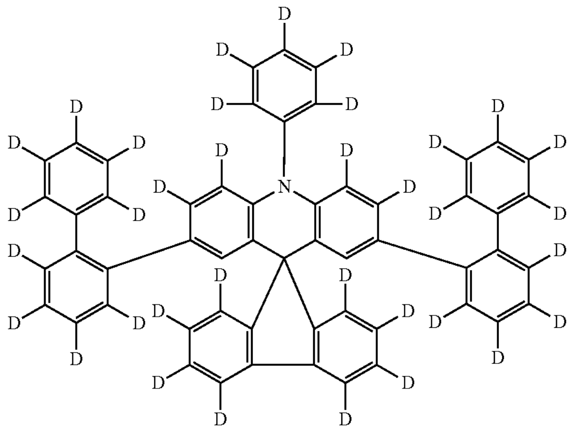
122
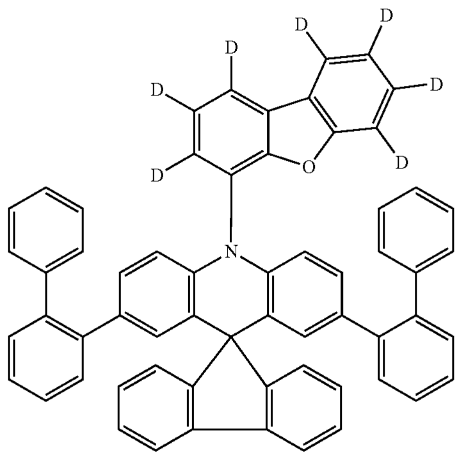

-continued
123
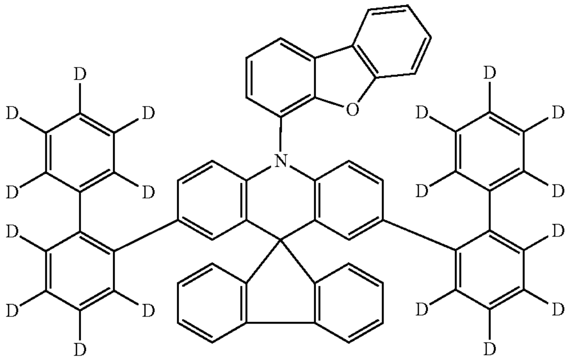
124
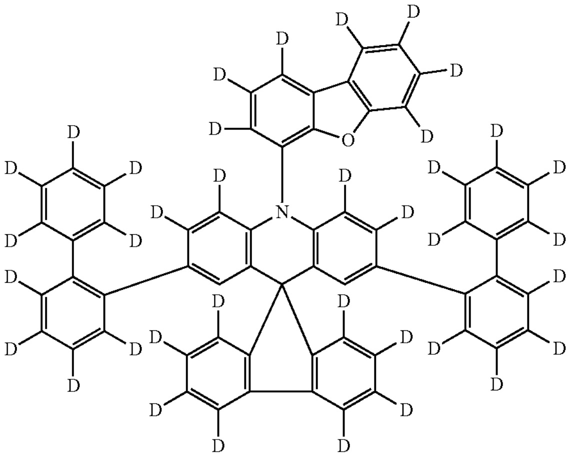
125
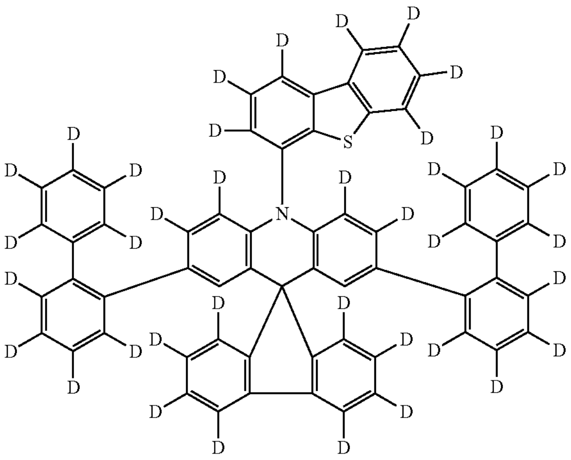
-continued
126
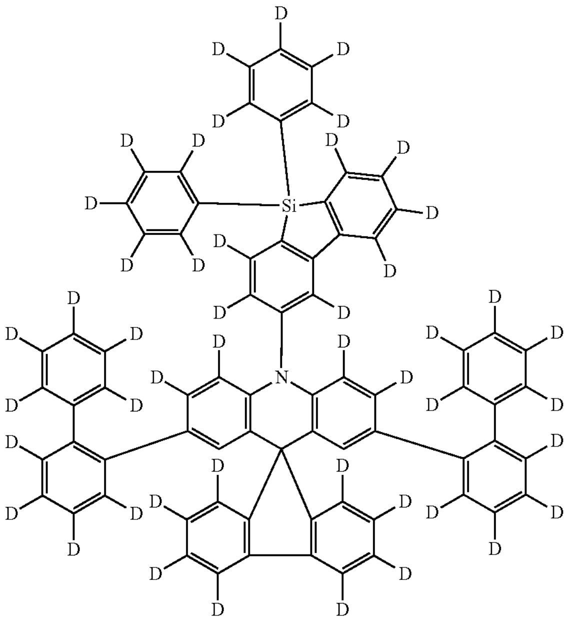
127
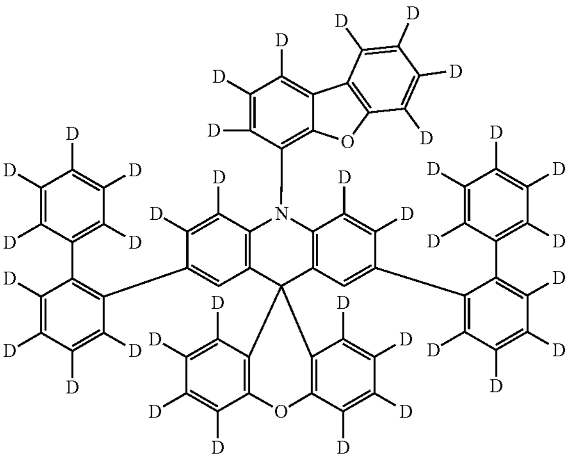
128
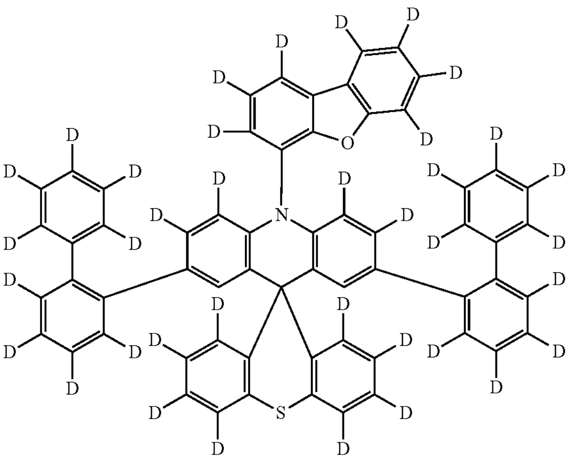

-continued
129
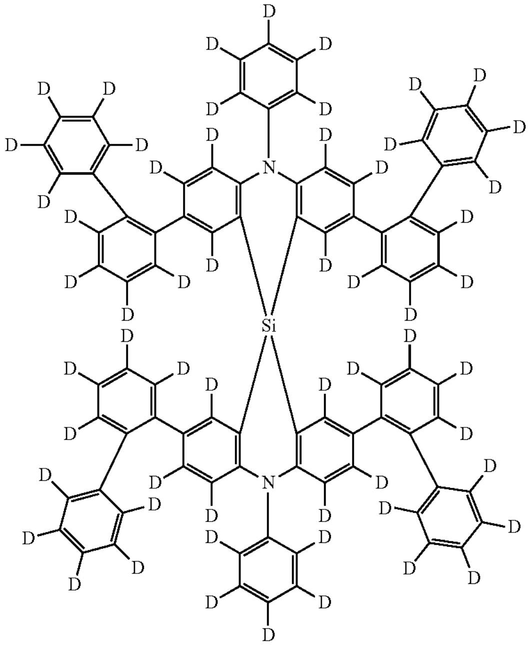
130
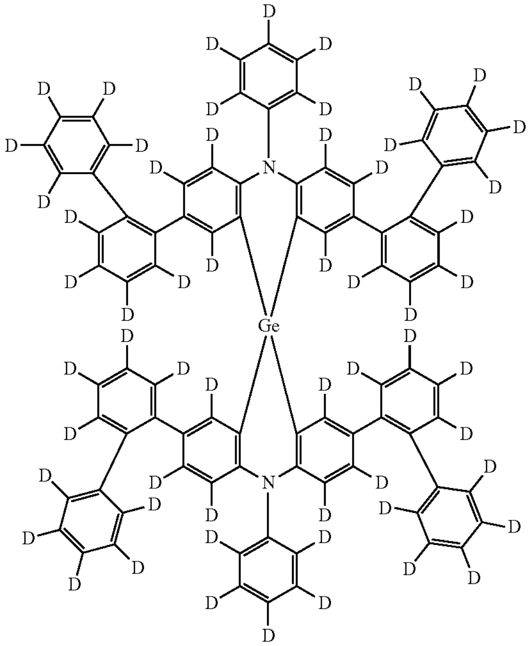
-continued
131
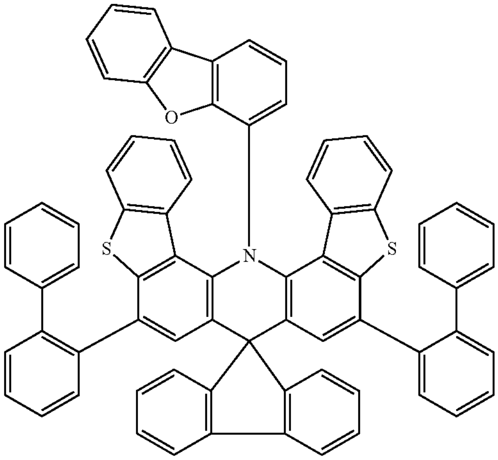
132
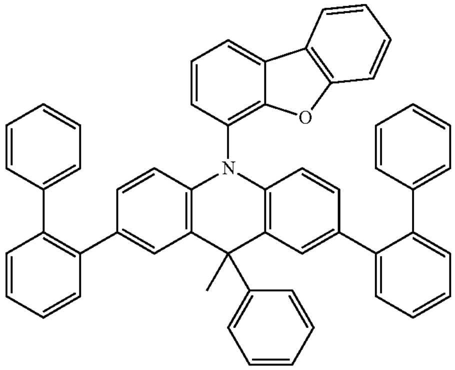
133
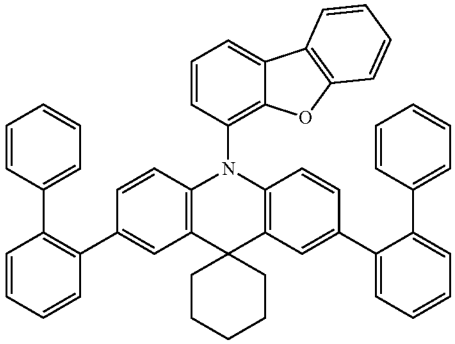
134
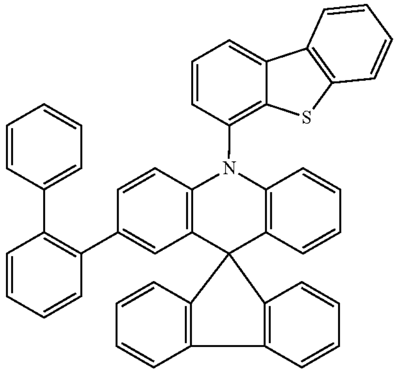

-continued

135

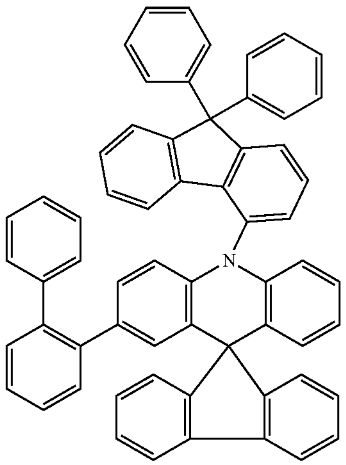

136

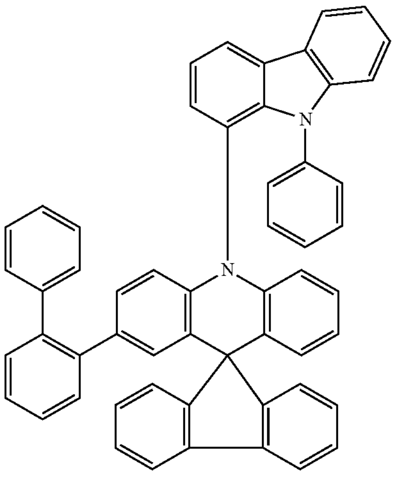

137

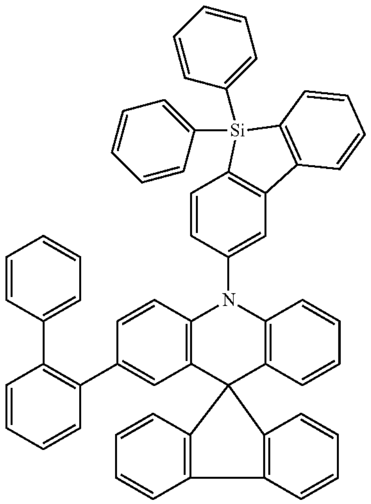

In an embodiment, the nitrogen-containing compound represented by Formula 1 may include acridane bonded with a substituted aryl group. The acridane bonded with the substituted aryl group may be represented by Formula Z below. The substituted aryl group may be bonded to the 3-position carbon of the acridane. For example, the substituent of the aryl group may be a phenyl group, and the substituted aryl group may be a biphenyl group. However, these are only illustrations, and embodiments are not limited thereto.

[Formula Z]

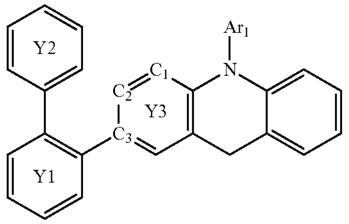

In Formula Z, $Ar_1$ may be the same as defined in connection with Formula 1. Y1 to Y3 are expressed in order to refer to each benzene ring. The benzene ring of Y2 is illustrated as a phenyl group, but embodiments are not limited thereto. The ring of Y2 may be a substituted or unsubstituted aryl group having 6 to 30 ring-forming carbon atoms, or a substituted or unsubstituted heteroaryl group having 2 to 30 ring-forming carbon atoms. The benzene ring of Y2 and the benzene ring of Y3 may be bonded at the ortho position in the benzene ring of Y1. The nitrogen-containing compound of an embodiment may have improved stability of materials as the benzene ring of Y2 is bonded to the benzene ring of Y1 and the benzene ring of Y2 is bonded at the ortho position with the benzene ring of Y3. The stability of the nitrogen-containing compound may be improved due to the steric characteristics of the molecular structure including the benzene rings of Y1 to Y3. The nitrogen-containing compound having improved stability may improve efficiency and a service life of the light emitting element. Therefore, the light emitting element including the nitrogen-containing compound of an embodiment may exhibit excellent efficiency and long service life characteristics.

The hole transport region HTR may include at least one of a hole injection layer HIL, a hole transport layer HTL, a buffer layer or an emission-auxiliary layer (not shown), or an electron blocking layer EBL. At least one of the hole injection layer IL, the hole transport layer HTL, or the electron blocking layer EBL may include the nitrogen-containing compound of an embodiment. For example, the hole transport region HTR includes the hole injection layer HIL, the hole transport layer HTL, and the electron blocking layer EBL, and the electron blocking layer EBL may include the nitrogen-containing compound of an embodiment.

The thickness of the hole transport region HTR may be, for example, from about 50 Å to about 15,000 Å. The hole transport region HTR may have a single layer formed of a single material, a single layer formed of different materials, or a multilayer structure including layers formed of different materials.

For example, the hole transport region HTR may have a single layer structure of the hole transport layer HTL, and may have a single layer structure formed of a hole injection material and a hole transport material. The hole transport region HTR may have a single layer structure formed of different materials, or a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer TIL/hole transport layer HTL/electron blocking layer EBL are stacked in order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The light emitting element ED of an embodiment may further include hole transport materials, which will be described below, in addition to the nitrogen-containing compound of an embodiment as described above. The hole transport region HTR may include a compound represented by Formula H-1 below:

[Formula H-1]

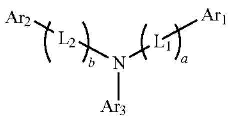

In Formula H-1 above, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-1, a and b may each independently be an integer from 0 to 10. When a or b is 2 or greater, multiple $L_1$ groups and multiple $L_2$ groups may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

The compound represented by Formula H-1 above may be a monoamine compound. In another embodiment, the compound represented by Formula H-1 above may be a diamine compound in which at least one of $Ar_1$ to $Ar_3$ includes an amine group as a substituent. For example, the compound represented by Formula H-1 above may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be any one selected from Compound Group H below. However, the compounds listed in Compound Group H below are examples, and the compounds represented by Formula H-1 are not limited to the compounds disclosed in Compound Group H below:

[Compound Group H]

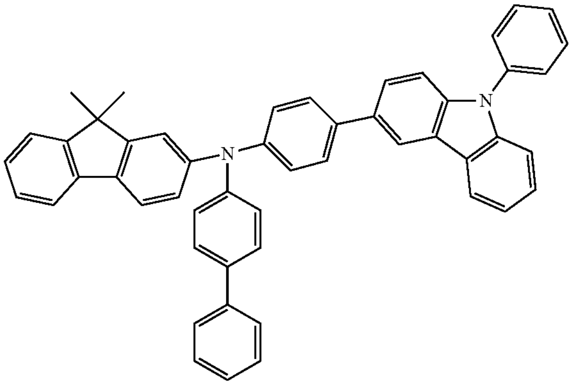

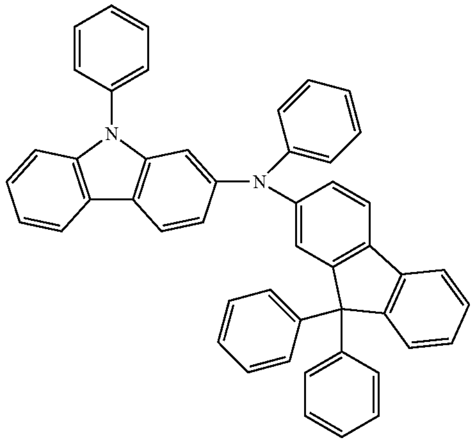

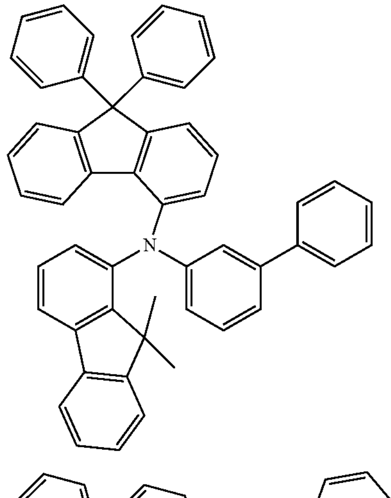

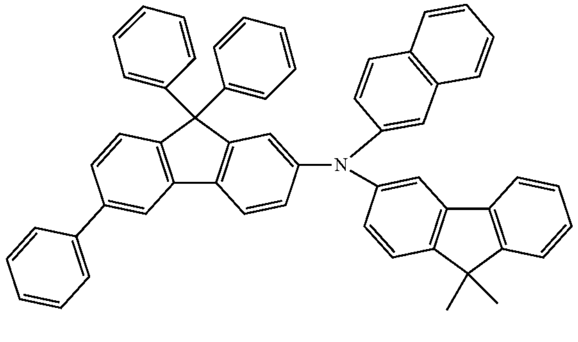

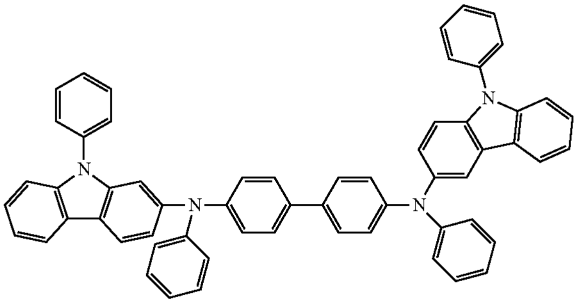
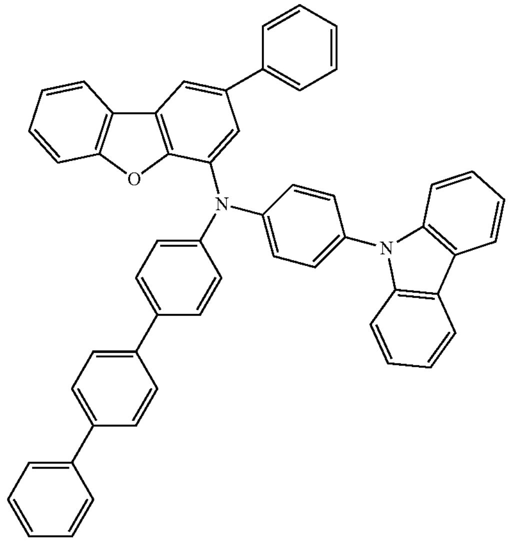
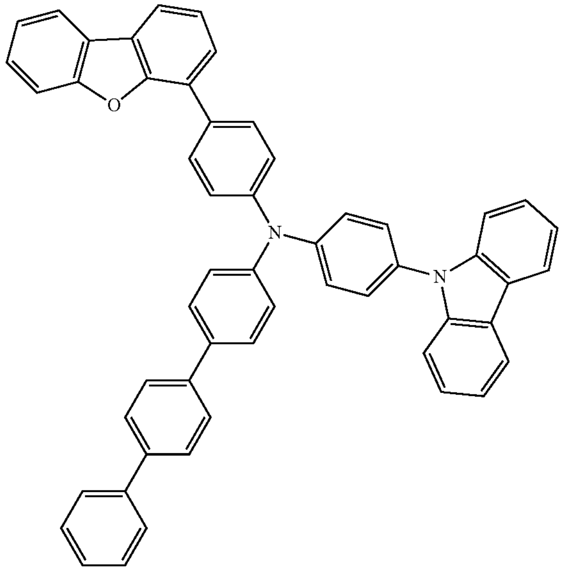
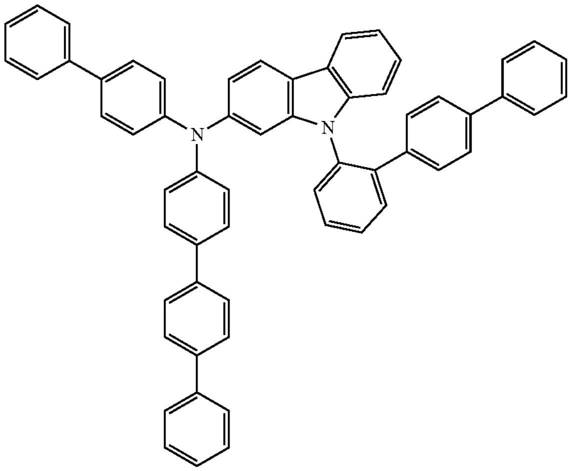
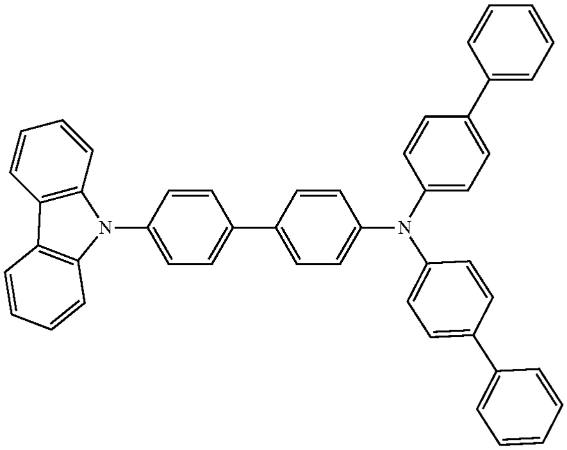
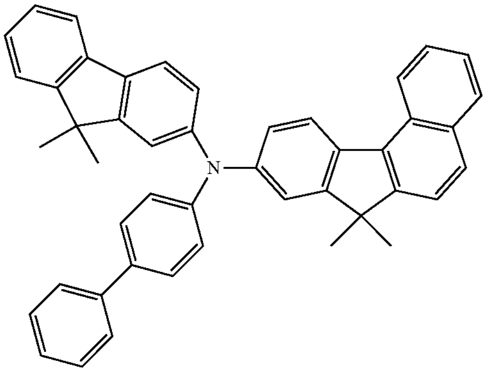

-continued
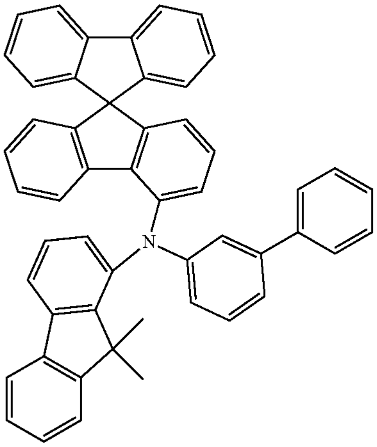
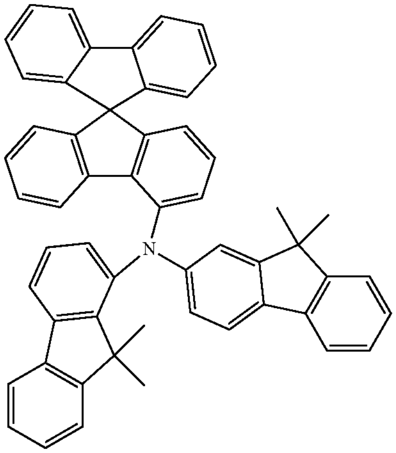
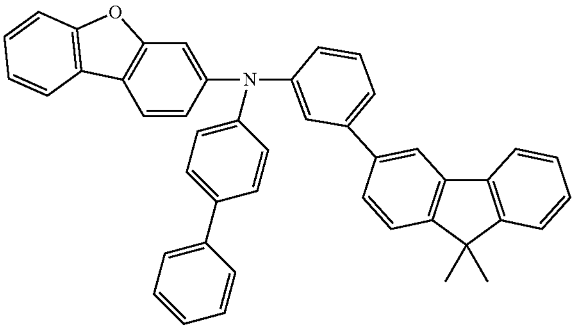
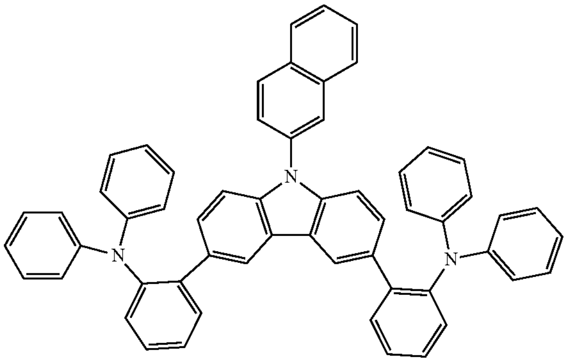
-continued
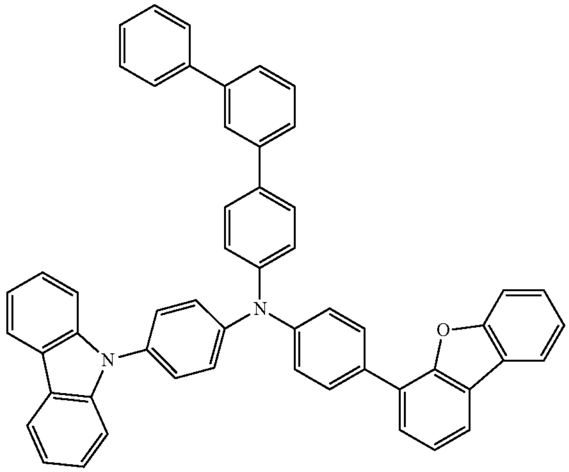
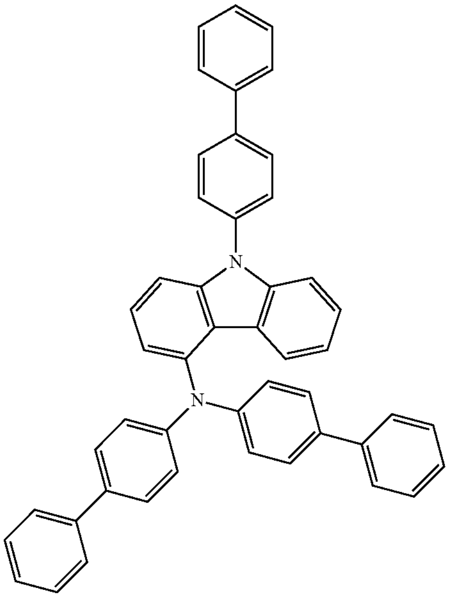
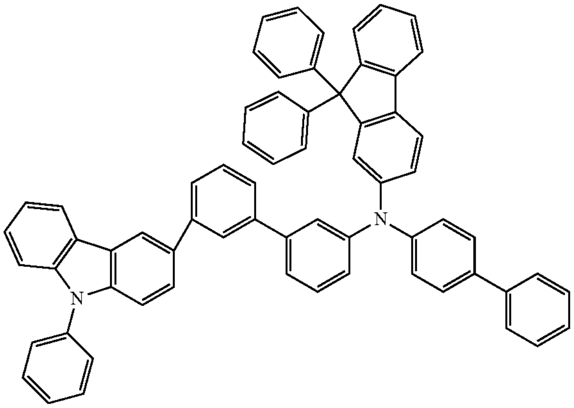

-continued

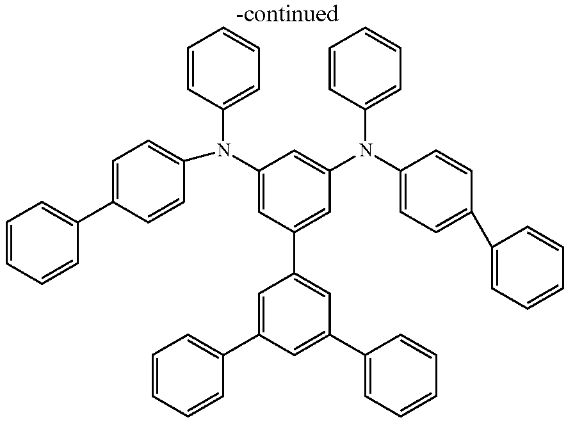

The hole transport region HTR may further include a phthalocyanine compound such as copper phthalocyanine; $N^1$,$N^{1'}$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino]triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may further include carbazole derivatives such as N-phenyl carbazole and polyvinyl carbazole, fluorene derivatives, N,N'-bis(3-methylphenyl)-N,N'-diphenyl-[1,1-biphenyl]-4,4'-diamine (TPD), triphenylamine derivatives such as 4,4',4"-tris(N-carbazolyl)triphenylamine (TCTA), N,N'-di(naphthalene-1-yl)-N,N'-diplienyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl) benzene (mCP), 1,3-bis(1,8-dimethyl-9H-carbazol-9-yl) benzene (mDCP), etc.

The hole transport region HTR may include the above-described compounds of the hole transport region in at least one of a hole injection layer HIL, a hole transport layer HTL, and an electron blocking layer EBL.

A thickness of the hole transport region HTR may be in a range of about 100 Å to about 10,000 Å. For example, the thickness of the hole transport region HTR may be in a range of about 100 Å to about 5,000 Å. When the hole transport region HTR includes a hole injection layer HIL, the hole injection layer HIL may have, for example, a thickness in a range of about 30 Å to about 1,000 Å. When the hole transport region HTR includes a hole transport layer HTL, the hole transport layer HTL may have a thickness in a range of about 30 Å to about 1,000 Å. For example, when the hole transport region HTR includes an electron blocking layer EBL, the electron blocking layer EBL may have a thickness in a range of about 10 Å to about 1,000 Å. If the thicknesses of the hole transport region HTR, the hole injection layer HIL, the hole transport layer HTL, and the electron blocking layer EBL satisfy the above-described ranges, satisfactory hole transport properties may be achieved without a substantial increase in a driving voltage.

The hole transport region HTR may further include a charge generating material to increase conductivity in addition to the above-described materials. The charge generating material may be dispersed uniformly or non-uniformly in the hole transport region HTR. The charge generating material may be, for example, a p-dopant. The p-dopant may include at least one of a halogenated metal compound, a quinone derivative, a metal oxide, or a cyano group-containing compound, but embodiments are not limited thereto. For example, the p-dopant may include metal halides such as CuI and RbI, quinone derivatives such as tetracyanoquinodimethane (TCNQ) and 2,3,5,6-tetrafluoro-7,7',8,8'-tetracyanoquinodimethane (F4-TCNQ), metal oxides such as tungsten oxide and molybdenum oxide, dipyrazino[2,3-f: 2',3'-h] quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3,5,6-tetrafluorobenzonitrile, etc., but embodiments are not limited thereto.

As described above, the hole transport region HTR may further include at least one of a buffer layer (not shown) or an electron blocking layer EBL, in addition to the hole injection layer HIL and the hole transport layer HTL. The buffer layer (not shown) may compensate for a resonance distance according to a wavelength of light emitted from the emission layer EML and may thus increase light emission efficiency. Materials which may be included in the hole transport region HTR may be used as materials to be included in the buffer layer (not shown). The electron blocking layer EBL may prevent electron injection from the electron transport region ETR to the hole transport region HTR.

The emission layer EML is provided on the hole transport region HTR. The emission layer EML may include the nitrogen-containing compound of an embodiment. The nitrogen-containing compound may be used as a host material in the emission layer EML. The emission layer EML may include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

In each light emitting element ED of embodiments illustrated in FIGS. 3 to 6, the emission layer EML may include a host and a dopant, and the emission layer EML may include a compound represented by Formula E-1 below. The compound represented by Formula E-1 below may be used as a fluorescence host material.

[Formula E-1]

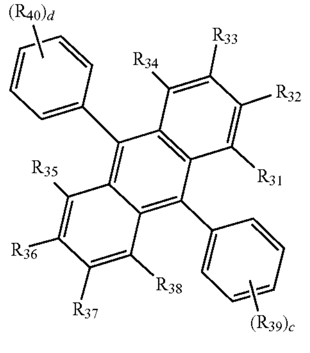

In Formula E-1, $R_{31}$ to $R_{40}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula E-1, $R_{31}$ to $R_{40}$ may be bonded to an adjacent group to form a saturated hydrocarbon ring or an unsaturated hydrocarbon ring.

In Formula E-1, c and d may each independently be an integer from 0 to 5. The compound represented by Formula E-1 may be any one selected from Compound E1 to Compound E19 below:

E1

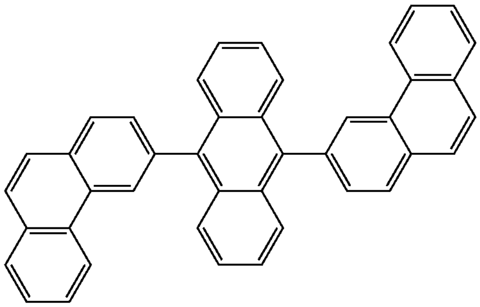

E2

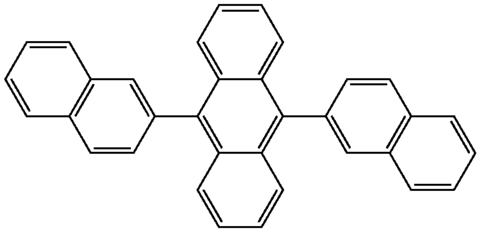

E3

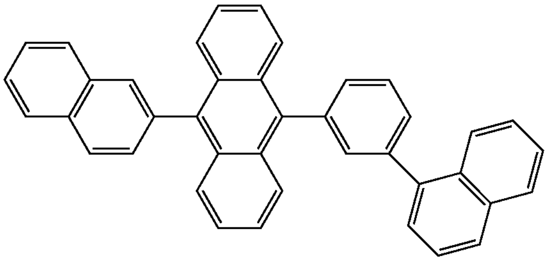

E4

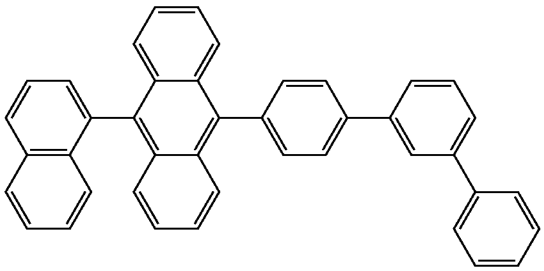

-continued

E5

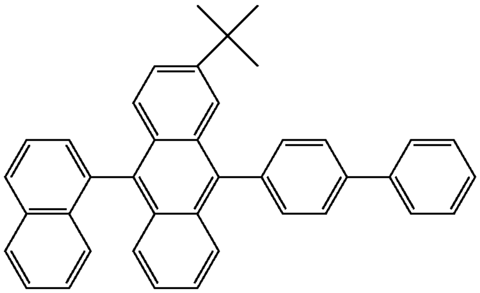

E6

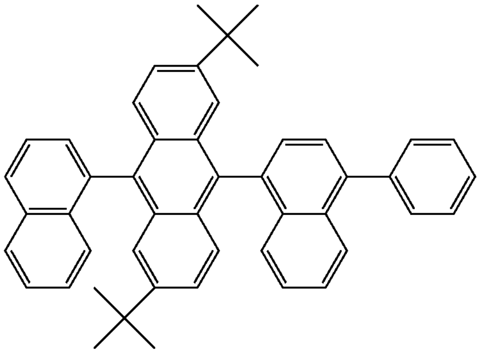

E7

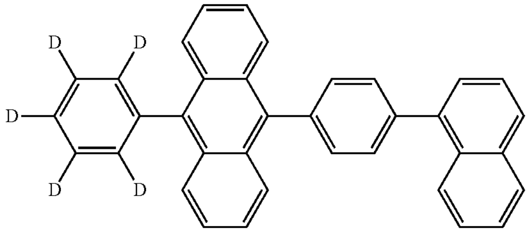

E8

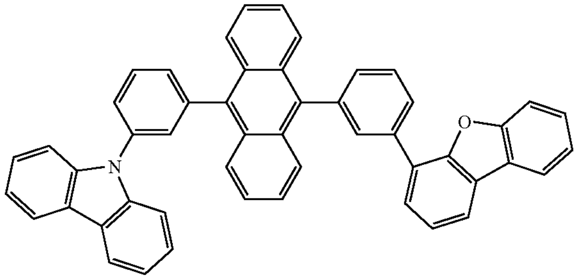

E9

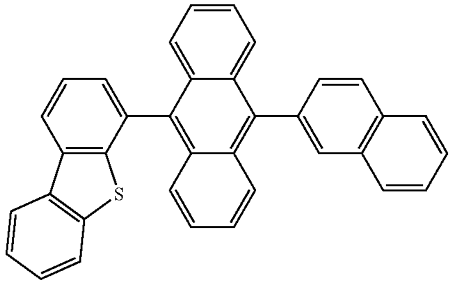

-continued
E10
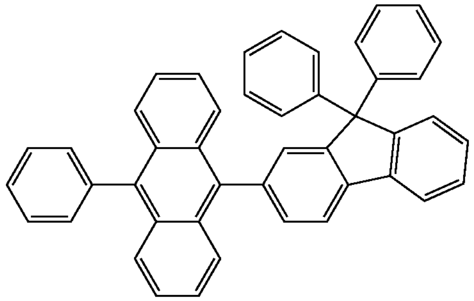
E11
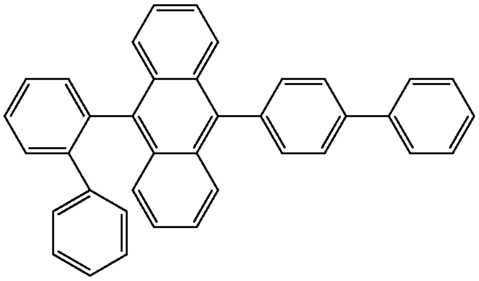
E12
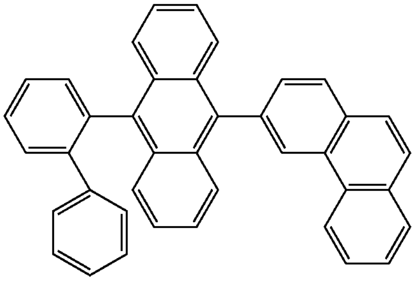
E13
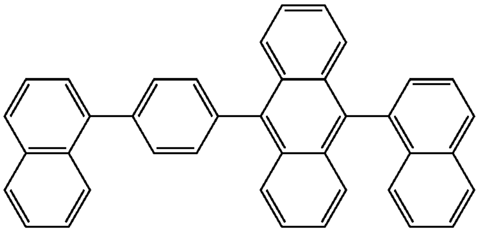
E14
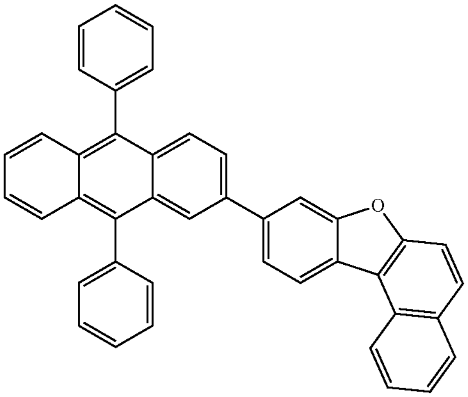
-continued
E15
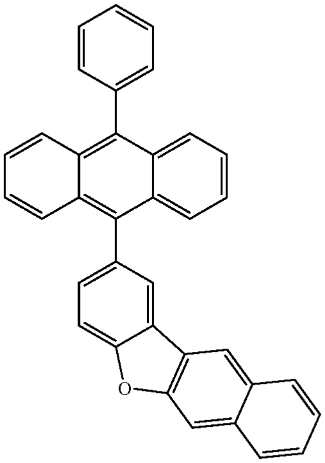
E16
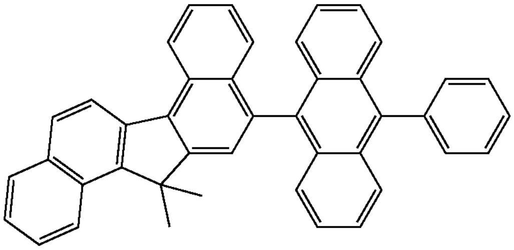
E17
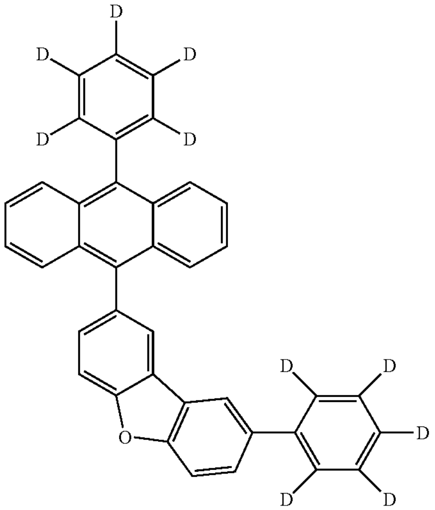
E18
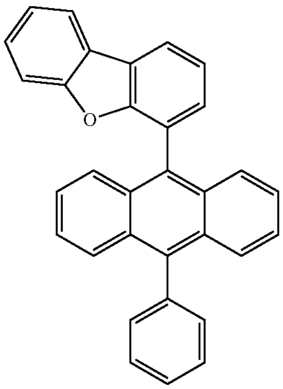

-continued

E19

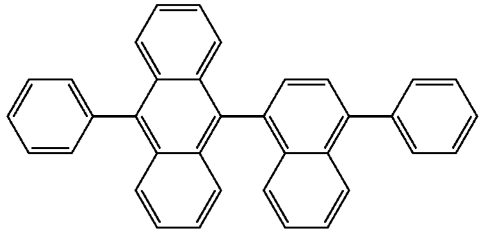

In an embodiment, the emission layer EML may include a compound represented by Formula E-2a or Formula E-2b below. The compound represented by Formula E-2a or Formula E-2b below may be used as a phosphorescence host material.

[Formula E-2a]

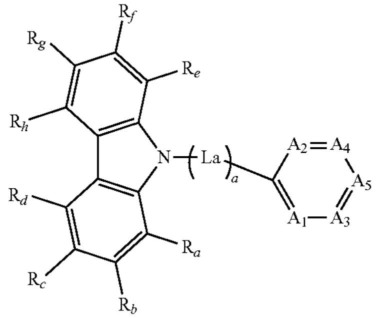

In Formula E-2a, a may be an integer from 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. When a is 2 or more, multiple $L_a$ groups may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle containing N, O, S, etc. as a ring-forming atom.

In Formula E-2a, two or three of $A_1$ to $A_5$ may be N, and the remainder of $A_1$ to $A_5$ may be $CR_i$.

[Formula E-2b]

$$(Cbz1)\!-\!(L_b)_b\!-\!(Cbz2)$$

In Formula E-2b, Cbz1 and Cbz2 may each independently be an unsubstituted carbazole group, or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2b, b may be an integer from 0 to 10, and when b is 2 or more, multiple $L_b$ groups may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be any one selected from Compound Group E-2 below. However, the compounds listed in Compound Group E-2 below are examples, the compound represented by Formula E-2a or Formula E-2b is not limited to those disclosed in Compound Group E-2 below.

[Compound Group E-2]

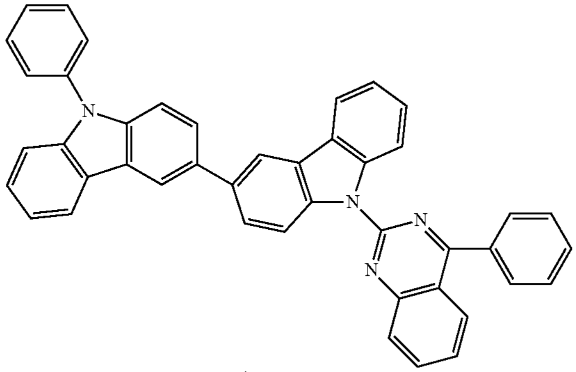

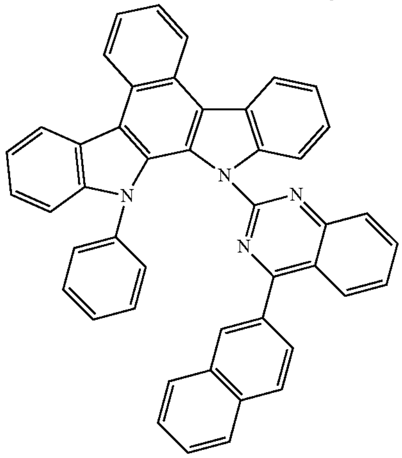

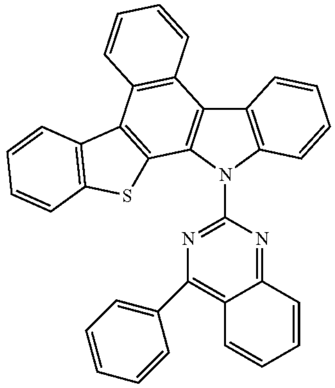

-continued
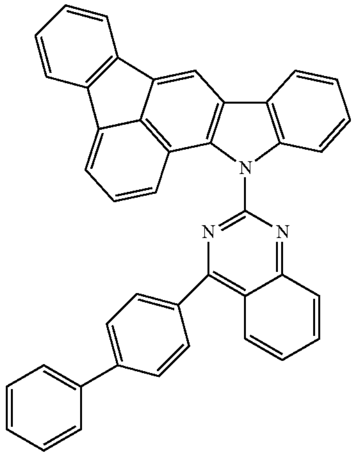
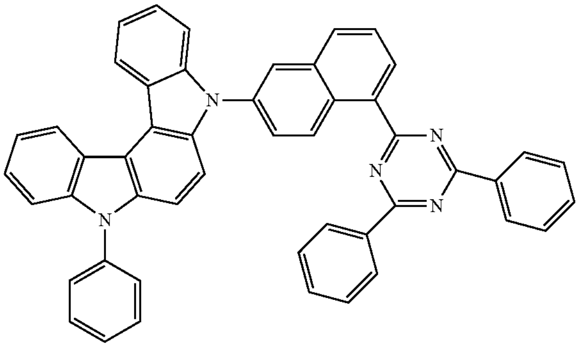
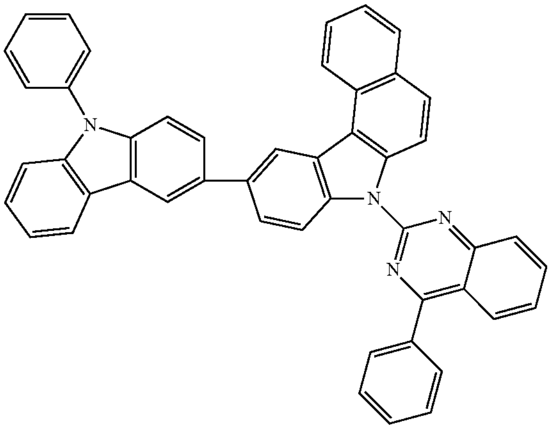
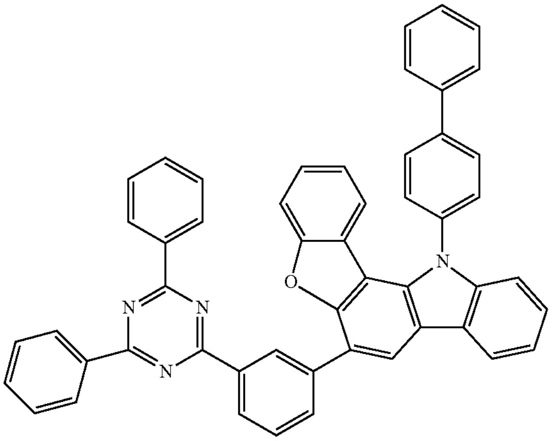
-continued
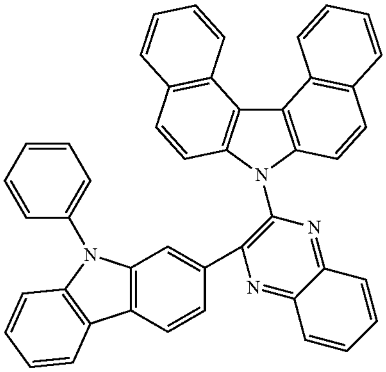
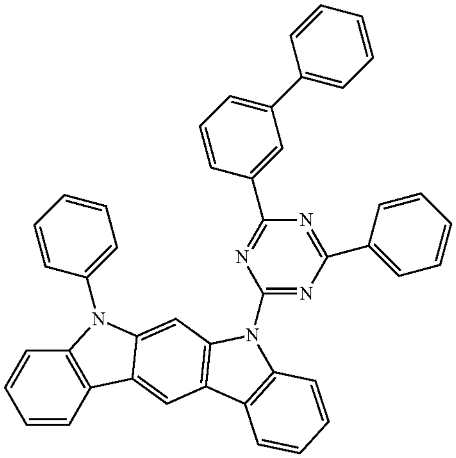
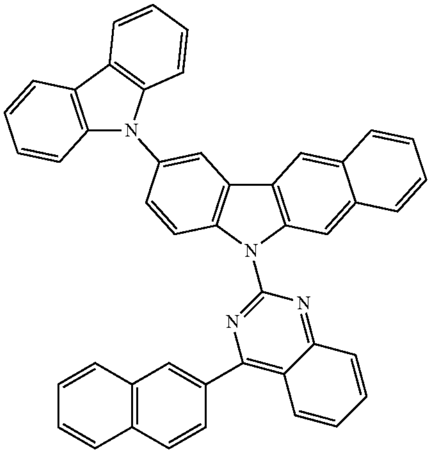

-continued
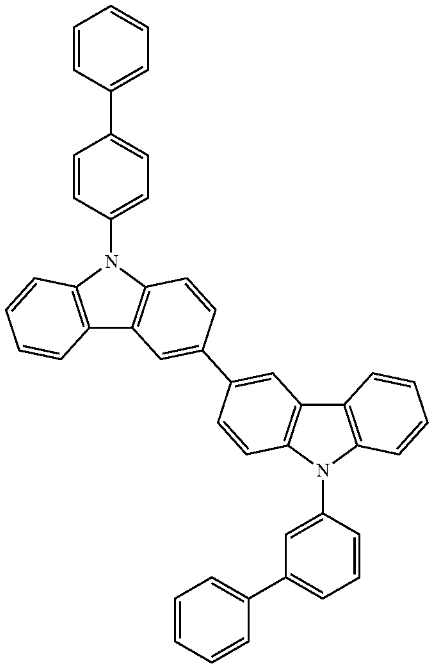
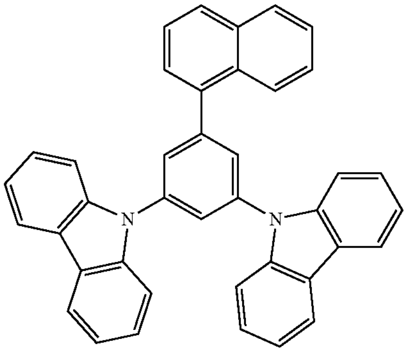
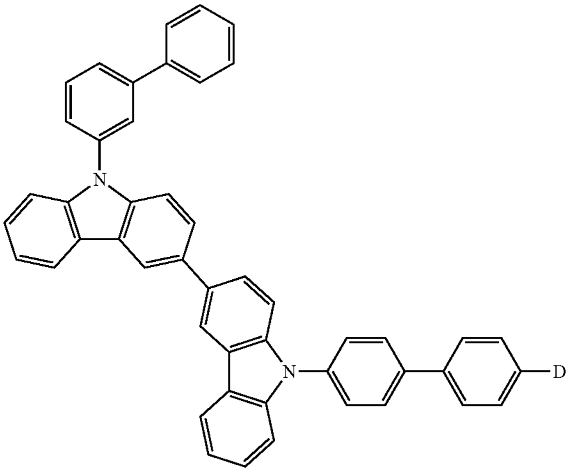
-continued
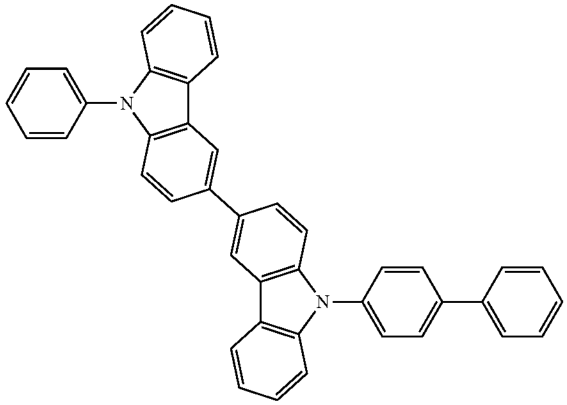
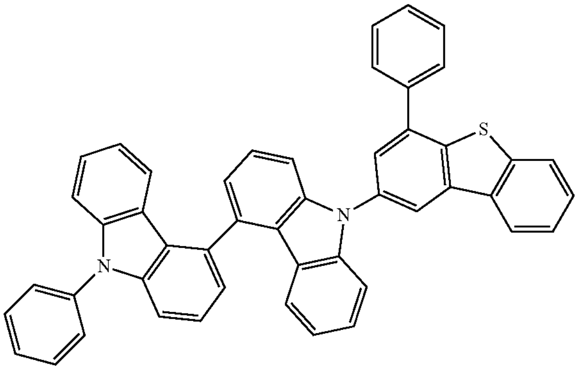
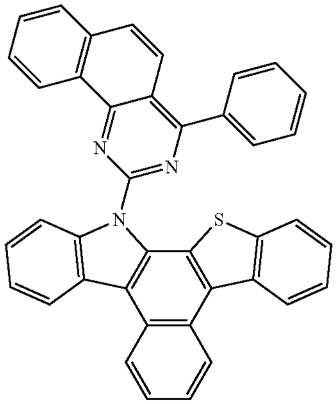
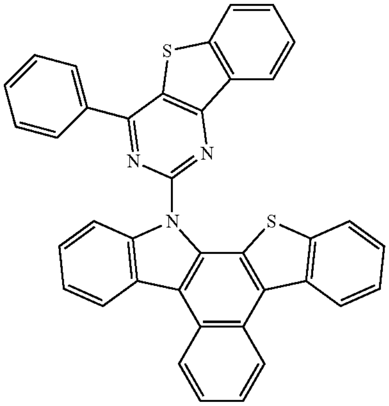

-continued

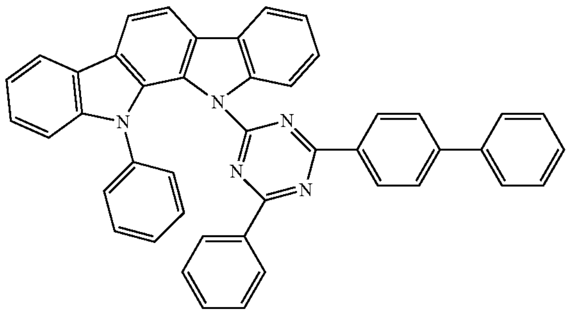

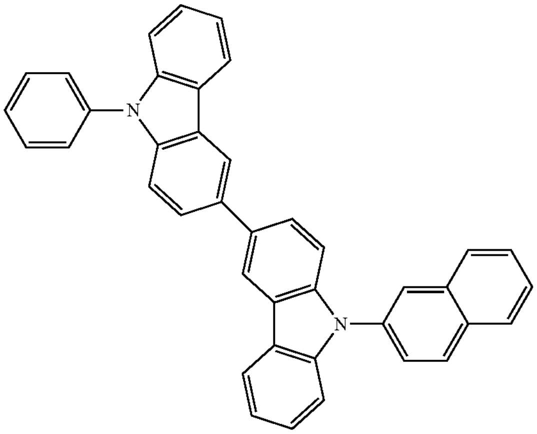

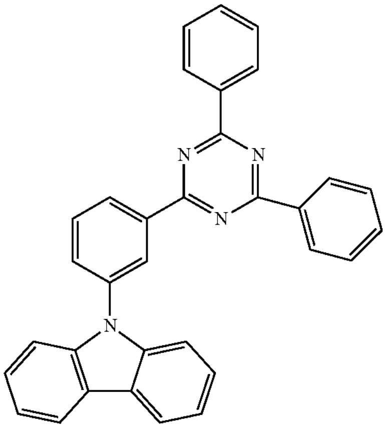

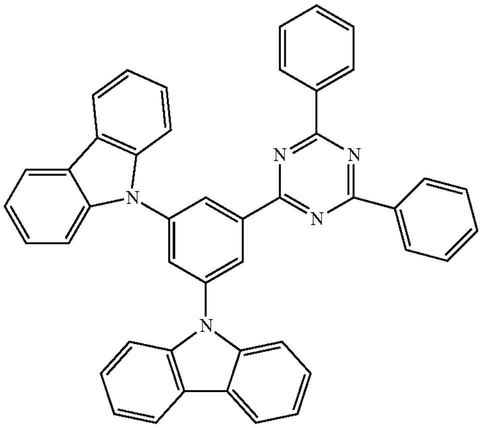

-continued

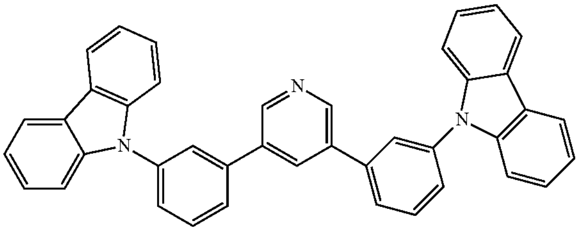

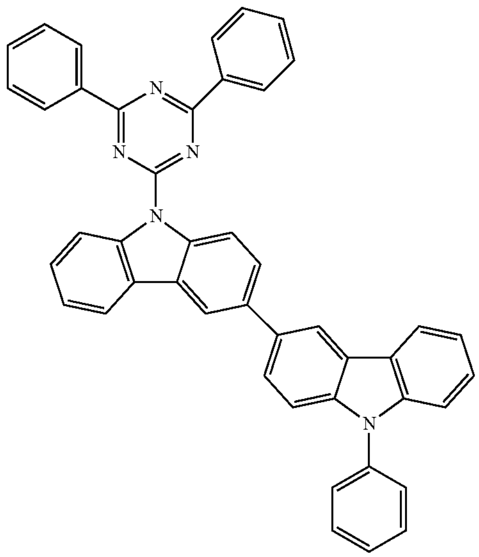

The emission layer EML may further include a general material in the art as a host material. For example, the emission layer EML may include, as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and 1,3,5-tris(1-phenyl-1H-benzo[d]imidazole-2-yl)benzene (TPBi). However, embodiments are not limited thereto, and for example, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenylcyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), etc. may be used as a host material.

The emission layer EML may include a compound represented by Formula M-a or Formula M-b below. The compound represented by Formula M-a or Formula M-b below may be used as a phosphorescence dopant material.

[Formula M-a]

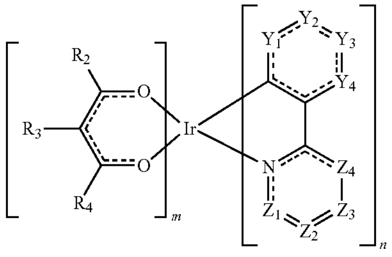

In Formula M-a above, $Y_1$ to $Y_4$ and $Z_1$ to $Z_4$ may each independently be $C(R_1)$ or N, $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is 0, n may be 3, and when m is 1, n may be 2.

The compound represented by Formula M-a may be used as a red phosphorescence dopant or a green phosphorescence dopant. The compound represented by Formula M-a may be any one selected from Compound M-a1 to Compound M-a19 below. However, Compounds M-a1 to M-a19 below are examples, and the compound represented by Formula M-a is not limited to Compounds M-a1 to M-a19 below.

M-a1

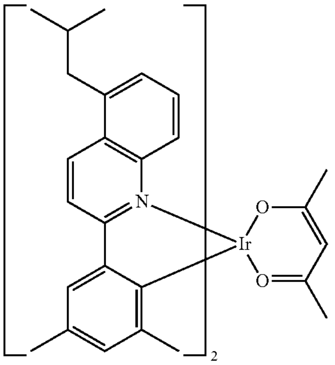

-continued

M-a2

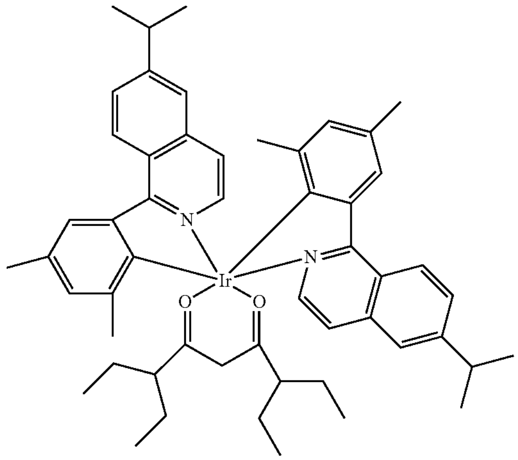

M-a3

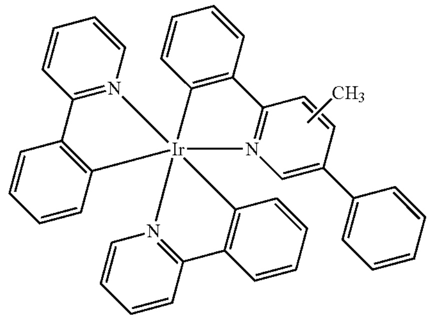

M-a4

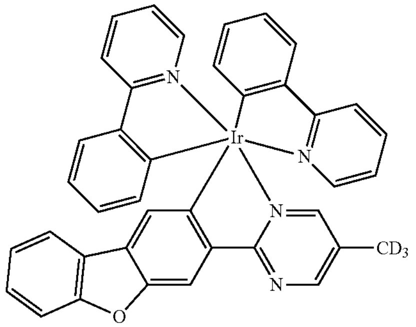

M-a5

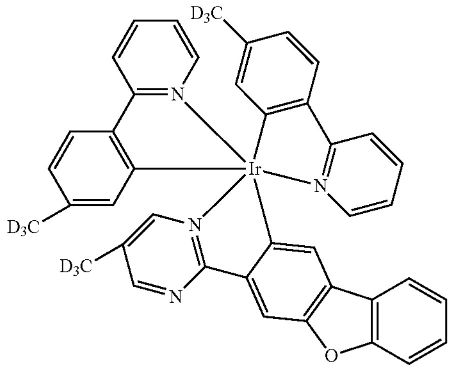

-continued
M-a6
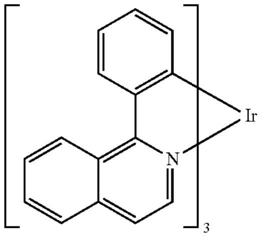
M-a7
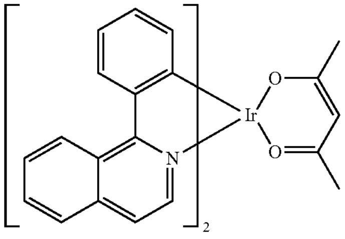
M-a8
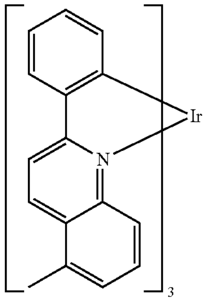
M-a9
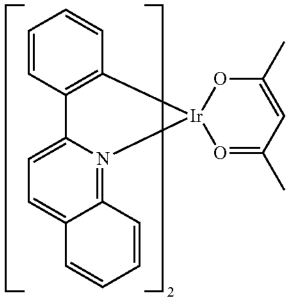
M-a10
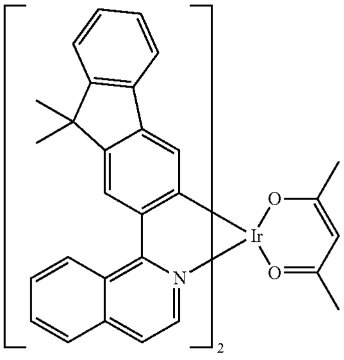
-continued
M-a11
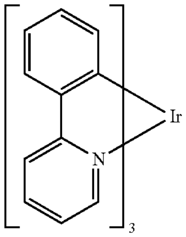
M-a12
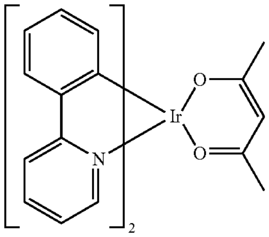
M-a13
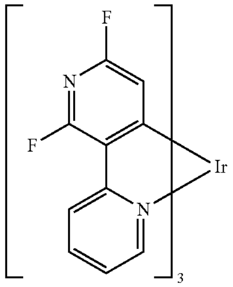
M-a14
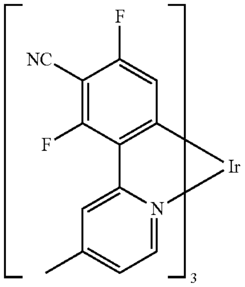
M-a15
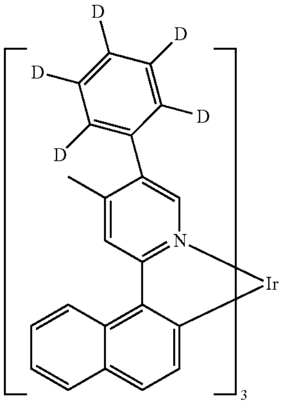

-continued

M-a16

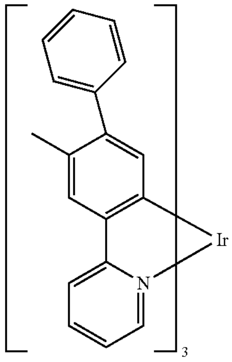

M-a17

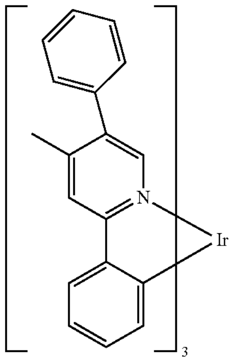

M-a18

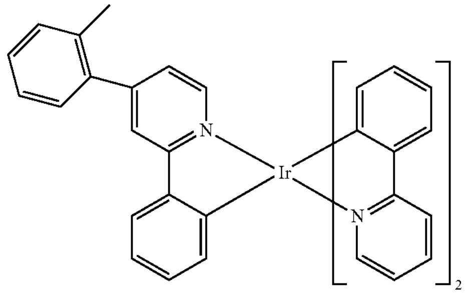

M-a19

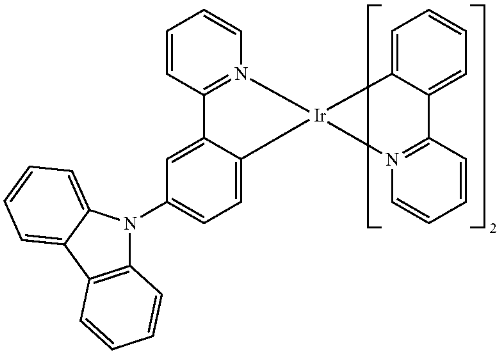

Compound M-a1 and Compound M-a2 may be used as a red dopant material, and Compound M-a3 to Compound M-a5 may be used as a green dopant material.

[Formula M-b]

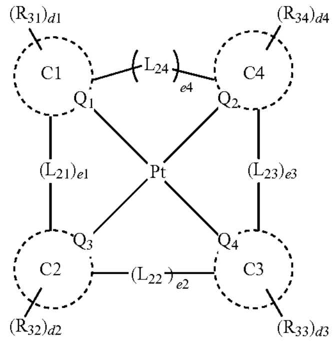

In Formula M-b, $Q_1$ to $Q_4$ may each independently be C or N, and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may each independently be a direct linkage,

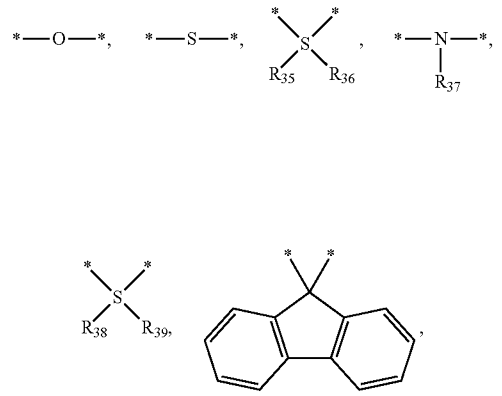

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and el to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and d1 to d4 may each independently be an integer from 0 to 4.

The compound represented by Formula M-b may be used as a blue phosphorescence dopant or a green phosphorescence dopant.

The compound represented by Formula M-b may be any one selected from the compounds below. However, the compounds below are examples, and the compound represented by Formula M-b is not limited to the compounds below.

-continued
M-b-1
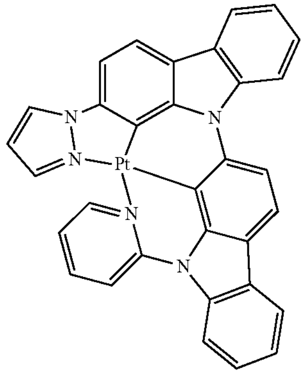
M-b-2
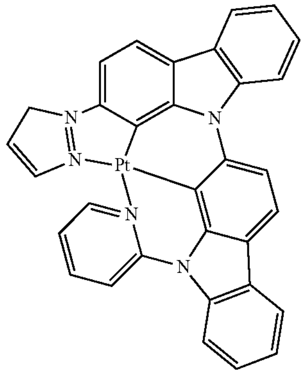
M-b-3
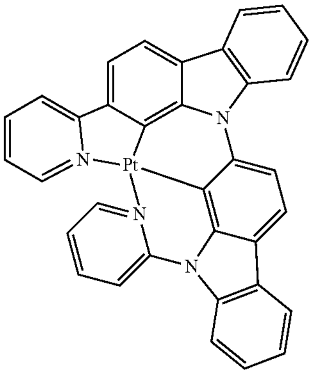
M-b-4
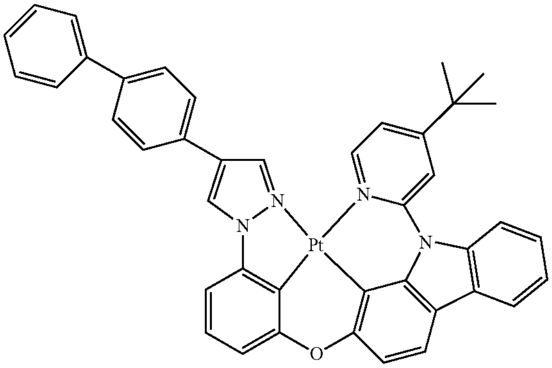
M-b-5
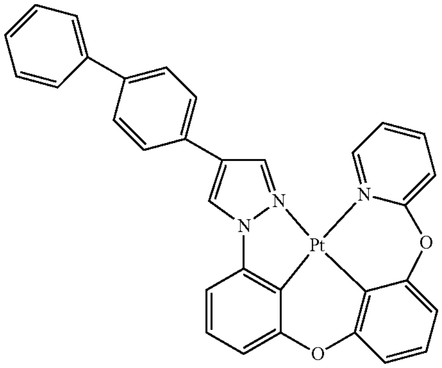
M-b-6
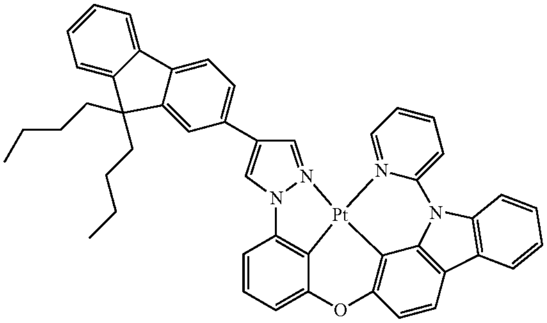
M-b-7
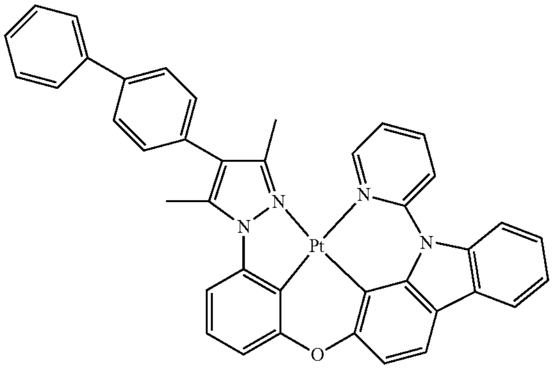
M-b-8
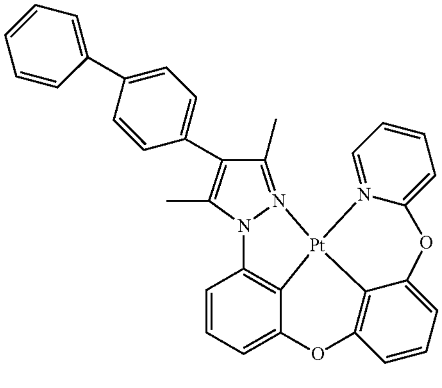

-continued

M-b-9

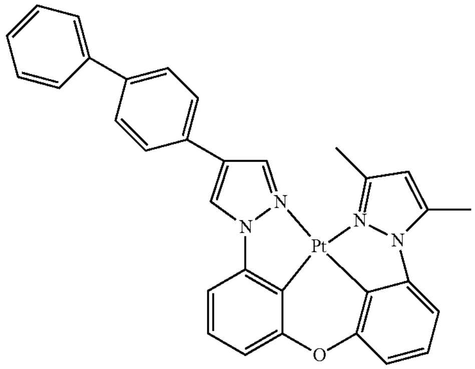

M-b-10

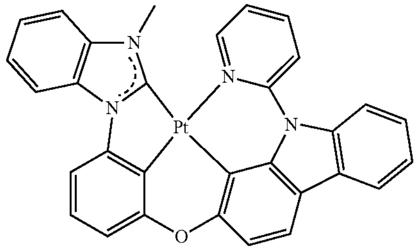

M-b-11

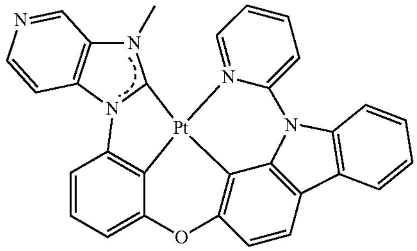

M-b-12

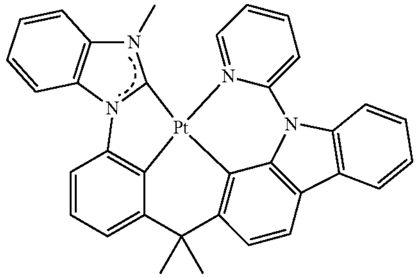

M-b-13

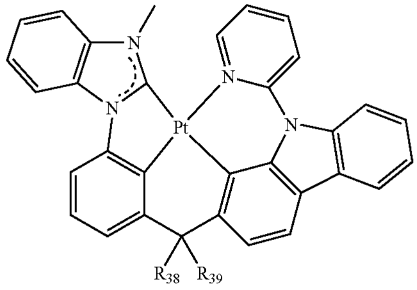

-continued

M-b-14

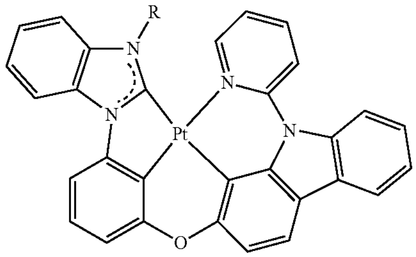

In the compounds, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one of Formula F-a to Formula F-c below. The compound represented by Formula F-a to Formula F-c below may be used as a fluorescence dopant material.

[Fomrula F-a]

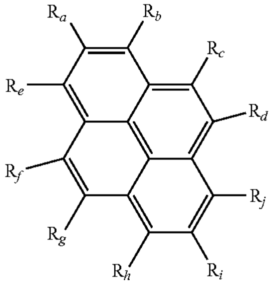

In Formula F-a, two selected from $R_a$ to $R_j$ may each independently be substituted with $*—NAr_1Ar_2$. The remainder of $R_a$ to $R_j$ which are not substituted with $*—NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In the group $*—NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ and $Ar_2$ may be a heteroaryl group containing O or S as a ring-forming atom.

[Formula F-b]

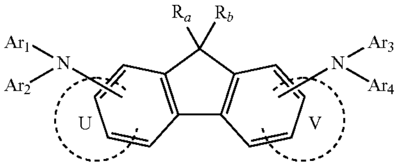

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula F-b, $Ar_1$ to $Ar_4$ may each independently be a substituted or unsubstituted aryl group having 6 to 30 ring-forming carbon atoms, or a substituted or unsubstituted heteroaryl group having 2 to 30 ring-forming carbon atoms.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, when the number of U or V is 1, a condensed ring may be present at the position indicated by U or V, and when the number of U or V is 0, a ring described may not be present at the position indicated by U or V. When the number of U is 0 and the number of V is 1, or when the number of U is 1 and the number of V is 0, the condensed ring having a fluorene core of Formula F-b may be a four-ring cyclic compound. When each number of U and V is 0, the condensed ring of Formula F-b may be a three-ring cyclic compound. When each number of U and V is 1, the condensed ring having a fluorene core of Formula F-b may be a five-ring cyclic compound.

[Formula F-c]

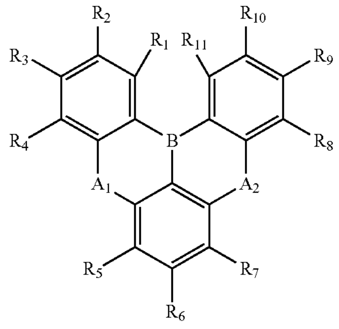

In Formula F-c, $A_1$ and $A_2$ may each independently be O, S, Se, or $N(R_m)$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-c, $A_1$ and $A_2$ may each independently be bonded to substituents of an adjacent ring to form a condensed ring. For example, when $A_1$ and $A_2$ are each independently $N(R_m)$, $A_1$ may be bonded to $R_4$ or $R_5$ to form a ring. For example, $A_2$ may be bonded to $R_7$ or $R_8$ to form a ring.

In an embodiment, the emission layer EML may include, as a dopant material, styryl derivatives (e.g., 1,4-bis[2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), 4,4'-bis[2-(4-(N,N-diphenylamino)phenyl)vinyl]biphenyl (DPAVBi), perylene and the derivatives thereof (e.g., 2,5,8,11-tetra-t-butylperylene (TBP)), pyrene and the derivatives thereof (e.g., 1,1-dipyrene, 1,4-dipyrenylbenzene, 1,4-bis(N,N-diphenylamino)pyrene), etc.

The emission layer EML may include a phosphorescence dopant material. For example, a metal complex including iridium (Ir), platinum (Pt), osmium (Os), aurum (Au), titanium (Ti), zirconium (Zr), hafnium (Hf), europium (Eu), terbium (Tb), or thulium (Tm) may be used as a phosphorescence dopant. For example, iridium(III) bis(4,6-difluorophenylpyridinato-N,C2') (FIrpic), bis(2,4-difluorophenylpyridinato)-tetrakis(1-pyrazolyl)borate iridium(III) (Fir6), or platinum octaethyl porphyrin (PtOEP) may be used as a phosphorescence dopant. However, embodiments are not limited thereto.

The emission layer EML may include a quantum dot material. The quantum dot may be selected from a Group II-VI compound, a Group III-VI compound, a Group I-III-IV compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and $In_2Se_3$, a ternary compound such as $InGaS_3$ and $InGaSe_3$, or any combination thereof.

The Group 1-III-VI compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration distribution, or may be present in the particle at a partially different concentration distribution. In an embodiment, the quantum dot may have a core/shell structure in which one quantum dot surrounds another quantum dot. An interface between the core and the shell may have a concentration gradient in which the concentration of an element present in the shell decreases towards the core.

In embodiments, a quantum dot may have the above-described core-shell structure including a core containing nanocrystals and a shell surrounding the core. The shell of the quantum dot may be a protection layer to prevent the chemical deformation of the core so as to maintain semiconductor properties, and/or may be a charging layer to impart electrophoresis properties to the quantum dot. The shell may be a single layer or a multilayer. An interface between the core and the shell may have a concentration gradient in which the concentration of an element present in the shell decreases towards the core. An example of the shell of the quantum dot may include a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO; or a ternary compound such as $MgAl_2O_4$, $CoFe_2O_4$, $NiFe_2O_4$, and $CoMn_2O_4$, but embodiments are not limited thereto.

The quantum dot may have a full width of half maximum (FWHM) of alight emission wavelength spectrum equal to or less than about 45 nm. For example, the quantum dot may have a FWHM of a light emission wavelength spectrum equal to or less than about 40 nm. For example, the quantum dot may have a FWHM of a light emission wavelength spectrum equal to or less than about 30 nm. Color purity or color reproducibility may be improved in the above ranges. Light emitted through the quantum dot may be emitted in all directions, and thus a wide viewing angle may be improved.

The form of a quantum dot may be a form that is commonly used in the art. For example, the quantum dot may have a spherical, a pyramidal, a multi-arm, or a cubic shape, or the quantum dot may be in the form of nanoparticles, nanotubes, nanowires, nanofibers, nanoparticles, etc.

The quantum dot may control the color of emitted light according to a particle size thereof, and accordingly, the quantum dot may have various emission colors such as blue, red, and green.

In each light emitting element ED of embodiments illustrated in FIGS. 3 to 6, the electron transport region ETR is provided on the emission layer EML. The electron transport region ETR may include at least one of a hole blocking layer HBL, an electron transport layer ETL, and an electron injection layer EIL, but embodiments are not limited thereto.

The electron transport region ETR may have a layer formed of a single material, a layer formed of different materials, or a multilayer structure including layers formed of different materials.

For example, the electron transport region ETR may have a single layer structure of the electron injection layer EIL or the electron transport layer ETL, or may have a single layer structure formed of an electron injection material and an electron transport material. In embodiment, the electron transport region ETR may have a single layer structure formed of different materials, or may have a structure in which an electron transport layer ETL/an electron injection layer EIL, or a hole blocking layer HBL/an electron transport layer ETL/an electron injection layer EIL are stacked in order from the emission layer EML, but embodiments are not limited thereto. The electron transport region ETR may have a thickness, for example, in a range of about 1,000 Å to about 1,500 Å.

The electron transport region ETR may be formed by using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

[Formula ET-1]

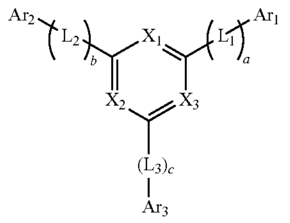

In Formula ET-1, at least one of $X_1$ to $X_3$ may be N, and the remainder of $X_1$ to $X_3$ may be $C(R_a)$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula ET-1, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula ET-1, when a to c are 2 or more, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl) anthracene (ADN), 1,3-Bis[3,5-di(pyridin-3-yl)phenyl] benzene (BmPyPhB), or a mixture thereof.

The electron transport region ETR may include a metal halide such as LiF, NaCl, CsF, RbCl, RbI, CuI, or KI, a lanthanide metal such as Yb, and a co-deposited material of the metal halide and the lanthanide metal. For example, the electron transport region ETR may include KI:Yb, RbI:Yb, etc. as a co-deposited material. The electron transport region ETR may be formed using a metal oxide such as $Li_2O$ or BaO, or 8-hydroxyl-lithium quinolate (Liq), etc., but embodiments are not limited thereto. The electron transport region ETR may also be formed of a mixture material of an electron transport material and an insulating organometallic salt. The organometallic salt may be a material having an energy band gap equal to or greater than about 4 eV. For example, the organometallic salt may include metal acetates, metal benzoates, metal acetoacetates, metal acetylacetonates, or metal stearates.

The electron transport region ETR may further include at least one of 2,9-dimethyl-4,7-diphenyl-1,10-phenanthroline (BCP), or 4,7-diphenyl-1,10-phenanthroline (Bphen) in addition to the above-described materials, but embodiments are not limited thereto.

The electron transport region ETR may include the above-described compounds of the electron transport region in at least one of an electron injection layer EIL, an electron transport layer ETL, and a hole blocking layer HBL.

When the electron transport region ETR includes an electron transport layer ETL, the electron transport layer ETL may have a thickness in a range of about 100 Å to about 1,000 Å. For example, the thickness of the electron transport layer ETL may be in a range of about 150 Å to about 500 Å. If the thickness of the electron transport layer ETL satisfies the aforementioned range, satisfactory electron transport characteristics may be obtained without a substantial increase in driving voltage. When the electron transport region ETR includes an electron injection layer EIL, the electron injection layer EIL may have a thickness in a range of about 1 Å to about 100 Å. For example, the thickness of the electron injection layer EIL may be in a range of about 3 Å to about 90 Å. If the thickness of the electron injection layer EIL satisfies the above-described range, satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgYb). In an embodiment, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, or the like.

Although not shown in the drawings, the second electrode EL2 may be electrically connected to an auxiliary electrode. If the second electrode EL2 is electrically connected to the auxiliary electrode, the resistance of the second electrode EL2 may decrease.

In an embodiment, the light emitting element ED may further include a capping layer CPL disposed on the second electrode EL2. The capping layer CPL may be a single layer or a multilayer.

In an embodiment, the capping layer CPL may include an organic layer or an inorganic layer. For example, when the capping layer CPL includes an inorganic material, the inorganic material may include an alkaline metal compound such as LiF, an alkaline earth metal compound such as $MgF_2$, SiON, $SiN_x$, SiOy, etc.

For example, when the capping layer CPL includes an organic material, the organic material may include a-NPD, NPB, TPD, m-MTDATA, $Alq_3$, CuPc, N4,N4,N4',N4'-tetra (biphenyl-4-yl)biphenyl-4,4'-diamine (TPD15), 4,4',4"-tris (carbazol-9-yl)triphenylamine (TCTA), etc., or may include an epoxy resin, or acrylate such as methacrylate. However, embodiments are not limited thereto, and the capping layer CPL may include at least one of Compounds P1 to P5 below:

P1

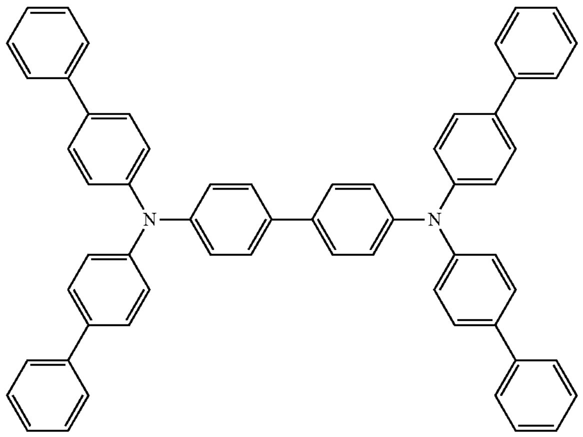

-continued

P2

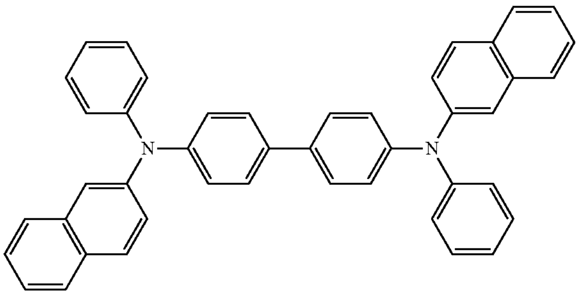

P3

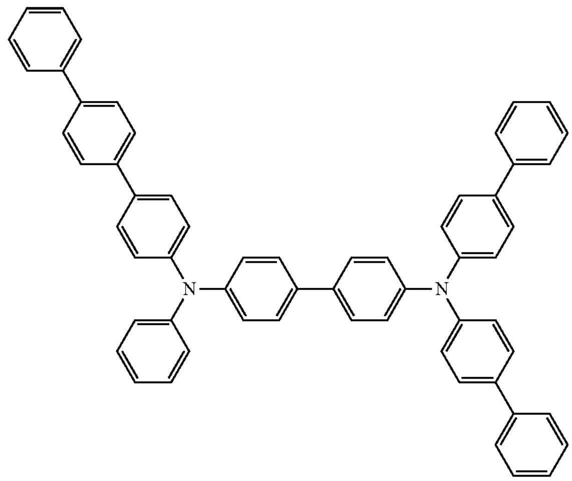

P4

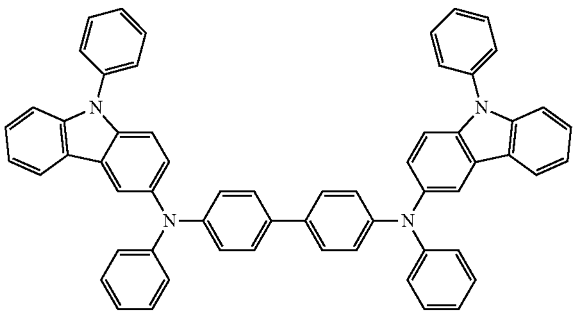

-continued

P5

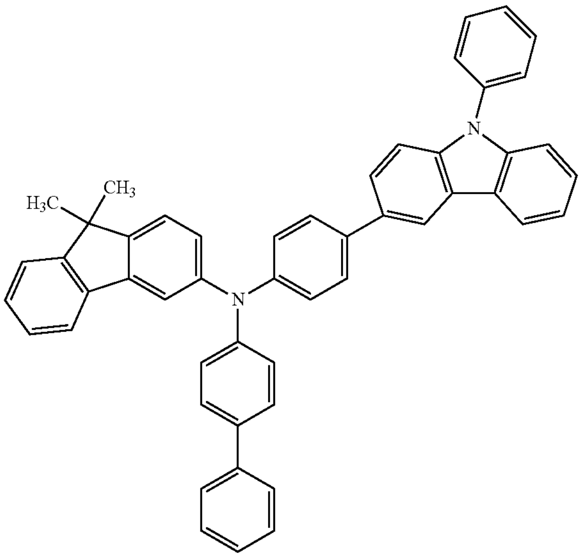

A refractive index of the capping layer CPL may be equal to or greater than about 1.6. For example, the refractive index of the capping layer CPL may be equal to or greater than about 1.6, with respect to light in a wavelength range of about 550 nm to about 660 nm.

Figure 7:
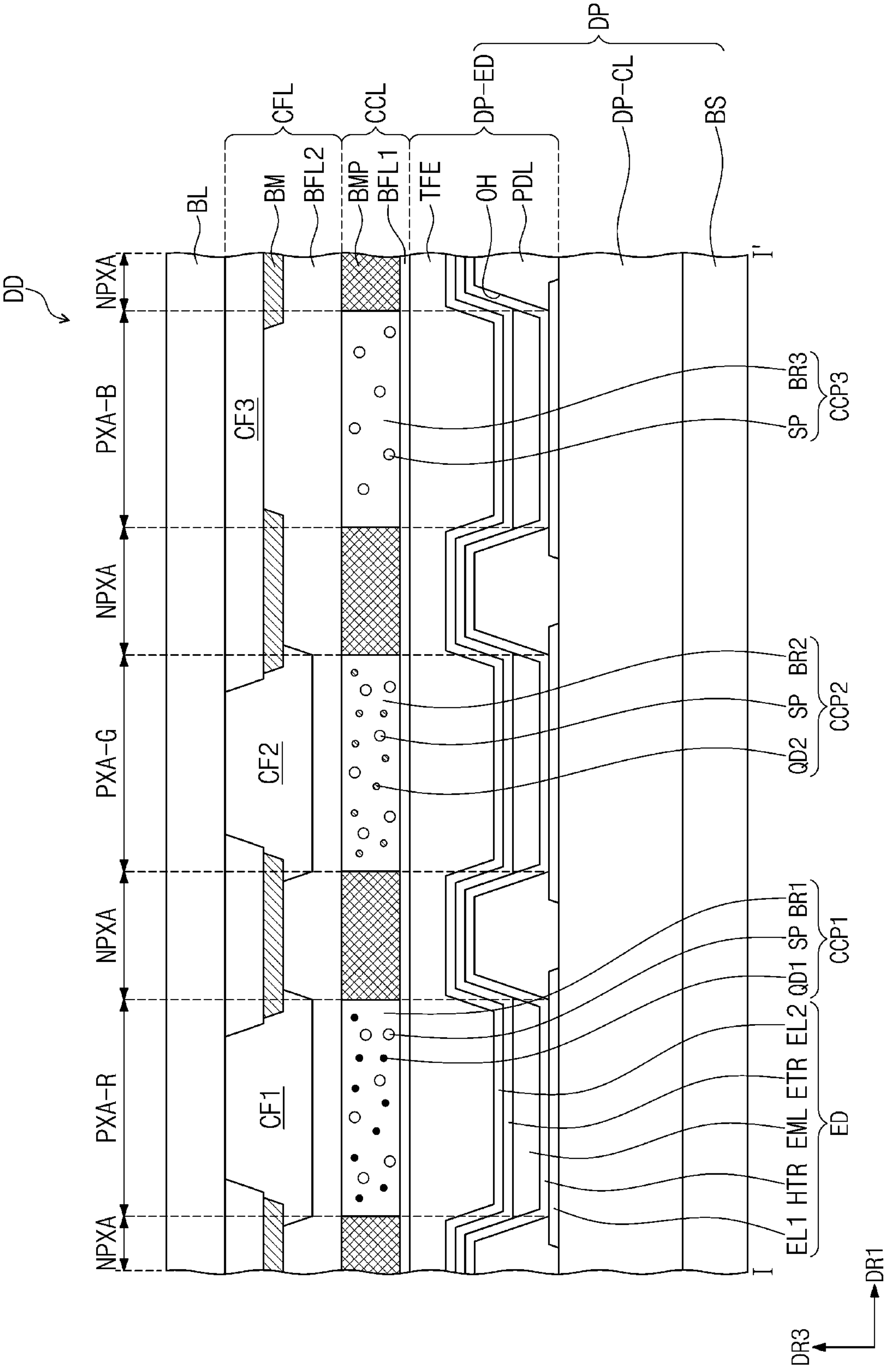
FIG. 7 is a schematic cross-sectional view illustrating a display device according to an embodiment.
Figure 8:
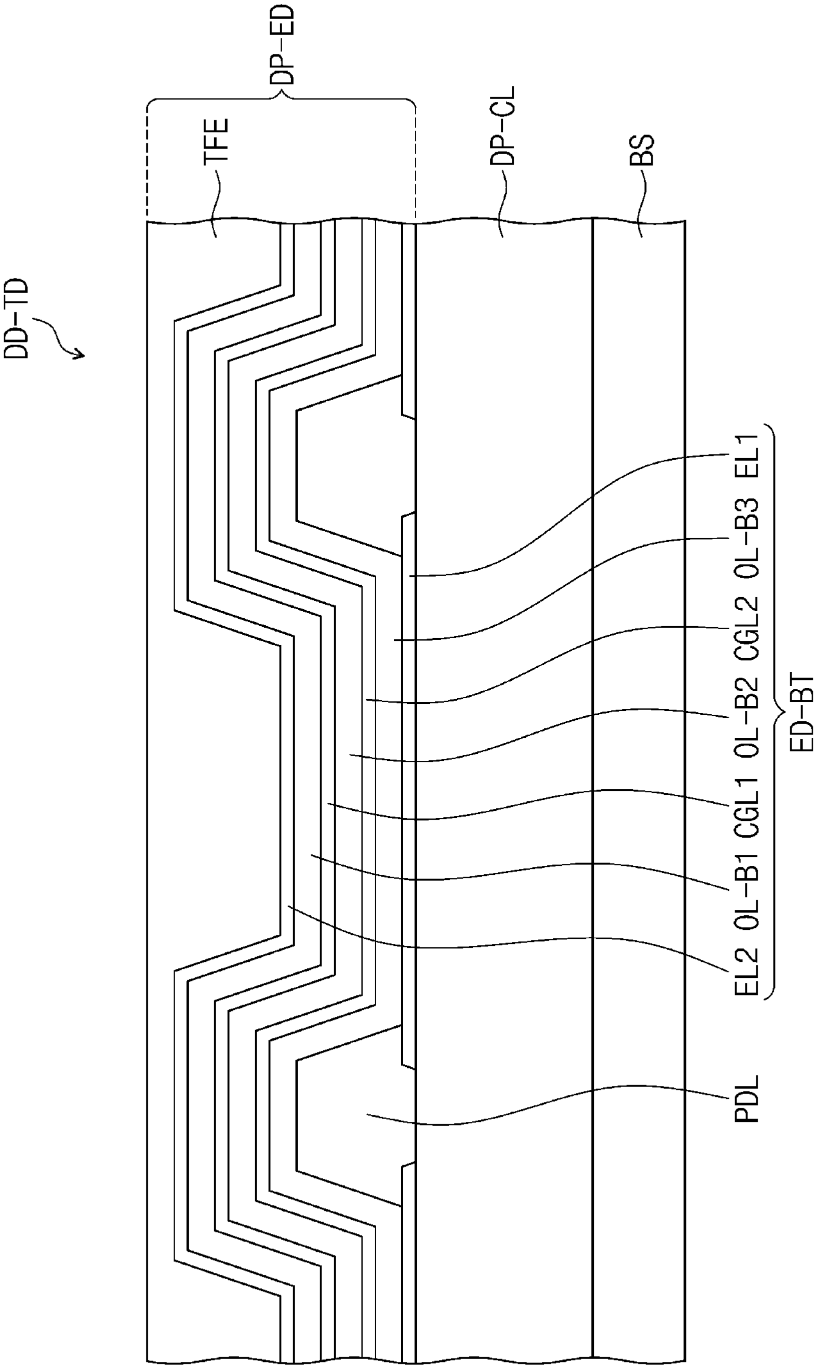
FIG. 8 is a schematic cross-sectional view illustrating a display device according to an embodiment.

FIGS. 7 and 8 are each a schematic cross-sectional view of a display device according to an embodiment. Hereinafter, in describing the display device of an embodiment with reference to FIGS. 7 and 8, the duplicated features which have been described in FIGS. 1 to 6 will not be described again, but their differing features will be described.

Referring to FIG. 7, the display device DD according to an embodiment may include a display panel DP including a display element layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and the display element layer DP-ED, and the display element layer DP-ED may include a light emitting element ED.

The light emitting element ED may include a first electrode EL1, a hole transport region HTR disposed on the first electrode EL1, an emission layer EML disposed on the hole transport region HTR, an electron transport region ETR disposed on the emission layer EIL, and a second electrode EL2 disposed on the electron transport region ETR. The structures of the light emitting elements of FIGS. 3 to 6 as described above may be applied to the structure of the light emitting element ED shown in FIG. 7.

Referring to FIG. 7, the emission layer EIL may be disposed in an opening OH defined in a pixel defining film PDL. For example, the emission layer EIL which is divided by the pixel defining film PDL and provided corresponding to each of the light emitting regions PXA-R, PXA-G, and PXA-B may emit light in a same wavelength range. In the display device DD of an embodiment, the emission layer EIL may emit blue light. Although not shown in the drawings, in an embodiment, the emission layer EIL may be provided as a common layer for all light emitting regions PXA-R, PXA-G, and PXA-B.

The light control layer CCL may be disposed on the display panel DP. The light control layer CCL may include a light conversion body. The light conversion body may include a quantum dot, a phosphor, or the like. The light conversion body may transform the wavelength of provided light and emit the converted light. For example, the light control layer CCL may be a layer containing the quantum dot or a layer containing the phosphor.

The light control layer CCL may include light control parts CCP1, CCP2, and CCP3. The light control parts CCP1, CCP2, and CCP3 may be spaced apart from one another.

Referring to FIG. 7, divided patterns BMP may be disposed between the light control parts CCP1, CCP2, and CCP3 which are spaced apart from each other, but embodiments are not limited thereto. FIG. 7 illustrates that the divided patterns BMP do not overlap the light control parts CCP1, CCP2, and CCP3, but in an embodiment, at least a portion of the edges of the light control parts CCP1, CCP2, and CCP3 may overlap the divided patterns BMP.

The light control layer CCL may include a first light control part CCP1 containing a first quantum dot QD1 which converts first color light provided from the light emitting element ED into second color light, a second light control part CCP2 containing a second quantum dot QD2 which converts the first color light into third color light, and a third light control part CCP3 which transmits the first color light.

In an embodiment, the first light control part CCP1 may provide red light that is the second color light, and the second light control part CCP2 may provide green light that is the third color light. The third light control part CCP3 may provide blue light by transmitting the blue light that is the first color light provided from the light emitting element ED. For example, the first quantum dot QD1 may be a red quantum dot, and the second quantum dot QD2 may be a green quantum dot. The same description above with respect to quantum dots may be applied to quantum dots QD1 and QD2.

The light control layer CCL may further include a scatterer SP. The first light control part CCP1 may include the first quantum dot QD1 and the scatterer SP, the second light control part CCP2 may include the second quantum dot QD2 and the scatterer SP, and the third light control part CCP3 may not include any quantum dot but include the scatterer SP.

The scatterer SP may be inorganic particles. For example, the scatterer SP may include at least one of $TiO_2$, ZnO, $Al_2O_3$, $SiO_2$, and hollow silica. The scatterer SP may include any one of $TiO_2$, ZnO, $Al_2O_3$, $SiO_2$, and hollow silica, or may be a mixture of at least two materials selected from among $TiO_2$, ZnO, $Al_2O_3$, $SiO_2$, and hollow silica.

The first light control part CCP1, the second light control part CCP2, and the third light control part CCP3 may each include base resins BR1, BR2, and BR3 in which the quantum dots QD1 and QD2 and the scatterer SP are dispersed. In an embodiment, the first light control part CCP1 may include the first quantum dot QD1 and the scatterer SP dispersed in a first base resin BR1, the second light control part CCP2 may include the second quantum dot QD2 and the scatterer SP dispersed in a second base resin BR2, and the third light control part CCP3 may include the scatterer SP dispersed in a third base resin BR3. The base resins BR1, BR2, and BR3 are media in which the quantum dots QD1 and QD2 and the scatterer SP are dispersed, and may be formed of various resin compositions, which may be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 each may be the same as or different from each other.

The light control layer CCL may include a barrier layer BFL1. The barrier layer BFL1 may prevent the penetration of moisture and/or oxygen (hereinafter, referred to as 'moisture/oxygen'). The barrier layer BFL1 may be disposed on the light control parts CCP1, CCP2, and CCP3 to block the light control parts CCP1, CCP2, and CCP3 from being exposed to moisture/oxygen. The barrier layer BFL1 may cover the light control parts CCP1, CCP2, and CCP3. The barrier layer BFL2 may be provided between the light control parts CCP1, CCP2, and CCP3 and a color filter layer CFL.

The barrier layers BFL1 and BFL2 may include at least one inorganic layer. For example, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. The barrier layers BFL1 and BFL2 may further include an organic film. The barrier layers BFL1 and BFL2 may be formed of a single layer or of multiple layers.

In the display device DD of an embodiment, the color filter layer CFL may be disposed on the light control layer CCL. For example, the color filter layer CFL may be directly disposed on the light control layer CCL. For example, in an embodiment, the barrier layer BFL2 may be omitted.

The color filter layer CFL may include a light shielding unit BM and filters CF1, CF2, and CF3. The color filter layer CFL may include a first filter CF1 that transmits the second color light, a second filter CF2 that transmits the third color light, and a third filter CF3 that transmits the first color light. For example, the first filter CF1 may be a red filter, the second filter CF2 may be a green filter, and the third filter CF3 may be a blue filter. The filters CF1, CF2, and CF3 each may include a polymeric photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

In an embodiment, the first filter CF1 and the second filter CF2 may each be a yellow filter. The first filter CF1 and the second filter CF2 may not be separated but be provided as one filter.

The light shielding unit BM may be a black matrix. The light shielding unit BM may include an organic light shielding material or an inorganic light shielding material containing a black pigment or dye. The light shielding unit BM may prevent light leakage, and may separate boundaries between the adjacent filters CF1, CF2, and CF3. In an embodiment, the light shielding unit BM may be formed of a blue filter.

The first to third filters CF1, CF2, and CF3 may be disposed corresponding to the red light emitting region PXA-R, the green light emitting region PXA-G, and the blue light emitting region PXA-B, respectively.

A base substrate BL may be disposed on the color filter layer CFL. The base substrate BL may provide a base surface on which the color filter layer CFL, the light control layer CCL, and the like are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

FIG. 8 is a schematic cross-sectional view illustrating a part of a display device according to an embodiment. FIG. 8 illustrates a schematic cross-sectional view of a part corresponding to the display panel DP of FIG. 7. In the display device DD-TD of an embodiment, the light emitting element ED-BT may include light emitting structures OL-B1, OL-B2, and OL-B3. The light emitting element ED-BT may include a first electrode EL1 and a second electrode EL2 which face each other, and the light emitting structures OL-B1, OL-B2, and OL-B3 which may be sequentially stacked in a thickness direction between the first electrode EL1 and the second electrode EL2. The light emitting structures OL-B1, OL-B2, and OL-B3 each may include an emission layer EML (FIG. 7) and a hole transport region HTR and an electron transport region ETR disposed with the emission layer EML (FIG. 7) therebetween.

For example, the light emitting element ED-BT included in the display device DD-TD of an embodiment may be a light emitting element having a tandem structure and including multiple emission layers.

In an embodiment illustrated in FIG. 8, all light respectively emitted from the light emitting structures OL-B1, OL-B2, and OL-B3 may be blue light. However, embodiments are not limited thereto, and the light respectively emitted from the light emitting structures OL-B1, OL-B2, and OL-B3 may have wavelength ranges that are different from each other. For example, the light emitting element ED-BT including the light emitting structures OL-B1, OL-B2, and OL-B3 which emit light having wavelength ranges different from each other may emit white light.

Charge generation layers CGL1 and CGL2 may be disposed between neighboring light emitting structures OL-B1, OL-B2, and OL-B3. The charge generation layers CGL1 and CGL2 may each independently include a p-type charge generation layer and/or an n-type charge generation layer.

Hereinafter, with reference to the Examples and the Comparative Examples, a compound according to an embodiment and a light emitting element of an embodiment will be described in detail. The Examples shown below are illustrated only for the understanding of the disclosure and the scope thereof is not limited thereto.

Examples

1. Synthesis of Nitrogen-Containing Compound of Example

A synthesis method of the nitrogen-containing compound according to the current embodiment will be described in detail by illustrating synthesis methods of Compounds 1, 3, 21, 28, 35, 42, 43, 44, 46, 48 and 60. In the following descriptions, a synthesis method of the nitrogen-containing compound is provided as an example, but embodiments are not limited to the following examples.

(1) Synthesis of Compound 1

Nitrogen-containing Compound 1 according to an example may be synthesized by, for example, the steps shown in Reaction Scheme 1-1 and Reaction Scheme 1-2 below:

<Synthesis of Intermediate Compound A>

Intermediate Compound A was synthesized by Reaction Scheme 1-1 below:

[Reaction Scheme 1-1]

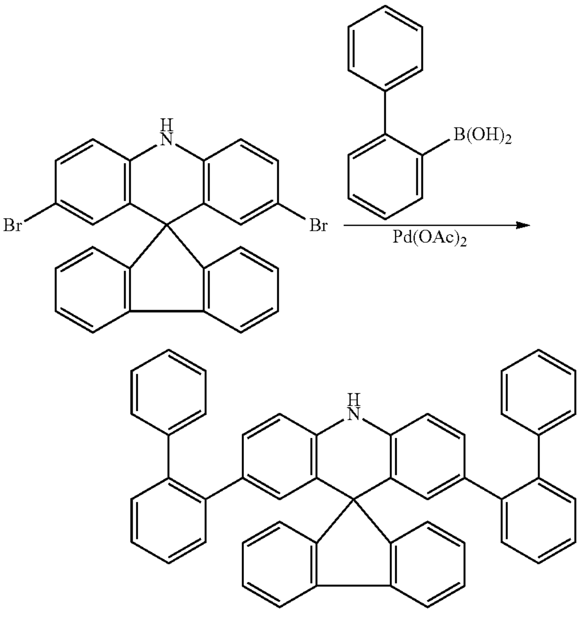

A

In an argon atmosphere, in a 1,000 mL three-neck flask, 2,7-dibromo-10H-spiro[acridine-9,9'-fluorene] (20.59 g, 42.1 mmol), 2-biphenylboronic acid (25.00 g, 126.2 mmol), $Pd(OAc)_2$ (0.95 g, 4.21 mmol), 2-dicyclohexylphosphino-2',6'-dimethoxybiphenyl (SPhos) (3.46 g, 8.42 mmol), $K_2CO_3$ (34.9 g, 252.5 mmol), dioxane (420 mL), and water (42 mL) were added and stirred at about 100° C. for about 10 hours. After the mixture was air-cooled, water was added to fractionate an organic layer, and the solvent was removed by distillation. The resulting crude product was purified by silica gel column chromatography to obtain Compound A which is a white solid (19.27 g, yield: 72%). The molecular weight of Compound A measured by FAB-MS measurement was 635.

<Synthesis of Compound 1>

Nitrogen-containing Compound 1 was synthesized by Reaction Scheme 1-2 below:

[Reaction Scheme 1-2]

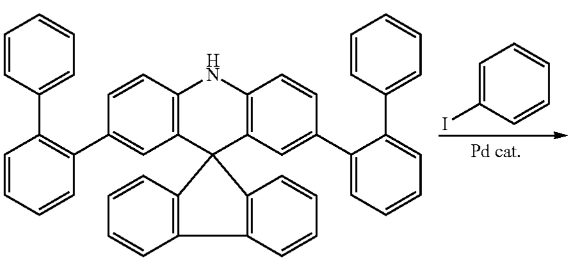

A

-continued

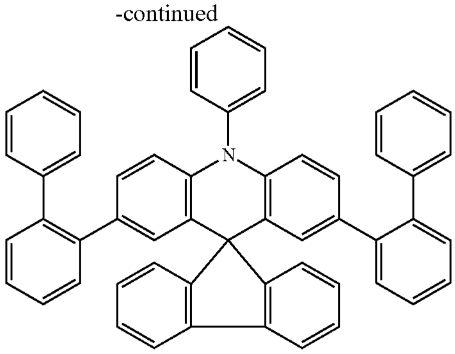

1

In an argon atmosphere, in a 100 mL three-neck flask, Compound A (6.43 g, 10.1 mmol), iodobenzene (1.4 mL, 12.2 mmol), $Pd(dba)_2$ (0.058 g, 0.10 mmol), $P(tBu)_3 \cdot HBF_4$ (0.117 g, 0.40 mmol), and NaOtBu (1.17 g, 12.1 mmol) were added and stirred in 50 mL of toluene solvent at about 100° C. for about 4 hours. After the mixture was air-cooled, water was added to fractionate an organic layer, and the solvent was removed by distillation. The resulting crude product was purified by silica gel column chromatography to obtain Compound 1 which is a white solid (6.26 g, yield: 87%). The molecular weight of Compound 1 measured by FAB-MS measurement was 711. Chemical Shifts δ of Compound 1 measured by $^1H$-NMR ($CDCl_3$) measurement were 7.72 (2H), 7.61-7.51 (5H), 7.28-7.16 (12H), 7.13-7.01 (8H), 6.98-6.91 (4H), 6.85 (2H), and 6.79-6.76 (4H).

(2) Synthesis of Compound 3

Nitrogen-containing Compound 3 according to an example may be synthesized by, for example, the steps shown in Reaction Scheme 2-1 to Reaction Scheme 2-3 below:

<Synthesis of Intermediate Compound D>

Intermediate Compound D was synthesized by Reaction Scheme 2-1 below:

[Reaction Scheme 2-1]

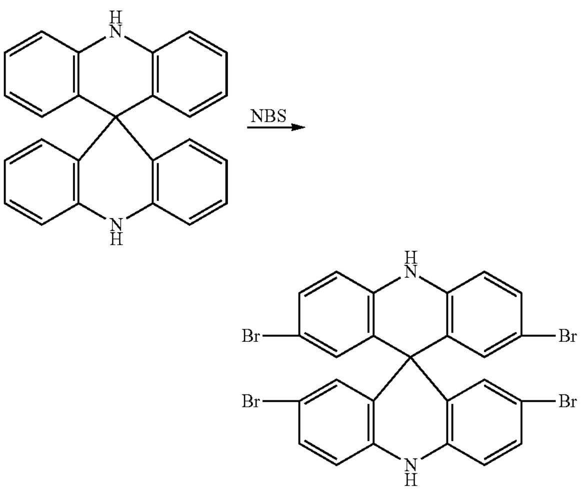

D

In a 300 mL round-bottom flask, 10H,10'H-9,9'-spirobi [acridine] (5.51 g, 15.9 mmol) and N-bromosuccinimide (NBS) (10.9 g, 66.8 mmol) were added and stirred in 160 mL of DMF solvent at room temperature for about 18 hours. After the reaction was completed, a $NaHCO_3$ aqueous solution and a $Na_2S_2O_4$ aqueous solution were added thereto and the resulting precipitation was filtered and obtained. The resulting crude product was purified by silica gel column chromatography to obtain Compound D which is a white solid (9.37 g, yield: 89%). The molecular weight of Compound D measured by FAB-MS measurement was 662.

<Synthesis of Intermediate Compound E>

Intermediate Compound E was synthesized by Reaction Scheme 2-2 below:

[Reaction Scheme 2-2]

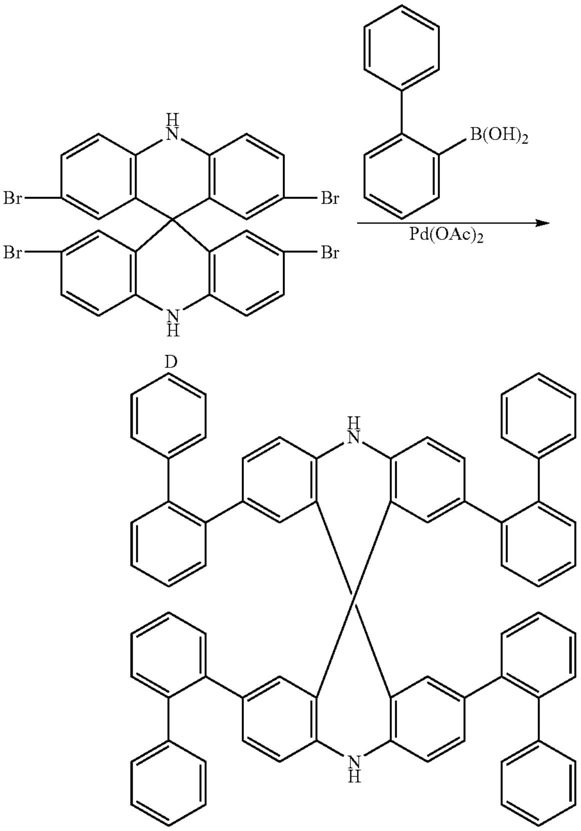

E

In an argon atmosphere, in a 1,000 mL three-neck flask, 2,7-dibromo-10H-spiro[acridine-9,9'-fluorene] (9.27 g, 14.0 mmol), 2-biphenylboronic acid (16.63 g, 84.0 mmol), $Pd(OAc)_2$ (0.63 g, 2.80 mmol), SPhos (2.30 g, 5.60 mmol), $K_2CO_3$ (23.2 g, 168.0 mmol), dioxane (280 mL), and water (28 mL) were added and stirred at about 100° C. for about 10 hours. After the mixture was air-cooled, water was added to fractionate an organic layer, and the solvent was removed by distillation. The resulting crude product was purified by silica gel column chromatography to obtain Compound E which is a white solid (6.29 g, yield: 47%). The molecular weight of Compound E measured by FAB-MS measurement was 955.

<Synthesis of Compound 3>

Nitrogen-containing Compound 3 was synthesized by Reaction Scheme 2-3 below:

[Reaction Scheme 2-3]

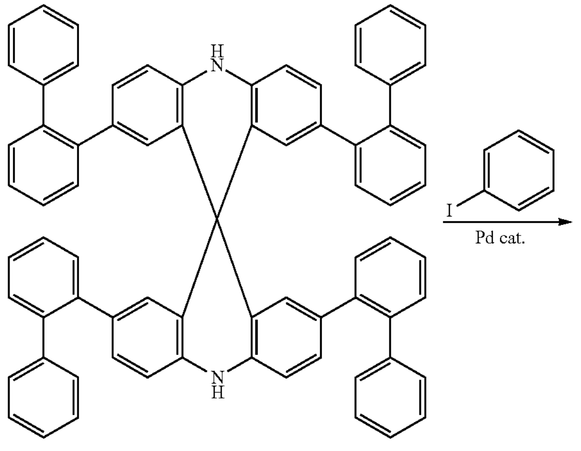

E

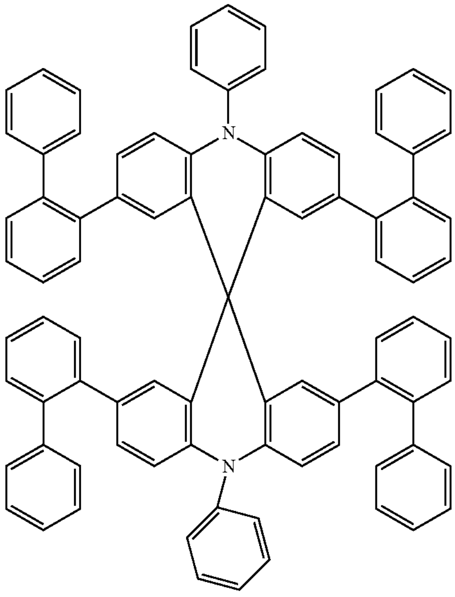

3

In an argon atmosphere, in a 100 mL three-neck flask, Compound E (4.87 g, 5.1 mmol), iodobenzene (1.4 mL, 12.2 mmol), $Pd(dba)_2$ (0.058 g, 0.10 mmol), $P(tBu)_3{\cdot}HBF_4$ (0.117 g, 0.40 mmol), and NaOtBu (1.17 g, 12.1 mmol) were added and stirred in 50 mL of toluene solvent at about 100° C. for about 4 hours. After the mixture was air-cooled, water was added to fractionate an organic layer, and the solvent was removed by distillation. The resulting crude product was purified by silica gel column chromatography to obtain Compound 3 which is a white solid (4.57 g, yield: 81%). The molecular weight of Compound 3 measured by FAB-MS measurement was 1107. Chemical Shifts δ of Compound 3 measured by $^1$H-NMR ($CDCl_3$) measurement were 7.61-7.74 (8H), 7.61-7.54 (12H), 7.42-7.38 (8H), 7.28-7.14 (4H), 7.04 (4H), and 6.90-6.78 (4H).

(3) Synthesis of Compound 21

Nitrogen-containing Compound 21 according to an example may be synthesized by, for example, the steps shown in Reaction Scheme 3-1 and Reaction Scheme 3-2 below:

<Synthesis of Intermediate Compound C>

Intermediate Compound C was synthesized by Reaction Scheme 3-1 below:

[Reaction Scheme 3-1]

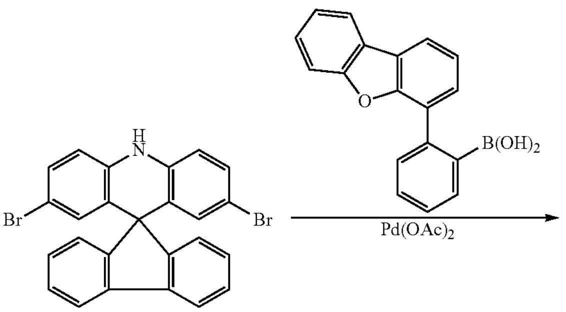

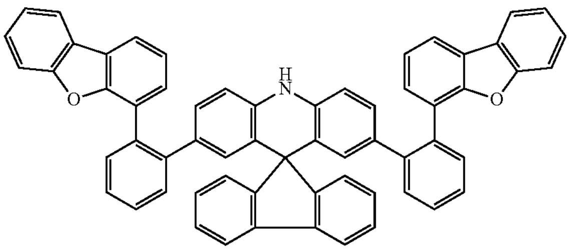

C

In an argon atmosphere, in a 500 mL three-neck flask, 2,7-dibromo-10H-spiro[acridine-9,9'-fluorene] (10.29 g, 21.0 mmol), 2-biphenylboronic acid (15.13 g, 52.5 mmol), $Pd(OAc)_2$ (0.47 g, 2.10 mmol), SPhos (1.73 g, 4.20 mmol), $K_2CO_3$ (17.4 g, 126.0 mmol), dioxane (210 mL), and water (21 mL) were added and stirred at about 100° C. for about 10 hours. After the mixture was air-cooled, water was added to fractionate an organic layer, and the solvent was removed by distillation. The resulting crude product was purified by silica gel column chromatography to obtain Compound C which is a white solid (8.57 g, yield: 50%). The molecular weight of Compound C measured by FAB-MS measurement was 815.

<Synthesis of Compound 21>

Nitrogen-containing Compound 21 was synthesized by Reaction Scheme 3-2 below:

[Reaction Scheme 3-2]

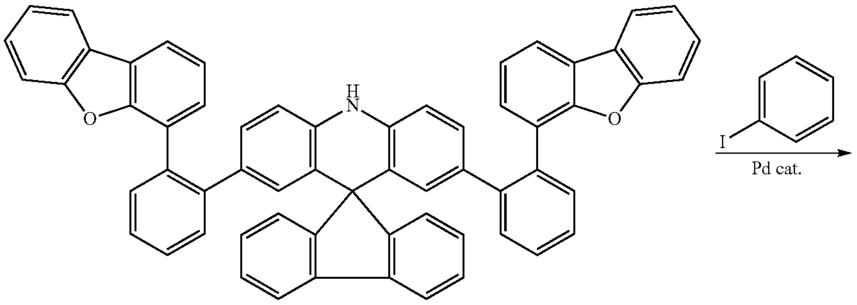

C

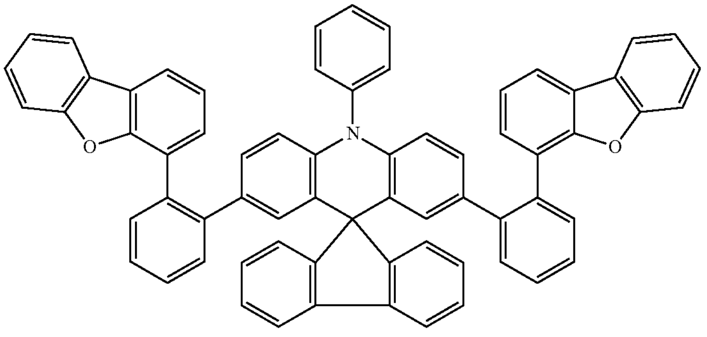

21

In an argon atmosphere, in a 100 mL three-neck flask, Compound C (8.23 g, 10.1 mmol), iodobenzene (1.4 mL, 12.2 mmol), $Pd(dba)_2$ (0.058 g, 0.10 mmol), $P(tBu)_3 \cdot HBF_4$ (0.117 g, 0.40 mmol), and NaOtBu (1.17 g, 12.1 mmol) were added and stirred in 50 mL of toluene solvent at about 100° C. for about 4 hours. After the mixture was air-cooled, water was added to fractionate an organic layer, and the solvent was removed by distillation. The resulting crude product was purified by silica gel column chromatography to obtain Compound 21 which is a white solid (8.29 g, yield: 92%). The molecular weight of Compound 21 measured by FAB-MS measurement was 892. Chemical Shifts δ of Compound 21 measured by $^1H$-NMR ($CDCl_3$) measurement were 7.90-7.68 (12H), 7.56 (2H), 7.37-7.02 (24H), and 6.90-6.78 (3H).

(4) Synthesis of Compound 28

Nitrogen-containing Compound 28 according to an example may be synthesized by, for example, the steps shown in Reaction Scheme 4 below:

[Reaction Scheme 4]

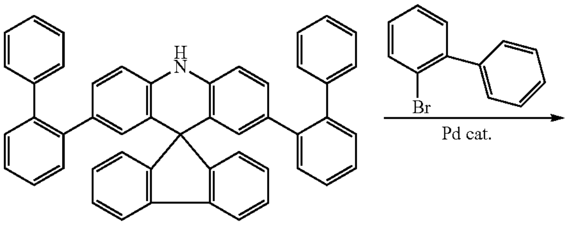

A

-continued

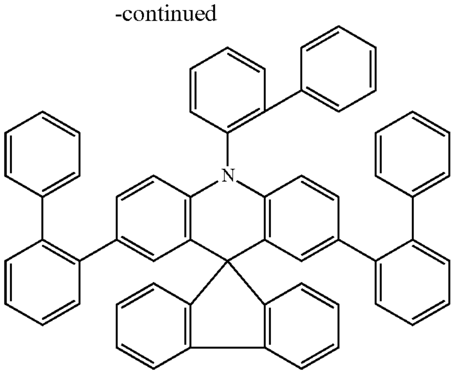

28

In an argon atmosphere, in a 100 mL three-neck flask, Compound A (6.43 g, 10.1 mmol), 2-bromobiphenyl (2.59 g, 11.1 mmol), $Pd(dba)_2$ (0.058 g, 0.10 mmol), $P(tBu)_3 \cdot HBF_4$ (0.117 g, 0.40 mmol), and NaOtBu (1.17 g, 12.1 mmol) were added and stirred in 50 mL of toluene solvent at about 110° C. for about 8 hours. After the mixture was air-cooled, water was added to fractionate an organic layer, and the solvent was removed by distillation. The resulting crude product was purified by silica gel column chromatography to obtain Compound 28 which is a white solid (4.62 g, yield: 58%). The molecular weight of Compound 28 measured by FAB-MS measurement was 788. Chemical Shifts δ of Compound 28 measured by $^1H$-NMR ($CDCl_3$) measurement were 7.90 (1H), 7.78-7.68 (6H), 7.61-7.54 (6H), 7.42-7.06 (25H), and 6.96-6.86 (3H).

(5) Synthesis of Compound 35

Nitrogen-containing Compound 35 according to an example may be synthesized by, for example, the steps shown in Reaction Scheme 5 below:

[Reaction Scheme 5]

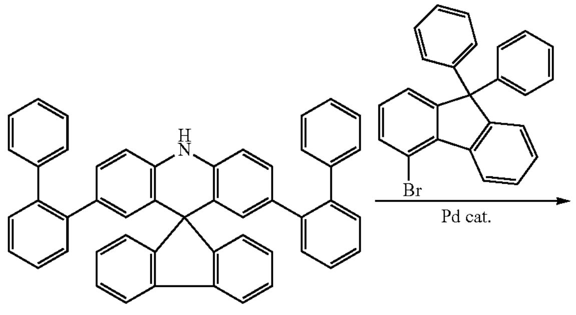

A

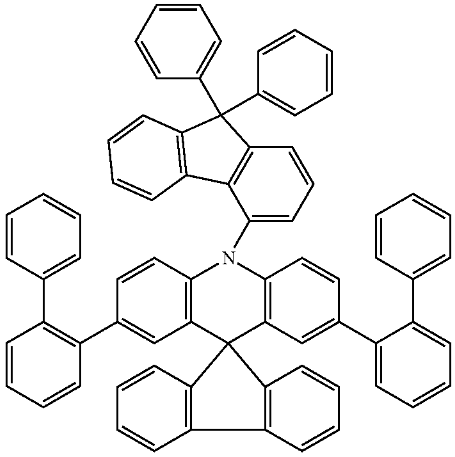

35

In an argon atmosphere, in a 100 mL three-neck flask, Compound A (6.43 g, 10.1 mmol), 4-bromo-9,9-diphenyl-9H-fluorene (4.41 g, 11.1 mmol), $Pd(dba)_2$ (0.058 g, 0.10 mmol), $P(tBu)_3 \cdot HBF_4$ (0.117 g, 0.40 mmol), and NaOtBu (1.17 g, 12.1 mmol) were added and stirred in 50 mL of toluene solvent at about 110° C. for about 8 hours. After the mixture was air-cooled, water was added to fractionate an organic layer, and the solvent was removed by distillation. The resulting crude product was purified by silica gel column chromatography to obtain Compound 35 which is a white solid (6.06 g, yield: 63%). The molecular weight of Compound 35 measured by FAB-MS measurement was 952. Chemical Shifts δ of Compound 35 measured by $^1$H-NMR ($CDCl_3$) measurement were 7.78-7.68 (7H), 7.61-7.54 (6H), and 7.42-6.88 (36H).

(6) Synthesis of Compound 42

Nitrogen-containing Compound 42 according to an example may be synthesized by, for example, the steps shown in Reaction Scheme 6 below:

[Reaction Scheme 6]

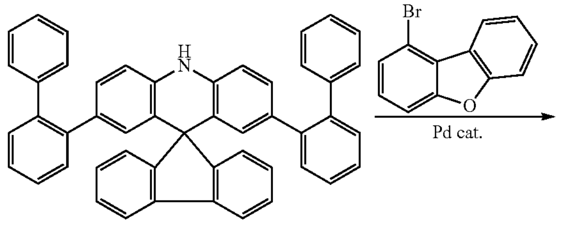

A

-continued

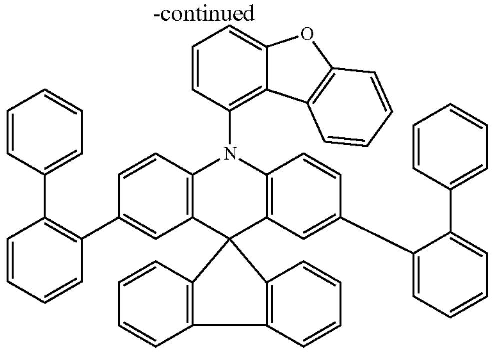

42

In an argon atmosphere, in a 100 mL three-neck flask, Compound A (6.43 g, 10.1 mmol), 1-bromodibenzofuran (2.74 g, 11.1 mmol), $Pd(dba)_2$ (0.058 g, 0.10 mmol), $P(tBu)_3 \cdot HBF_4$ (0.117 g, 0.40 mmol), and NaOtBu (1.17 g, 12.1 mmol) were added and stirred in 50 mL of toluene solvent at about 110° C. for about 8 hours. After the mixture was air-cooled, water was added to fractionate an organic layer, and the solvent was removed by distillation. The resulting crude product was purified by silica gel column chromatography to obtain Compound 42 which is a white solid (6.39 g, yield: 79%). The molecular weight of Compound 42 measured by FAB-MS measurement was 801. Chemical Shifts δ of Compound 42 measured by $^1$H-NMR ($CDCl_3$) measurement were 7.80-7.68 (7H), 7.61-7.54 (6H), 7.42-7.03 (25H), and 6.71 (1H).

(7) Synthesis of Compound 43

Nitrogen-containing Compound 43 according to an example may be synthesized by, for example, the steps shown in Reaction Scheme 7 below:

[Reaction Scheme 7]

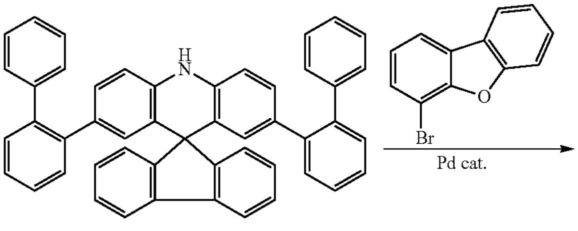

A

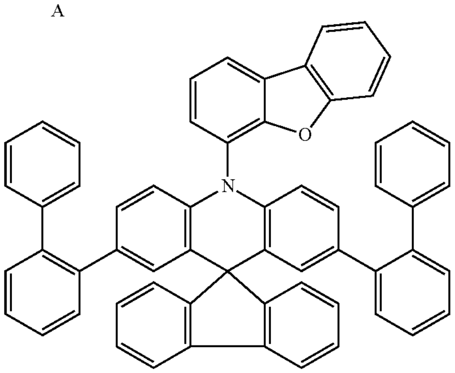

43

In an argon atmosphere, in a 100 mL three-neck flask, Compound A (6.43 g, 10.1 mmol), 4-bromodibenzofuran (2.74 g, 11.1 mmol), $Pd(dba)_2$ (0.058 g, 0.10 mmol), P(tBu)

$_3$·$HBF_4$ (0.117 g, 0.40 mmol), and NaOtBu (1.17 g, 12.1 mmol) were added and stirred in 50 mL of toluene solvent at about 110° C. for about 8 hours. After the mixture was air-cooled, water was added to fractionate an organic layer, and the solvent was removed by distillation. The resulting crude product was purified by silica gel column chromatography to obtain Compound 43 which is a white solid (6.64 g, yield: 82%). The molecular weight of Compound 43 measured by FAB-MS measurement was 801. Chemical Shifts δ of Compound 43 measured by $^1$H-NMR ($CDCl_3$) measurement were 8.17 (1H), 8.08 (1H), 7.72-7.50 (7H), 7.43 (1H), 7.30-7.10 (16H), 7.07-6.91 (7H), and 6.84-6.77 (6H).

(8) Synthesis of Compound 44

Nitrogen-containing Compound 44 according to an example may be synthesized by, for example, the steps shown in Reaction Scheme 8 below:

[Reaction Scheme 8]

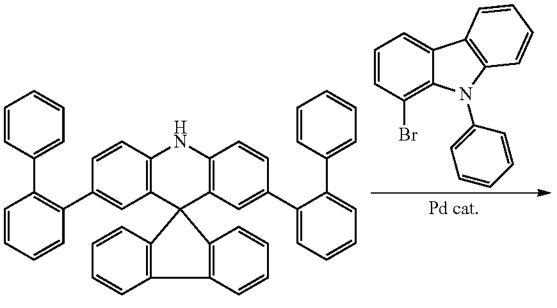

A

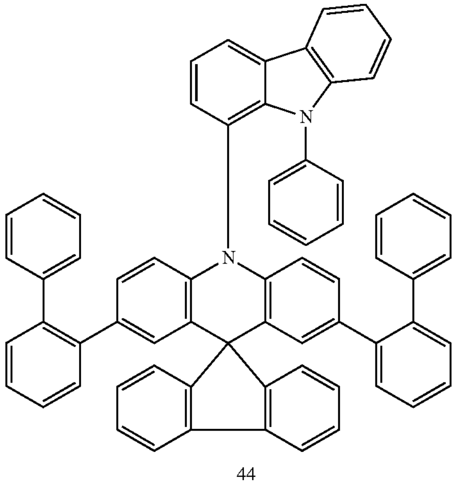

44

In an argon atmosphere, in a 100 mL three-neck flask, Compound A (6.43 g, 10.1 mmol), 1-bromo-9-phenyl-9H-carbazole (3.58 g, 11.1 mmol), $Pd(dba)_2$ (0.058 g, 0.10 mmol), $P(tBu)_3$·$HBF_4$ (0.117 g, 0.40 mmol), and NaOtBu (1.17 g, 12.1 mmol) were added and stirred in 50 mL of toluene solvent at about 110° C. for about 8 hours. After the mixture was air-cooled, water was added to fractionate an organic layer, and the solvent was removed by distillation. The resulting crude product was purified by silica gel column chromatography to obtain Compound 44 which is a white solid (6.11 g, yield: 69%). The molecular weight of Compound 44 measured by FAB-MS measurement was 877. Chemical Shifts δ of Compound 44 measured by $^1$H-NMR ($CDCl_3$) measurement were 8.03-7.97 (2H), 7.78-7.68 (6H), 7.61-7.54 (6H), 7.44-6.98 (28H), 6.28 (1H), and 6.02 (1H).

(9) Synthesis of Compound 46

Nitrogen-containing Compound 46 according to an example may be synthesized by, for example, the steps shown in Reaction Scheme 9 below:

[Reaction Scheme 9]

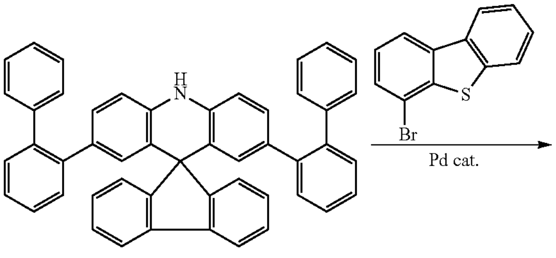

A

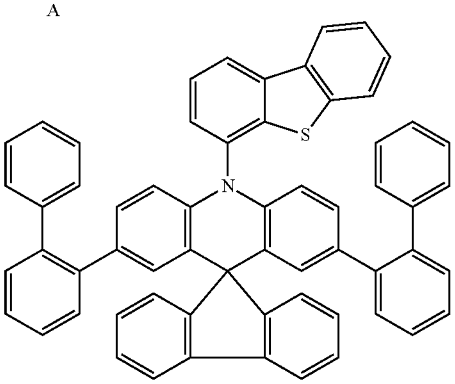

46

In an argon atmosphere, in a 100 mL three-neck flask, Compound A (6.43 g, 10.1 mmol), 4-bromodibenzothiophene (2.92 g, 11.1 mmol), $Pd(dba)_2$ (0.058 g, 0.10 mmol), $P(tBu)_3$·$HBF_4$ (0.117 g, 0.40 mmol), and NaOtBu (1.17 g, 12.1 mmol) were added and stirred in 50 mL of toluene solvent at about 110° C. for about 8 hours. After the mixture was air-cooled, water was added to fractionate an organic layer, and the solvent was removed by distillation. The resulting crude product was purified by silica gel column chromatography to obtain Compound 46 which is a white solid (5.87 g, yield: 71%). The molecular weight of Compound 46 measured by FAB-MS measurement was 818. Chemical Shifts δ of Compound 46 measured by $^1$H-NMR ($CDCl_3$) measurement were 8.25 (1H), 7.91 (1H), 7.78-7.68 (7H), 7.61-7.54 (6H), and 7.42-7.06 (24H).

(10) Synthesis of Compound 48

Nitrogen-containing Compound 48 according to an example may be synthesized by, for example, the steps shown in Reaction Scheme 10 below:

[Reaction Scheme 10]

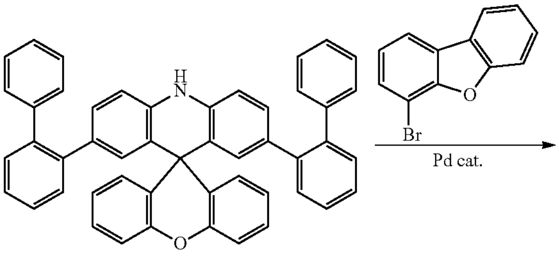

-continued

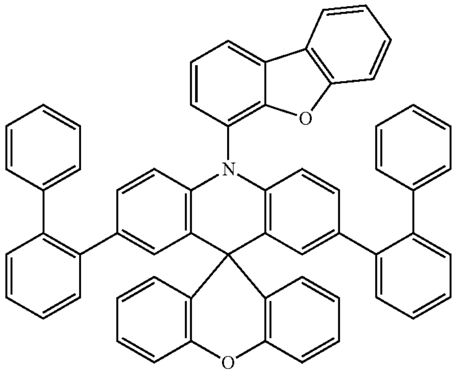

48

In an argon atmosphere, in a 100 mL three-neck flask, 2,7-di([1,1'-biphenyl]-2-yl)-10H-spiro[acridine-9,9'-xanthene] 6.58 g (10.1 mmol), 4-bromodibenzofuran 2.74 g (11.1 mmol), $Pd(dba)_2$ 0.058 g (0.10 mmol), $P(tBu)_3$·$HBF_4$ 0.117 g (0.40 mmol), and NaOtBu 1.17 g (12.1 mmol) were added and stirred in 50 mL of toluene solvent at about 110° C. for about 8 hours. After the mixture was air-cooled, water was added to fractionate an organic layer, and the solvent was removed by distillation. The resulting crude product was purified by silica gel column chromatography to obtain Compound 48 which is a white solid (6.69 g, yield: 81%). The molecular weight of Compound 48 measured by FAB-MS measurement was 817. Chemical Shifts δ of Compound 48 measured by $^1$H-NMR ($CDCl_3$) measurement were 7.80-7.74 (5H), 7.61-7.54 (6H), 7.46-7.06 (21H), 6.99-6.92 (4H), and 6.83-6.75 (3H).

(11) Synthesis of Compound 60

Nitrogen-containing Compound 60 according to an example may be synthesized by, for example, the steps shown in Reaction Scheme 11-1 and Reaction Scheme 11-2 below:

<Synthesis of Intermediate Compound B>

Intermediate Compound B was synthesized by Reaction Scheme 11-1 below:

[Reaction Scheme 11-1]

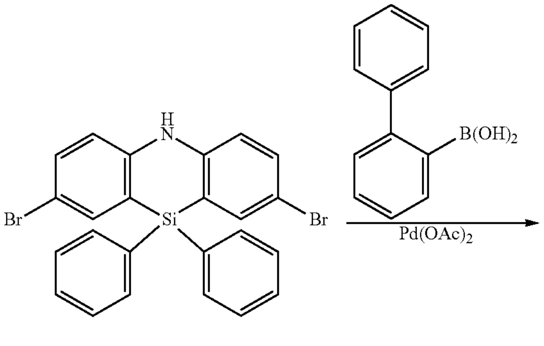

-continued

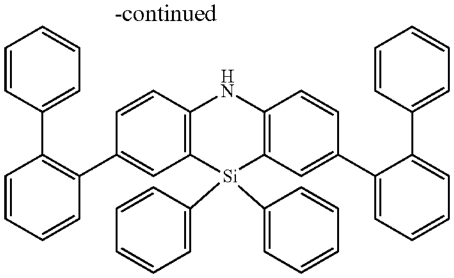

B

In an argon atmosphere, in a 500 mL three-neck flask, 2,8-dibromo-10,10-diphenyl-5,10-dihydrodibenzo[b,e][1,4]azasiline (10.68 g, 21.0 mmol), 2-biphenylboronic acid (12.5 g, 63.0 mmol), $Pd(OAc)_2$ (0.47 g, 2.10 mmol), SPhos (1.73 g, 4.20 mmol), $K_2CO_3$ (17.4 g, 126.0 mmol), dioxane (210 mL), and water (21 mL) were added and stirred at about 100° C. for about 10 hours. After the mixture was air-cooled, water was added to fractionate an organic layer, and the solvent was removed by distillation. The resulting crude product was purified by silica gel column chromatography to obtain Compound B which is a white solid (7.16 g, yield: 52%). The molecular weight of Compound B measured by FAB-MS measurement was 653.

<Synthesis of Compound 60>

Nitrogen-containing Compound 60 was synthesized by Reaction Scheme 11-2 below:

[Reaction Scheme11-2]

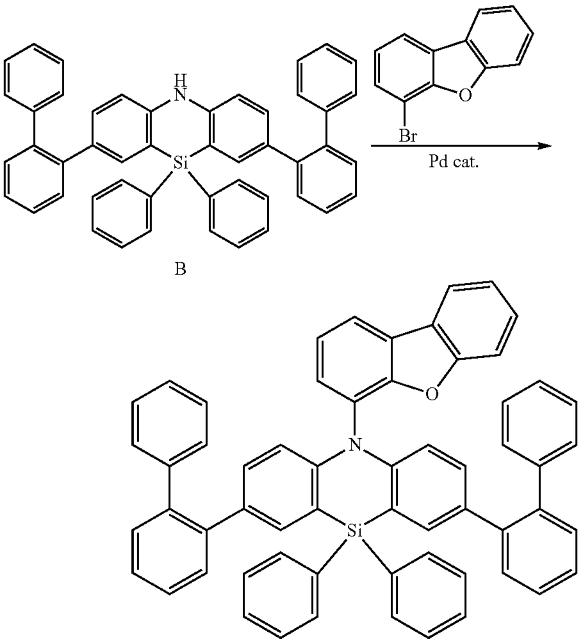

B

60

In an argon atmosphere, in a 100 mL three-neck flask, Compound B (6.61 g, 10.1 mmol), 4-bromodibenzofuran (2.74 g, 11.1 mmol), $Pd(dba)_2$ (0.058 g, 0.10 mmol), $P(tBu)_3$·$HBF_4$ (0.117 g, 0.40 mmol), and NaOtBu (1.17 g, 12.1 mmol) were added and stirred in 50 mL of toluene solvent at about 100° C. for about 15 hours. After the mixture was air-cooled, water was added to fractionate an organic layer, and the solvent was removed by distillation. The resulting crude product was purified by silica gel column chromatography to obtain Compound 60 which is a white solid (4.06 g, yield: 49%). The molecular weight of Compound 60 measured by FAB-MS measurement was 820. Chemical Shifts δ of Compound 60 measured by $^1$H-NMR ($CDCl_3$) measurement were 7.80-7.74 (5H), 7.66-7.57 (6H), 7.46-7.06 (29H), and 6.77 (1H).

2. Evaluation of Energy Level of Compounds

Table 2 below shows the evaluation of the lowest triplet excitation energy level (T1 level) of Example Compounds and Comparative Example Compounds. Example Compounds are Compounds 1, 3, 21, 28, 35, 42, 43, 44, 46, 48, and 60, and Comparative Example Compounds are mCP and Comparative Example Compounds C1 to C11. Example Compounds and Comparative Example Compounds are listed in Table 1.

The value of the energy level in Table 2 was calculated by a non-empirical molecular orbital method, which is with B3LYP/6-31G(d) using Gaussian 09 from Gaussian, Inc. (Wallingford, CT, USA).

TABLE 1

Compound 1

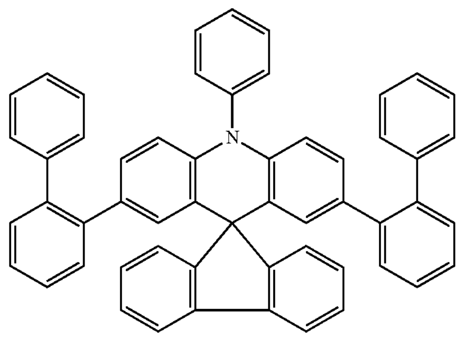

1

Compound 3

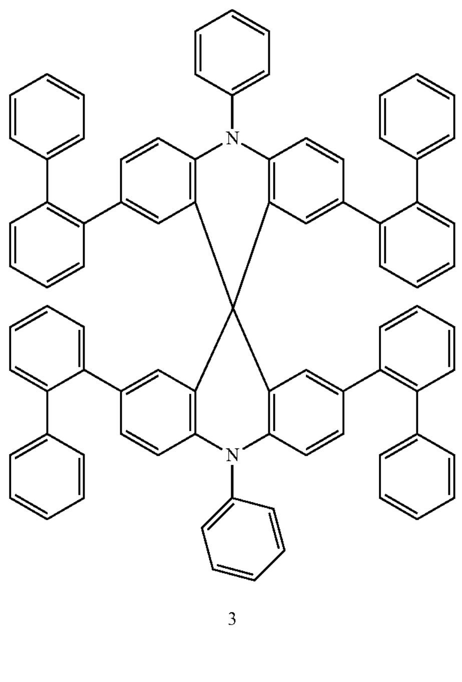 [SMILES: c1ccc(-c2ccccc2-c2ccc3c(c2)C2(c4cc(-c5ccccc5-c5ccccc5)ccc4N3c3ccccc3)c3cc(-c4ccccc4-c4ccccc4)ccc3N(c3ccccc3)c3ccc(-c4ccccc4-c4ccccc4)cc32)cc1]

3

TABLE 1-continued
Compound 21
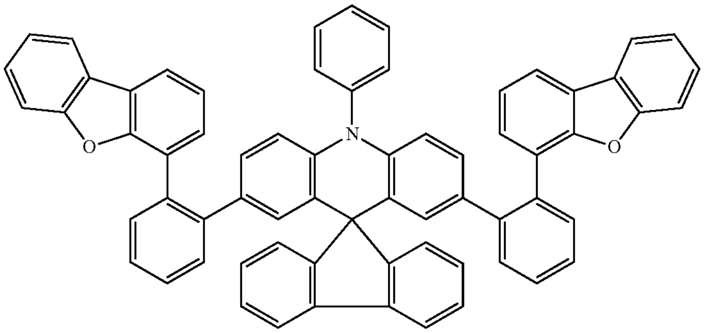
21
Compound 28
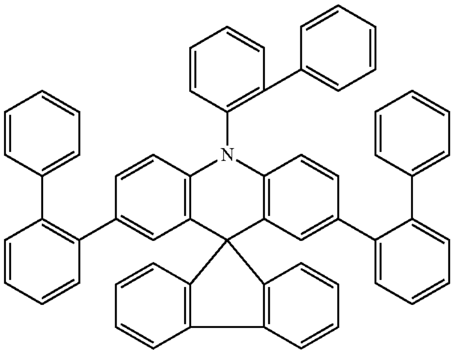
28
Compound 35
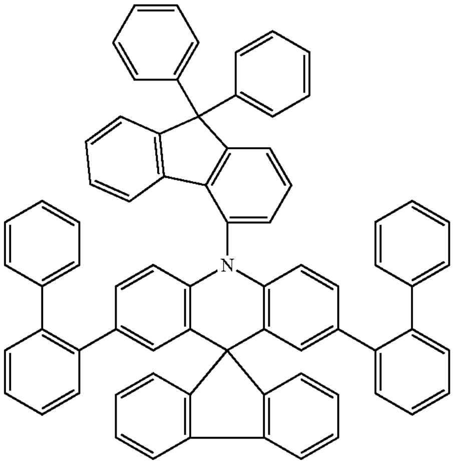
35

TABLE 1-continued
Compound 42
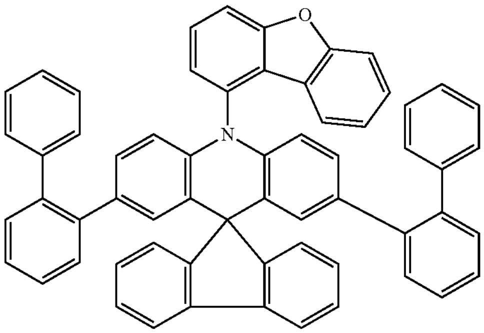
42
Compound 43
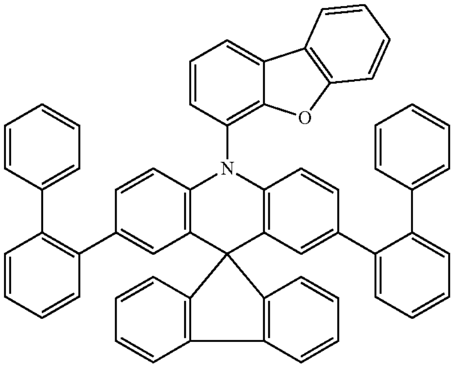
43
Compound 44
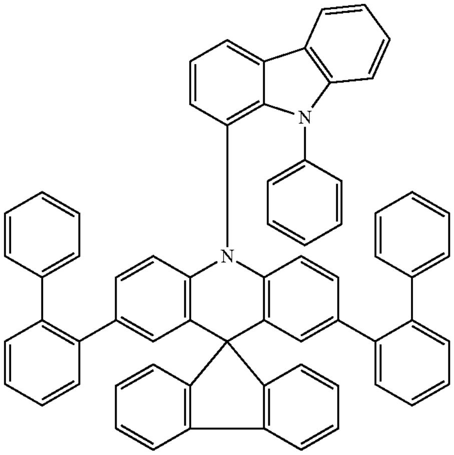
44

TABLE 1-continued
| | |
|---|---|
| Compound 46 | 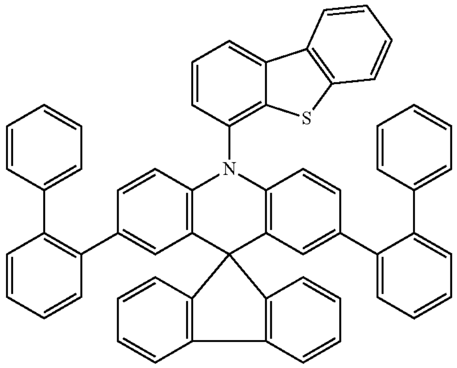 46 |
| Compound 48 | 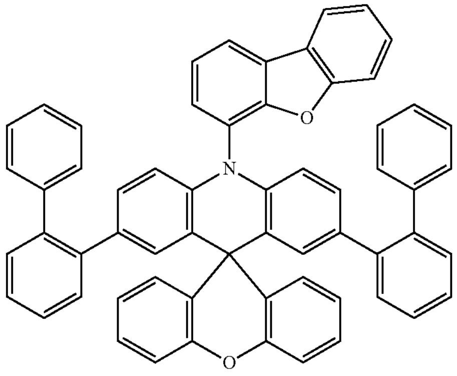 48 |
| Compound 60 | 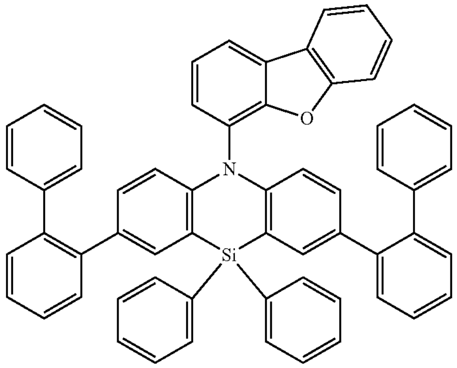 60 |
| Comparative Example Compond C1 | 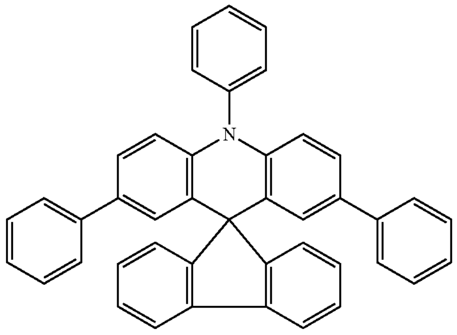 C1 |

TABLE 1-continued
| | |
|---|---|
| Comparative Example Compound C2 | 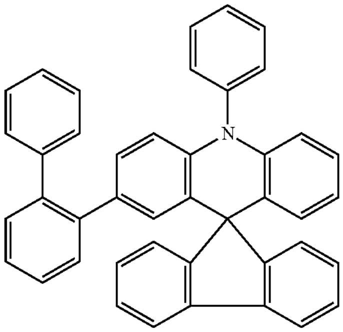 C2 |
| Comparative Example Compound C3 | 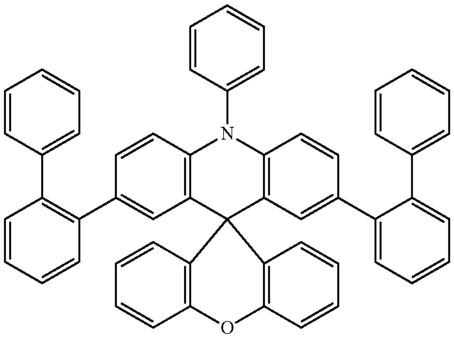 C3 |
| Comparative Example Compound C4 | 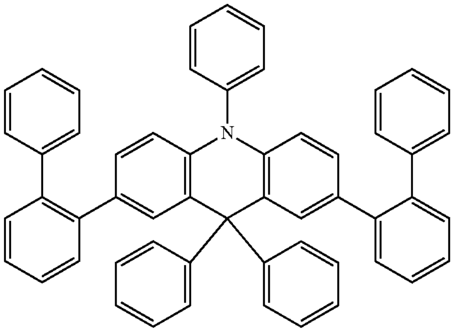 C4 |
| Comparative Example Compound C5 | 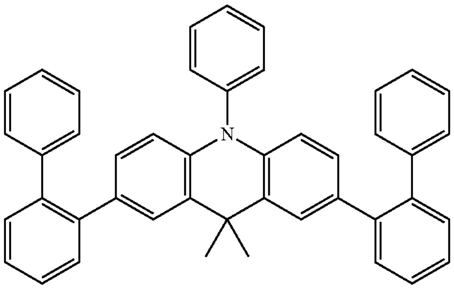 C5 |

TABLE 1-continued
| | |
|---|---|
| Comparative Example Compound C6 | 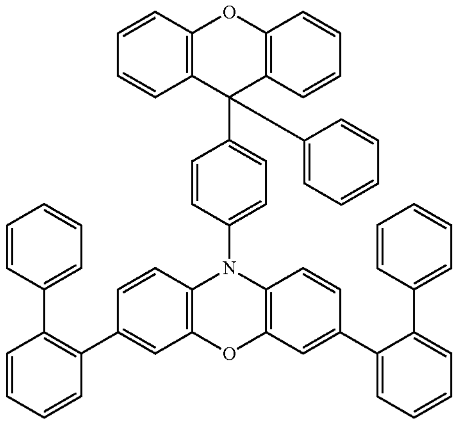 C6 |
| Comparative Example Compound C7 | 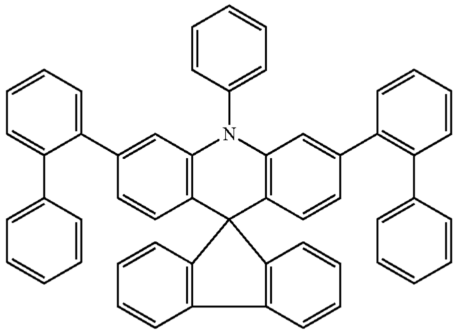 C7 |
| Comparative Example Compound C8 | 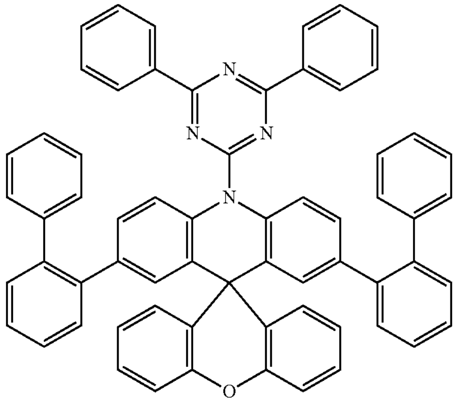 C8 |

TABLE 1-continued
| | |
|---|---|
| Comparative Example Compound C9 | 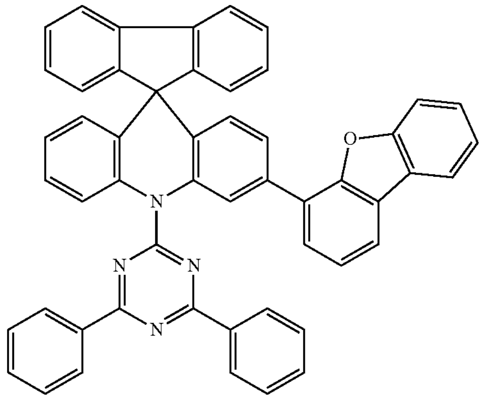 C9 |
| Comparative Example Compound C10 | 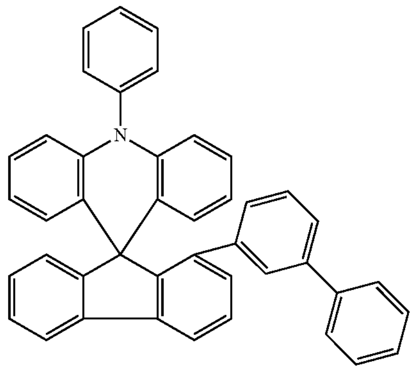 C10 |
| Comparative Example Compound C11 | 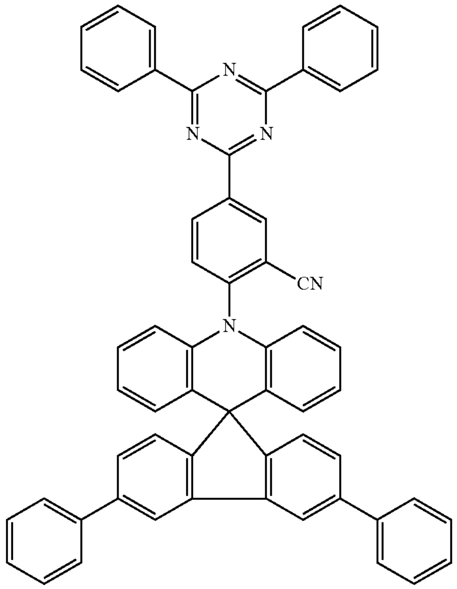 C11 |

TABLE 2

| Compounds | T1 level (eV) |
|---|---|
| Compound 1 | 2.95 |
| Compound 3 | 2.83 |
| Compound 21 | 2.93 |
| Compound 28 | 2.98 |
| Compound 35 | 2.94 |
| Compound 42 | 2.97 |
| Compound 43 | 2.94 |
| Compound 44 | 2.92 |
| Compound 46 | 2.99 |
| Compound 48 | 2.92 |
| Compound 60 | 2.96 |
| mCP | 3.18 |
| Comparative Example Compound C1 | 2.83 |
| Comparative Example Compound C2 | 3.01 |
| Comparative Example Compound C3 | 2.91 |
| Comparative Example Compound C4 | 3.04 |
| Comparative Example Compound C5 | 2.86 |
| Comparative Example Compound C6 | 2.57 |
| Comparative Example Compound C7 | 3.00 |
| Comparative Example Compound C8 | 3.05 |
| Comparative Example Compound C9 | 2.98 |
| Comparative Example Compound C10 | 3.01 |
| Comparative Example Compound C11 | 2.17 |

Referring to Table 2, it may be seen that Compounds 1, 21, 28, 35, 42, 43, 44, 46, 48, and 60 which are compounds of examples exhibit a lowest triplet excitation energy level (Ti level) of about 2.9 eV to about 3.0 eV. It is believed that the lowest triplet excitation energy level of Compound 3 is a little lower than 2.9 eV, but the symmetry of the compound is high, and thus substantial lowest triplet excitation energy level is improved.

It may be seen that Comparative Example Compounds C1 to C5 and C7 to C10 exhibit a lowest triplet excitation energy level (T1 level) of about 2.8 eV to about 3.1 eV. It may be seen that Comparative Example Compounds C6 and C11 exhibit lowest triplet exciton energy levels lower than those of Comparative Example Compounds C1 to C5 and C7 to C10.

3. Manufacture and Evaluation of Light Emitting Element (1) Manufacture of Light Emitting Elements Light emitting elements including nitrogen-containing compounds of examples or Comparative Example Compounds in the electron blocking layers were manufactured as follows. Compound 1, Compound 3, Compound 21, Compound 28, Compound 35, Compound 42, Compound 43, Compound 44, Compound 46, Compound 48, and Compound 60 which are nitrogen-containing compounds of examples were used as a dopant material of an electron blocking layer to manufacture the light emitting elements of Examples 1 to 11, respectively. An electron blocking layer was manufactured with mCP in the light emitting element of Comparative Example 1. Comparative Example Compound C2 to Comparative Example Compound C12 were used in a hole transport layer to manufacture the light emitting elements of Comparative Examples 2 to 12, respectively.

A 1,500 Å-thick ITO was patterned on a glass substrate, the glass substrate was washed with ultrapure water, irradiated with ultraviolet rays for about 30 minutes, and treated with ozone. HAT-CN was deposited to a thickness of about 100 Å, NPB was deposited to a thickness of about 400 Å, and Example Compound or Comparative Example Compound was deposited to a thickness of about 50 Å to form a hole transport region.

FIrpic and mCBP were co-deposited at a ratio of 8:92 to form a 200 Å-thick emission layer. On the emission layer, a 100 Å-thick layer was formed with BmPyPhB, a 300 Å-thick layer was formed with TPBi, and a 20 Å-thick layer was formed with Liq to form an electron transport region. A 1,200 Å-thick second electrode was formed with aluminum (Al). In the Examples, the hole transport region, the emission layer, the electron transport region, and the second electrode were formed using a vacuum deposition apparatus.

(2) Evaluation of Light Emitting Elements

Luminous efficiencies and service lives of the light emitting elements of Examples and Comparative Examples are shown in Table 3 below. In Table 3, the luminous efficiencies and service lives are relative values, which are represented for comparison when it is assumed that each of the luminous efficiency and service life of the light emitting element of Comparative Example 1 is 100%. The luminous efficiency shows, for comparison, a luminous efficiency value with respect to a current density of 10 $mA/cm^2$. The element service life shows, for comparison, a time taken to reduce an initial brightness of 100 $cd/m^2$ by half.

TABLE 3

| Examples of manufactured devices | Electron blocking layer | Maximum luminous Efficiency | Service life |
|---|---|---|---|
| Example 1 | Compound 1 | 120% | 160% |
| Example 2 | Compound 3 | 135% | 140% |
| Example 3 | Compound 21 | 120% | 190% |
| Example 4 | Compound 28 | 130% | 170% |
| Example 5 | Compound 35 | 125% | 180% |
| Example 6 | Compound 42 | 125% | 220% |
| Example 7 | Compound 43 | 130% | 240% |
| Example 8 | Compound 44 | 125% | 180% |
| Example 9 | Compound 46 | 135% | 210% |
| Example 10 | Compound 48 | 125% | 140% |
| Example 11 | Compound 60 | 125% | 150% |
| Comparative Example 1 | mCP | 100% | 100% |
| Comparative Example 2 | Comparative Example Compound C1 | 40% | 90% |
| Comparative Example 3 | Comparative Example Compound C2 | 90% | 30% |
| Comparative Example 4 | Comparative Example Compound C3 | 95% | 80% |
| Comparative Example 5 | Comparative Example Compound C4 | 80% | 10% |
| Comparative Example 6 | Comparative Example Compound C5 | 90% | 20% |
| Comparative Example 7 | Comparative Example Compound C6 | 80% | 5% |
| Comparative Example 8 | Comparative Example Compound C7 | 90% | 25% |
| Comparative Example 9 | Comparative Example Compound C8 | 20% | 5% |
| Comparative Example 10 | Comparative Example Compound C9 | 10% | 5% |
| Comparative Example 11 | Comparative Example Compound C10 | 95% | 20% |
| Comparative Example 12 | Comparative Example Compound C11 | 10% | 5% |

Referring to Table 3, it may be seen that the light emitting elements of Examples 1 to 11 have superior luminous efficiencies to the light emitting elements of Comparative Examples 1 to 12. It may be seen that the light emitting elements of Examples 1 to 11 have service lives longer than the light emitting elements of Comparative Examples 1 to 12.

The light emitting elements of Examples 1 to 11 include the nitrogen-containing compounds of examples, and include Compounds 1, 3, 21, 28, 35, 42, 43, 44, 46, 48, and 60, respectively. In Compounds 1, 3, 21, 28, 35, 42, 43, 44, 46, 48, and 60 which are nitrogen-containing compounds of examples, a substituted aryl group is bonded to the 3-position carbon ($C_3$) of acridane. The 3-position carbon ($C_3$) of the acridane is highly reactive, and the substituent of the aryl group is bonded at the ortho position with the benzene ring including the 3-position carbon. Accordingly, it is believed that Compounds 1, 3, 21, 28, 35, 42, 43, 44, 46, 48, and 60 exhibit high hole transport properties and stability, and high lowest triplet excitation energy levels (T1 levels). It is believed that the nitrogen-containing compound of an example having a high lowest triplet excitation energy level is used in the electron blocking layer adjacent to the emission layer, thus preventing the separation of the lowest triplet excitation energy of the blue phosphorescent emission layer, thereby improving efficiency and service life of the light emitting element.

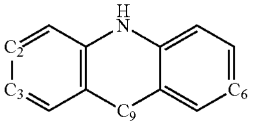

Acridane

It is believed that in Compounds 42, 43, 44, 46, 48, and 60, a heteroaryl group is bonded to the nitrogen atom of the acridane, and thus an electron blocking characteristic is further improved. It is believed that in Compounds 1, 21, 28, 35, 42, 43, 44, and 46, an acrydyl group or a fluorenyl group is bonded to the 9-position carbon ($C_9$) of acridane, and thus resistance against holes and electrons is further improved. Accordingly, it is believed that the nitrogen-containing compound of an example having improved electron blocking characteristic is used in the electron blocking layer adjacent to the emission layer, thereby improving the service life of the light emitting element.

The light emitting element of Comparative Example 2 includes Comparative Example Compound C1. It is believed that in Comparative Example Compound C1, an unsubstituted phenyl group is bonded to the nitrogen atom of acridane, Comparative Example Compound C1 is not twisted in a steric structure, and thus the lowest triplet excitation energy level is low. It is believed that as the lowest triplet excitation energy level of Comparative Example Compound C1 becomes lower than the lowest triplet excitation energy level of the emission layer, the efficiency of the light emitting element is reduced.

The light emitting element of Comparative Example 3 includes Comparative Example Compound C2, and in Comparative Example Compound C2, no substituent other than a hydrogen atom is bonded to the 6-position carbon ($C_6$) of acridane. It is believed that since no substituent other than a hydrogen atom is bonded to the 6-position carbon ($C_6$) of the acridane, Comparative Example Compound C2 has high reactivity, thereby reducing the service life of the light emitting element.

The light emitting elements of Comparative Examples 4 to 6 include Comparative Example Compounds C3 to C5, respectively. In Comparative Example Compound C3, xanthene is bonded to the carbon ($C_9$) facing the nitrogen atom of acridane, in Comparative Example Compound C4, a diphenyl group is bonded to the carbon ($C_9$) facing the nitrogen atom of acridane, and in Comparative Example Compound C5, a dimethyl group is bonded to the carbon ($C_9$) facing the nitrogen atom of acridane. In Comparative Example Compounds C3 to C5, a phenyl group is bonded to the nitrogen atom of acridane. Accordingly, it is believed that in Comparative Example Compounds C3 to C5, resistance against holes and electrons is reduced, and the light emitting elements of Comparative Examples 4 to 6 include Comparative Example Compounds C3 to C5, respectively, thereby exhibiting low efficiencies and short service lives.

The light emitting element of Comparative Example 7 includes Comparative Example Compound C6. A substituted phenyl group is bonded to the nitrogen atom of acridane, and the phenyl group is substituted with a xanthene group. The phenyl group substituted with a xanthene group is unstable, Comparative Example Compound C6 has low stability, and thus it is believed that the light emitting element of Comparative Example 7 including Comparative Example Compound C6 has a reduced service life.

The light emitting element of Comparative Example 8 includes Comparative Example Compound C7. In Comparative Example Compound C7, a biphenyl group is bonded to the 2-position carbon ($C_2$) of acridane, and no substituent other than a hydrogen atom is bonded to the 3-position carbon ($C_3$), and thus the 3-position carbon ($C_3$) has high reactivity. Accordingly, it is believed that the light emitting element of Comparative Example 8 including Comparative Example Compound C7 has a reduced service life.

The light emitting elements of Comparative Examples 9, 10, and 12 include Comparative Example Compounds C8, C9, and C11, respectively. In Comparative Example Compound C8, a lowest unoccupied molecular orbital (LUMO) level is low because a triazine group having a strong electron withdrawing property is bonded to the nitrogen atom of acridane. Accordingly, it is believed that Comparative Example Compounds C8, C9, and C11 do not exhibit an electron blocking characteristic, and as the energy absorption wavelengths of compounds become longer, the energy of the emission layer is absorbed, thereby reducing the efficiencies and service lives of the light emitting elements.

The light emitting element of Comparative Example 11 includes Comparative Example Compound C10. In Comparative Example Compound C10, a fluorenyl group substituted with a biphenyl group is bonded to the 9-position carbon ($C_9$) of acridane, and no substituent other than a hydrogen atom is bonded to the 3-position carbon ($C_3$), and thus the 3-position carbon ($C_3$) has high reactivity. Accordingly, it is believed that the light emitting element of Comparative Example 11 including Comparative Example Compound C10 has a reduced service life.

The light emitting element of an example may include a first electrode, a second electrode, which face each other, and at least one functional layer disposed between the first electrode and the second electrode. The at least one functional layer includes a nitrogen-containing compound of an example, and the nitrogen-containing compound may include acridane to which a substituted aryl group is bonded. The substituent of the aryl group is bonded at the ortho-position with the benzene ring of the acridane, the stability of the nitrogen-containing compound may be improved due to a steric characteristic of the structure including the substituted aryl group and the benzene ring. Therefore, the light emitting element including the nitrogen-containing compound of an example may exhibit excellent efficiency and long service life characteristics.

The nitrogen-containing compound of an example includes acridane to which a substituted aryl group is bonded, and the substituted aryl group may be bonded to the 3-position carbon of the acridane. The substituted aryl group may be an ortho-biphenyl group. The benzene ring of the acridane and the substituent of the substituted aryl group are bonded at the ortho-position in the aryl group, and the nitrogen-containing compound may have improved stability of material. Accordingly, the nitrogen-containing compound of an example may improve efficiency and a service life of the light emitting element.

The light emitting element of an embodiment may include the nitrogen-containing compound of an embodiment in the hole transport region, thereby exhibiting high efficiency and long service life characteristics.

The nitrogen-containing compound of an embodiment may improve luminous efficiency and an element service life of the light emitting element.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting element comprising:

a first electrode;

a second electrode disposed on the first electrode; and at least one functional layer disposed between the first electrode and the second electrode and comprising a nitrogen-containing compound represented by Formula 1:

[Formula 1]

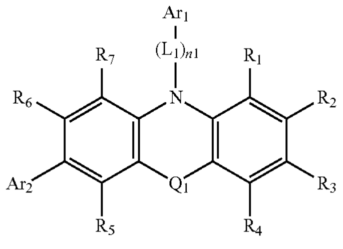

wherein in Formula 1, n1 is an integer from 0 to 2, $L_1$ is a substituted or unsubstituted arylene group having 6 to 30 ring-forming carbon atoms, or a substituted or unsubstituted heteroarylene group having 2 to 30 ring-forming carbon atoms, $Ar_1$ is a substituted or unsubstituted aryl group having 6 to 30 ring-forming carbon atoms, or a substituted or unsubstituted heteroaryl group having 2 to 30 ring-forming carbon atoms, and $Ar_2$ is a group represented by one of Ar2-1 to Ar2-6, $R_1$, $R_2$ and $R_4$ to $R_7$ are each independently a hydrogen atom, a deuterium atom, a substituted or unsubstituted silyl group, a substituted or unsubstituted amine group, a substituted or unsubstituted oxy group, a substituted or unsubstituted thio group, a substituted or unsubstituted alkyl group having 1 to 20 carbon atoms, a substituted or unsubstituted alkenyl group having 2 to 20 carbon atoms, a substituted or unsubstituted aryl group having 6 to 20 ring-forming carbon atoms, or a substituted or unsubstituted heteroaryl group having 2 to 20 ring-forming carbon atoms, or are bonded to an adjacent group to form a ring, $Ar_2$ and $R_3$ are the same, $Q_1$ is O, S, SO, Se, CO, $C(R_{11})(R_{12})$, $B(R_{13})$, $P(R_{15})$, $PO(R_{16})$, $PS(R_{17})$, or a group represented by Formula 3, $R_{11}$ and $R_{12}$ are each independently a substituted or unsubstituted alkyl group having 1 to 20 carbon atoms, or a substituted or unsubstituted aryl group having 6 to 20 ring-forming carbon atoms, or are bonded to an adjacent group to form a ring, and $R_{13}$ and $R_{15}$ to $R_{17}$ are each independently a substituted or unsubstituted aryl group having 6 to 30 ring-forming carbon atoms:

Ar2-1

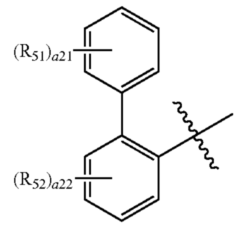

Ar2-2

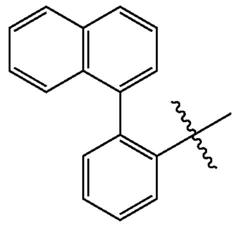

Ar2-3

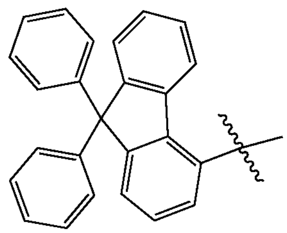

Ar2-4

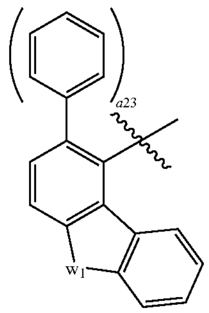

-continued

Ar2-5

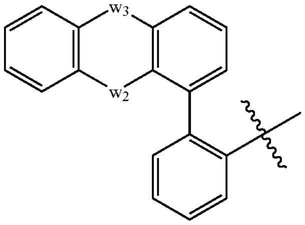

Ar2-6

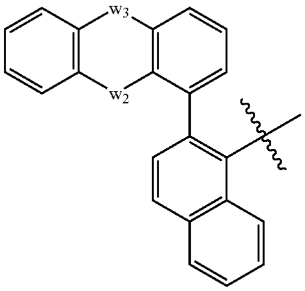

wherein in Ar2-1, a21 is an integer from 0 to 5, a22 is an integer from 0 to 4, and $R_{51}$ and $R_{52}$ are each independently a hydrogen atom, a deuterium atom, or an unsubstituted phenyl group, wherein in Ar2-4, a23 is 0 or 1, and $W_1$ is N(Ph), O, or S, wherein in Ar2-5 and Ar2-6, one of $W_2$ or $W_3$ is a direct linkage, and the other of $W_2$ and $W_3$ is N(Ph), O, or S, and wherein in Ar2-4 to Ar2-6, Ph is a phenyl group,

[Formula 3]

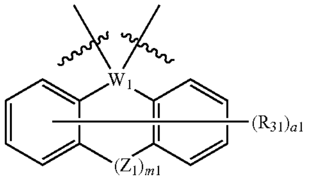

wherein in Formula 3, $W_1$ is C, Si, or Ge, and is the same as $Q_1$, m1 is 0 or 1, $Z_1$ is a direct linkage, $C(R_{32})(R_{33})$, $N(R_{34})$, O, or S, a1 is an integer from 0 to 8, $R_{31}$ to $R_{34}$ are each independently a hydrogen atom, a deuterium atom, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, when $R_3$ is a hydrogen atom, Aris a substituted or unsubstituted fluorenyl group, a substituted or unsubstituted carbazole group, a substituted or unsubstituted dibenzofuran group, a substituted or unsubstituted dibenzothiophene group, or a substituted or unsubstituted dibenzosilole group, and when $Ar_2$ is a group represented by Ar2-1, $Q_1$ is a group represented by Formula 3, and $Z_1$ is a direct linkage or $N(R_{34})$.

2. The light emitting element of claim 1, wherein $Ar_1$ is a group represented by one of Ar1-1 to Ar1-9:

Ar1-1

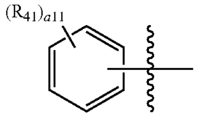

Ar1-2

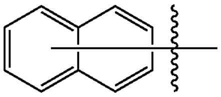

Ar1-3

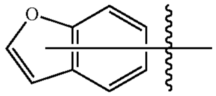

Ar1-4

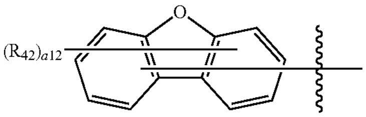

Ar1-5

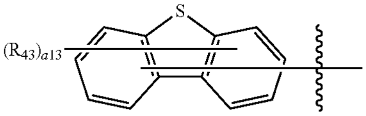

Ar1-6

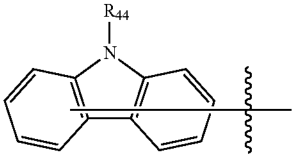

Ar1-7

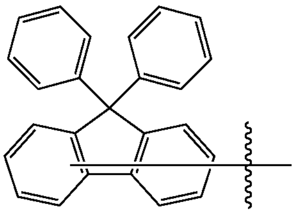

Ar1-8

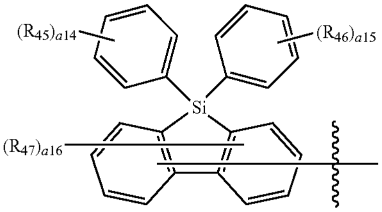

Ar1-9

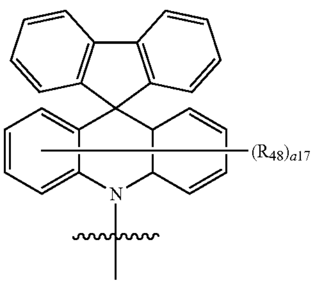

wherein in Ar1-1, a11 is an integer from 0 to 5, wherein in Ar1-4 and Ar1-5, a12 and a13 are each independently an integer from 0 to 7, wherein in Ar1-8, a14 and a15 are each independently an integer from 0 to 5, and a16 is an integer from 0 to 7, wherein in Ar1-9, a17 is an integer from 0 to 8, and wherein in Ar1-1, Ar1-4 to Ar1-6, Ar1-8, and Ar1-9, $R_{41}$ to $R_{48}$ are each independently a hydrogen atom, a deuterium atom, or a substituted or unsubstituted aryl group having 6 to 30 ring-forming carbon atoms.

3. The light emitting element of claim 1, wherein the nitrogen-containing compound represented by Formula 1 is represented by one of Formula 1-1 to Formula 1-3:

[Formula 1-1]

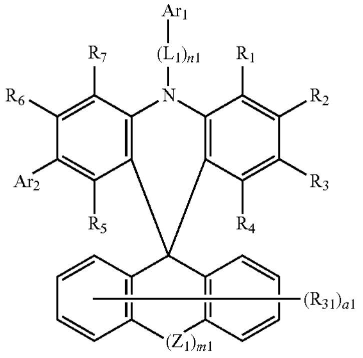

[Formula 1-2]

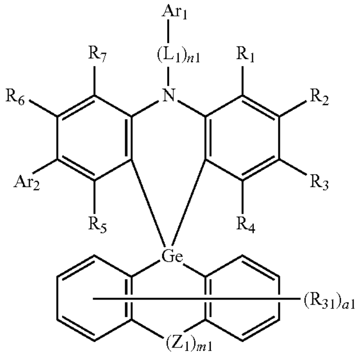

[Formula 1-3]

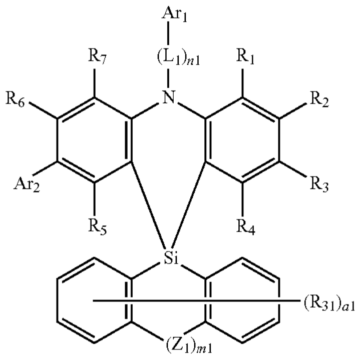

wherein in Formula 1-1 to Formula 1-3, $Ar_1$, $Ar_2$, $L_1$, n1, $R_1$ to $R_7$, a1, $R_{31}$, m1, and Z1 are the same as defined in connection with Formula 1.

4. The light emitting element of claim 3, wherein the nitrogen-containing compound represented by Formula 1-1 is represented by one of Formula 1-1A to Formula 1-1E:

[Formula 1-1A]

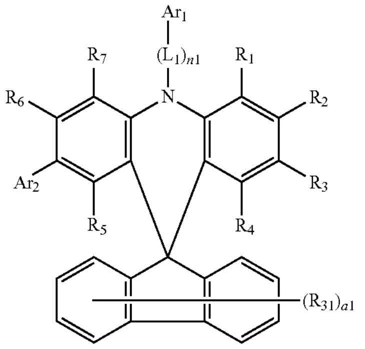

[Formula 1-1B]

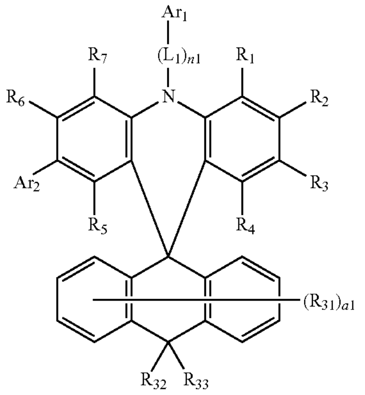

[Formula 1-1C]

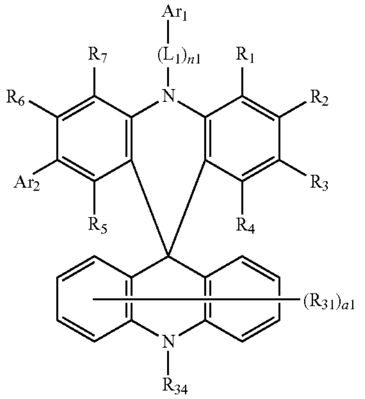

[Formula 1-1D]

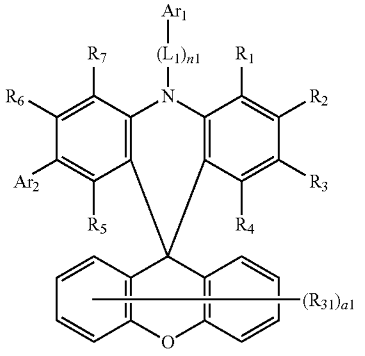

-continued

[Formula 1-1E]

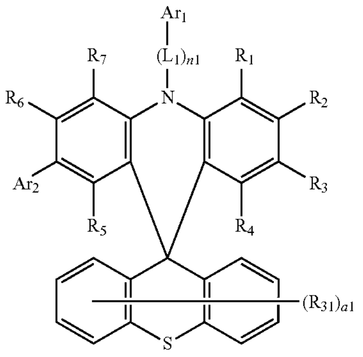

wherein in Formula 1-1A to Formula 1-1E, $Ar_1$, $Ar_2$, $L_1$, n1, $R_1$ to $R_7$, a1, and $R_{31}$ to $R_{34}$ are the same as defined in connection with Formula 1.

5. The light emitting element of claim 1, wherein at least one of $R_1$, $R_2$ and $R_4$ to $R_7$ is a deuterium atom.

6. The light emitting element of claim 1, wherein the at least one functional layer comprises:

a hole injection layer disposed on the first electrode;

a hole transport layer disposed on the hole injection layer;

an electron blocking layer disposed on the hole transport layer; and an emission layer disposed on the electron blocking layer, and at least one of the hole injection layer, the hole transport layer, the electron blocking layer, and the emission layer comprises the nitrogen-containing compound.

7. A light emitting element comprising:

a first electrode;

a second electrode disposed on the first electrode; and at least one functional layer disposed between the first electrode and the second electrode and comprising a nitrogen-containing compound selected from Compound Group 1:

[Compound Group 1]

1

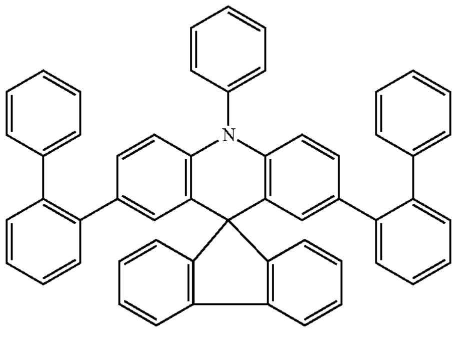

-continued

2

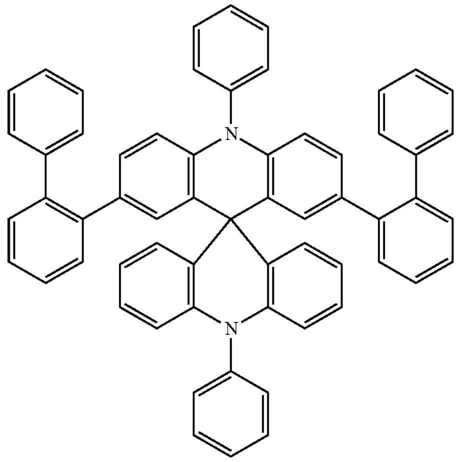

3

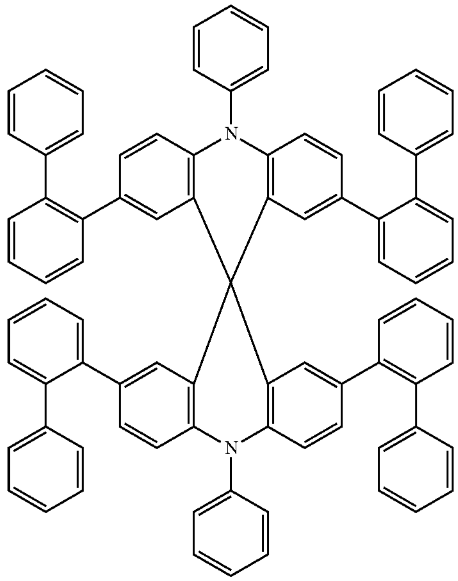

4

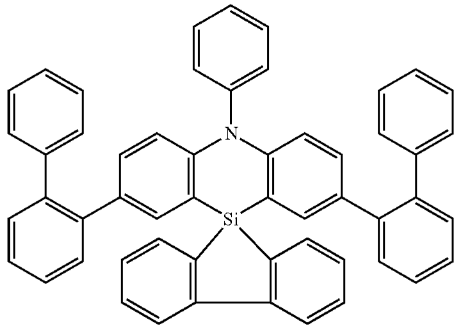

-continued
5
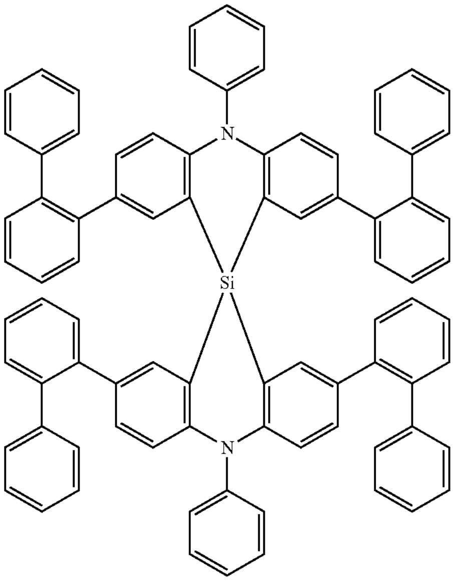
6
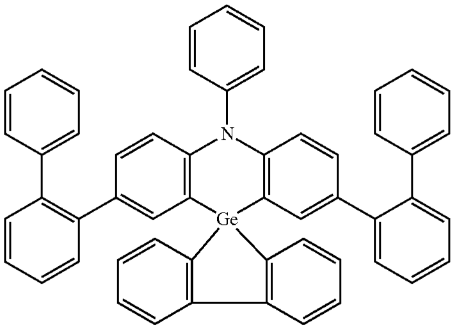
7
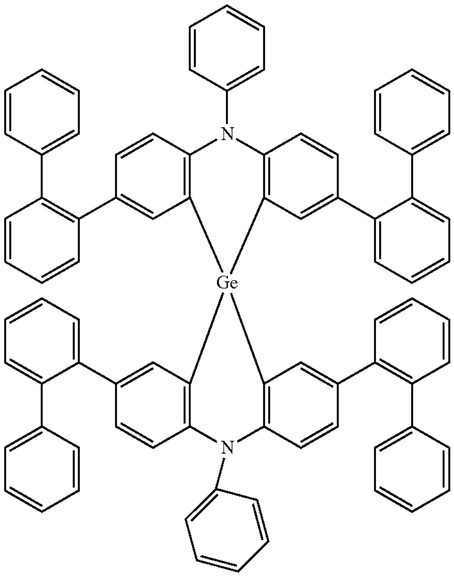
-continued
8
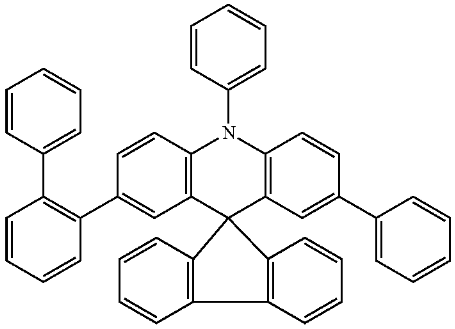
9
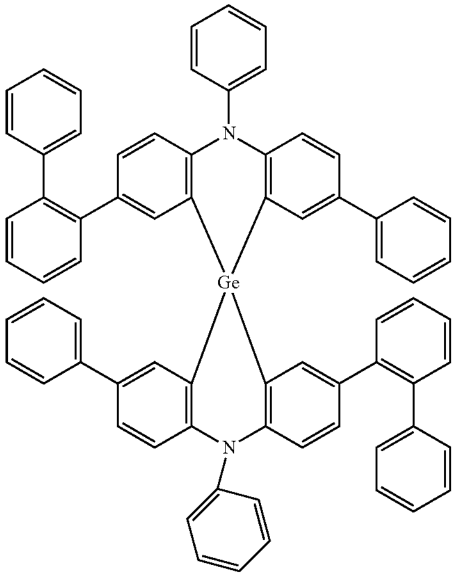
10
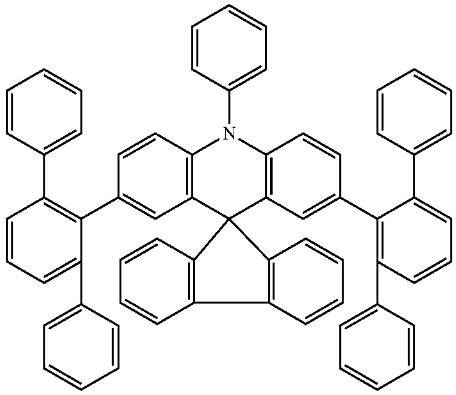
11
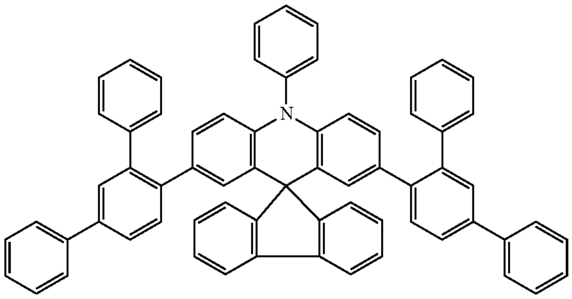

-continued
12
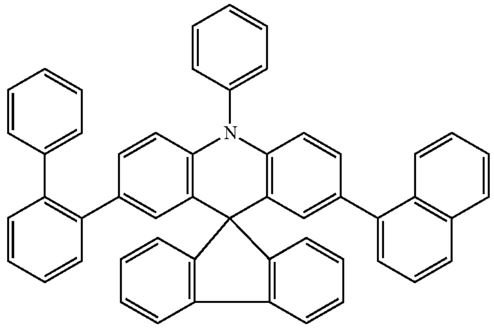
13
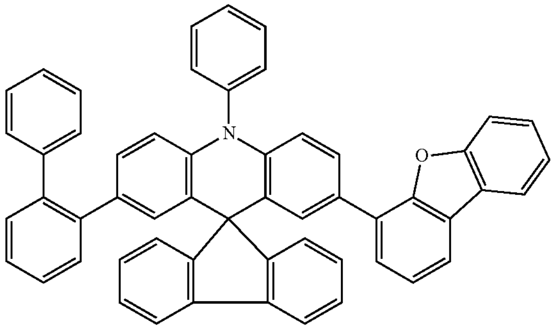
14
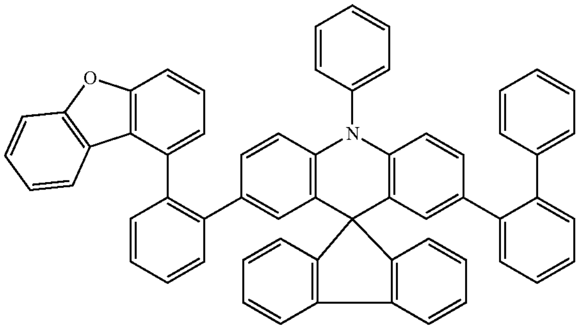
15
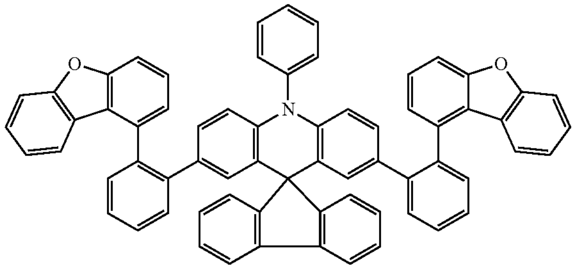
-continued
16
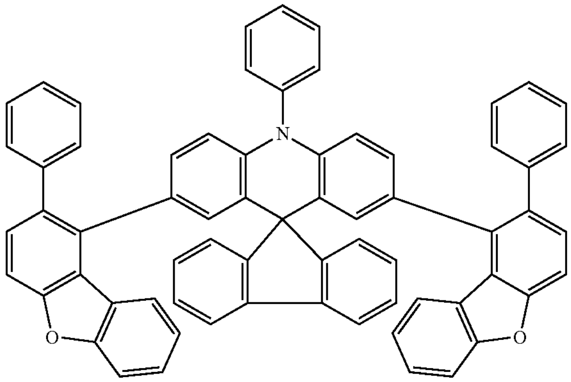
17
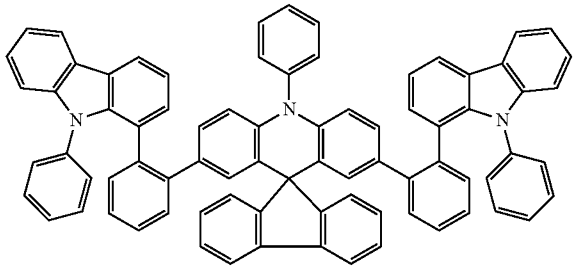
18
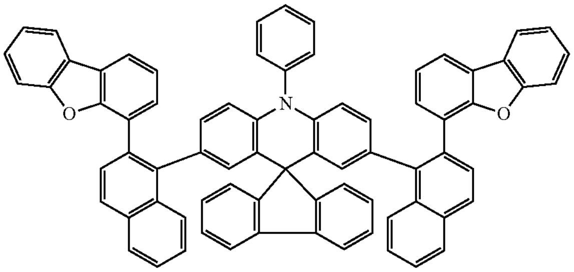
19
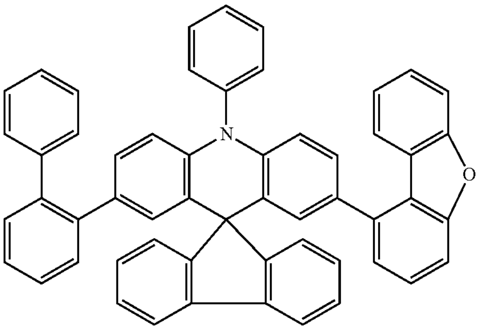

20
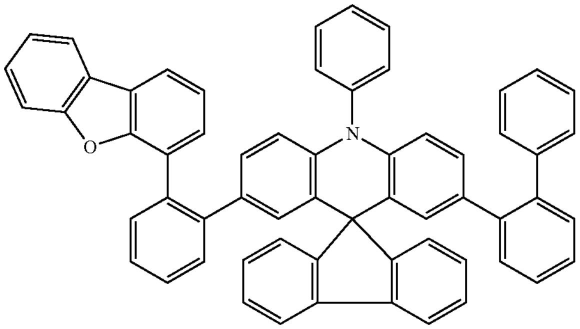
21
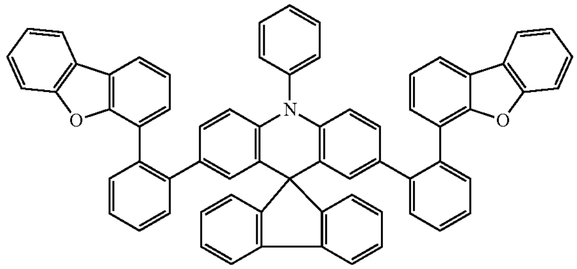
22
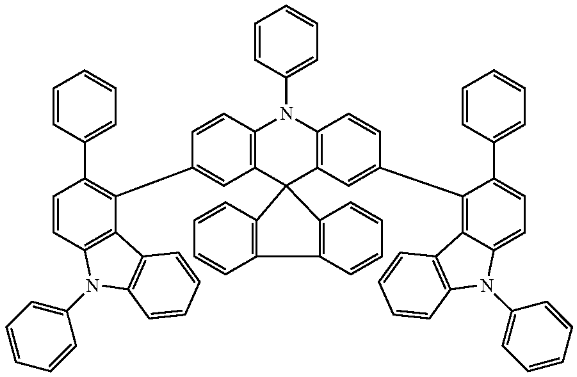
23
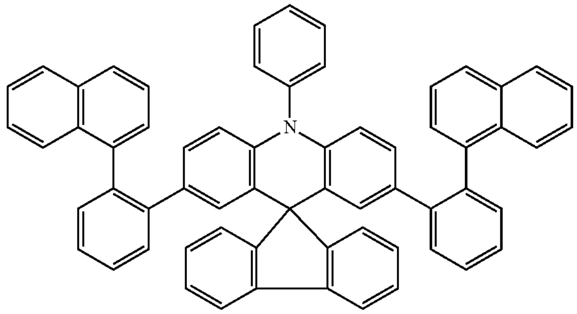
24
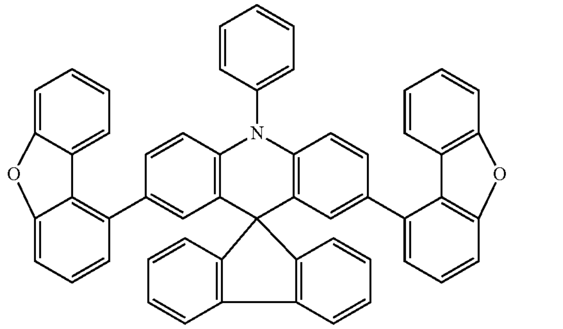
25
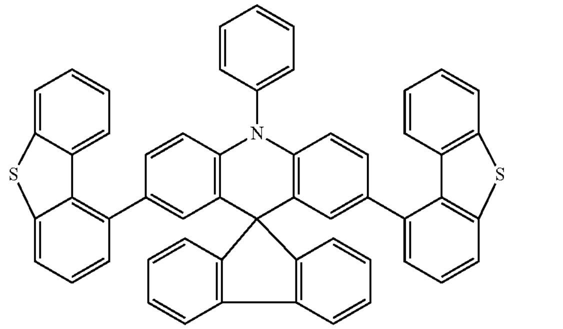
26
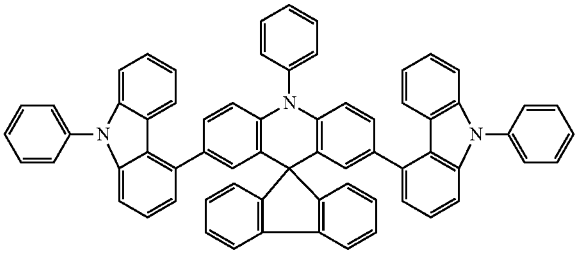
27
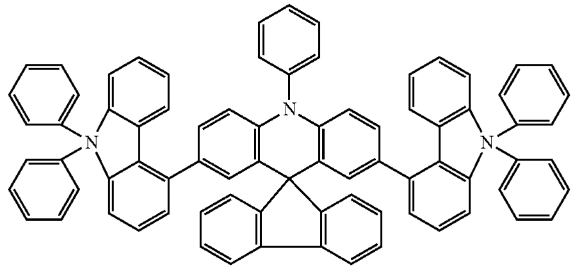
28
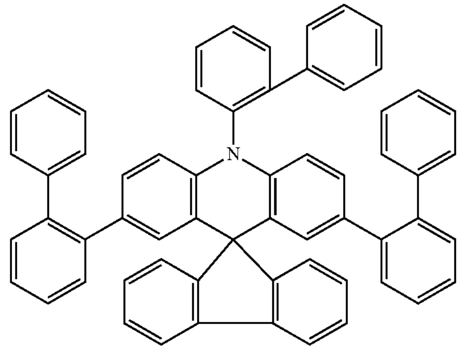

-continued
29
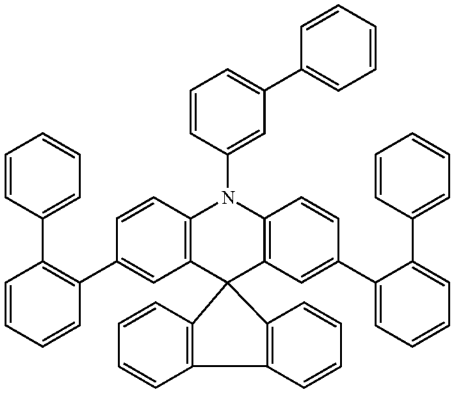
30
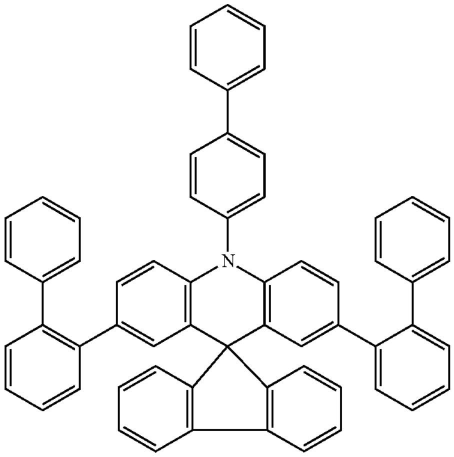
31
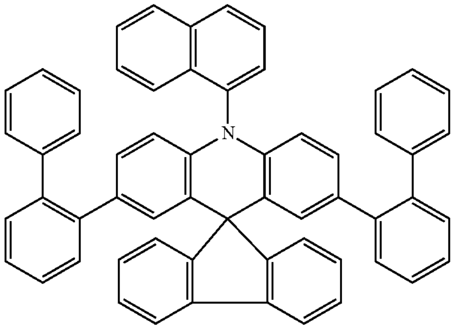
32
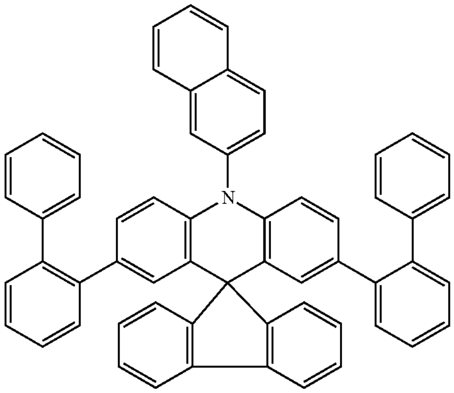
-continued
33
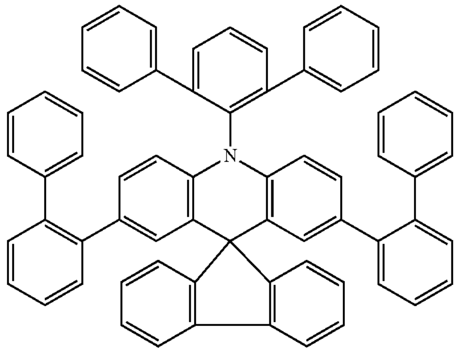
34
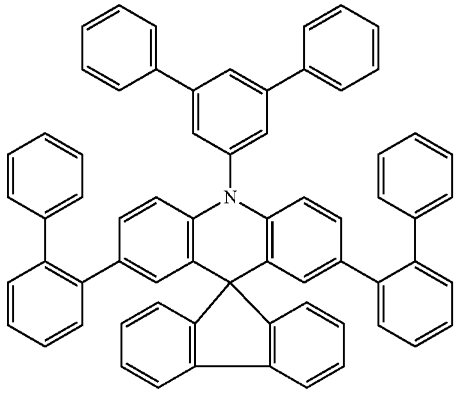
35
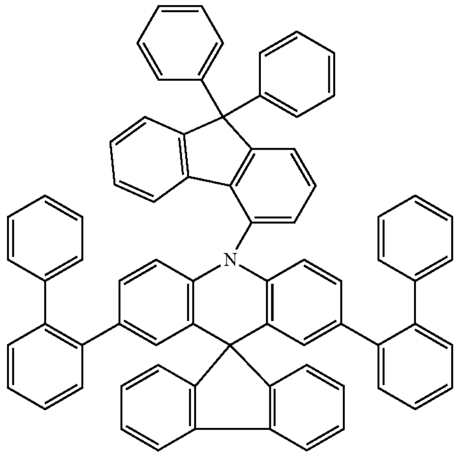
36
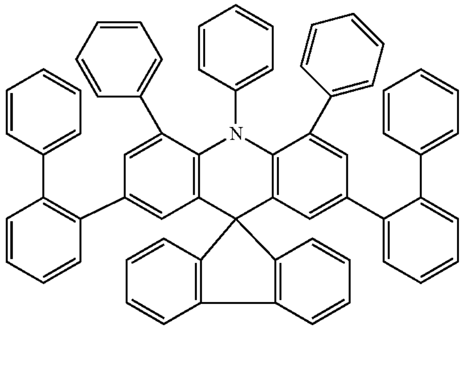

-continued
37
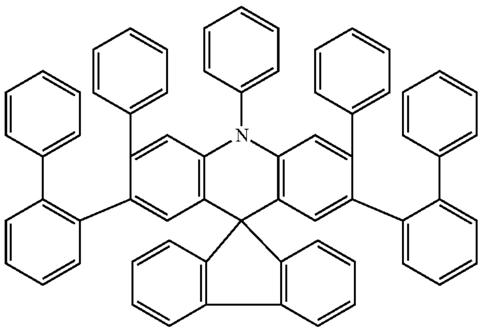
38
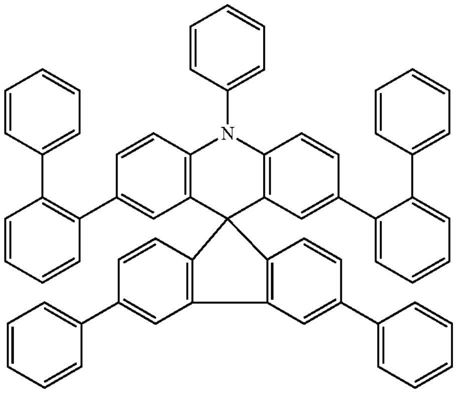
39
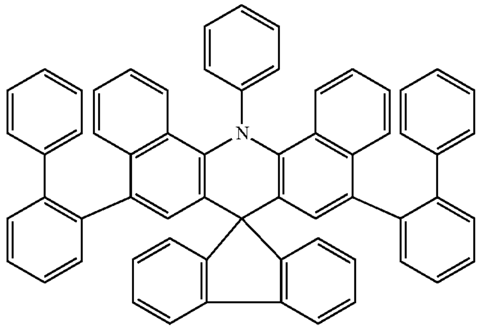
40
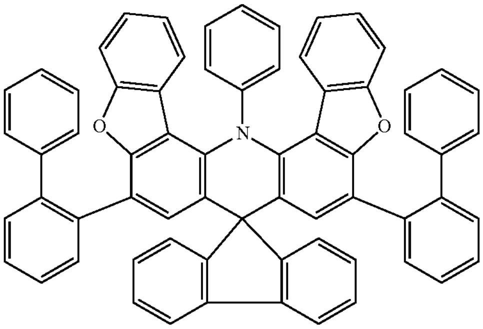
-continued
41
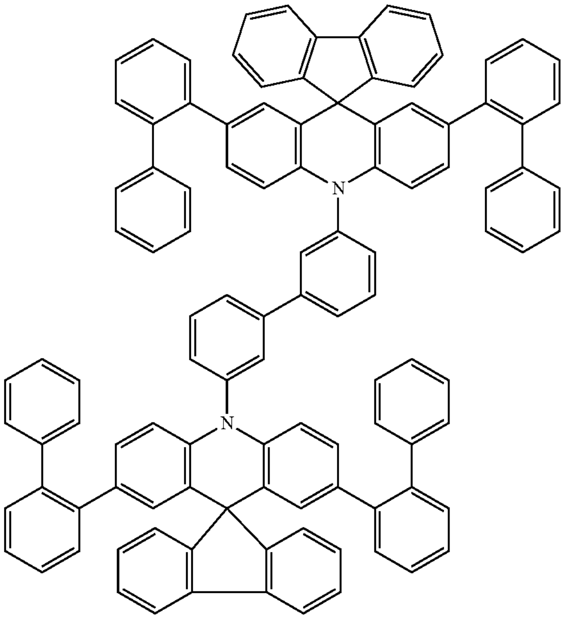
42
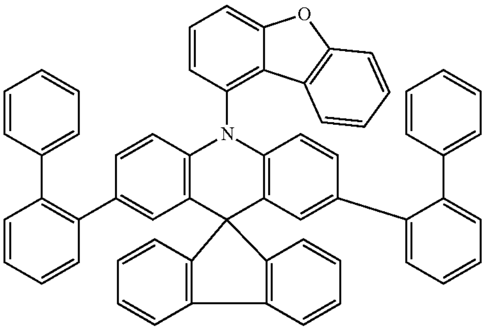
43
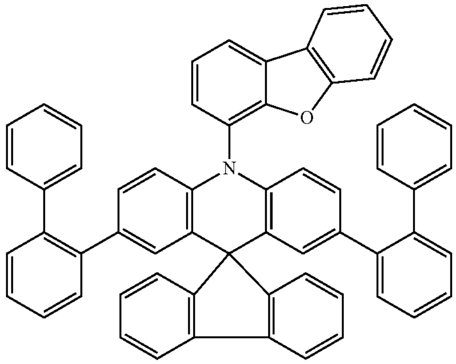

-continued
44
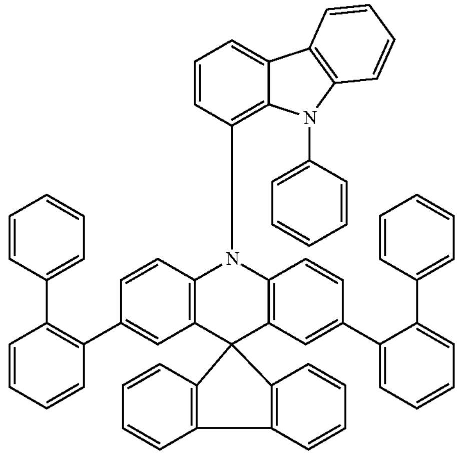
45
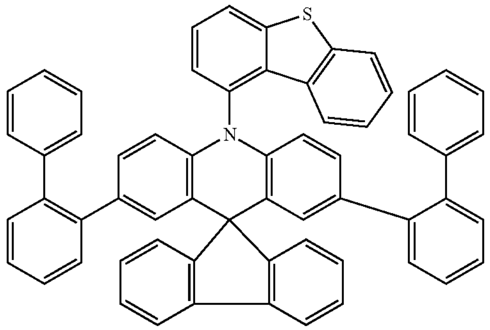
46
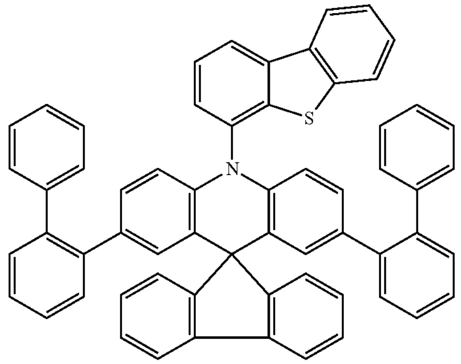
47
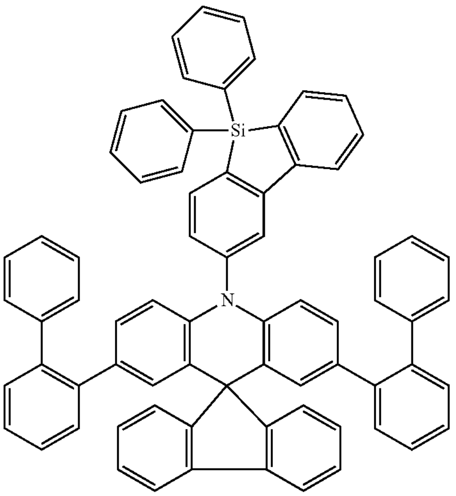
-continued
48
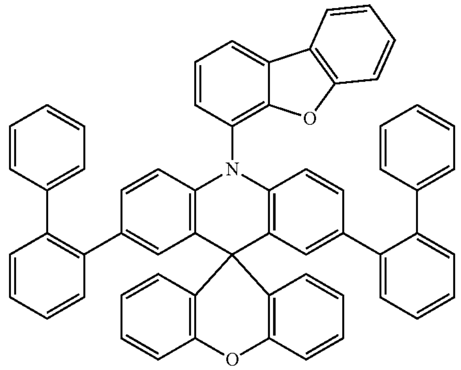
49
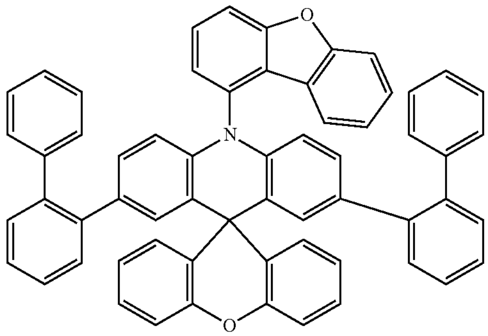
50
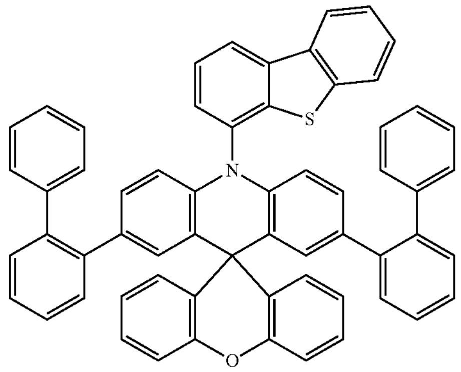
51
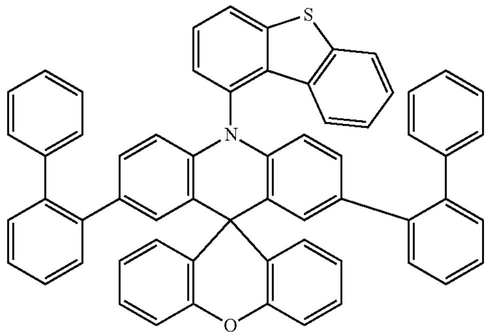

-continued
52
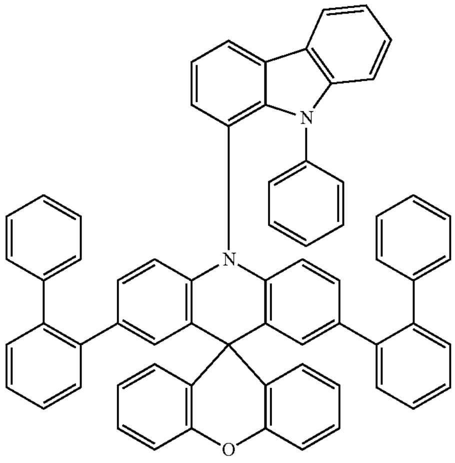
53
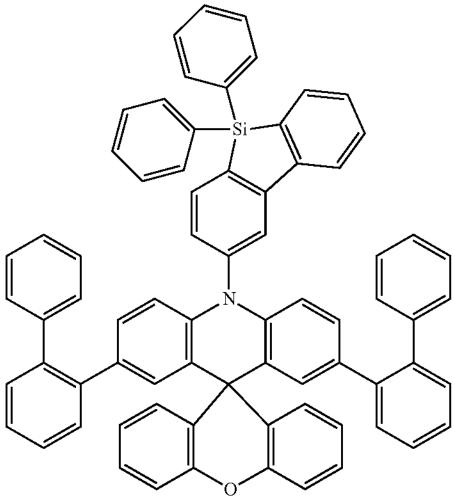
54
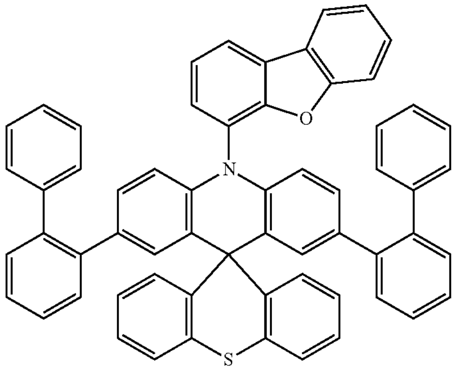
-continued
55
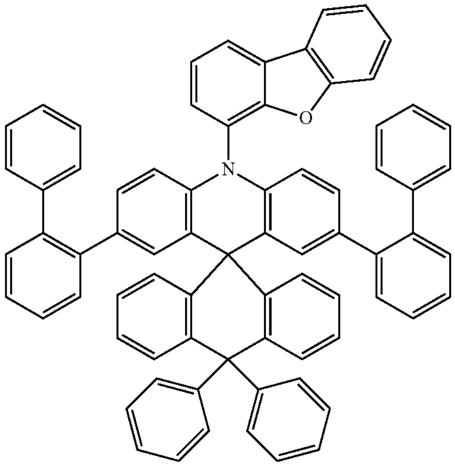
56
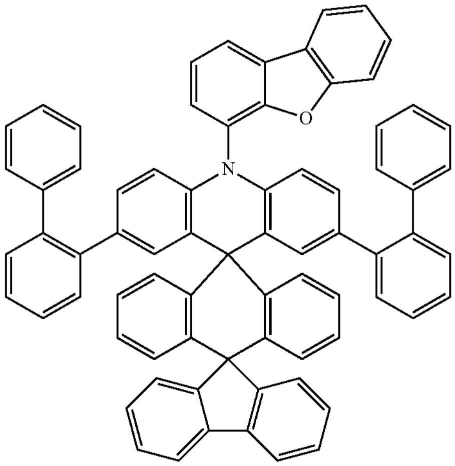
57
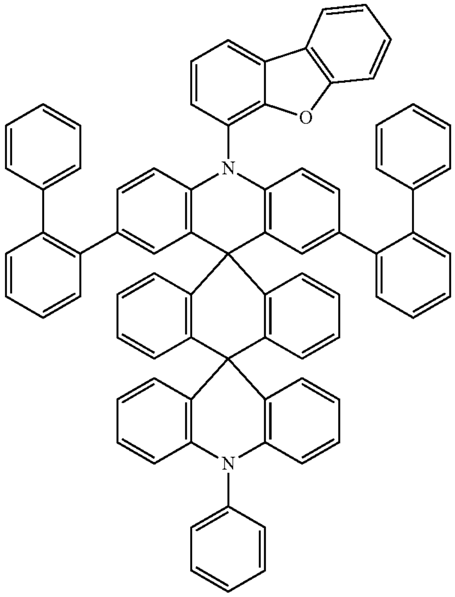

-continued
58
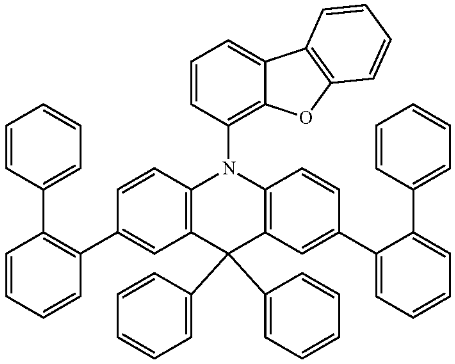
59
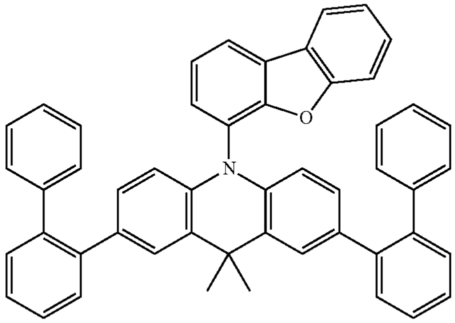
60
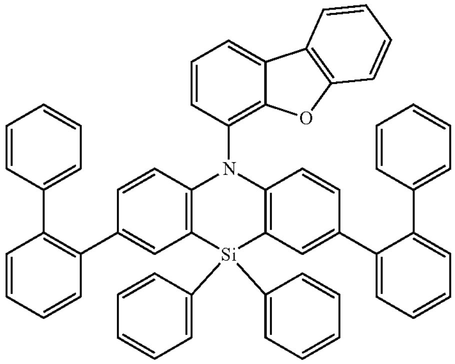
61
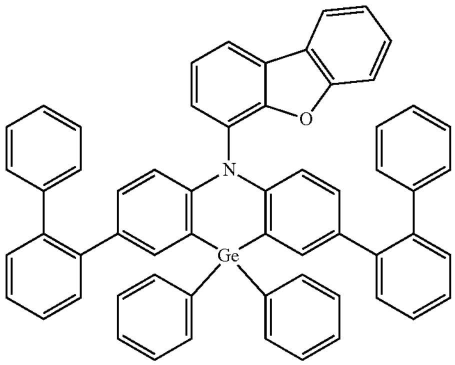
-continued
62
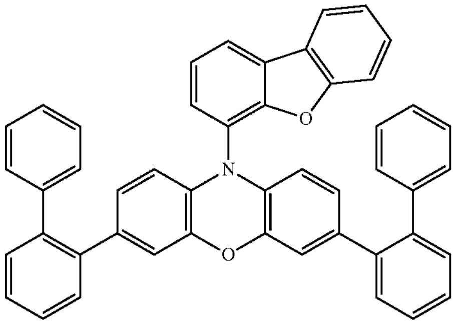
63
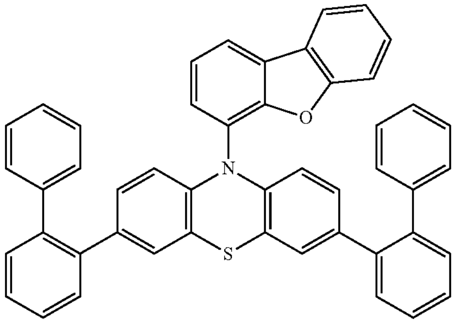
64
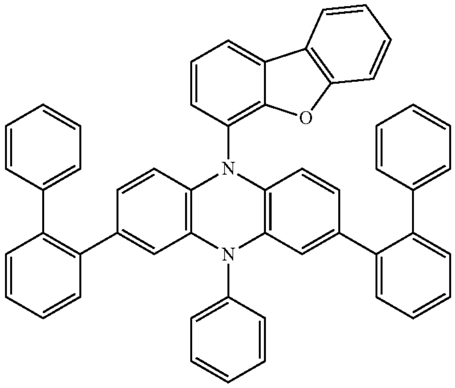
65
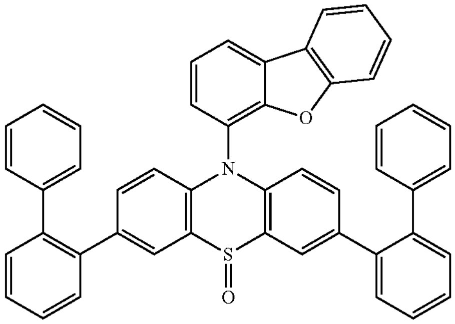

-continued
66
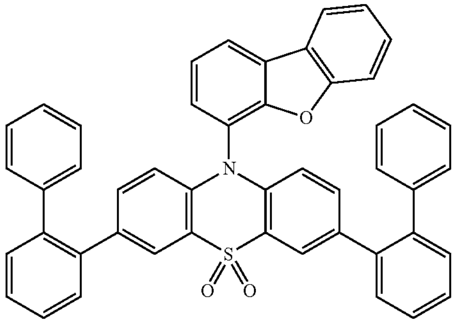
67
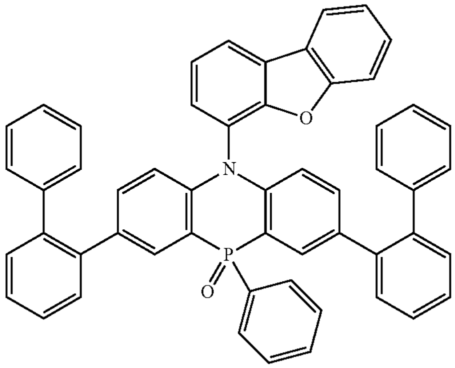
68
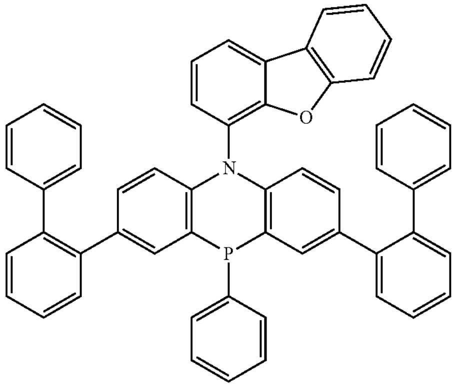
69
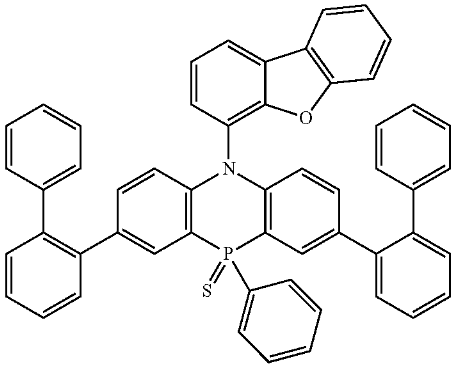
-continued
70
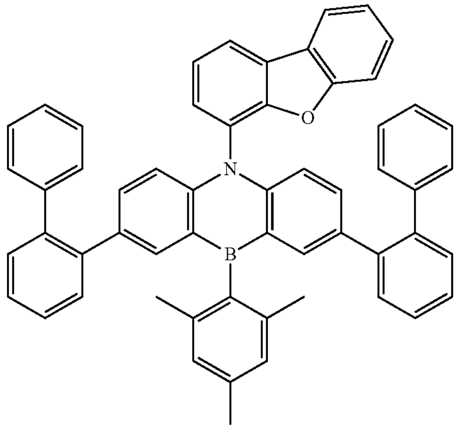
71
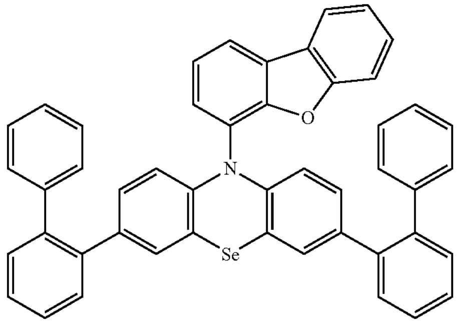
72
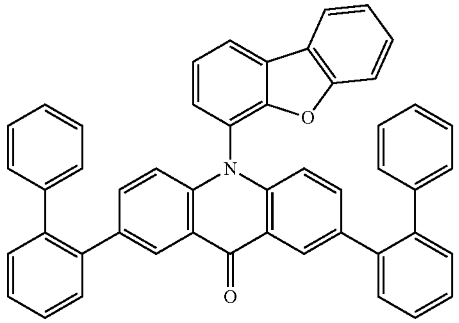
73
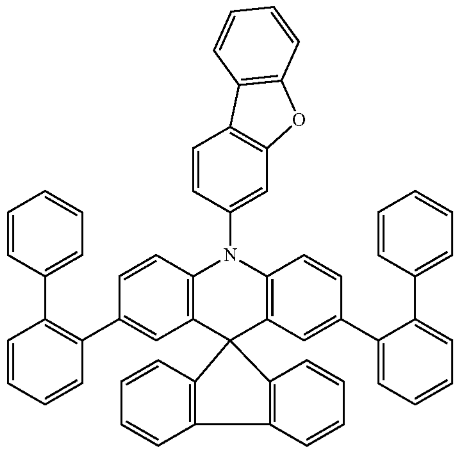

-continued
74
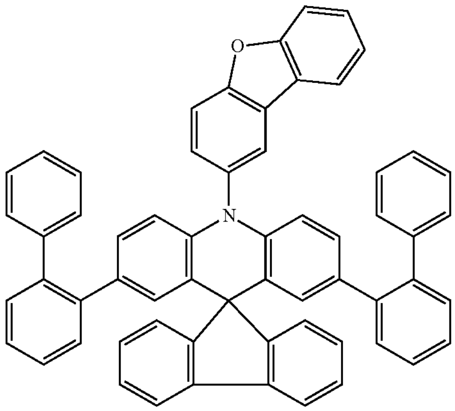
75
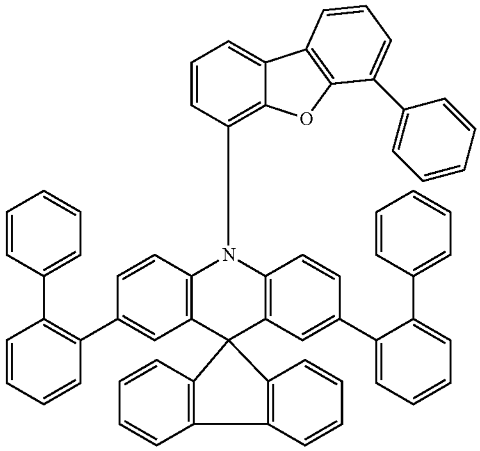
76
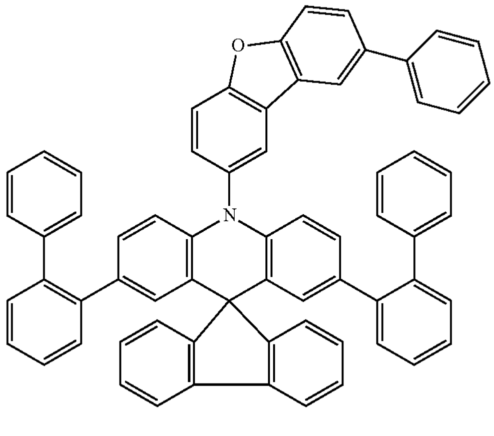
-continued
77
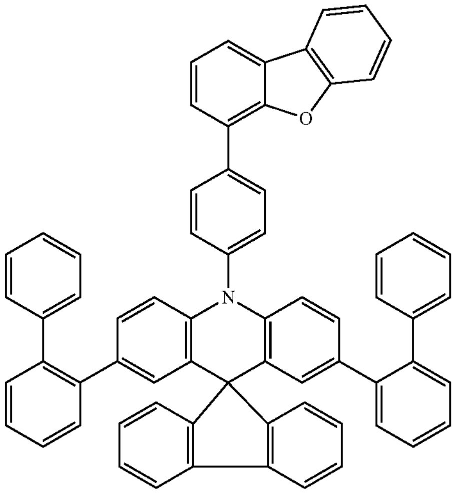
78
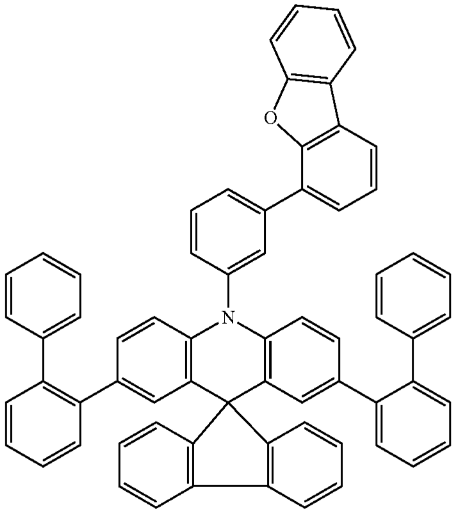
79
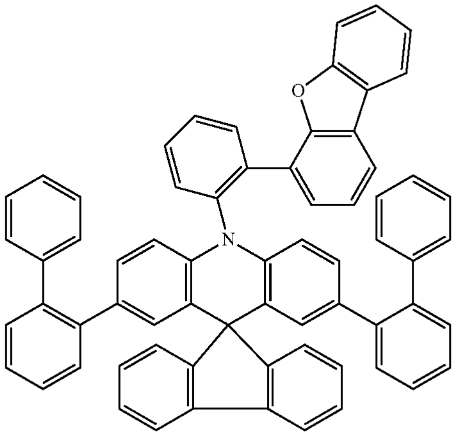

-continued
80
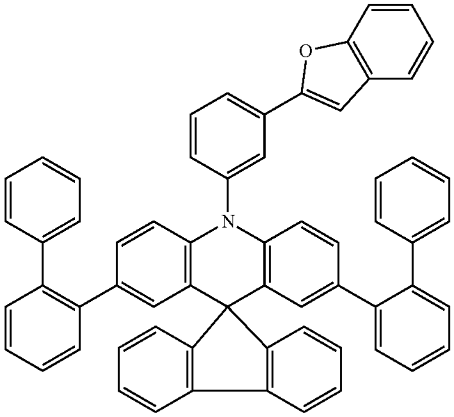
81
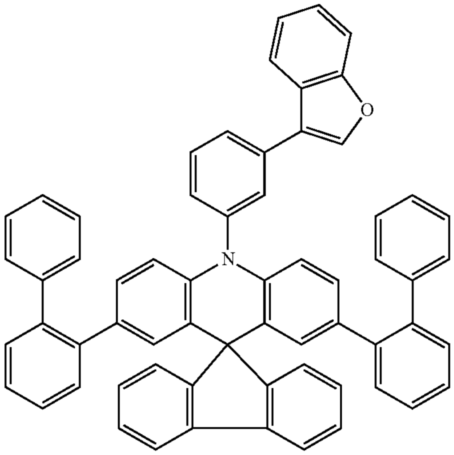
82
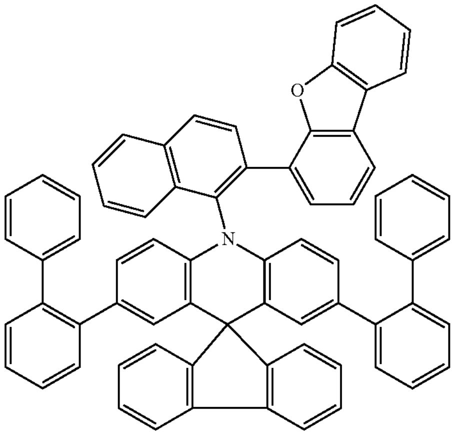
-continued
83
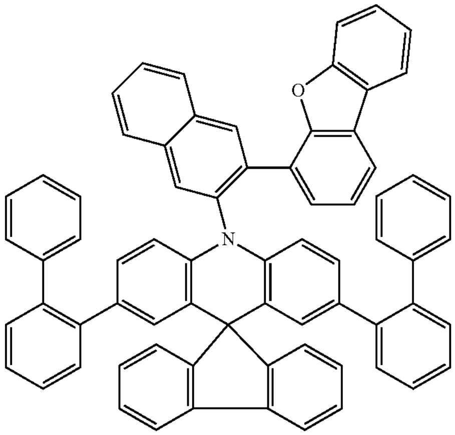
84
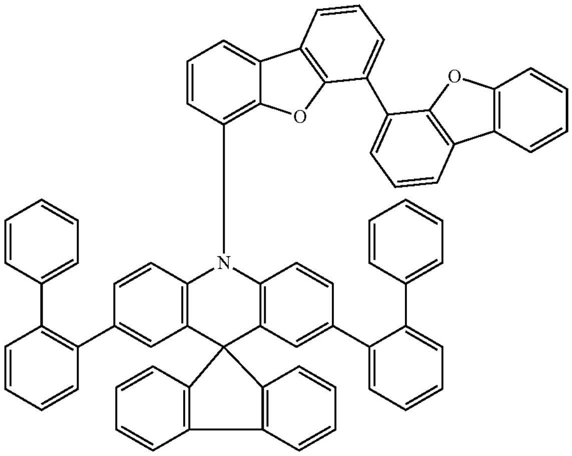
85
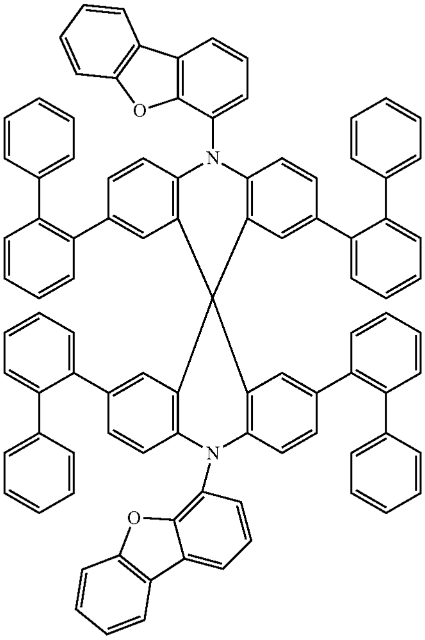

-continued
86
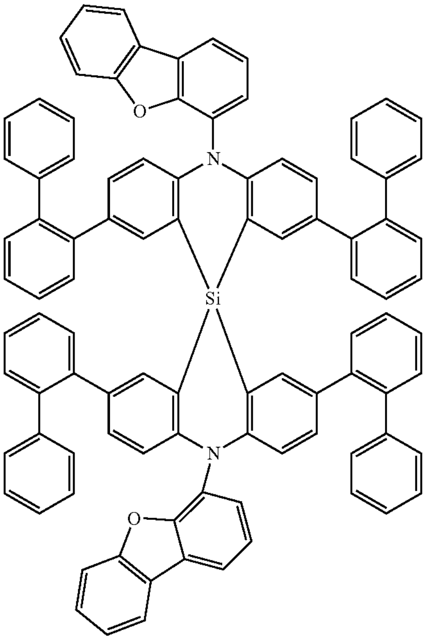
87
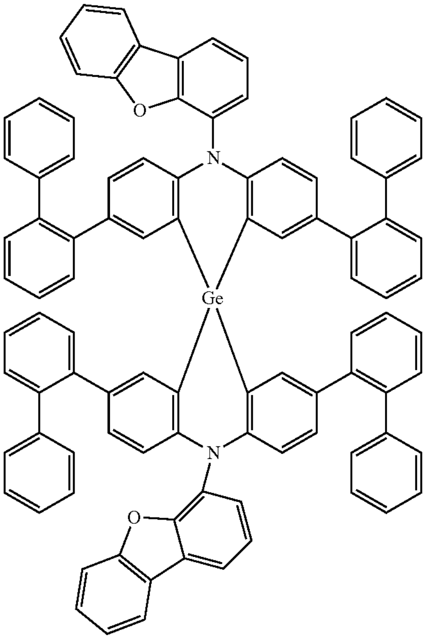
88
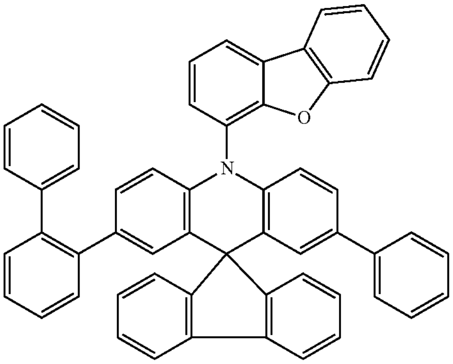
-continued
89
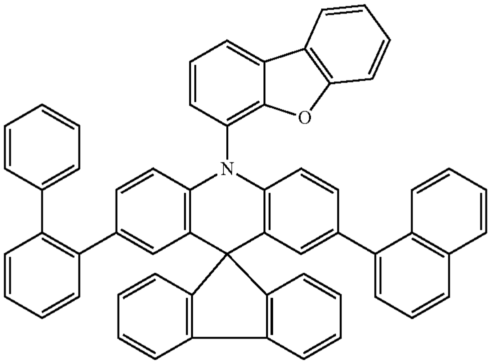
90
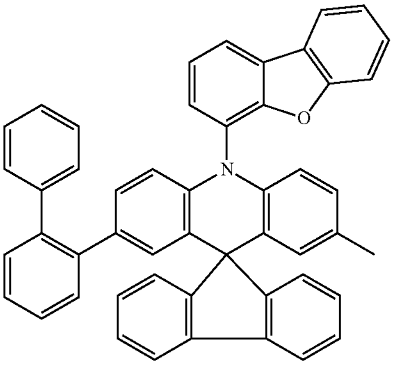
91
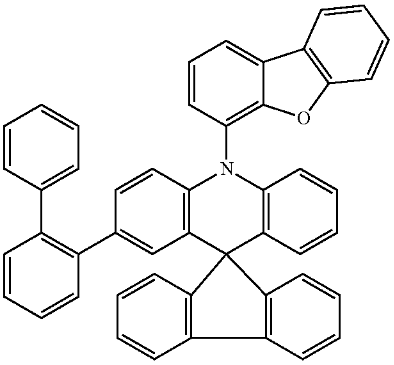
92
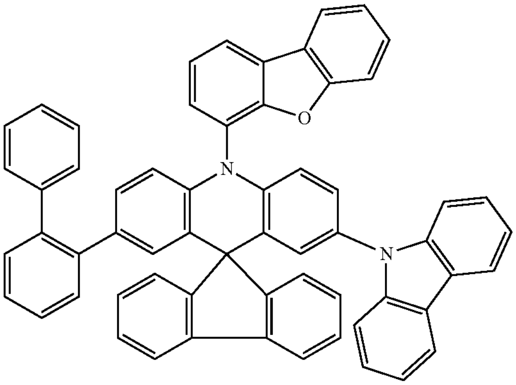

-continued
93
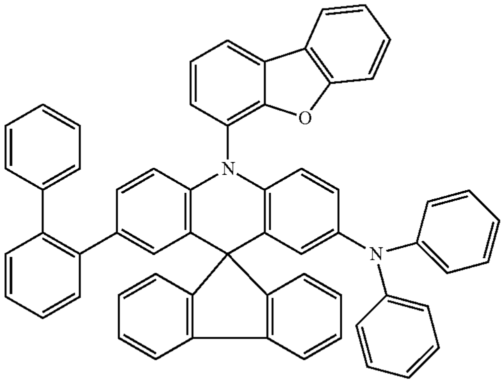
94
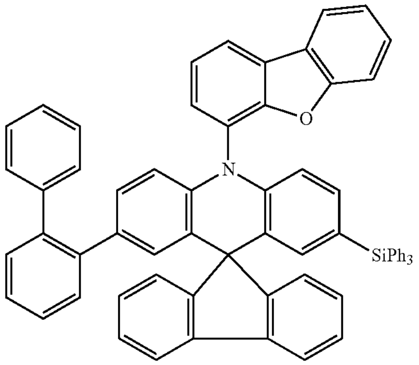
95
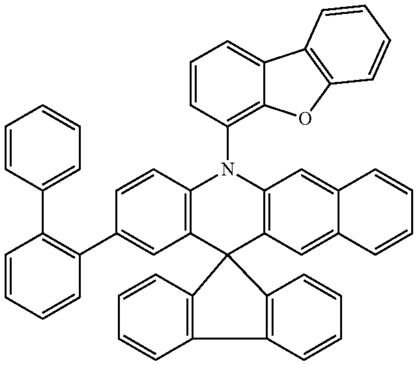
96
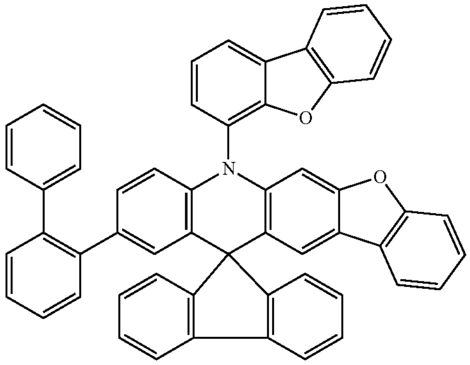
-continued
97
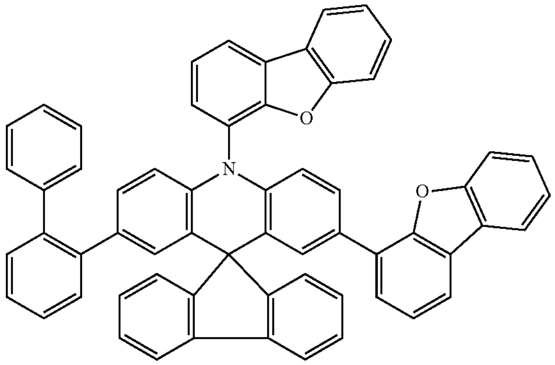
98
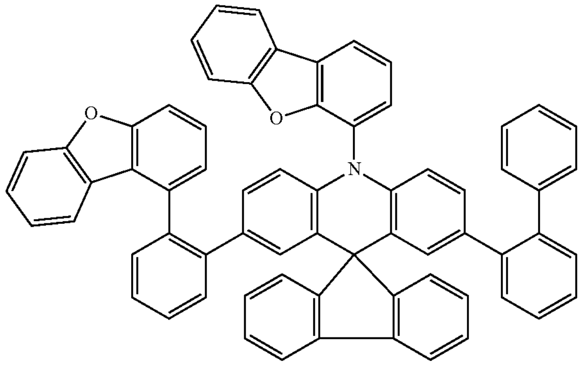
99
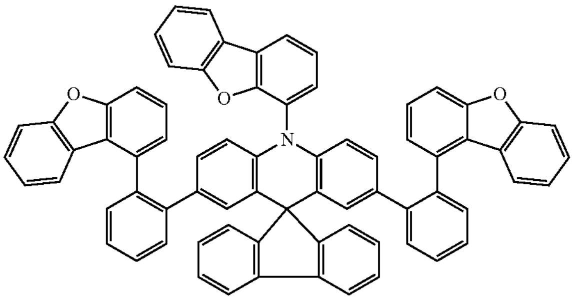
100
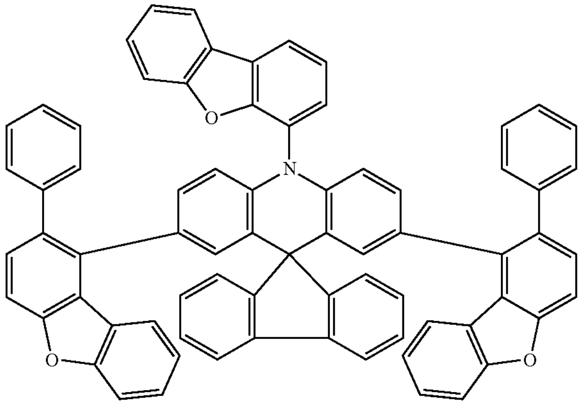

-continued
101
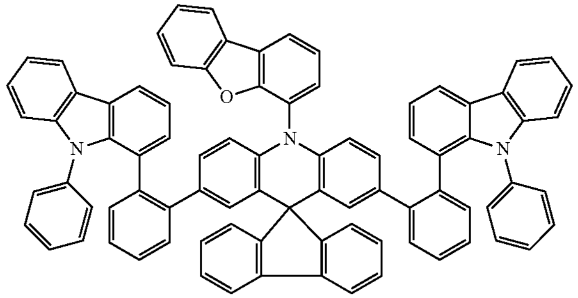
102
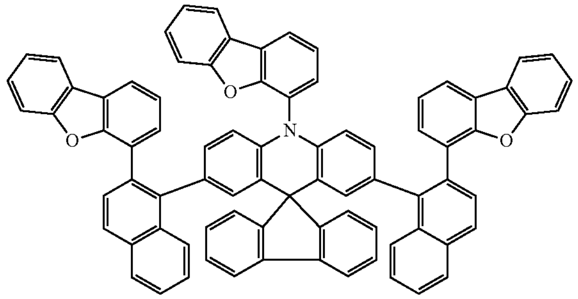
103
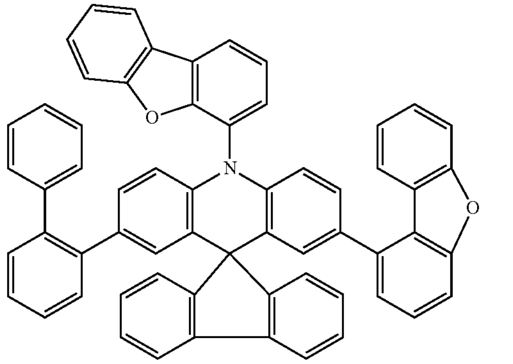
104
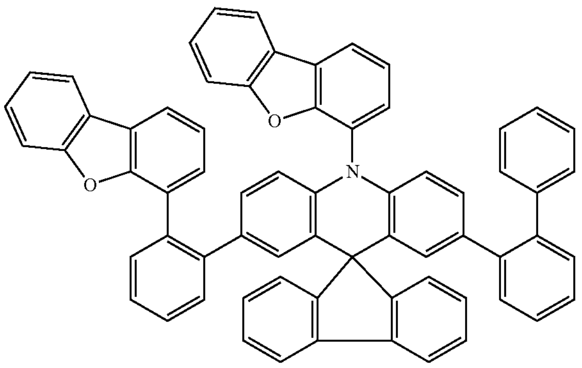
-continued
105
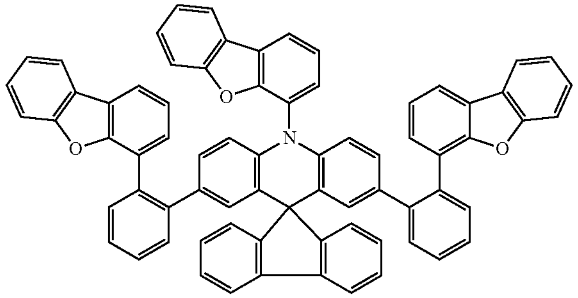
106
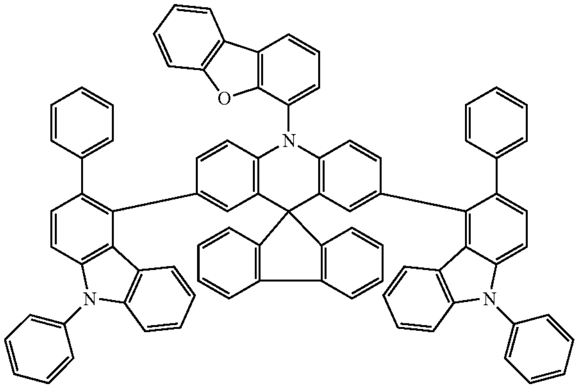
107
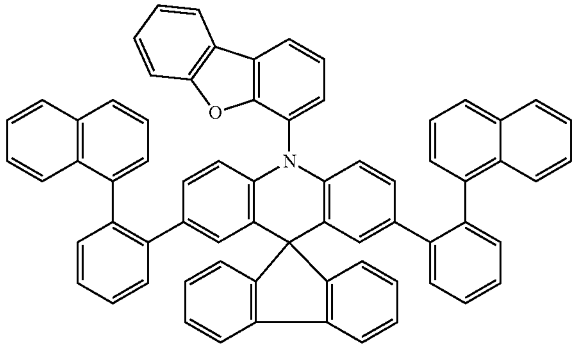
108
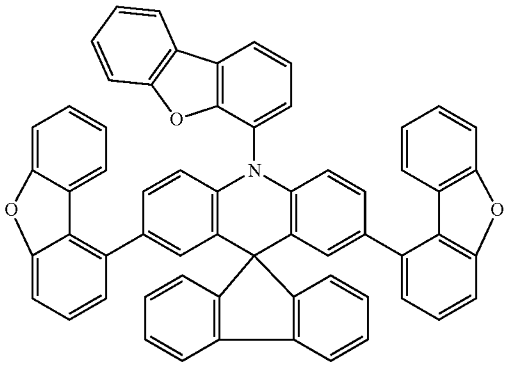

-continued
109
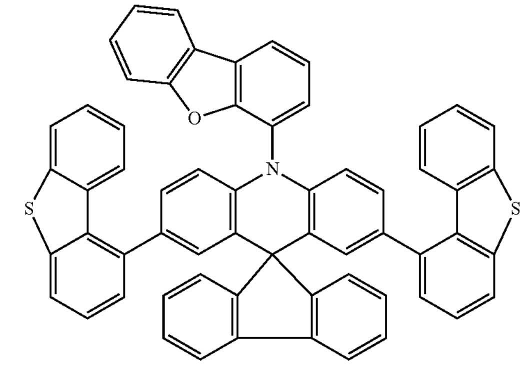
110
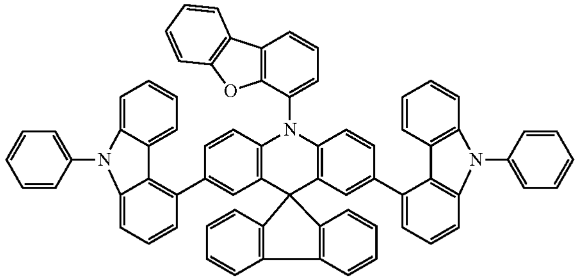
111
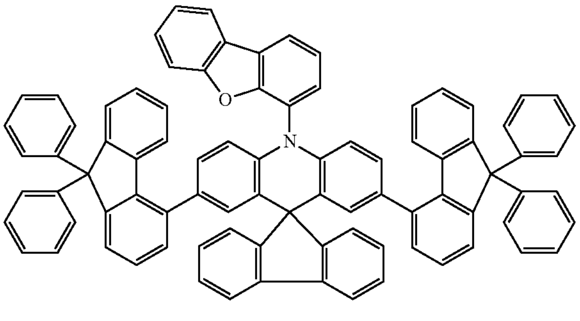
112
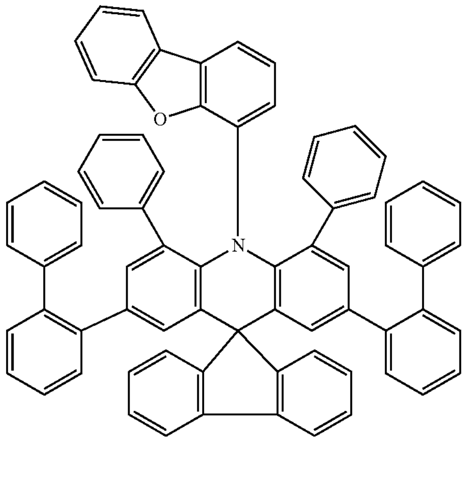
-continued
113
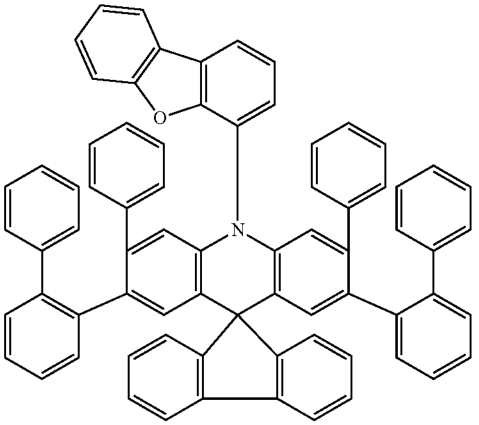
114
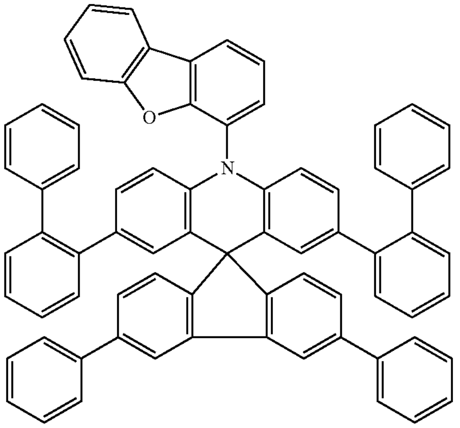
115
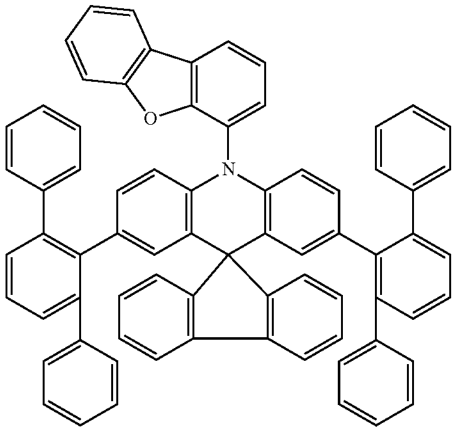
116
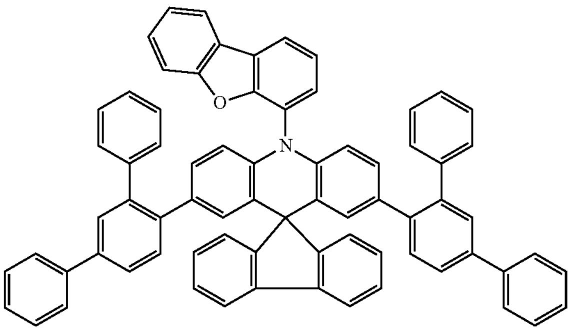

-continued
117
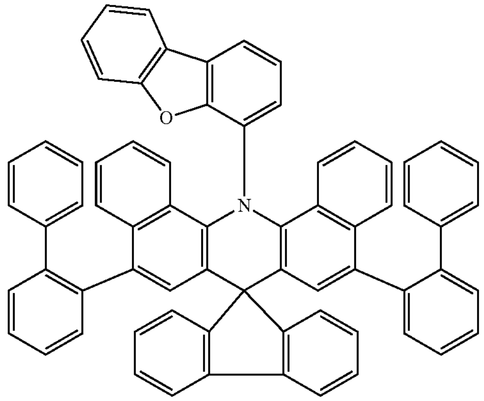
118
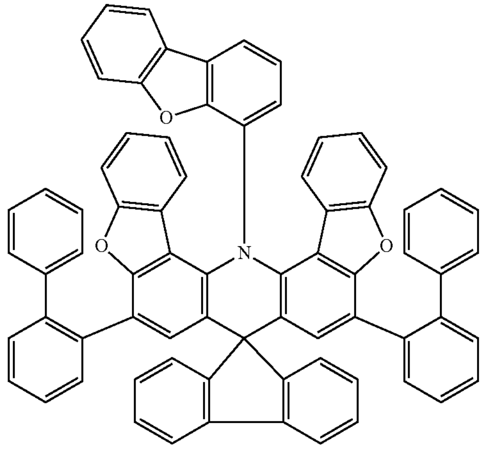
119
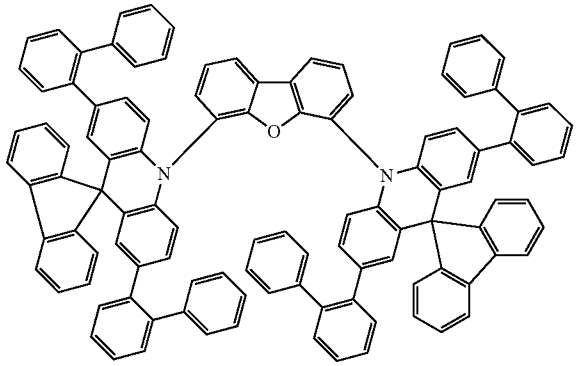
120
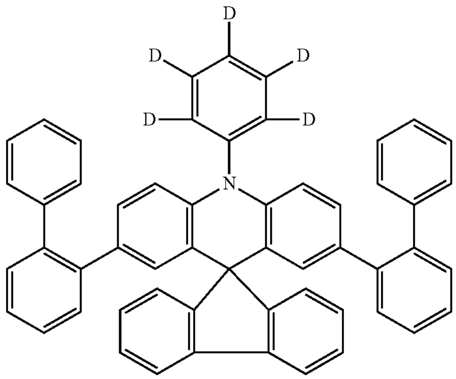
-continued
121
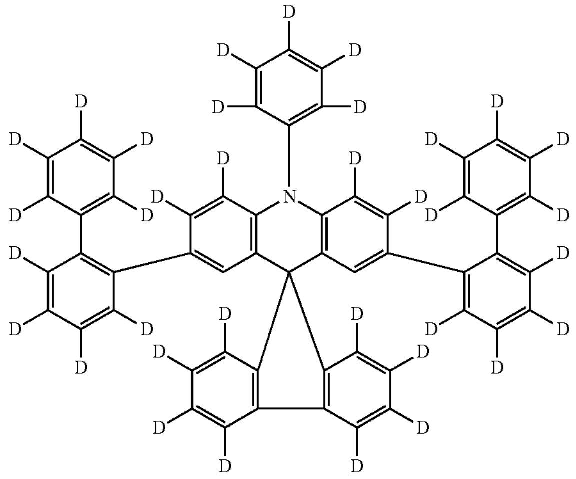
122
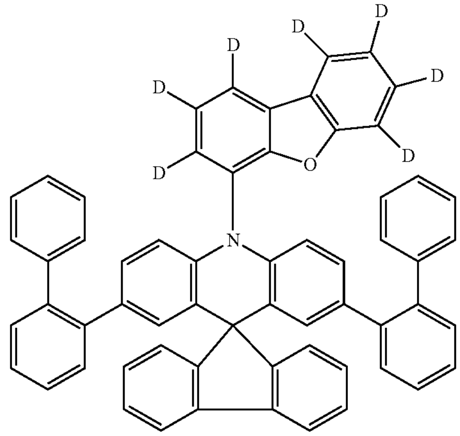
123
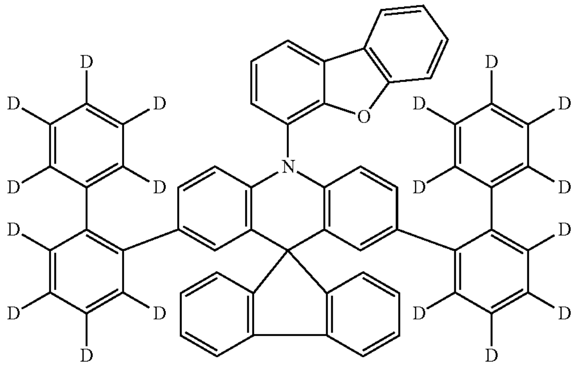

-continued
124
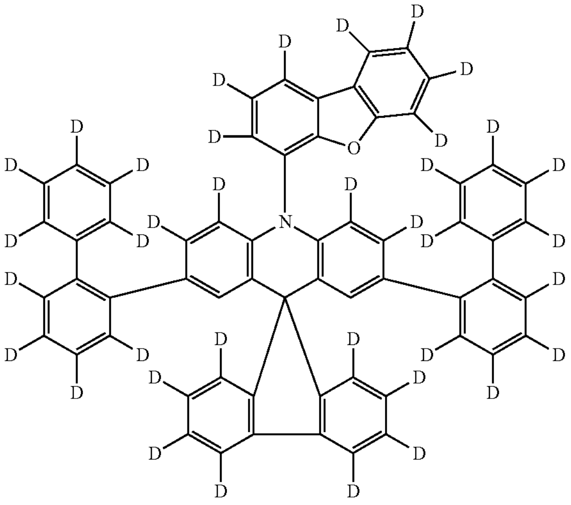
125
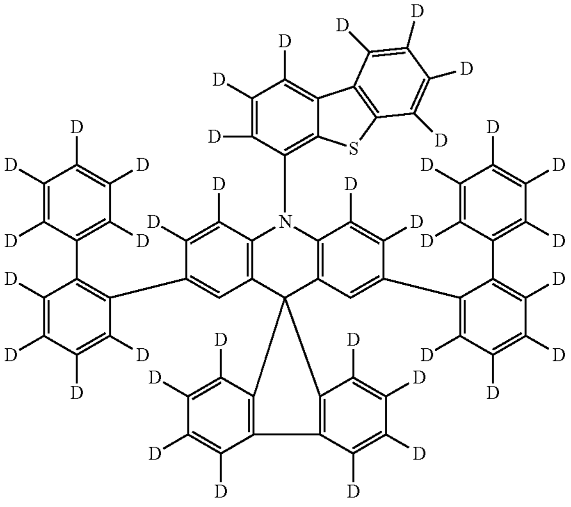
-continued
126
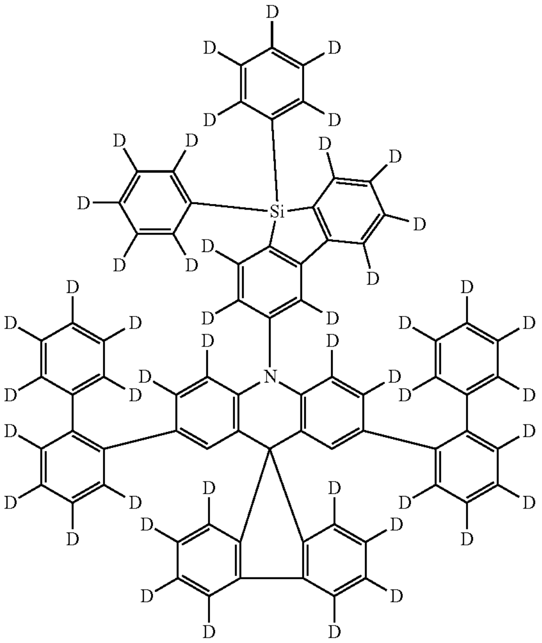
127
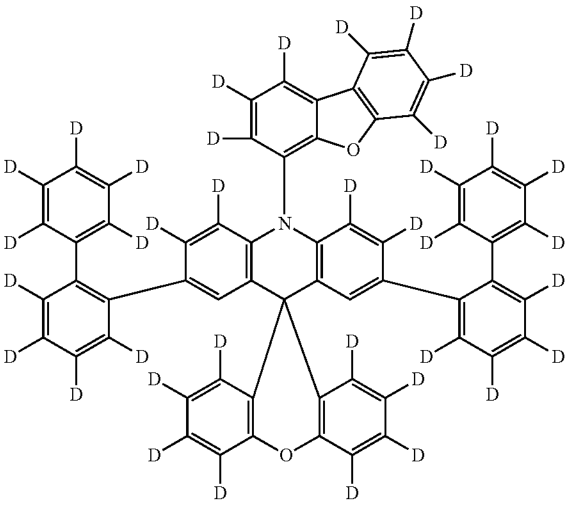

128
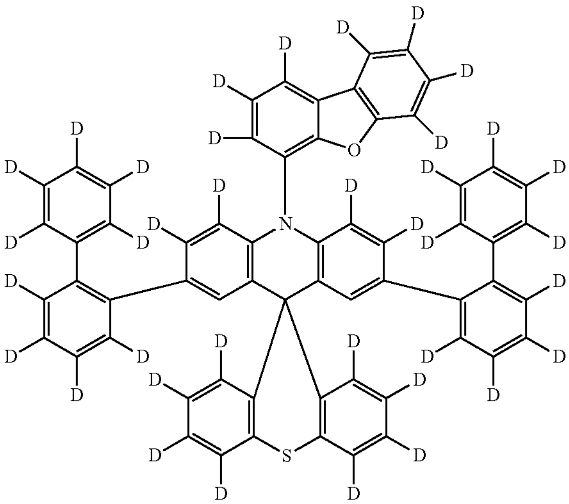
129
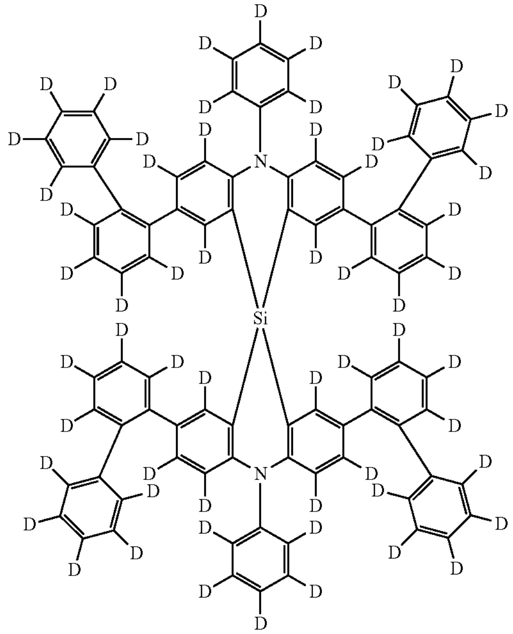
130
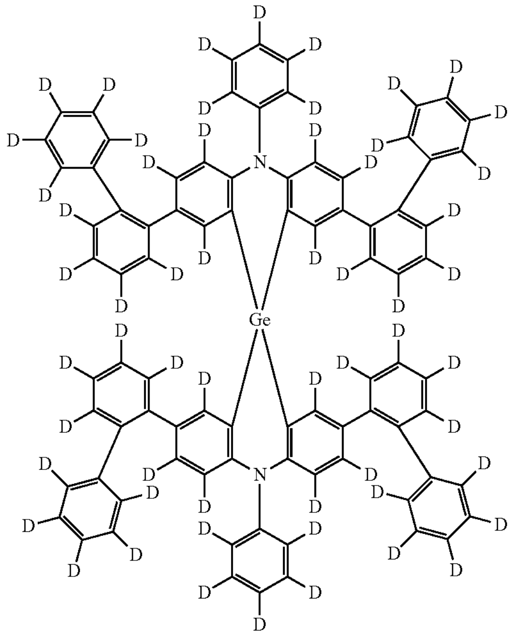
131
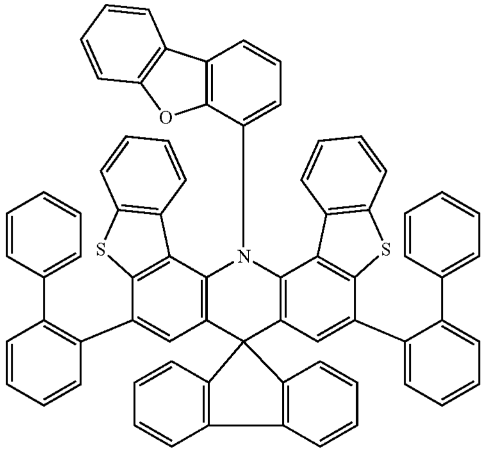
132
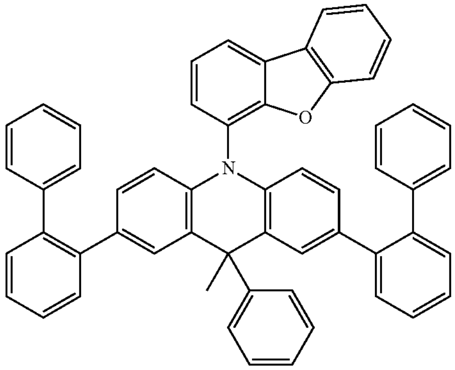

-continued

133

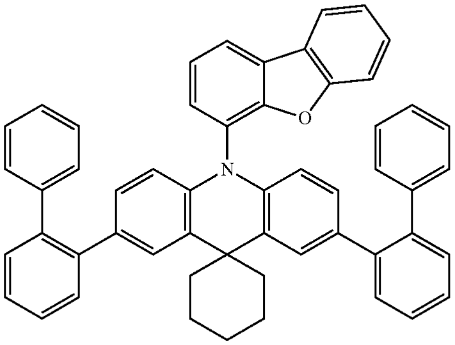

134

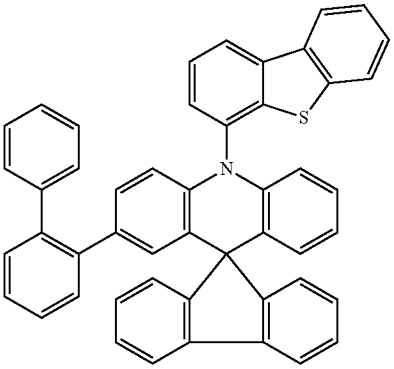

135

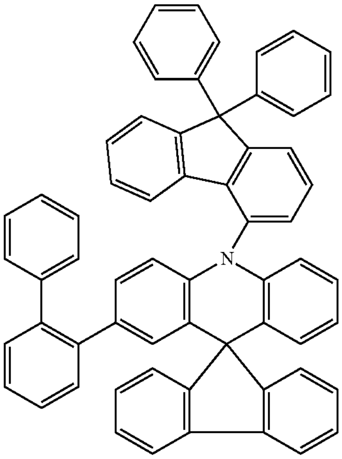

136

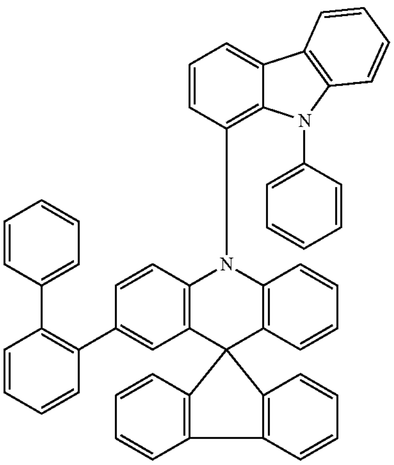

-continued

137

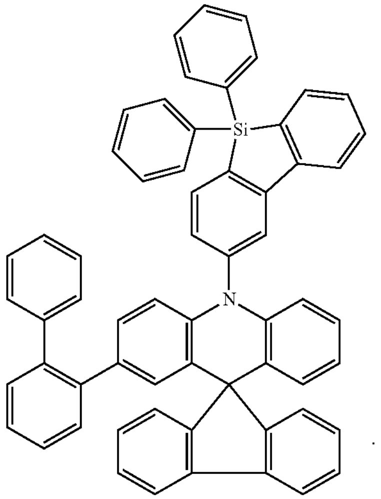

8. A nitrogen-containing compound represented by Formula 1:

[Formula 1]

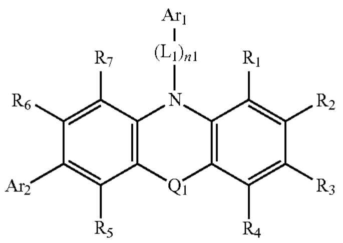

wherein in Formula 1, n1 is an integer from 0 to 2, $L_1$ is a substituted or unsubstituted arylene group having 6 to 30 ring-forming carbon atoms, or a substituted or unsubstituted heteroarylene group having 2 to 30 ring-forming carbon atoms, $Ar_1$ is a substituted or unsubstituted aryl group having 6 to 30 ring-forming carbon atoms, or a substituted or unsubstituted heteroaryl group having 2 to 30 ring-forming carbon atoms, and $Ar_2$ is a group represented by one of Ar2-1 to Ar2-6:

$R_1$, $R_2$ and $R_4$ to $R_7$ are each independently a hydrogen atom, a deuterium atom, a substituted or unsubstituted silyl group, a substituted or unsubstituted amine group, a substituted or unsubstituted oxy group, a substituted or unsubstituted thio group, a substituted or unsubstituted alkyl group having 1 to 20 carbon atoms, a substituted or unsubstituted alkenyl group having 2 to 20 carbon atoms, a substituted or unsubstituted aryl group having 6 to 20 ring-forming carbon atoms, or a substituted or unsubstituted heteroaryl group having 2 to 20 ring-forming carbon atoms, or are bonded to an adjacent group to form a ring, $Ar_2$ and $R_3$ are the same, $Q_1$ is O, S, SO, Se, CO, $C(R_{11})(R_{12})$, $B(R_{13})$, $P(R_{15})$, $PO(R_{16})$, $PS(R_{17})$, or a group represented by Formula 3, $R_{11}$ and $R_{12}$ are each independently a substituted or unsubstituted alkyl group having 1 to 20 carbon atoms, or a substituted or unsubstituted aryl group having 6 to 20 ring-forming carbon atoms, or are bonded to an adjacent group to form a ring, and $R_{13}$ and $R_{15}$ to $R_{17}$ are each independently a substituted or unsubstituted aryl group having 6 to 30 ring-forming carbon atoms:

Ar2-1

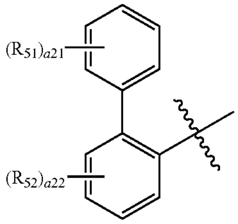

Ar2-2

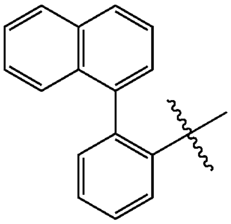

Ar2-3

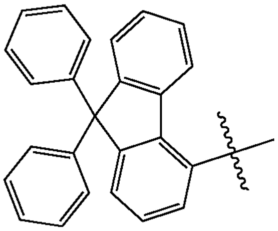

Ar2-4

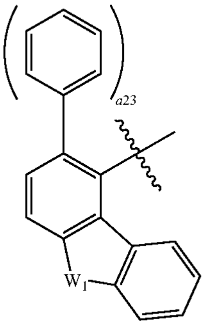

Ar2-5

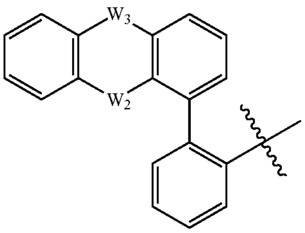

-continued

Ar2-6

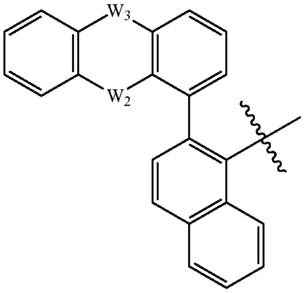

wherein in Ar2-1, a21 is an integer from 0 to 5, a22 is an integer from 0 to 4, and $R_{51}$ and $R_{52}$ are each independently a hydrogen atom, a deuterium atom, or an unsubstituted phenyl group, wherein in Ar2-4, a23 is 0 or 1, and $W_1$ is N(Ph), O, or S, wherein in Ar2-5 and Ar2-6, one of $W_2$ or $W_3$ is a direct linkage, and the other of $W_2$ and $W_3$ is N(Ph), O, or S, and wherein in Ar2-4 to Ar2-6, Ph is a phenyl group,

[Formula 3]

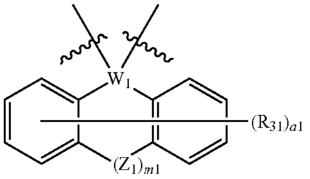

wherein in Formula 3, $W_1$ is C, Si, or Ge, m1 is 0 or 1, and $Z_1$ is a direct linkage, $C(R_{32})(R_{33})$, $N(R_{34})$, O, or S, a1 is an integer from 0 to 8, $R_{31}$ to $R_{34}$ are each independently a hydrogen atom, a deuterium atom, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, when $R_3$ is a hydrogen atom, $Ar_1$ is a substituted or unsubstituted fluorenyl group, a substituted or unsubstituted carbazole group, a substituted or unsubstituted dibenzofuran group, a substituted or unsubstituted dibenzothiophene group, or a substituted or unsubstituted dibenzosilole group, and when $Ar_2$ is a group represented by Ar2-1, $Q_1$ is a group represented by Formula 3, and $Z_1$ is a direct linkage or $N(R_{34})$.

9. The nitrogen-containing compound of claim 8, wherein $Ar_1$ is a group represented by one of Ar1-1 to Ar1-9:

Ar1-1

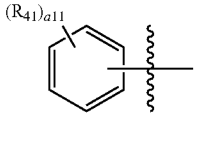

-continued

Ar1-2

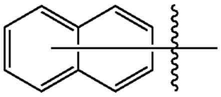

Ar1-3

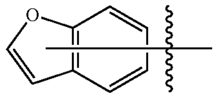

Ar1-4

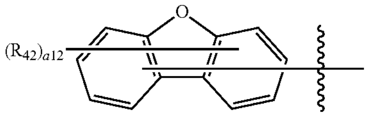

Ar1-5

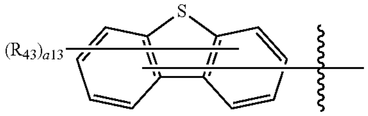

Ar1-6

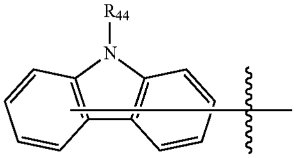

Ar1-7

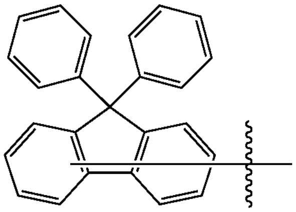

Ar1-8

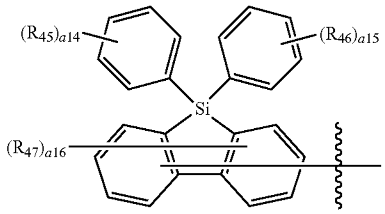

Ar1-9

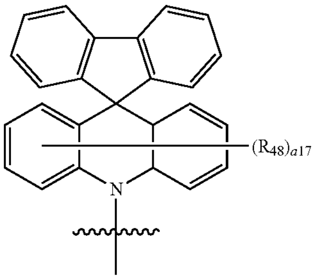

wherein in Ar1-1, a11 is an integer from 0 to 5, wherein in Ar1-4 and Ar1-5, a12 and a13 are each independently an integer from 0 to 7, wherein in Ar1-8, a14 and a15 are each independently an integer from 0 to 5, and a16 is an integer from 0 to 7, wherein in Ar1-9, a17 is an integer from 0 to 8, and wherein in Ar1-1, Ar1-4 to Ar1-6, Ar1-8, and Ar1-9, $R_{41}$ to $R_{48}$ are each independently a hydrogen atom, a deuterium atom, or a substituted or unsubstituted aryl group having 6 to 30 ring-forming carbon atoms.

10. The nitrogen-containing compound of claim 8, wherein the nitrogen-containing compound represented by Formula 1 is represented by one of Formula 1-1 to Formula 1-3:

[Formula 1-1]

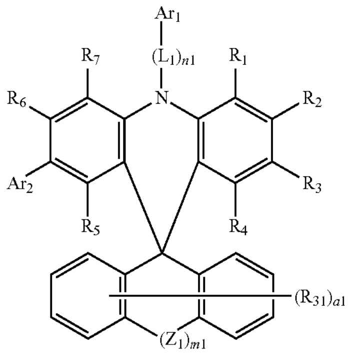

[Formula 1-2]

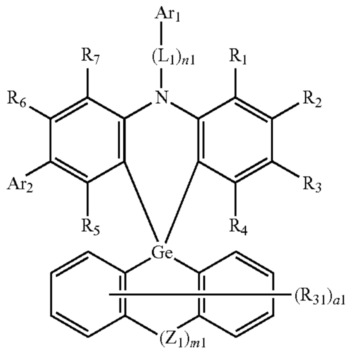

[Formula 1-3]

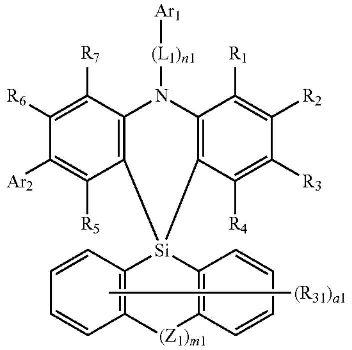

wherein in Formula 1-1 to Formula 1-3, $Ar_1$, $Ar_2$, $L_1$, n1, $R_1$ to $R_7$, a1, $R_{31}$, m1, and $Z_1$ are the same as defined in connection with Formula 1.

11. The nitrogen-containing compound of claim 10, wherein the nitrogen-containing compound represented by Formula 1-1 is represented by one of Formula 1-1A to Formula 1-1E:

[Formula 1-1A]

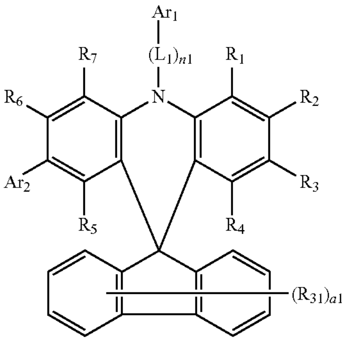

[Formula 1-1B]

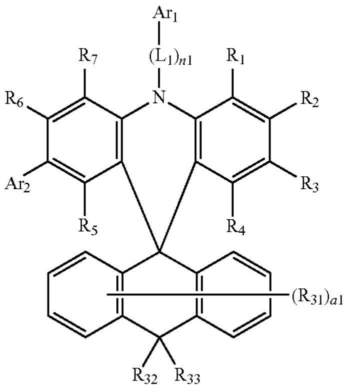

[Formula 1-1C]

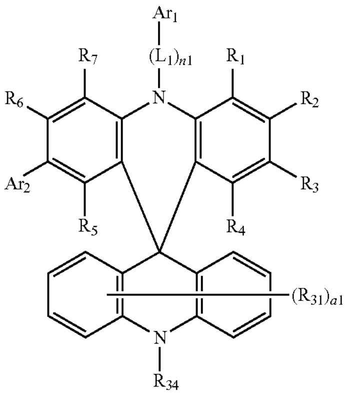

[Formula 1-1D]

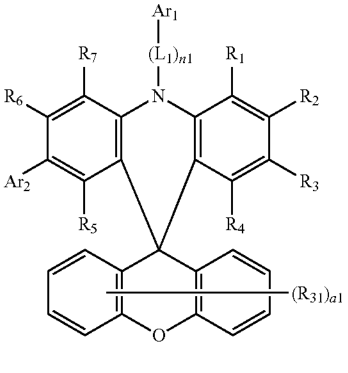

-continued

[Formula 1-1E]

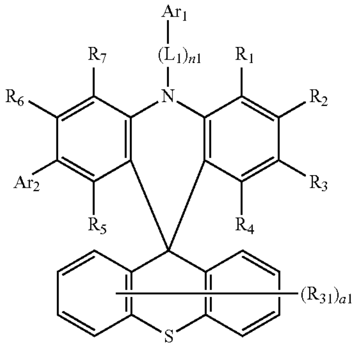

wherein in Formula 1-1A to Formula 1-1E, $Ar_1$, $Ar_2$, $L_1$, n1, $R_1$ to $R_7$, a1, and $R_{31}$ to $R_{34}$ are the same as defined in connection with Formula 1.

12. The nitrogen-containing compound of claim 8, wherein at least one of $R_1$, $R_2$ and $R_4$ to $R_7$ is a deuterium atom.

13. The nitrogen-containing compound of claim 8, wherein the nitrogen-containing compound is bilaterally symmetrical with respect to the nitrogen atom (N) in Formula 1.

14. The nitrogen-containing compound of claim 8, wherein the nitrogen-containing compound represented by Formula 1 is one selected from Compound Group 1:

[Compound Group 1]

1

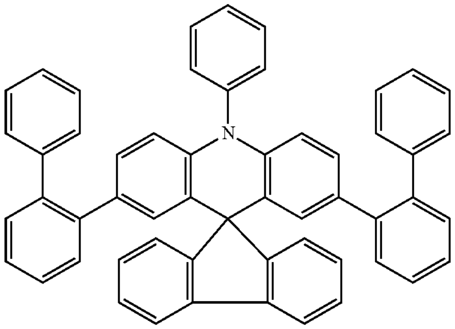

2

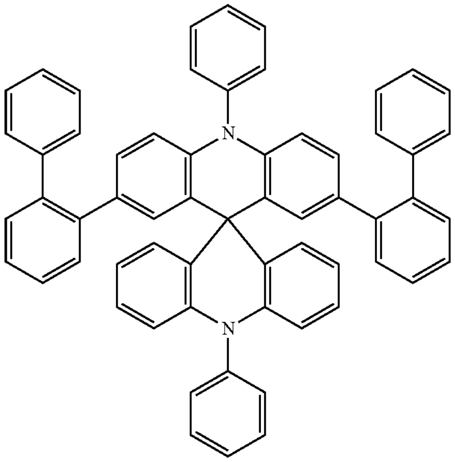

-continued
3
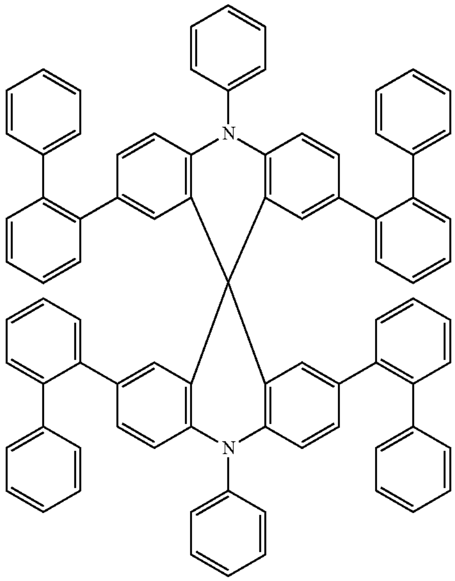
4
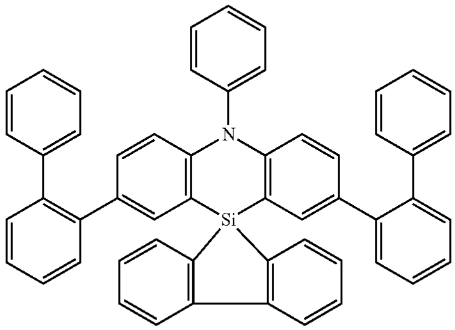
5
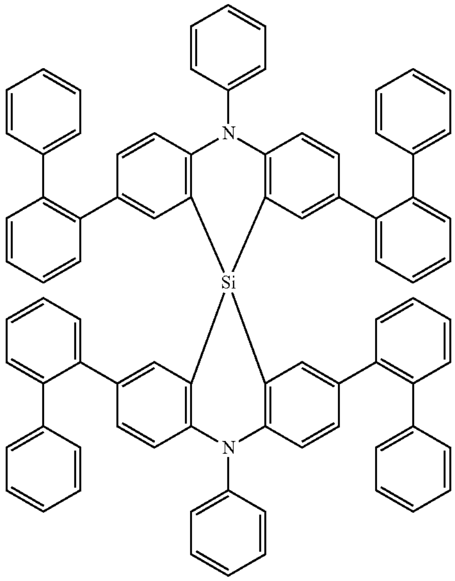
-continued
6
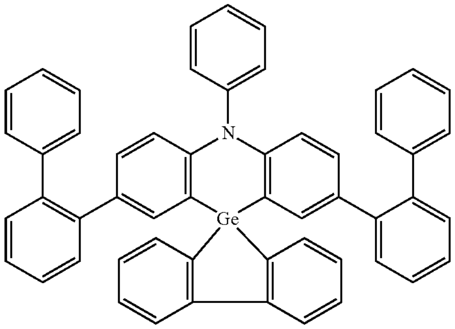
7
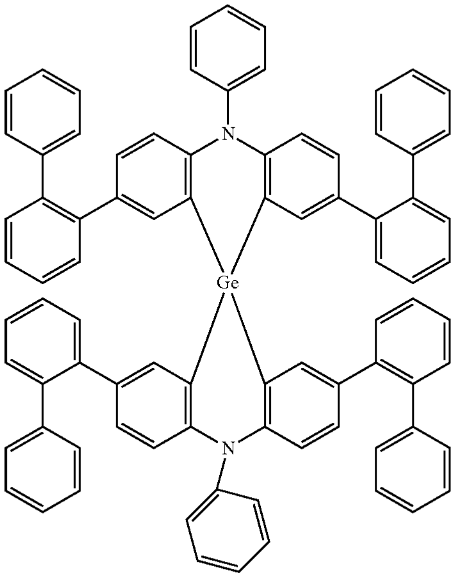
10
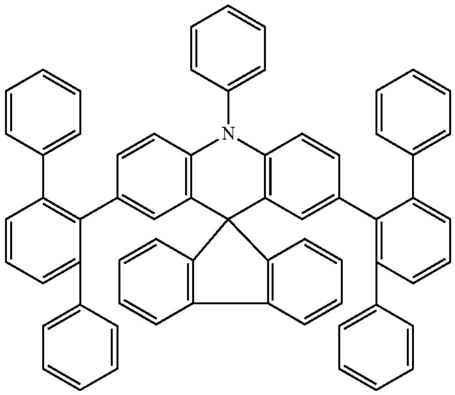
11
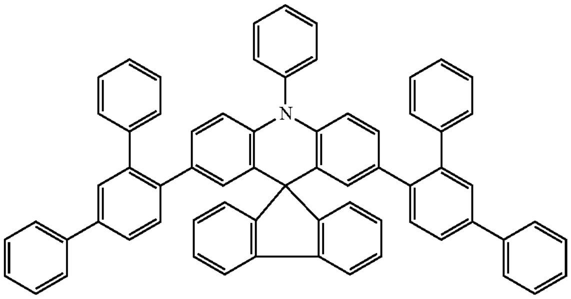

-continued
15
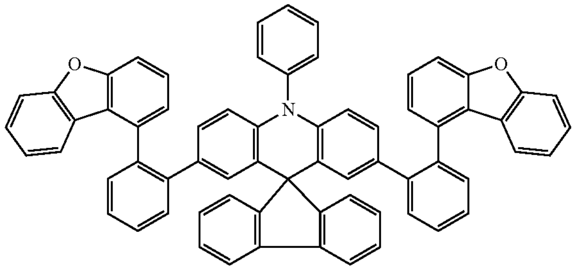
16
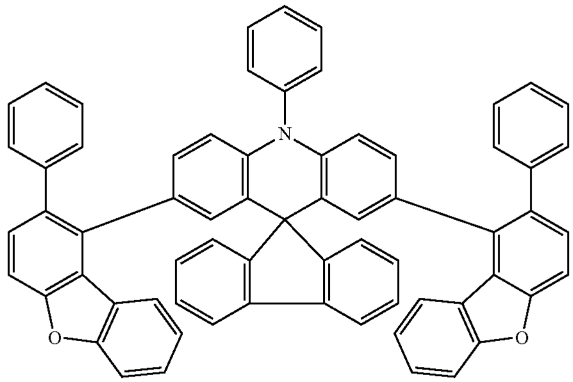
17
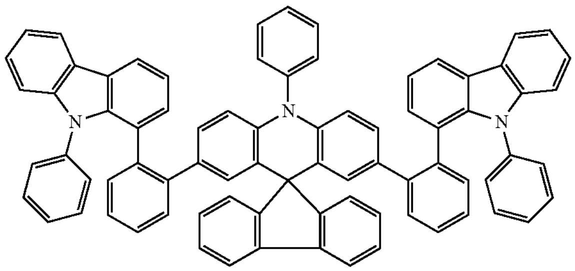
18
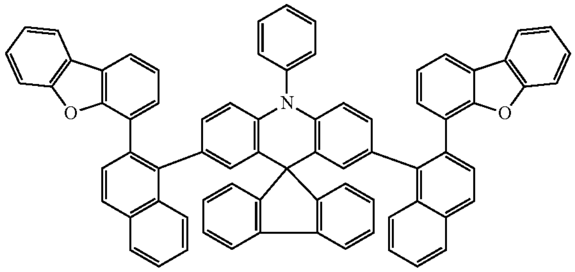
21
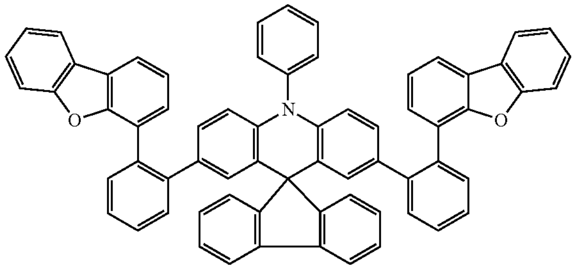
-continued
22
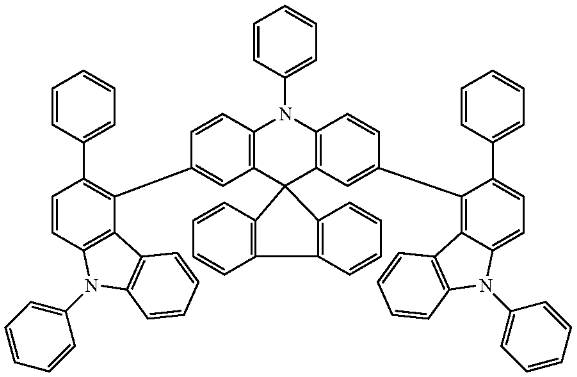
23
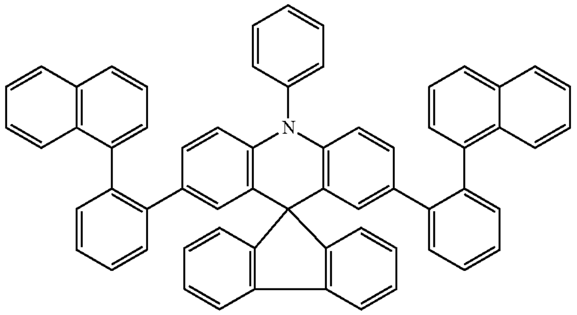
24
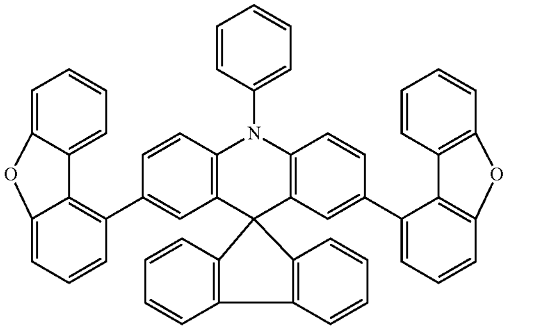
25
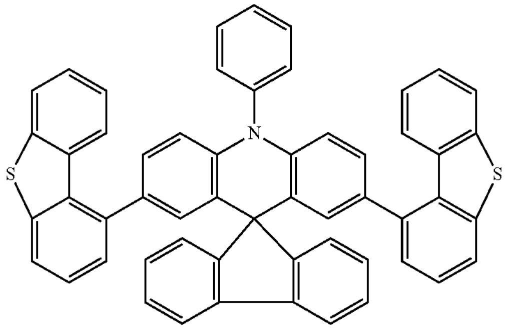

-continued
26
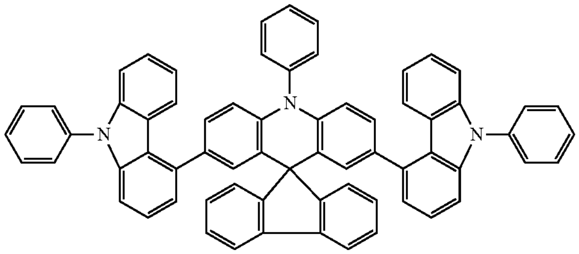
27
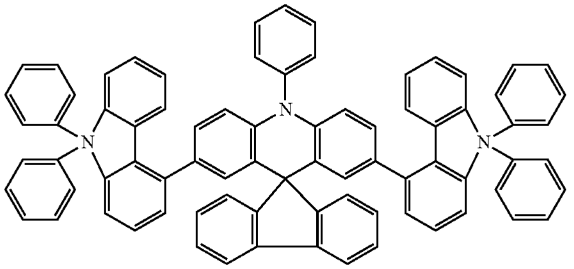
28
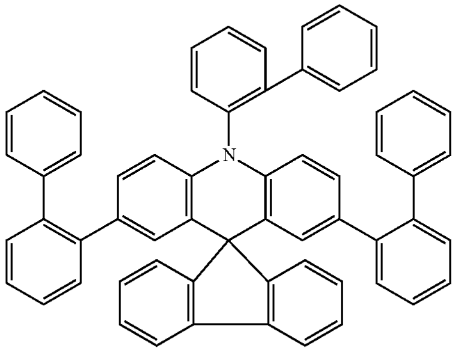
29
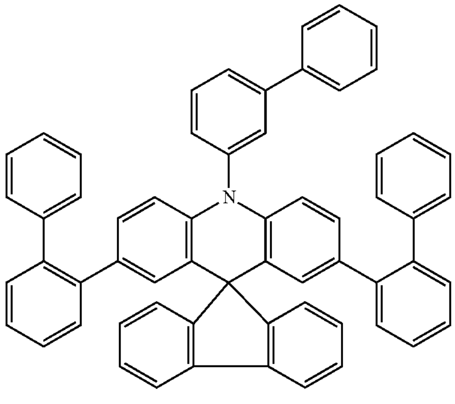
-continued
30
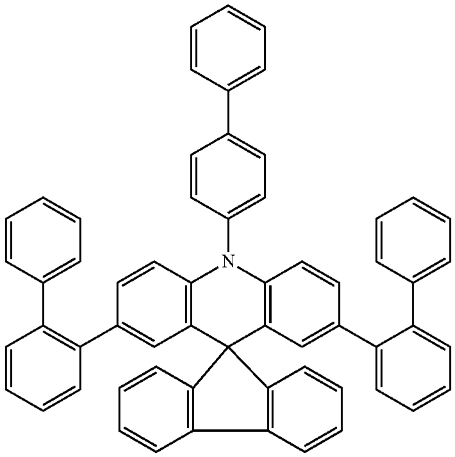
31
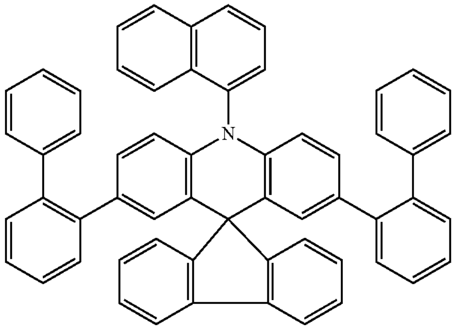
32
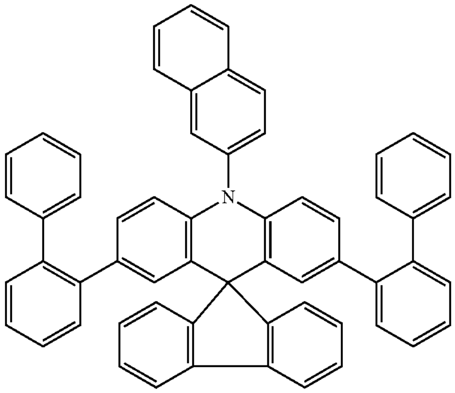
33
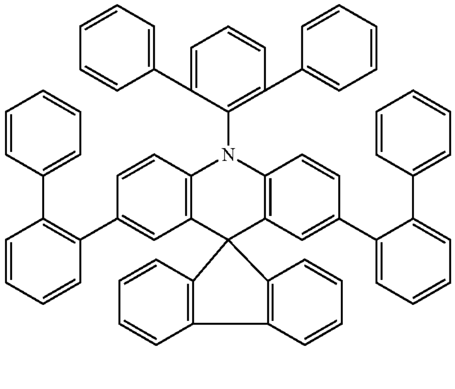

-continued
34
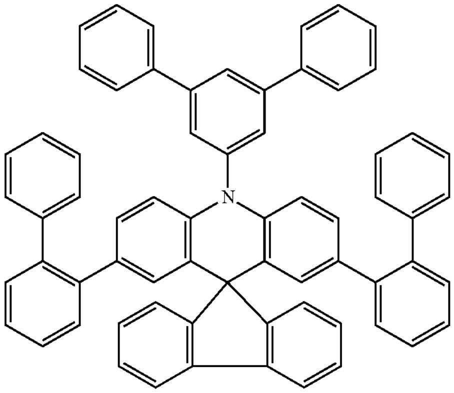
35
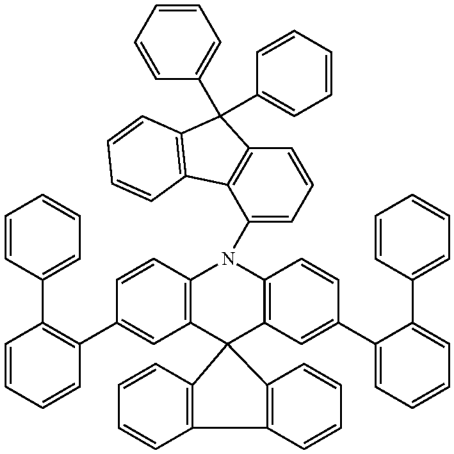
36
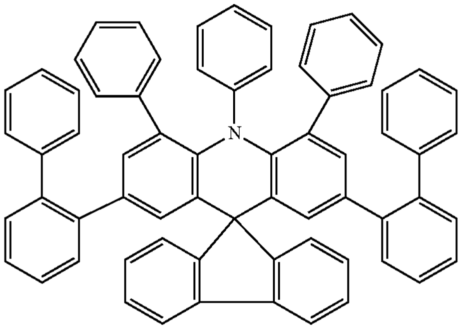
37
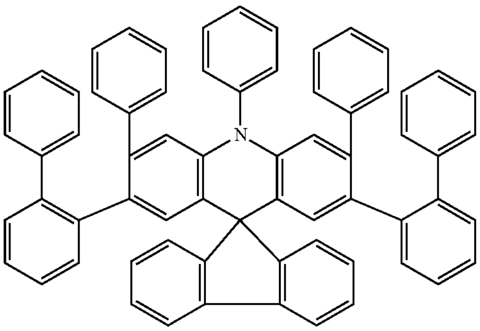
-continued
38
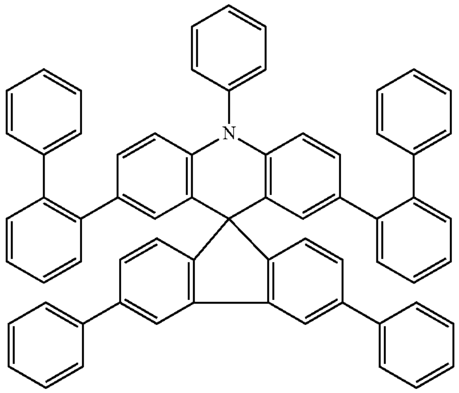
39
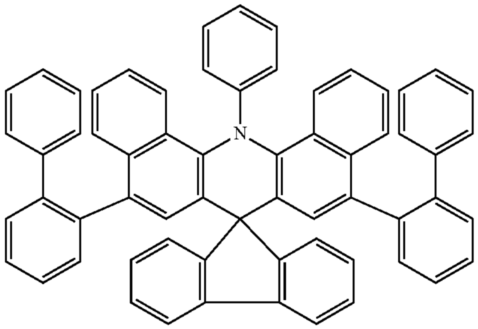
40
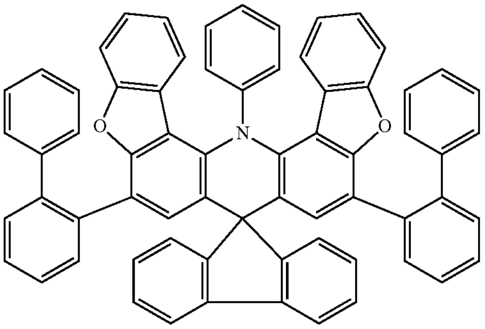

-continued
41
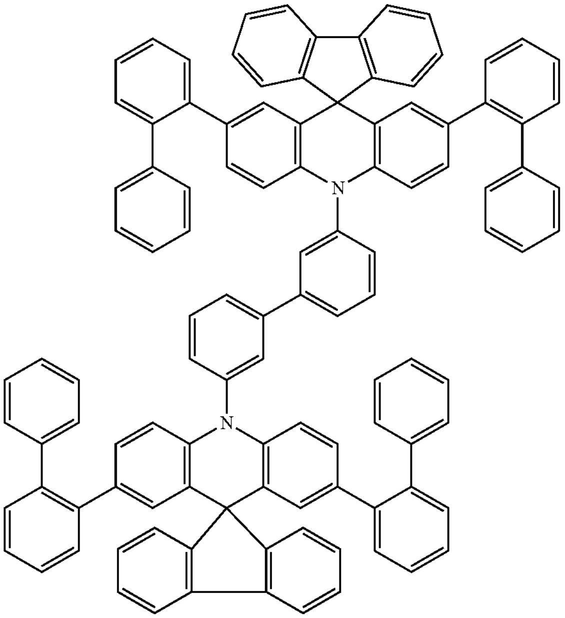
42
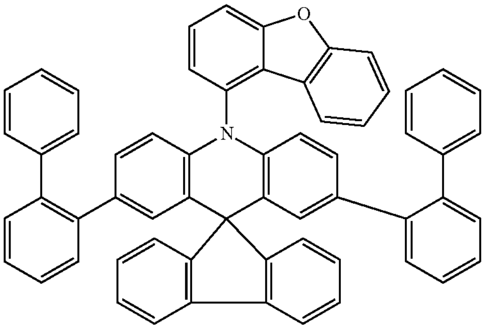
43
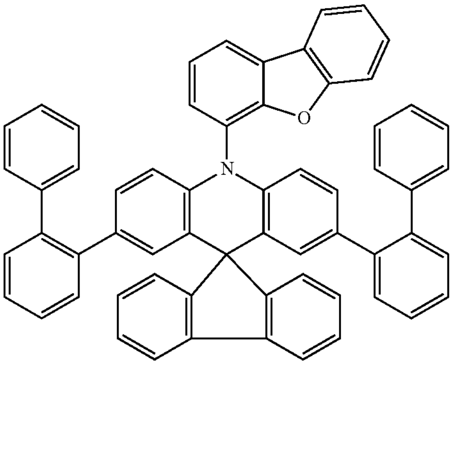
-continued
44
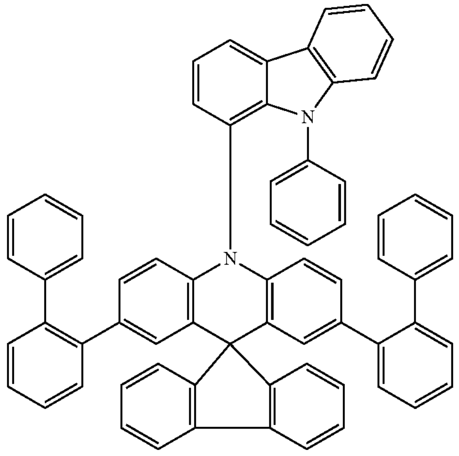
45
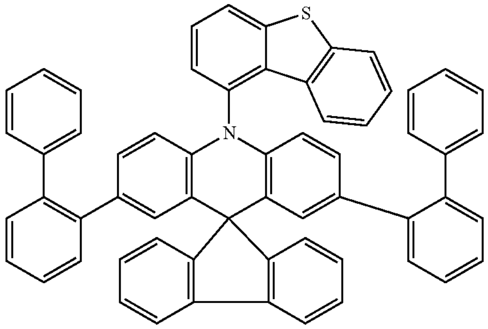
46
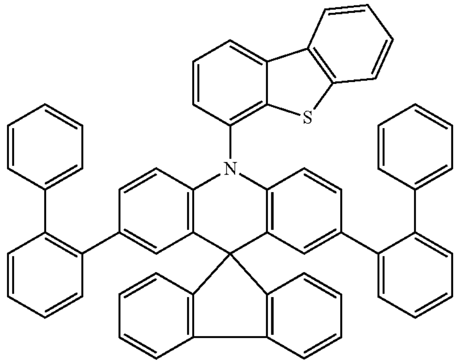
47
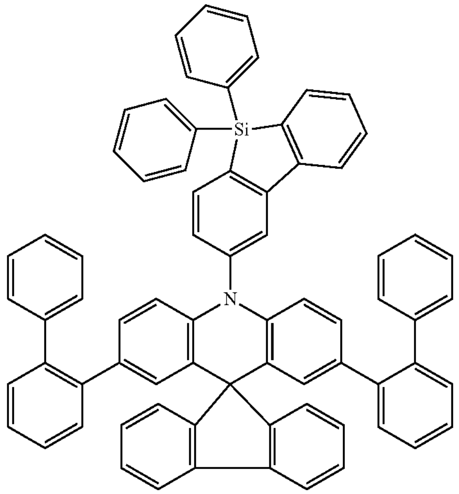

-continued
48
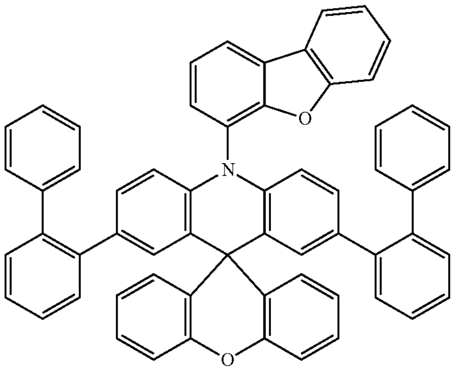
49
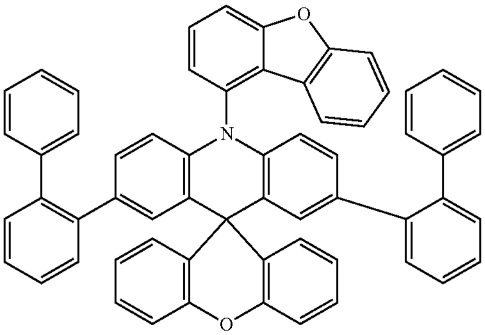
50
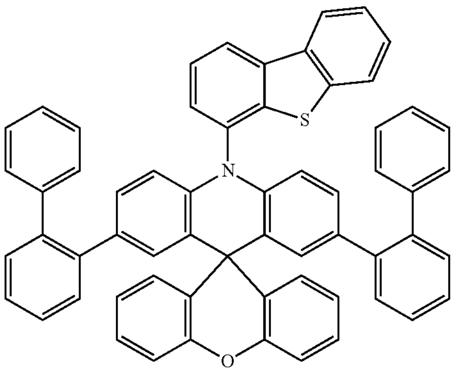
51
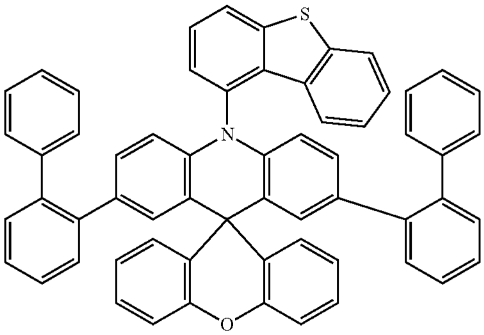
-continued
52
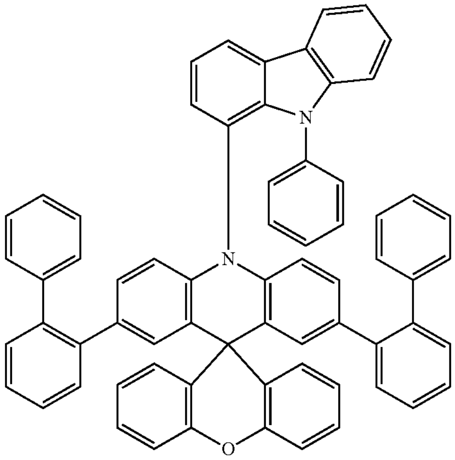
53
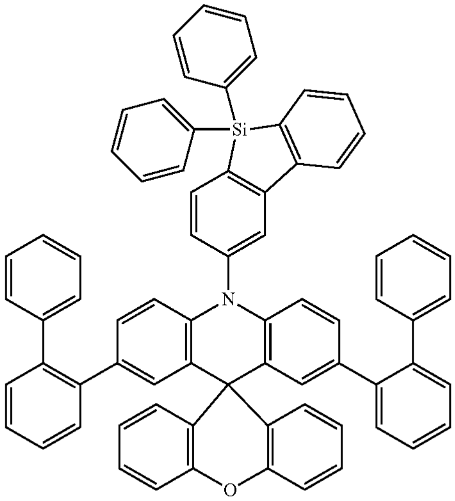
54
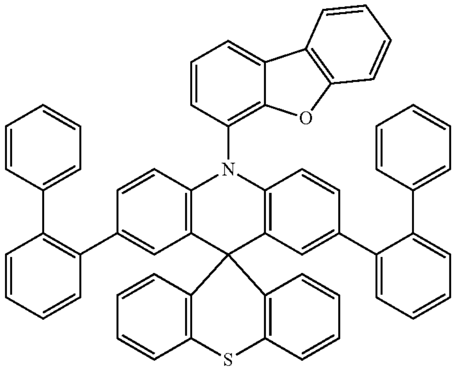

-continued
55
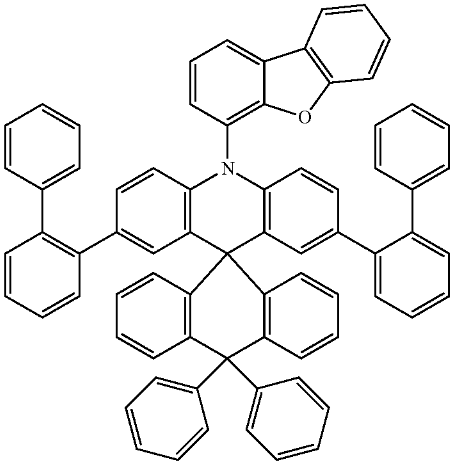
56
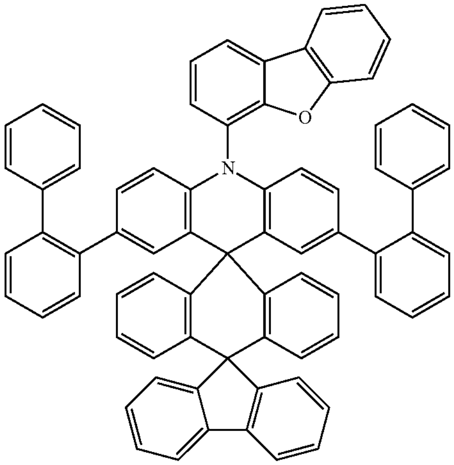
57
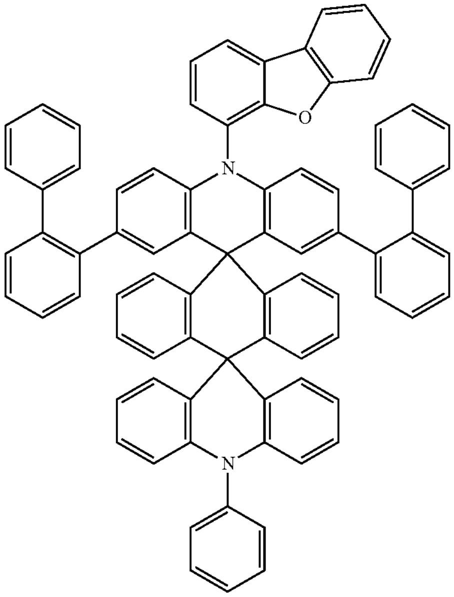
-continued
58
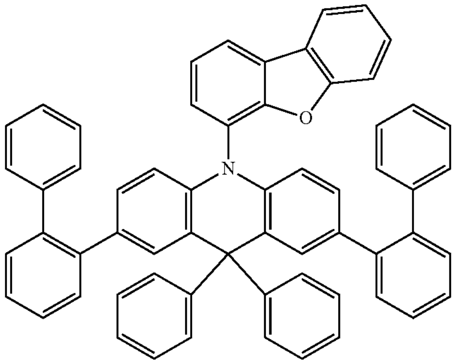
59
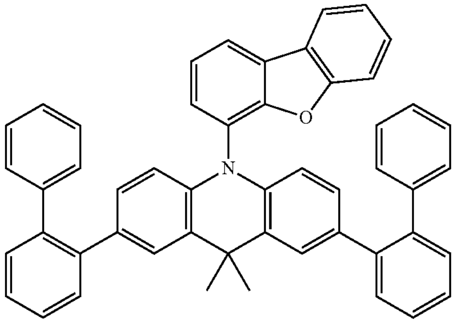
60
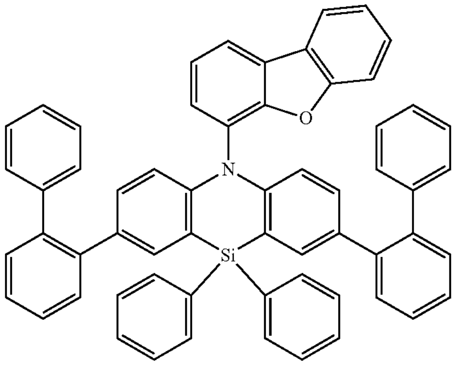
61
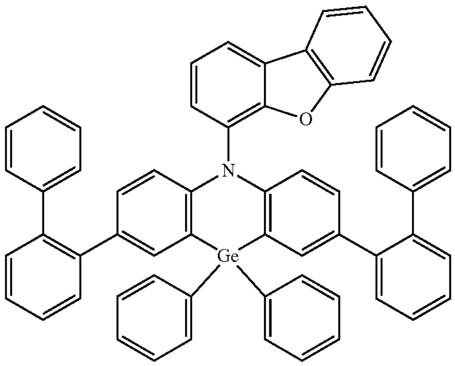

-continued
62
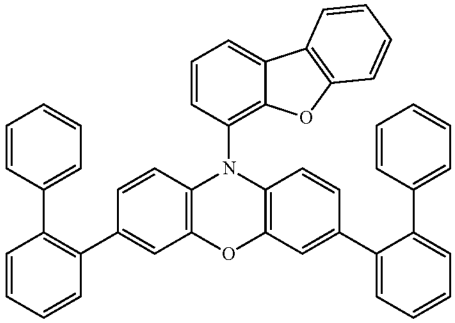
63
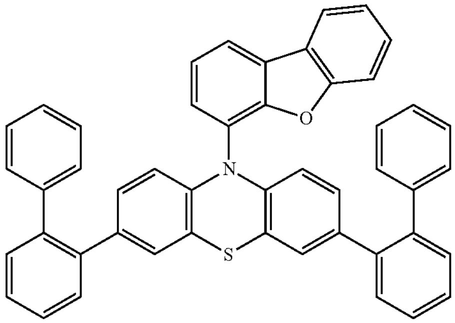
64
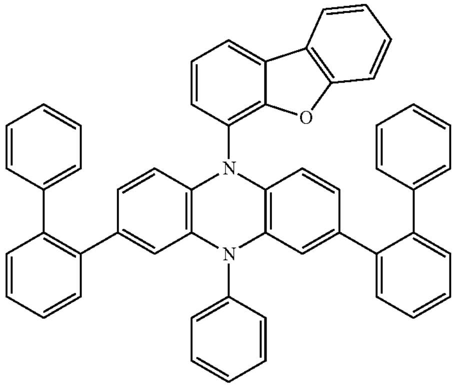
65
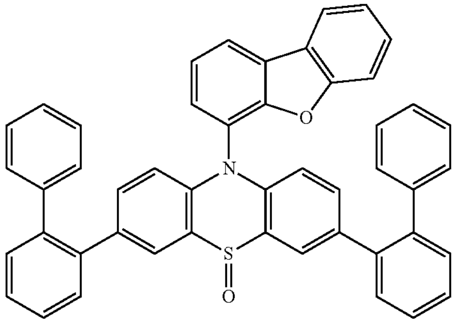
-continued
66
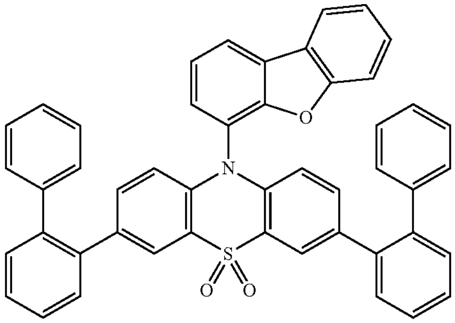
67
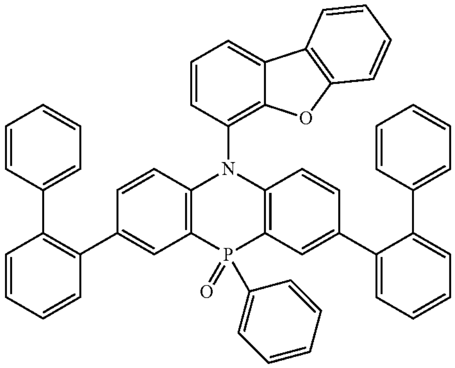
68
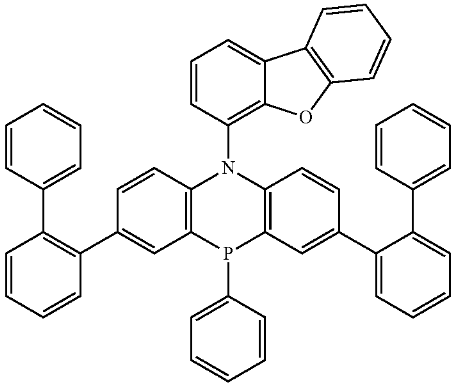
69
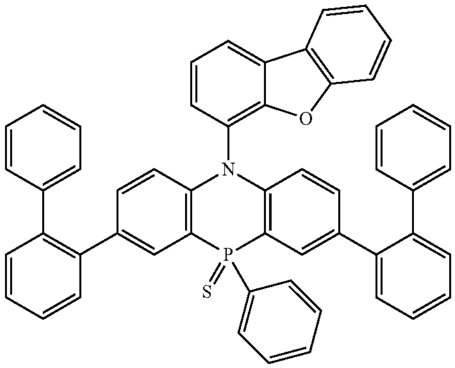

-continued
70
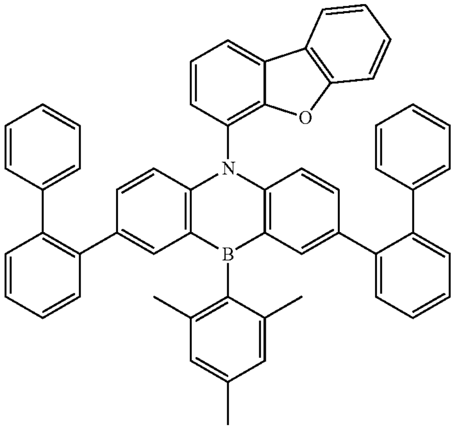
71
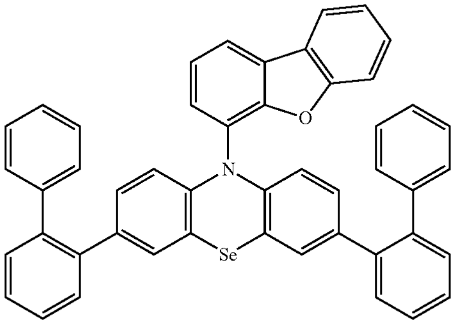
72
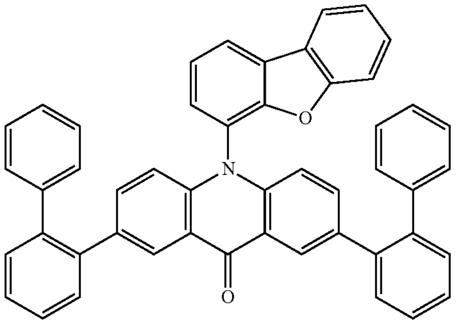
73
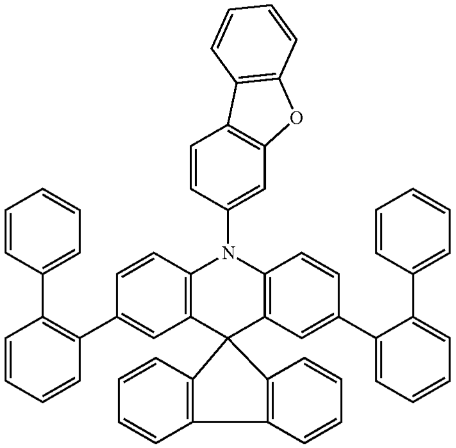
-continued
74
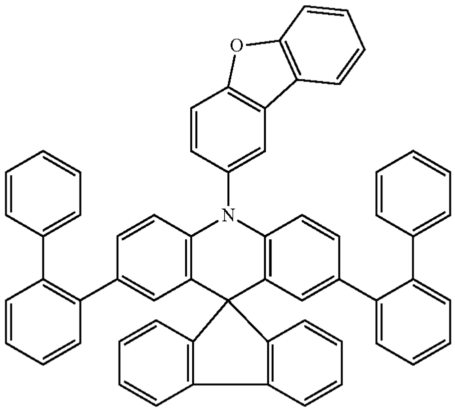
75
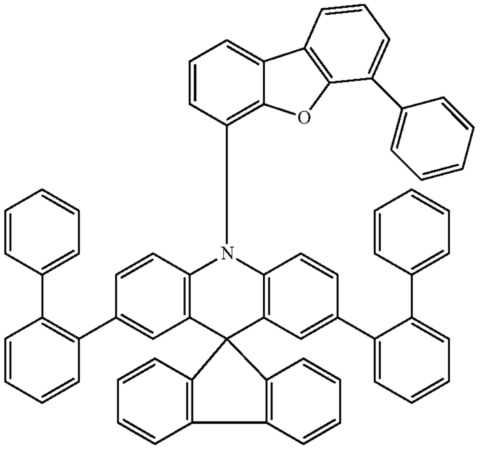
76
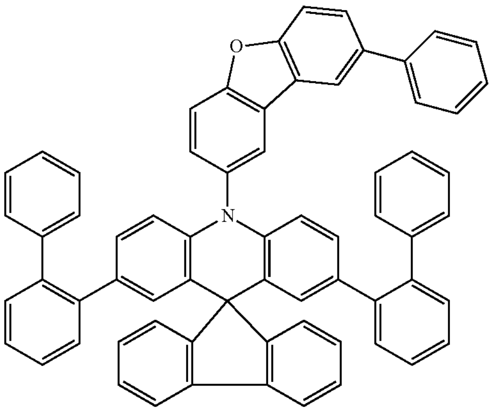

-continued
77
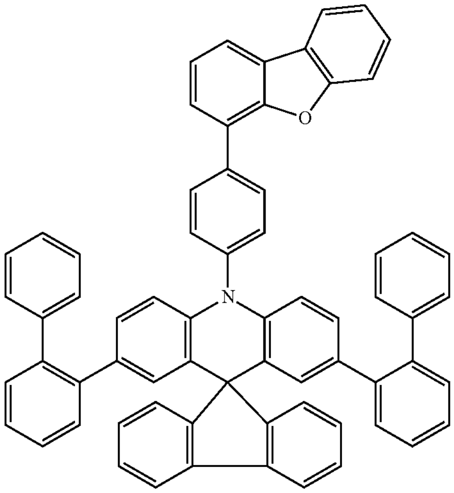
78
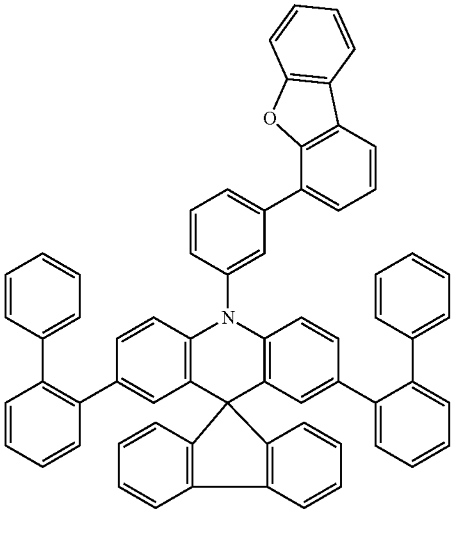
79
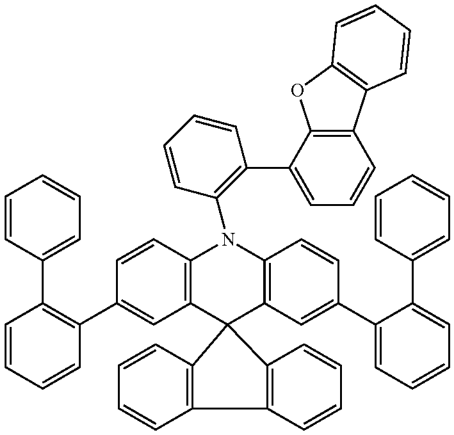
-continued
80
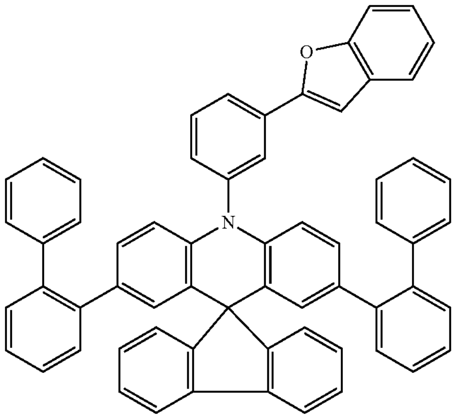
81
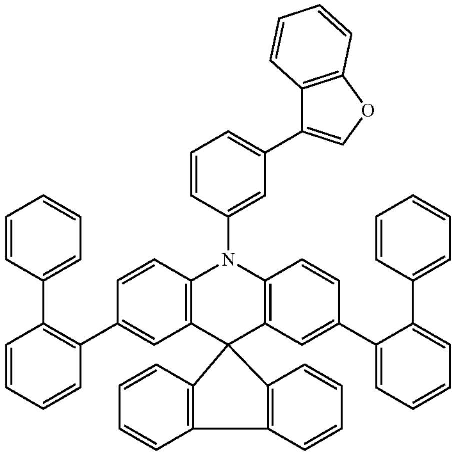
82
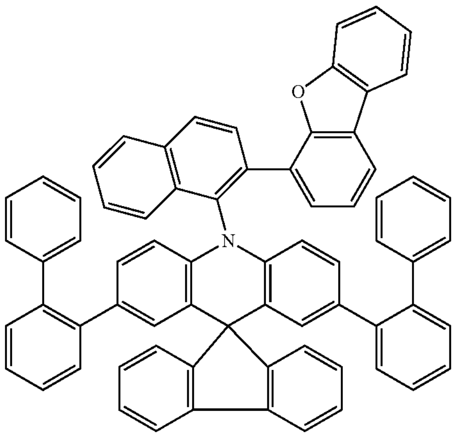

-continued
83
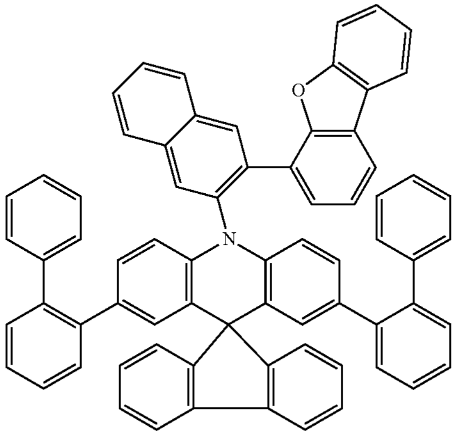
84
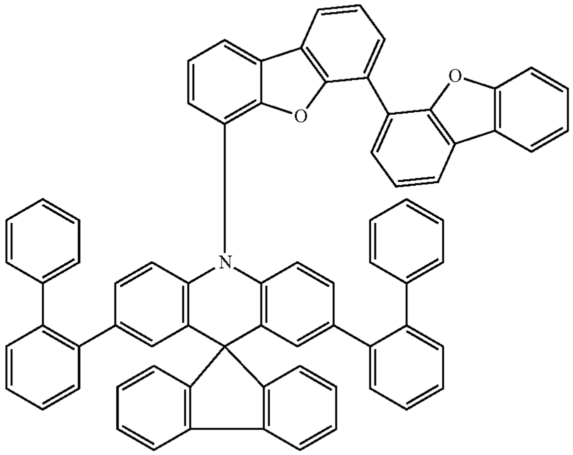
85
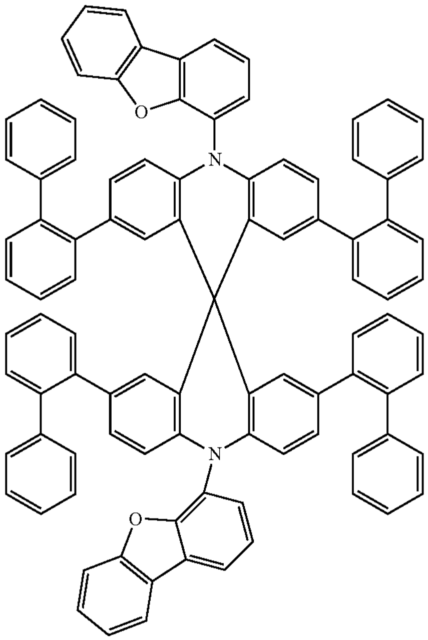
-continued
86
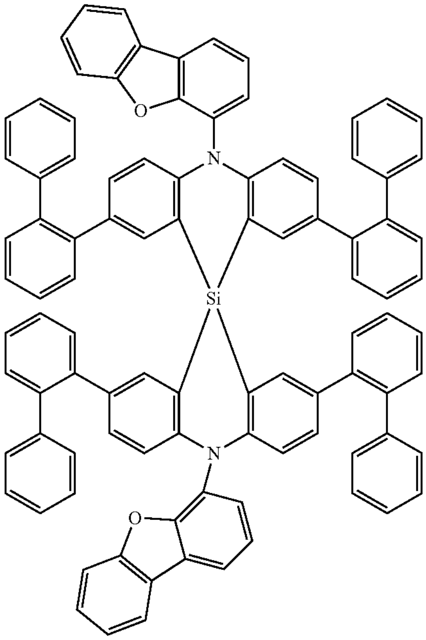
87
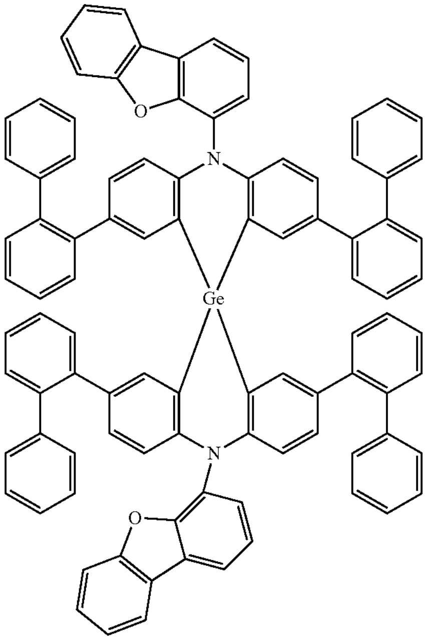
99
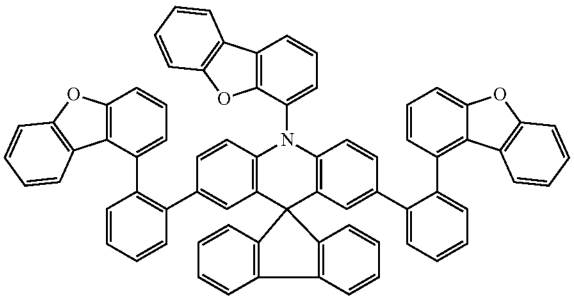

-continued
100
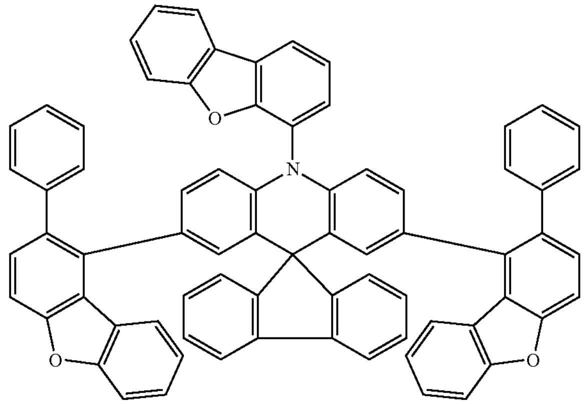
101
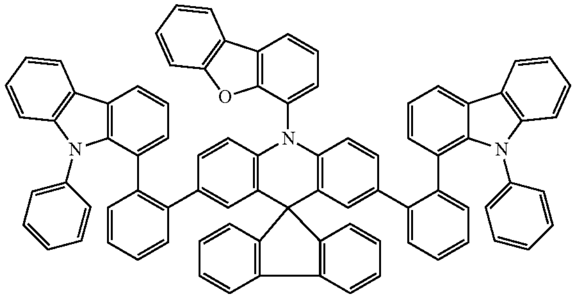
102
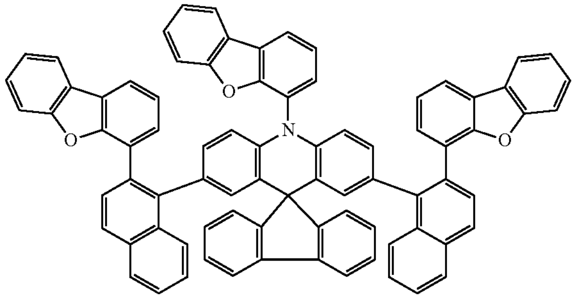
105
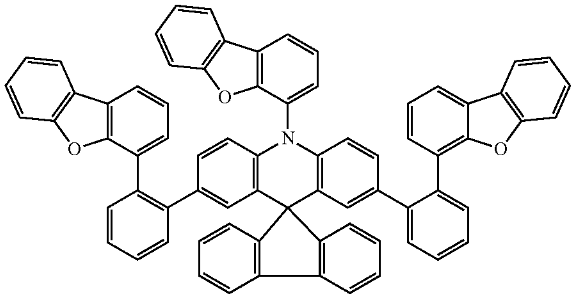
-continued
106
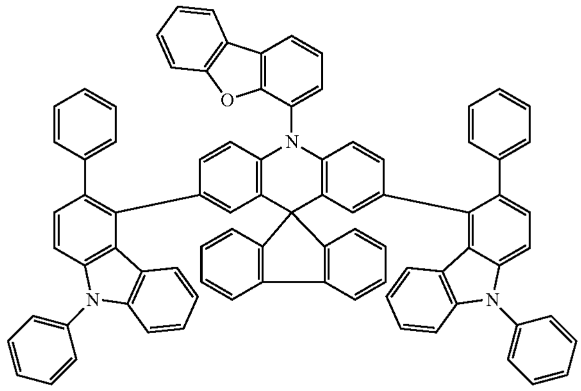
107
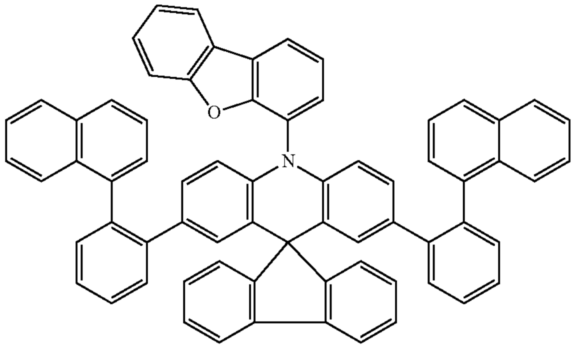
108
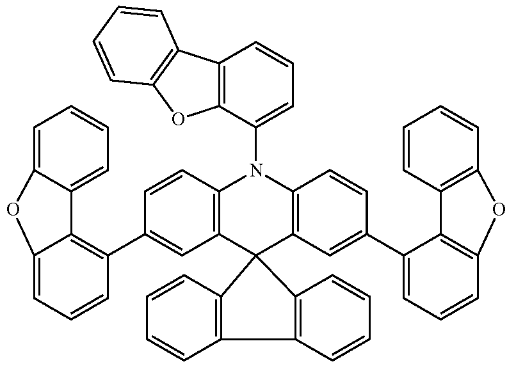
109
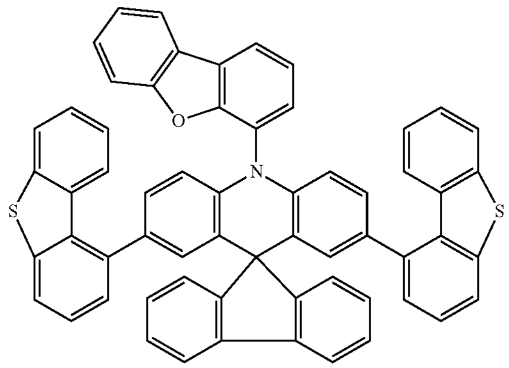

110
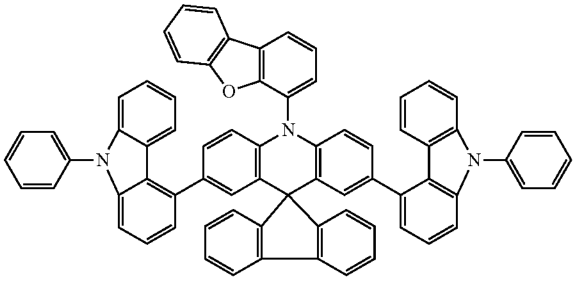
111
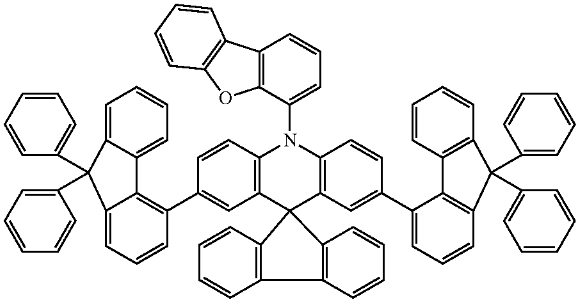
112
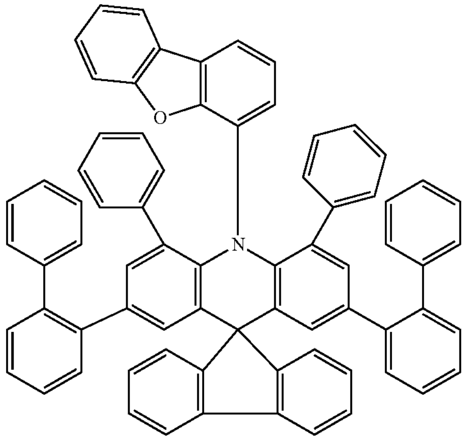
113
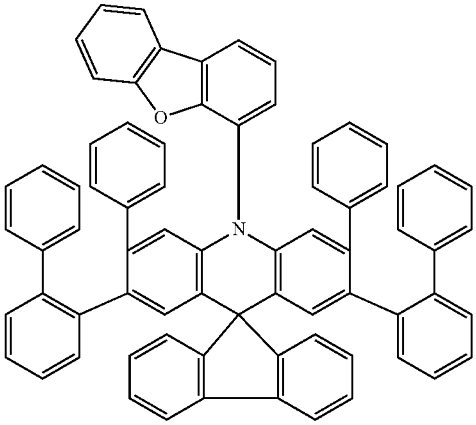
114
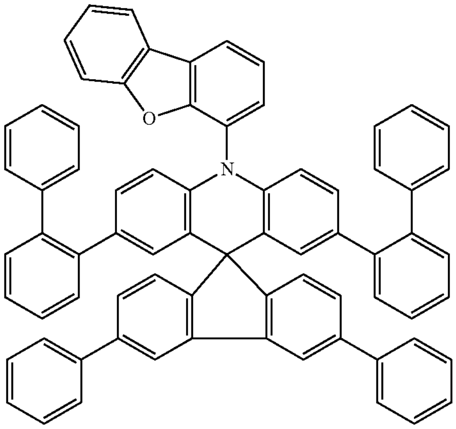
115
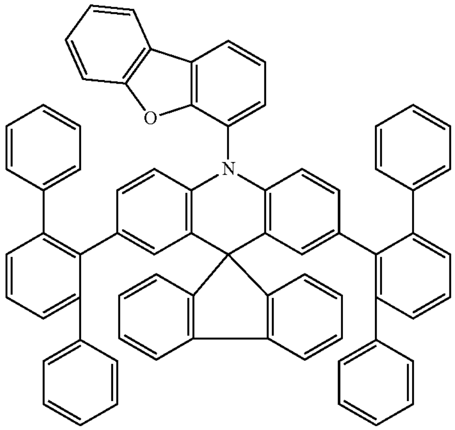
116
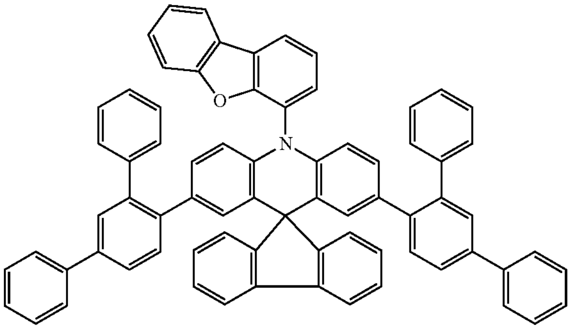
117
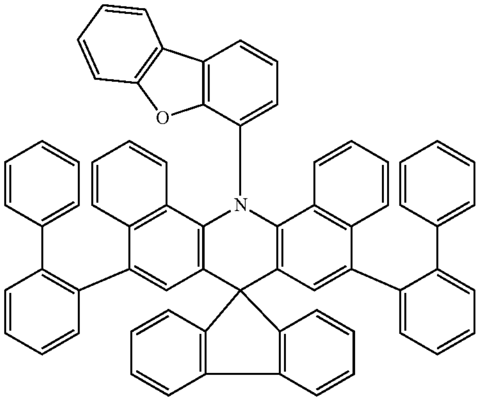

-continued
118
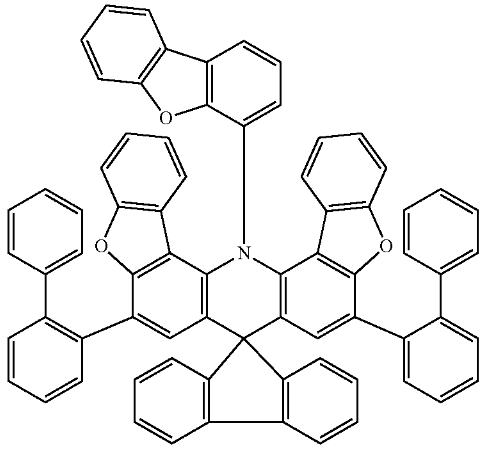
119
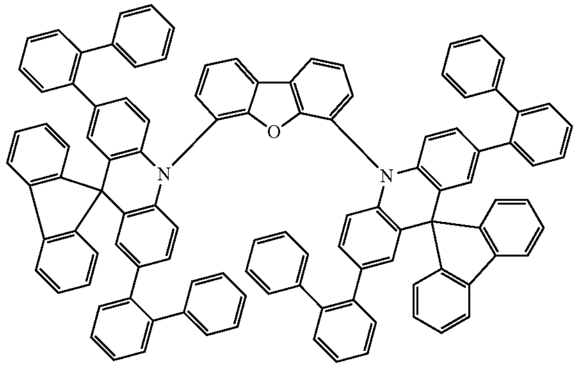
120
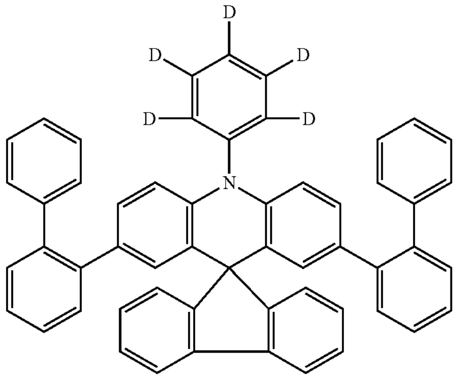
-continued
121
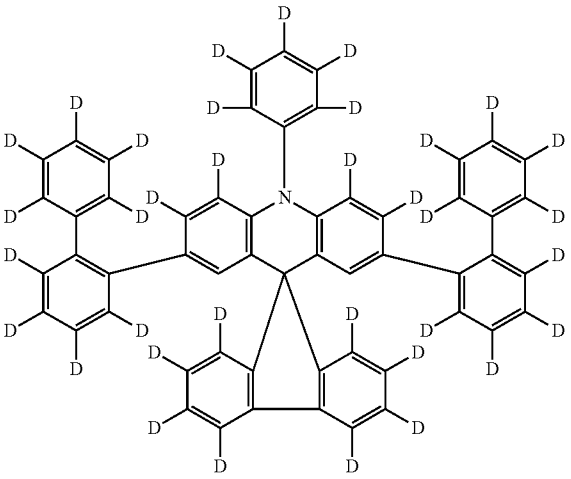
122
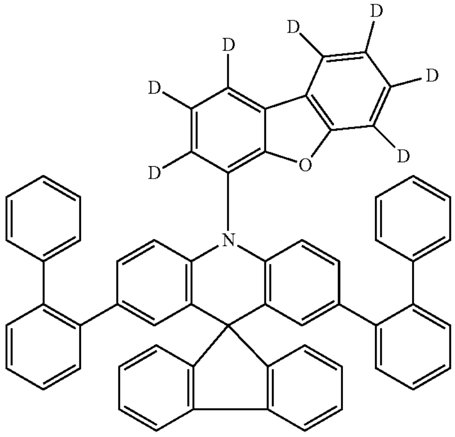
123
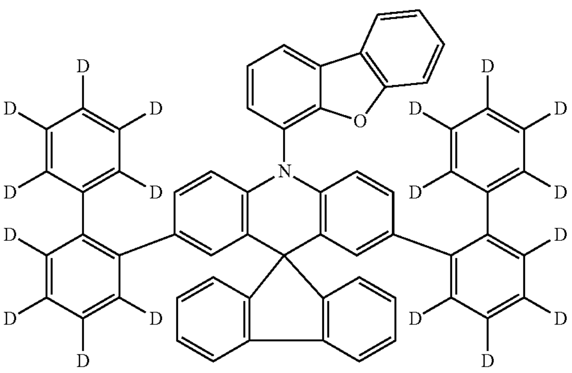

-continued
124
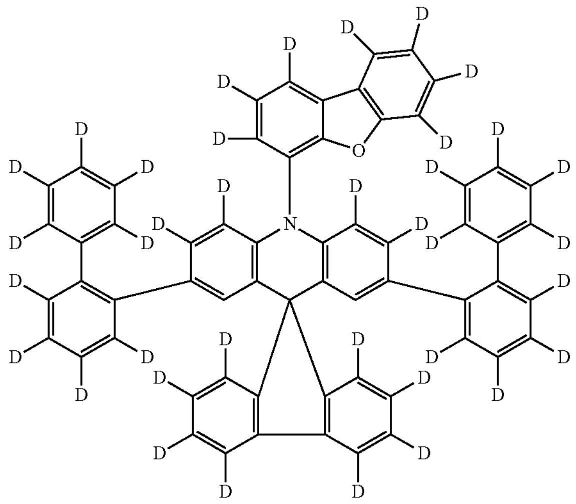
125
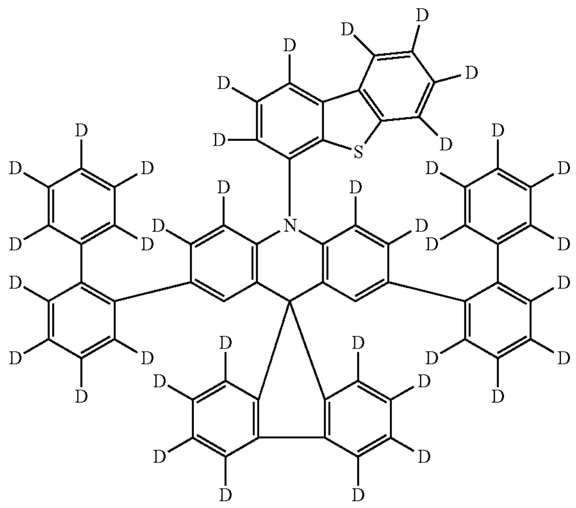
-continued
126
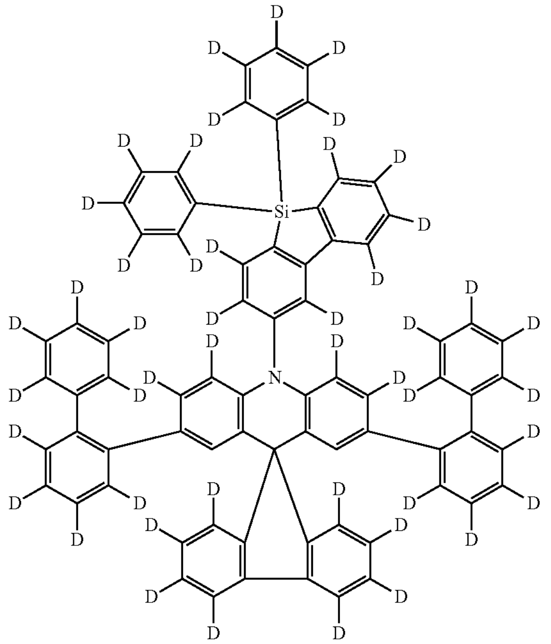
127
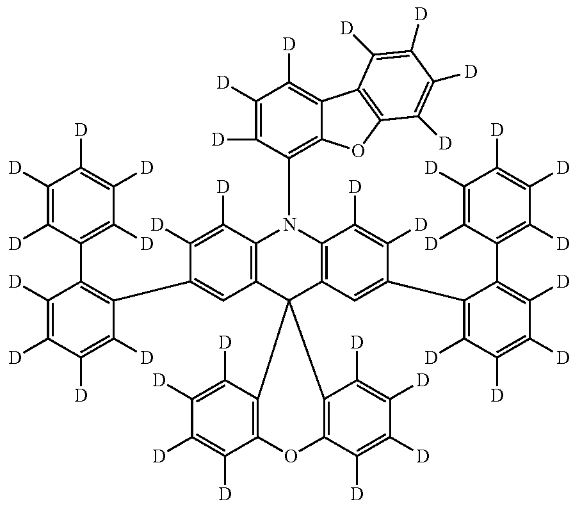

-continued
128
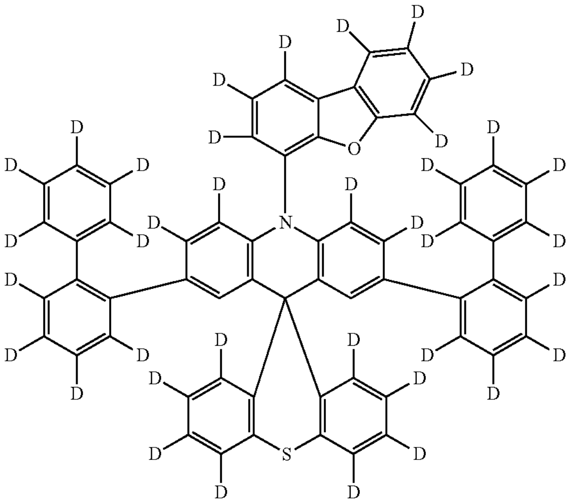
129
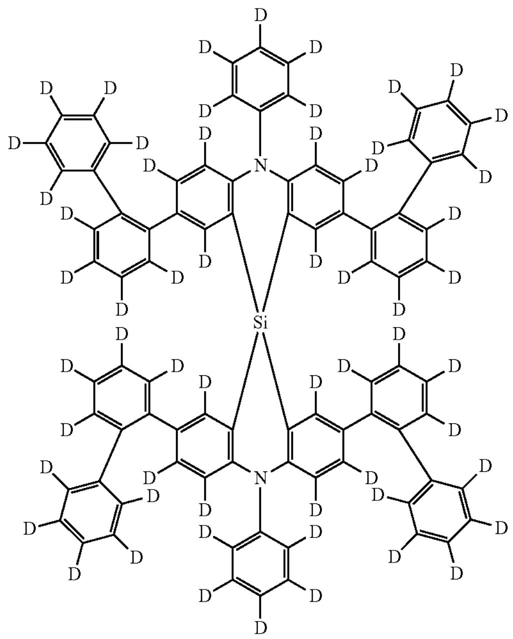
-continued
130
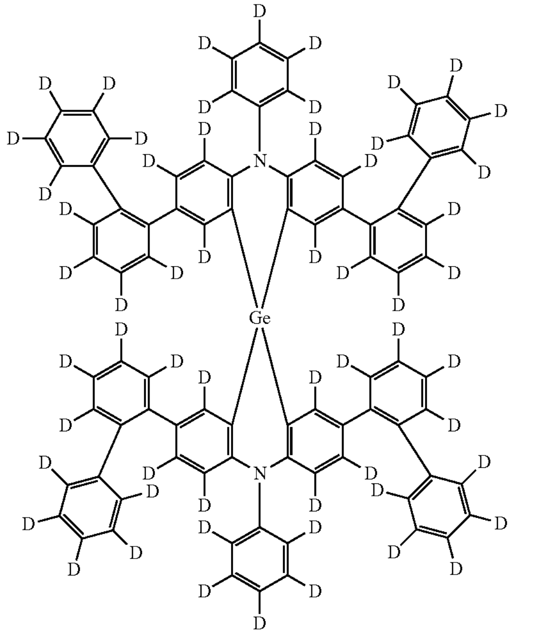
131
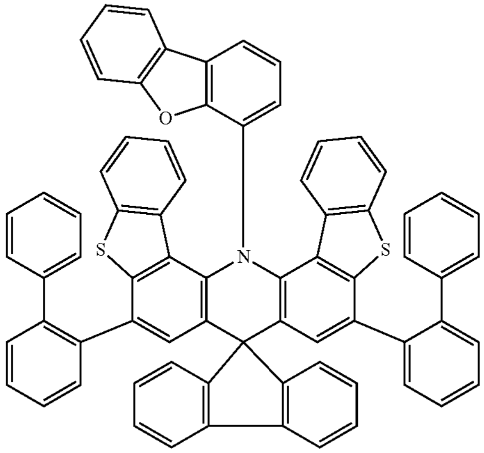
132
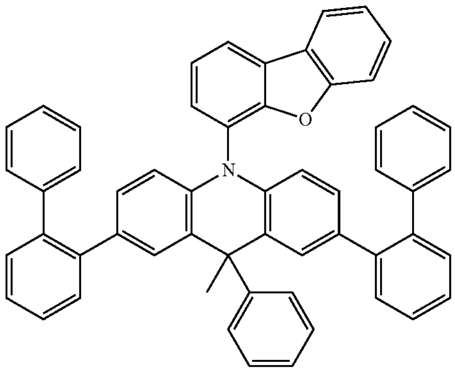

-continued
133
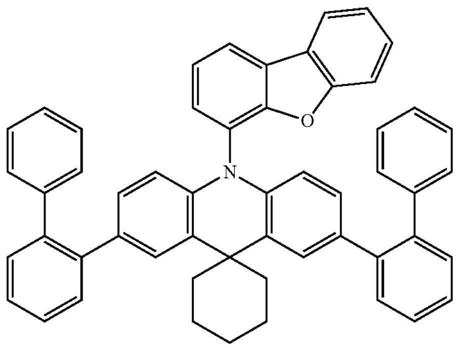
.
* * * * *